(12) United States Patent
Yamazaki et al.

(10) Patent No.: US 12,237,389 B2
(45) Date of Patent: Feb. 25, 2025

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Kenichi Okazaki, Tochigi (JP); Masami Jintyou, Shimotsuga (JP); Yukinori Shima, Tatebayashi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 721 days.

(21) Appl. No.: 17/288,680

(22) PCT Filed: Oct. 23, 2019

(86) PCT No.: PCT/IB2019/059035
§ 371 (c)(1),
(2) Date: Apr. 26, 2021

(87) PCT Pub. No.: WO2020/089733
PCT Pub. Date: May 7, 2020

(65) Prior Publication Data
US 2021/0399106 A1 Dec. 23, 2021

(30) Foreign Application Priority Data

Nov. 2, 2018 (JP) .................................. 2018-207399
Nov. 7, 2018 (JP) .................................. 2018-209953
(Continued)

(51) Int. Cl.
*H01L 29/423* (2006.01)
*H01L 29/49* (2006.01)
(Continued)

(52) U.S. Cl.
CPC .... *H01L 29/42384* (2013.01); *H01L 29/4908* (2013.01); *H01L 29/66969* (2013.01);
(Continued)

(58) Field of Classification Search
CPC ........... H01L 29/42384; H01L 29/4908; H01L 29/7869; H01L 29/78696
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

| CN | 106537567 A | 3/2017 |
| JP | 2004-163901 A | 6/2004 |

(Continued)

OTHER PUBLICATIONS

International Search Report (Application No. PCT/IB2019/059035) Dated Jan. 28, 2020.
(Continued)

*Primary Examiner* — Michele Fan
(74) *Attorney, Agent, or Firm* — Eric J. Robinson; Robinson Intellectual Property Law Office, P.C.

(57) ABSTRACT

A highly reliable semiconductor device with favorable electrical characteristics is provided. A semiconductor device includes a semiconductor layer, an insulating layer, a metal oxide layer, and a conductive layer. The semiconductor layer, the insulating layer, the metal oxide layer, and the conductive layer are stacked in this order. The semiconductor layer includes a first region, a pair of second regions, and a pair of third regions. The first region overlaps the metal oxide layer. The second regions sandwich the first region, overlap the insulating layer, and do not overlap the metal
(Continued)

oxide layer. The third regions sandwich the first region and the pair of second regions, and do not overlap the insulating layer. The third region includes a portion having a lower resistance than the first region. The second region includes a portion having a higher resistance than the third region.

16 Claims, 55 Drawing Sheets

(30) Foreign Application Priority Data

Dec. 19, 2018 (JP) .................................. 2018-237471
Apr. 22, 2019 (JP) ................................. 2019-081176

(51) Int. Cl.
H01L 29/66 (2006.01)
H01L 27/12 (2006.01)
H01L 29/786 (2006.01)

(52) U.S. Cl.
CPC ............................... H01L 27/1225 (2013.01); H01L 2029/42388 (2013.01); H01L 29/78621 (2013.01); H01L 29/7869 (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,061,565 B2 | 6/2006 | Kwon et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,662,704 B2 | 2/2010 | Yasukawa |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,003,981 B2 | 8/2011 | Iwasaki et al. |
| 8,058,645 B2 | 11/2011 | Jeong et al. |
| 8,067,775 B2 | 11/2011 | Miyairi et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,222,092 B2 | 7/2012 | Yamazaki et al. |
| 8,274,078 B2 | 9/2012 | Itagaki et al. |
| 8,274,079 B2 | 9/2012 | Yamazaki |
| 8,367,489 B2 | 2/2013 | Yamazaki |
| 8,373,832 B2 | 2/2013 | Takasawa et al. |
| 8,384,076 B2 | 2/2013 | Park et al. |
| 8,436,342 B2 | 5/2013 | Park et al. |
| 8,461,594 B2 * | 6/2013 | Morosawa .......... H01L 29/7869 257/E29.299 |
| 8,513,661 B2 | 8/2013 | Takahashi et al. |
| 8,624,240 B2 | 1/2014 | Sato et al. |
| 8,643,008 B2 | 2/2014 | Yamazaki et al. |
| 8,674,354 B2 | 3/2014 | Yamazaki |
| 8,698,138 B2 | 4/2014 | Yamazaki |
| 8,748,215 B2 | 6/2014 | Yamazaki |
| 8,748,881 B2 | 6/2014 | Yamazaki |
| 8,765,522 B2 | 7/2014 | Yamazaki |
| 8,779,420 B2 | 7/2014 | Yamazaki |
| 8,878,180 B2 | 11/2014 | Yamazaki |
| 9,136,390 B2 | 9/2015 | Yamazaki et al. |
| 9,202,923 B2 | 12/2015 | Yamazaki |
| 9,412,876 B2 | 8/2016 | Koezuka et al. |
| 9,496,408 B2 | 11/2016 | Yamazaki et al. |
| 9,646,829 B2 | 5/2017 | Ohno et al. |
| 9,711,651 B2 | 7/2017 | Yamazaki et al. |
| 9,728,555 B2 | 8/2017 | Yamazaki |
| 9,991,288 B2 | 6/2018 | Yamazaki |
| 9,997,637 B2 | 6/2018 | Koezuka et al. |
| 10,249,768 B2 | 4/2019 | Koezuka et al. |
| 11,302,717 B2 | 4/2022 | Yamazaki |
| 2001/0030323 A1 | 10/2001 | Ikeda |
| 2001/0046027 A1 | 11/2001 | Tai et al. |
| 2002/0043662 A1 | 4/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |

(56) References Cited

U.S. PATENT DOCUMENTS

| | | |
|---|---|---|
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0321732 A1 | 12/2009 | Kim et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0163868 A1 | 7/2010 | Yamazaki et al. |
| 2010/0320458 A1 | 12/2010 | Umeda et al. |
| 2010/0320459 A1 | 12/2010 | Umeda et al. |
| 2011/0073856 A1 | 3/2011 | Sato et al. |
| 2011/0127579 A1 | 6/2011 | Yamazaki |
| 2011/0193083 A1 | 8/2011 | Kim et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2011/0215328 A1 | 9/2011 | Morosawa et al. |
| 2012/0052624 A1 | 3/2012 | Yamazaki |
| 2012/0061668 A1 | 3/2012 | Miyairi et al. |
| 2012/0119205 A1 | 5/2012 | Taniguchi et al. |
| 2014/0014947 A1 | 1/2014 | Yamazaki |
| 2014/0152936 A1* | 6/2014 | Kim .................. H01L 29/7869 252/519.1 |
| 2014/0197407 A1 | 7/2014 | Yamazaki |
| 2014/0346501 A1 | 11/2014 | Yamazaki |
| 2014/0349443 A1 | 11/2014 | Yamazaki |
| 2015/0228803 A1 | 8/2015 | Koezuka et al. |
| 2015/0263141 A1* | 9/2015 | Yamazaki ........... H01L 29/4966 438/104 |
| 2017/0104090 A1 | 4/2017 | Koezuka et al. |
| 2017/0125604 A1 | 5/2017 | Oshima |
| 2017/0170325 A1 | 6/2017 | Koezuka et al. |
| 2017/0317215 A1 | 11/2017 | Yamazaki et al. |
| 2018/0211980 A1 | 7/2018 | Yamazaki |
| 2019/0115476 A1 | 4/2019 | Oshima |
| 2022/0208796 A1 | 6/2022 | Yamazaki |
| 2024/0006418 A1 | 1/2024 | Yamazaki |

FOREIGN PATENT DOCUMENTS

| | | |
|---|---|---|
| JP | 2014-007399 A | 1/2014 |
| JP | 2015-188063 A | 10/2015 |
| JP | 2017-076788 A | 4/2017 |
| JP | 2017-112369 A | 6/2017 |
| JP | 2017-191934 A | 10/2017 |
| JP | 2017-204637 A | 11/2017 |
| JP | 2018-163949 A | 10/2018 |
| KR | 2015-0093616 A | 8/2015 |
| WO | WO-2016/009715 | 1/2016 |
| WO | WO-2017/098369 | 6/2017 |

OTHER PUBLICATIONS

Written Opinion (Application No. PCT/IB2019/059035) Dated Jan. 28, 2020.

* cited by examiner

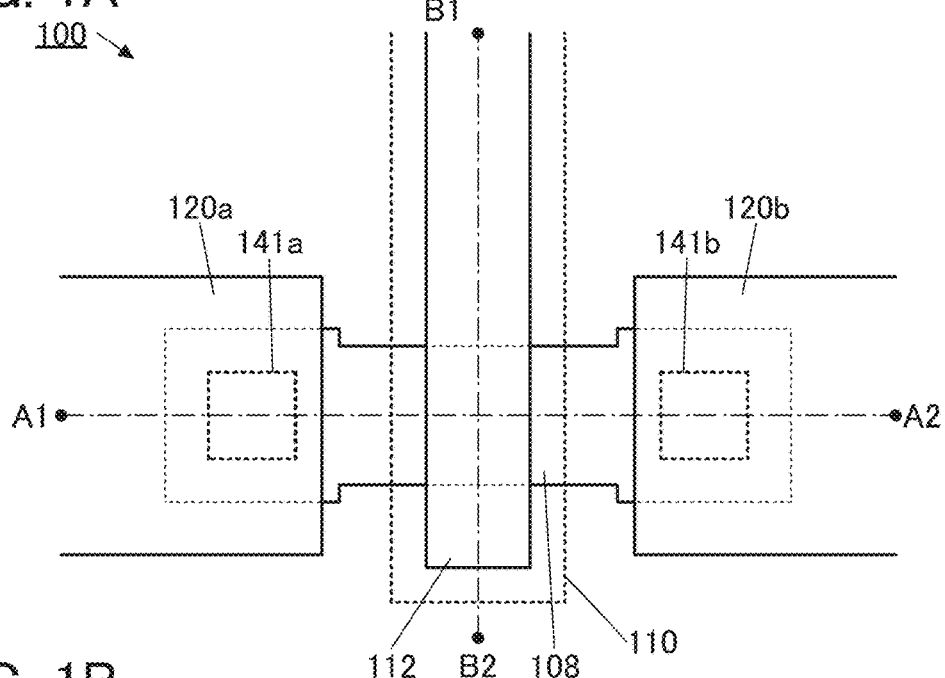
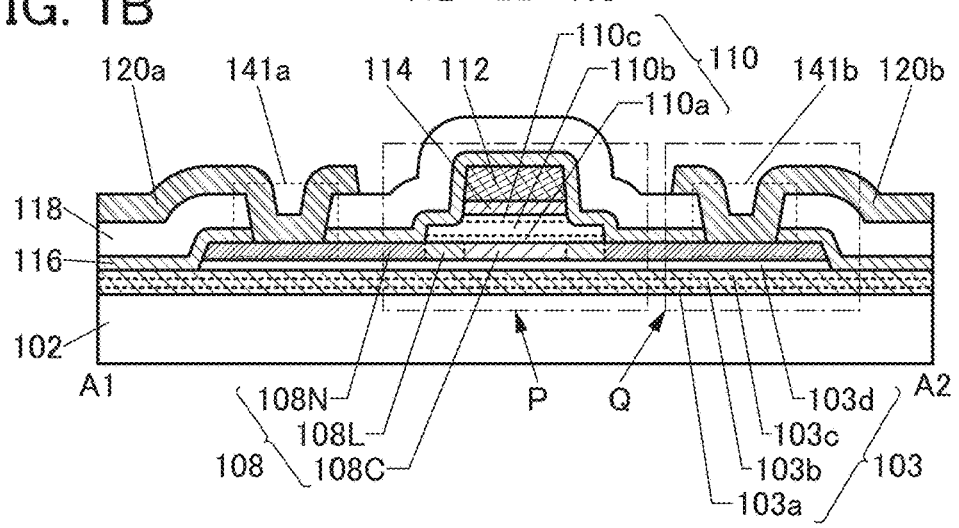
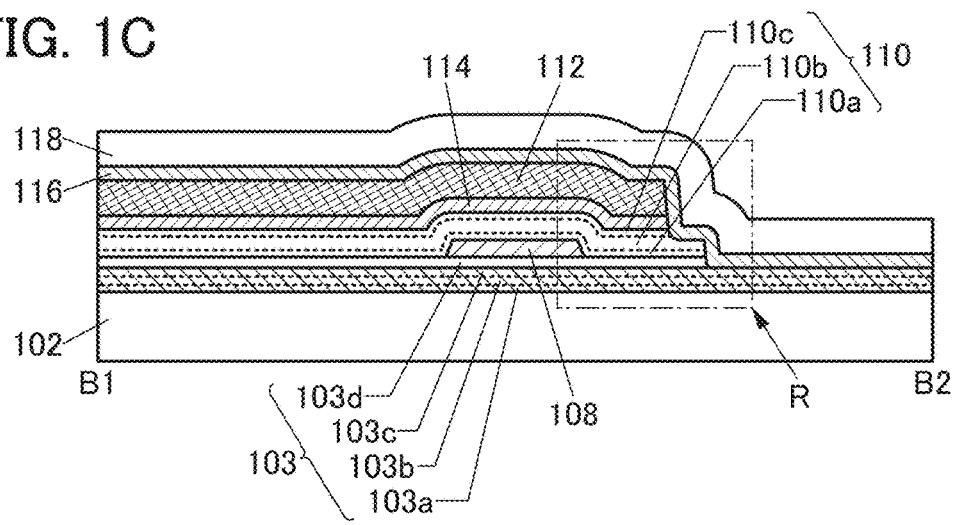

m/z=2 ($H_2$)

FIG. 50
| | sample Q4 |
|---|---|
| | SiN (w/ NH3) |
| | Tsub=350°C |
| L/W =2/50 μm | 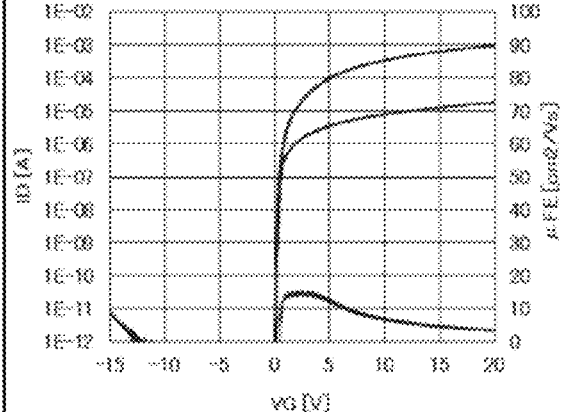 |
| Vth [V] | ave=0.55 / 3σ=0.13 |
| μFE [cm2/Vs] | ave=14.56 / 3σ=1.22 |
| L/W =3/50 μm | 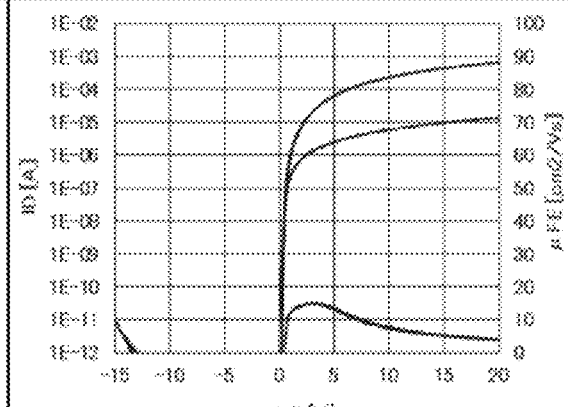 |
| Vth [V] | ave=0.65 / 3σ=0.14 |
| μFE [cm2/Vs] | ave=14.78 / 3σ=0.75 |
| L/W =6/50 μm | 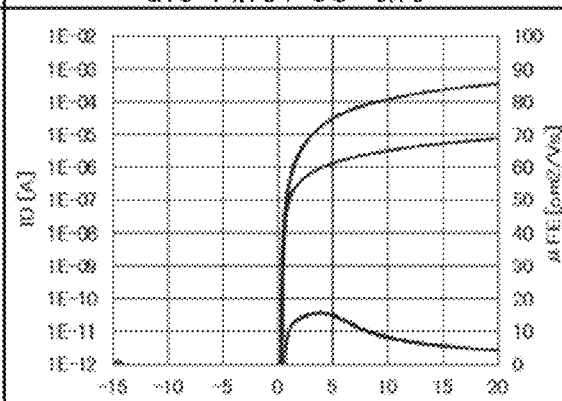 |
| Vth [V] | ave=0.77 / 3σ=0.15 |
| μFE [cm2/Vs] | ave=15.63 / 3σ=0.67 |
| 2ΔL [μm] | −0.18 |
| S/D-Rs [Ω/□] | 1.12E+03 |

SEMICONDUCTOR DEVICE

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that makes field-effect mobility (simply referred to as mobility or μFE in some cases) to be increased by stacking a plurality of oxide semiconductor layers, including indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case of using amorphous silicon; therefore, a high-performance display device provided with driver circuits can be obtained.

There is a trend in a display device toward a larger screen, and development taking a screen size of 60 inches diagonal or more or 120 inches diagonal or more into consideration has been progressed. Furthermore, there is a trend in resolution of a screen toward a higher definition, for example, full high definition (the number of pixels: 1920×1080; also referred to as "2K", for example), ultra high definition (the number of pixels: 3840×2160; also referred to as "4K", for example), and super high definition (the number of pixels: 7680×4320; also referred to as "8K", for example).

Increase in screen size or definition tends to increase wiring resistance in a display portion. Patent Document 2 discloses a technique of forming a low-resistance wiring layer using copper (Cu) in order to suppress increase in wiring resistance in a liquid crystal display device using an amorphous silicon transistor.

REFERENCE

Patent Document

[Patent Document 1] Japanese Published Patent Application No. 2014-7399
[Patent Document 2] Japanese Published Patent Application No. 2004-163901

SUMMARY OF THE INVENTION

Problems to be Solved by the Invention

An object of one embodiment of the present invention is to provide a semiconductor device having favorable electrical characteristics. Another object of one embodiment of the present invention is to provide a highly reliable semiconductor device. Another object of one embodiment of the present invention is to provide a novel semiconductor device.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a semiconductor device including a semiconductor layer, a first insulating layer, a second insulating layer, a third insulating layer, a metal oxide layer, and a conductive layer. The semiconductor layer, the second insulating layer, the metal oxide layer, and the conductive layer are stacked in this order over the first insulating layer. In a cross section in a channel length direction, an end portion of the second insulating layer is positioned inward from an end portion of the semiconductor layer, and an end portion of the conductive layer and an end portion of the metal oxide layer are positioned inward from the end portion of the second insulating layer. The third insulating layer is in contact with a top surface of the first insulating layer, a top surface and a side surface of the semiconductor layer, a top surface and a side surface of the second insulating layer, a side surface of the metal oxide layer, and a top surface and a side surface of the conductive layer. The semiconductor layer includes a first region, a pair of second regions, and a pair of third regions. The first region overlaps the first insulating layer and is overlapped by the metal oxide layer. The second regions sandwich the first region, are overlapped by the second insulating layer, and are not overlapped by the metal oxide layer. The third regions sandwich the first region and the pair of second regions, and are not overlapped by the second insulating layer. The third regions are in contact with the third insulating layer and include a portion having a lower resistance than the first region. The second regions include a portion having a higher resistance than the third regions.

In the above semiconductor device, the second insulating layer preferably includes a portion where a region not overlapped by the metal oxide layer is thinner than a region overlapped by the metal oxide layer.

In the above semiconductor device, the second region preferably includes a portion having a sheet resistance greater than or equal to $1\times10^3$ Ω/square and lower than or equal to $1\times10^9$ Ω/square.

In the above semiconductor device, the electric resistance of the first region is preferably greater than or equal to $1\times10^0$ times and less than or equal to $1\times10^9$ times the electric resistance of the second region.

In the above semiconductor device, the electric resistance of the second region is preferably greater than or equal to $1\times10^0$ times and less than or equal to $1\times10^9$ times the electric resistance of the third region.

In the above semiconductor device, in the cross section in the channel length direction, the width of the second region is preferably greater than or equal to 100 nm and less than or equal to 2 μm.

In the above semiconductor device, it is preferred that the first insulating layer contain a nitride, and the third insulating layer contain a nitride.

Preferably, the above semiconductor device further includes a fourth insulating layer. It is preferred that the fourth insulating layer be in contact with a top surface of the third insulating layer and contain a nitride.

In the above semiconductor device, the third insulating layer preferably includes a region having a lower hydrogen concentration than the fourth insulating layer.

In the above semiconductor device, the third insulating layer preferably includes a region having a higher film density than the fourth insulating layer.

In the above semiconductor device, the conductive layer and the metal oxide layer preferably have substantially the same top surface shapes. Alternatively, the end portion of the conductive layer is preferably positioned inward from the end portion of the metal oxide layer.

In the above semiconductor device, the end portion of the second insulating layer and the end portion of the metal oxide layer are preferably tapered.

In the above semiconductor device, the semiconductor layer and the metal oxide layer preferably contain the same metal element.

In the above semiconductor device, the metal element is preferably at least one of indium and zinc.

Effect of the Invention

According to one embodiment of the present invention, a semiconductor device having favorable electrical characteristics can be provided. Alternatively, a highly reliable semiconductor device can be provided. Alternatively, a novel semiconductor device can be provided.

Note that the description of these effects does not preclude the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIG. 1A is a top view of a semiconductor device. FIG. 1B and FIG. 1C are cross-sectional views of the semiconductor device.

FIG. 50 is a diagram showing Id-Vg characteristics of transistors.

MODE FOR CARRYING OUT THE INVENTION

Figure 2A:
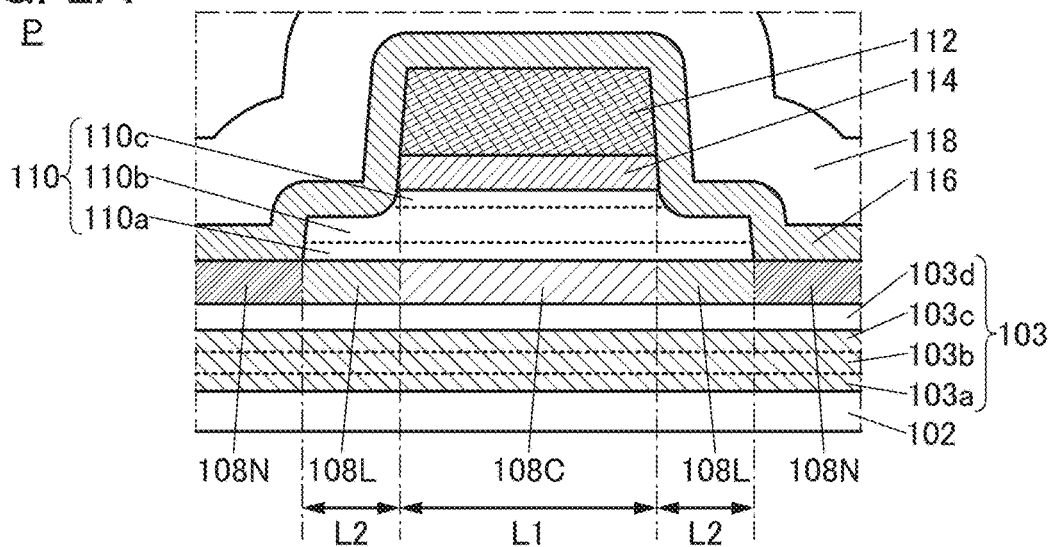
FIG. 2A, FIG. 2B, and FIG. 2C are cross-sectional views of a semiconductor device.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Thus, the present invention should not be construed as being limited to the following description of the embodiments.

In each drawing described in this specification, the size, the layer thickness, or the region of each component is exaggerated for clarity in some cases.

Ordinal numbers such as "first," "second," and "third" used in this specification and the like are used in order to avoid confusion among components and do not limit the components numerically.

In this specification and the like, terms for describing arrangement, such as "over" and "under," are used for convenience to describe the positional relation between components with reference to drawings. Furthermore, the positional relation between components is changed as appropriate in accordance with a direction in which the components are described. Thus, terms for the description are not limited to those used in this specification, and the description can be rephrased appropriately depending on the situation.

In this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

In this specification and the like, the channel length direction of a transistor refers to one of directions parallel to the straight line that connects a source region and a drain region in the shortest distance. In other words, the channel length direction corresponds to one of directions of current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric action" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

In this specification and the like, the expression "having substantially the same top surface shapes" means that at least outlines of stacked layers partly overlap each other. For example, the case of processing or partly processing an upper layer and a lower layer with the use of the same mask pattern is included. However, in some cases, the outlines do not completely overlap with each other and an end portion of the upper layer is positioned inward from an end portion of the lower layer or an end portion of the upper layer is positioned outward from an end portion of the lower layer; such a case is also represented by the expression "having substantially the same top surface shapes."

Unless otherwise specified, off-state current in this specification and the like refers to a drain current of a transistor in an off state (also referred to as a non-conducting state or a cutoff state). Unless otherwise specified, an off state refers to a state where the voltage $V_{gs}$ between its gate and source is lower than the threshold voltage Vth in an n-channel transistor (higher than Vth in a p-channel transistor).

In this specification and the like, a display panel that is one embodiment of a display device has a function of displaying (outputting) an image or the like on (to) a display surface. Therefore, the display panel is one embodiment of an output device.

In this specification and the like, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display panel module or a display module, or simply as a display panel or the like in some cases.

Note that in this specification and the like, a touch panel that is one embodiment of a display device has a function of displaying an image or the like on a display surface and a function of a touch sensor that senses the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a structure in which a connector and an IC are mounted on a substrate of a touch panel is referred to as a touch panel module or a display module, or simply as a touch panel or the like in some cases.

Embodiment 1

In this embodiment, a semiconductor device of one embodiment of the present invention will be described. As examples of the semiconductor device, structure examples of a transistor and examples of a manufacturing method thereof will be described below.

One embodiment of the present invention is a semiconductor device including, over a first insulating layer, a semiconductor layer in which a channel is formed; a second insulating layer functioning as a gate insulating layer; and a conductive layer functioning as a gate electrode. The semiconductor layer preferably includes a metal oxide exhibiting semiconductor characteristics (hereinafter also referred to as an oxide semiconductor).

A metal oxide layer is provided between the second insulating layer and the conductive layer. The metal oxide layer preferably has conductivity, in which case the metal oxide layer functions as part of the gate electrode.

In the cross section in the channel length direction, an end portion (outline) of the second insulating layer is preferably positioned inward from an end portion (outline) of the semiconductor layer. Furthermore, in the cross section in the channel length direction, end portions (outlines) of the conductive layer and the metal oxide layer are preferably positioned inward from the end portion (outline) of the second insulating layer.

The semiconductor device of one embodiment of the present invention further includes a third insulating layer. The third insulating layer is preferably provided in contact with a top surface of the first insulating layer, a top surface and a side surface of the semiconductor layer, a top surface and a side surface of the second insulating layer, a side surface of the metal oxide layer, and a top surface and a side surface of the conductive layer. Each of the first insulating layer and the third insulating layer is preferably formed using a material that inhibits diffusion of impurities. For example, a nitride can be used for each of the first insulating layer and the third insulating layer. Providing a region where the first insulating layer is in contact with the third insulating layer can inhibit diffusion of impurities into the transistor, and thus the transistor can have high reliability.

The semiconductor layer includes a first region where a channel is formed, a pair of second regions between which the first region is sandwiched, and a pair of third regions between which the first region and the second regions are sandwiched and which function as a source region and a drain region. The first region is a region that overlaps the first insulating layer and is overlapped by the metal oxide layer. The second region is a region overlapped by the second insulating layer and not overlapped by the metal oxide layer. The third region is a region not overlapped by the second insulating layer. Preferably, the third region is in contact with the third insulating layer and includes a portion having a lower resistance than the first region. The second region preferably includes a portion having a higher resistance than the third region.

The second region functions as an LDD (Lightly Doped Drain) region. Including the second region can relieve a drain electric field; hence, the transistor can have high reliability even when driven at high voltage.

More specific examples are described below with reference to drawings.

Structure Example 1

FIG. 1A is a top view of a transistor 100, FIG. 1B corresponds to a cross-sectional view of a cut plane along the dashed-dotted line A1-A2 shown in FIG. 1A, and FIG. 1C corresponds to a cross-sectional view of a cut plane along the dashed-dotted line B1-B2 shown in FIG. 1A. Note that in FIG. 1A, some components (e.g., a protective layer) of the transistor 100 are not illustrated. In addition, the direction of the dashed-dotted line A1-A2 corresponds to the channel length direction, and the direction of the dashed-dotted line B1-B2 corresponds to the channel width direction. Furthermore, some components are not illustrated in top views of transistors in the following drawings, as in FIG. 1A.

The transistor 100 is provided over a substrate 102 and includes an insulating layer 103, a semiconductor layer 108, an insulating layer 110, a metal oxide layer 114, a conductive layer 112, an insulating layer 116, an insulating layer 118, and the like. The semiconductor layer 108 having an island shape is provided over the insulating layer 103. The insulating layer 110 is provided to cover part of the top surface of the insulating layer 103 and part of the semiconductor layer 108. The metal oxide layer 114 and the conductive layer 112 are provided to be stacked in this order over the insulating layer 110 and each include a portion overlapping the semiconductor layer 108. An enlarged view of a region P surrounded by a dashed-dotted line in FIG. 1B is shown in FIG. 2A.

End portions of the conductive layer 112 and the metal oxide layer 114 are located inward from an end portion of the insulating layer 110. In other words, the insulating layer 110 includes a portion extending beyond the end portions of the conductive layer 112 and the metal oxide layer 114 over at least the semiconductor layer 108.

The semiconductor layer 108 includes a region 108C functioning as a channel formation region, a pair of regions 108L between which the region 108C is sandwiched, and a pair of regions 108N on the outer sides of the regions 108L. The region 108L is a region of the semiconductor layer 108 that is overlapped by the insulating layer 110 and is not overlapped by the conductive layer 112. In FIG. 2A, the width of the region 108C in the channel length direction of the transistor 100 is denoted as L1 and the width of the region 108L is denoted as L2.

The region 108C functions as a channel formation region. Here, the metal oxide layer 114 functions as part of a gate electrode when having conductivity; thus, an electric field is applied from the gate electrode to the region 108C through the insulating layer 110 functioning as a gate insulating layer, whereby a channel is formed.

The region 108L has a function of a buffer region for relieving a drain electric field. Since the region 108L is a region not overlapped by the conductive layer 112 and the metal oxide layer 114, a channel is hardly formed in the region 108L even when gate voltage is applied to the conductive layer 112. The region 108L preferably has a higher carrier concentration than the region 108C. In that case, the region 108L can function as an LDD region.

The region 108L can be referred to as a region whose resistance is substantially equal to or lower than that of the region 108C, a region whose carrier concentration is substantially equal to or higher than that of the region 108C, a region whose oxygen vacancy density is substantially equal to or higher than that of the region 108C, or a region whose impurity concentration is substantially equal to or higher than that of the region 108C.

The region 108L can be referred to as a region whose resistance is substantially equal to or higher than that of the region 108N, a region whose carrier concentration is substantially equal to or lower than that of the region 108N, a region whose oxygen vacancy density is substantially equal to or lower than that of the region 108N, or a region whose impurity concentration is substantially equal to or lower than that of the region 108N.

In this manner, the region 108L functioning as the LDD region is provided between the region 108C that is the channel formation region and the region 108N that is a source region or a drain region, whereby a highly reliable transistor having both high drain withstand voltage and a high on-state current can be provided.

The region 108N functions as the source region or the drain region and has the lowest resistance in the regions of the semiconductor layer 108. Alternatively, the region 108N can be referred to as a region having the highest carrier concentration, a region having the highest oxygen vacancy density, or a region having the highest impurity concentration in the regions of the semiconductor layer 108.

The electric resistance of the region 108N is preferably as low as possible; for example, the sheet resistance of the region 108N is preferably higher than or equal to 1 Ω/square and less than $1 \times 10^3$ Ω/square, further preferably higher than or equal to 1 Ω/square and lower than or equal to $8 \times 10^2$ Ω/square.

The electric resistance of the region 108C in a state where the channel is not formed is preferably as high as possible. For example, the sheet resistance of the region 108C is preferably higher than or equal to $1 \times 10^9$ Ω/square, further preferably higher than or equal to $5 \times 10^9$ Ω/square, still further preferably higher than or equal to $1 \times 10^{10}$ Ω/square.

Since the electric resistance of the region 108C in a state where the channel is not formed is preferably as high as possible, it is not necessary to set its upper limit. If the upper limit is set, the sheet resistance of the region 108C is preferably higher than or equal to $1 \times 10^9$ Ω/square and lower than or equal to $1 \times 10^{12}$ Ω/square, further preferably higher than or equal to $5 \times 10^9$ Ω/square and lower than or equal to $1 \times 10^{12}$ Ω/square, still further preferably higher than or equal to $1 \times 10^{10}$ Ω/square and lower than or equal to $1 \times 10^{12}$ Ω/square, for example.

The sheet resistance of the region 108L can be, for example, higher than or equal to $1 \times 10^3$ Ω/square and lower than or equal to $1 \times 10^9$ Ω/square, preferably higher than or equal to $1 \times 10^3$ Ω/square and lower than or equal to $1 \times 10^8$ Ω/square, further preferably higher than or equal to $1 \times 10^3$ Ω/square and lower than or equal to $1 \times 10^7$ Ω/square. When the resistance is within the above range, a transistor that has favorable electrical characteristics and high reliability can be provided. Note that the sheet resistance can be calculated from a resistance value. Providing the region 108L between the region 108N and the region 108C can increase the source-drain withstand voltage of the transistor 100.

The electric resistance of the region 108C in a state where the channel is not formed can be more than or equal to $1 \times 10^6$ times and less than or equal to $1 \times 10^{12}$ times that of the region 108N, preferably more than or equal to $1 \times 10^6$ times and less than or equal to $1 \times 10^{11}$ times that of the region 108N, further preferably more than or equal to $1 \times 10^6$ times and less than or equal to $1 \times 10^{10}$ times that of the region 108N.

The electric resistance of the region 108C in a state where the channel is not formed can be more than or equal to $1 \times 10^0$ times and less than or equal to $1 \times 10^9$ times that of the region 108L, preferably more than or equal to $1 \times 10^1$ times and less than or equal to $1 \times 10^8$ times that of the region 108L, further preferably more than or equal to $1 \times 10^2$ times and less than or equal to $1 \times 10^7$ times that of the region 108L.

The electric resistance of the region 108L can be more than or equal to $1 \times 10^0$ times and less than or equal to $1 \times 10^9$ times that of the region 108N, preferably more than or equal to $1 \times 10^1$ times and less than or equal to $1 \times 10^8$ times that of the region 108N, further preferably more than or equal to $1 \times 10^1$ times and less than or equal to $1 \times 10^7$ times that of the region 108N.

Providing the region 108L having the resistance described above between the region 108N and the channel formation region can increase the source-drain withstand voltage of the transistor 100.

The carrier concentration in the semiconductor layer 108 preferably has a distribution such that the concentration is the lowest in the region 108C and increases in the order of the region 108L and the region 108N. Providing the region 108L between the region 108C and the region 108N can keep the carrier concentration of the region 108C extremely low even when impurities such as hydrogen diffuse from the region 108N during the manufacturing process, for example.

The carrier concentration of the region 108C functioning as the channel formation region is preferably as low as possible and is preferably lower than or equal to $1 \times 10^{18}$ cm$^{-3}$, further preferably lower than or equal to $1 \times 10^{17}$ cm$^{-3}$, still further preferably lower than or equal to $1 \times 10^{16}$ cm$^{-3}$, yet further preferably lower than or equal to $1 \times 10^{13}$ cm$^{-3}$, yet still further preferably lower than or equal to $1 \times 10^{12}$ cm$^{-3}$. Note that the lower limit of the carrier concentration of the region 108C is not particularly limited and can be, for example, $1 \times 10^{-9}$ cm$^{-3}$.

Meanwhile, the carrier concentration of the region 108N can be higher than or equal to $5 \times 10^{18}$ cm$^{-3}$, preferably higher than or equal to $1 \times 10^{19}$ cm$^{-3}$, further preferably higher than or equal to $5 \times 10^{19}$ cm$^{-3}$, for example. The upper limit of the carrier concentration of the region 108N is not particularly limited and can be, for example, $5 \times 10^{21}$ cm$^{-3}$ or $1 \times 10^{22}$ cm$^{-3}$.

The carrier concentration of the region 108L can lie between that of the region 108C and that of the region 108N and is, for example, a value higher than or equal to $1 \times 10^{14}$ cm$^{-3}$ and lower than $1 \times 10^{20}$ cm$^{-3}$.

Note that the carrier concentration is not necessarily uniform in the region 108L; in some cases, the carrier concentration has a falling gradient from the region 108N side toward the channel formation region. For example, one or both of the hydrogen concentration and the oxygen vacancy concentration in the region 108L may have a falling gradient from the region 108N side to the channel formation region side.

The semiconductor layer 108 preferably contains a metal oxide. In addition, for the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Thus, heat treatment or the like in the manufacturing process of the transistor 100 can supply oxygen released from the insulating layer 103 and the insulating layer 110 to the channel formation region of the semiconductor layer 108 to reduce oxygen vacancies in the semiconductor layer 108.

Part of the end portion of the insulating layer 110 is positioned over the semiconductor layer 108. The insulating layer 110 includes a portion that is overlapped by the conductive layer 112 and functions as the gate insulating layer, and a portion that is not overlapped by the conductive layer 112 and the metal oxide layer 114 (i.e., a portion overlapping the region 108L).

The insulating layer 110 may have a stacked-layer structure of two or more layers. FIG. 1B, FIG. 1C, and FIG. 2A illustrate an example in which the insulating layer 110 has a three-layer structure of an insulating layer 110a, an insulating layer 110b over the insulating layer 110a, and an insulating layer 110c over the insulating layer 110b. Note that insulating films formed of the same kind of material can be used as the insulating layer 110a, the insulating layer 110b, and the insulating layer 110c; thus, the interfaces between the insulating layer 110a, the insulating layer 110b, and the insulating layer 110c cannot be clearly observed in some cases. Therefore, in this embodiment, the interfaces between the insulating layer 110a, the insulating layer 110b, and the insulating layer 110c are shown by dashed lines.

The insulating layer 110a includes a region in contact with the channel formation region of the semiconductor layer 108. The insulating layer 110c includes a region in contact with the metal oxide layer 114. The insulating layer 110b is positioned between the insulating layer 110a and the insulating layer 110c.

The insulating layer 110a, the insulating layer 110b, and the insulating layer 110c are each preferably an insulating film containing an oxide. In this case, the insulating layer 110a, the insulating layer 110b, and the insulating layer 110c are preferably formed successively with the same film formation apparatus.

As the insulating layer 110a, the insulating layer 110b, and the insulating layer 110c, an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used, for example.

The insulating layer 110 that is in contact with the semiconductor layer 108 preferably has a stacked-layer structure of oxide insulating films, and further preferably includes a region containing oxygen in excess of that in the stoichiometric composition. In other words, the insulating layer 110 includes an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For example, the insulating layer 110a, the insulating layer 110b, and the insulating layer 110c can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method.

In particular, the insulating layer 110a, the insulating layer 110b, and the insulating layer 110c are preferably formed by a plasma CVD method.

The insulating layer 110a is formed over the semiconductor layer 108, and thus is preferably a film formed under conditions where the semiconductor layer 108 is damaged as little as possible. For example, the insulating layer 110a can be formed at a sufficiently low deposition rate.

For example, when the insulating layer 110a is formed by a plasma CVD method under a low-power condition, damage to the semiconductor layer 108 can be extremely small.

When a silicon oxynitride film is used as the insulating layer 110a, the insulating layer 110b, and the insulating layer 110c, a film formation gas used for forming the silicon oxynitride film can be, for example, a source gas that contains a deposition gas containing silicon, such as silane or disilane, and an oxidizing gas such as oxygen, ozone, dinitrogen monoxide, or nitrogen dioxide. The film formation gas may contain a dilution gas such as argon, helium, or nitrogen in addition to the source gas.

For example, when the proportion of the flow rate of the deposition gas in the total flow rate of the film formation gas (hereinafter also simply referred to as flow rate ratio) is low, the deposition rate can be made low, which allows formation of a dense film with few defects.

The insulating layer 110b is preferably a film formed under conditions where the deposition rate is higher than that of the insulating layer 110a. Thus, the productivity can be improved.

For example, the insulating layer 110b can be formed at an increased deposition rate by setting the flow rate ratio of the deposition gas to be higher than that for the insulating layer 110a.

The insulating layer 110c is preferably an extremely dense film that has reduced defects on the surface and is less likely to adsorb impurities contained in the air, such as water. For example, like the insulating layer 110a, the insulating layer 110c can be formed at a sufficiently low deposition rate.

Since the insulating layer 110c is formed over the insulating layer 110b, the formation of the insulating layer 110c affects the semiconductor layer 108 less than the formation of the insulating layer 110a. Thus, the insulating layer 110c can be formed under conditions where the power is higher than that for the insulating layer 110a. The reduced flow rate ratio of the deposition gas and the relatively high-power film formation enable formation of a dense film in which defects on its surface are reduced.

That is, the insulating layer 110 can be a stacked-layer film formed under conditions where the descending order of the deposition rate is the insulating layer 110b, the insulating layer 110a, and the insulating layer 110c. In addition, in the insulating layer 110, the descending order of the etching rate under the same wet etching or dry etching conditions is the insulating layer 110b, the insulating layer 110a, and the insulating layer 110c.

The insulating layer 110b is preferably formed to be thicker than the insulating layer 110a and the insulating layer 110c. The time taken to form the insulating layer 110 can be shortened by forming the insulating layer 110b, which is formed at the highest deposition rate, to be thick.

Here, the boundary between the insulating layer 110a and the insulating layer 110b and the boundary between the insulating layer 110b and the insulating layer 110c are sometimes unclear and thus are shown by dashed lines in FIG. 1A and the like. Since the insulating layer 110a and the insulating layer 110b have different film densities, the boundary therebetween can sometimes be observed as a difference in contrast in a transmission electron microscopy (TEM) image or the like of the cross section of the insulating layer 110. Similarly, the boundary between the insulating layer 110b and the insulating layer 110c can be observed in some cases.

At the time of forming the conductive layer 112 and the metal oxide layer 114, the thickness of the insulating layer 110 in a region that is not overlapped by the conductive layer 112 is reduced in some cases. FIG. 1B, FIG. 1C, and FIG. 2A illustrate a structure in which the insulating layer 110c is removed and the insulating layer 110a and the insulating layer 110b remain in the region that is not overlapped by the conductive layer 112. Moreover, the thickness of the insulating layer 110b in the region that is not overlapped by the conductive layer 112 is sometimes smaller than the thickness of the insulating layer 110b in a region overlapped by the conductive layer 112.

By reducing the thickness of the insulating layer 110 in the region that is not overlapped by the conductive layer 112, the amount of hydrogen supplied from the insulating layer 116 is increased and the resistance of the region 108L can be lowered. Moreover, by adjusting the thickness of the insulating layer 110 in the region that is not overlapped by the conductive layer 112, the amount of hydrogen supplied from the insulating layer 116 can be adjusted to control the resistance of the region 108L.

Reducing the thickness of the insulating layer 110 in the region that is not overlapped by the conductive layer 112 reduces a step at the end portion of the insulating layer 110, which can improve step coverage with the layer formed over the insulating layer 110 (e.g., the insulating layer 116) and inhibit occurrence of a defect, such as breakage or a void, in the layer.

Figure 2B:
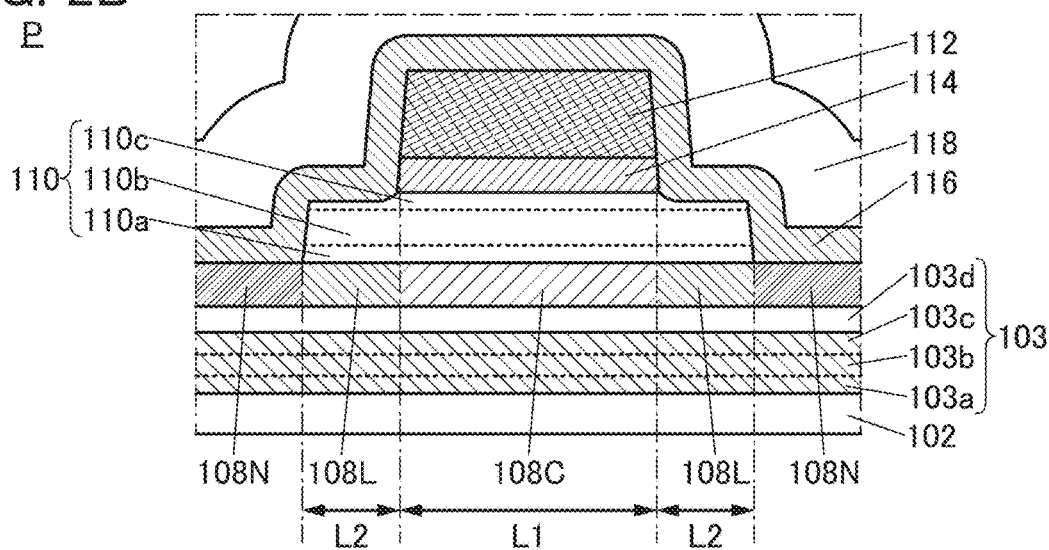

FIG. 2B illustrates a structure in which the insulating layer 110a, the insulating layer 110b, and the insulating layer 110c remain in regions that are not overlapped by the conductive layer 112. The thickness of the insulating layer 110c in the region that is not overlapped by the conductive layer 112 is sometimes smaller than the thickness of the insulating layer 110c in a region overlapped by the conductive layer 112. As illustrated in FIG. 2B, it is particularly preferable that the insulating layer 110c remain in the region that is not overlapped by the conductive layer 112. With the structure in which the insulating layer 110c remains in the region that is not overlapped by the conductive layer 112, water adsorption on the insulating layer 110 can be inhibited. The thickness of the insulating layer 110c in the region overlapped by conductive layer 112 is greater than or equal to 1 nm and less than or equal to 50 nm, preferably greater than or equal to 2 nm and less than or equal to 40 nm, further preferably greater than or equal to 3 nm and less than or equal to 30 nm.

Figure 2C:
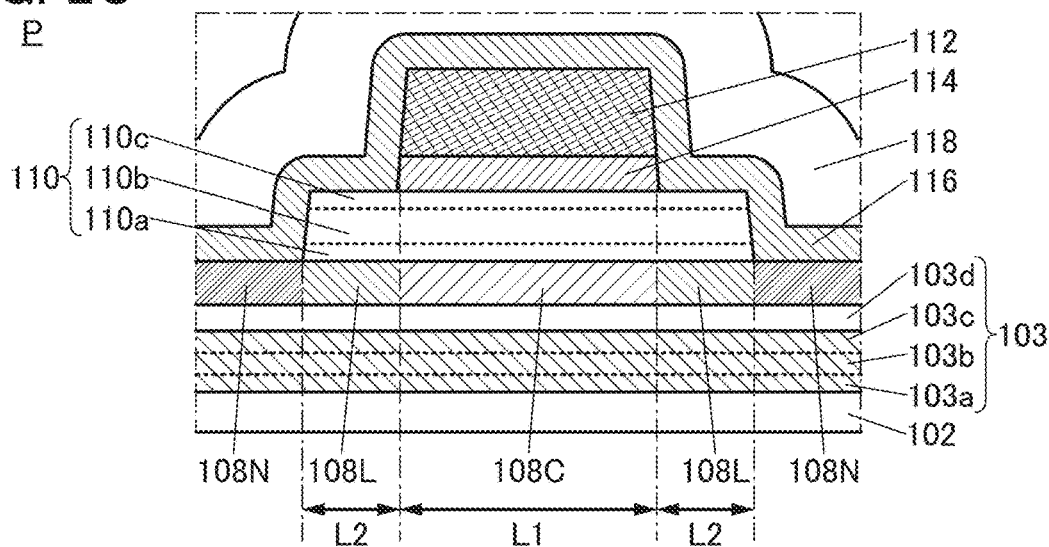

FIG. 2C illustrates an example in which the insulating layer 110a, the insulating layer 110b, and the insulating layer 110c remain in regions that are not overlapped by the conductive layer 112, and the thickness of the insulating layer 110c in a region overlapped by the conductive layer 112 is approximately equal to that of the insulating layer 110c in the region that is not overlapped by the conductive layer 112.

Note that the insulating layer 110 may have a two-layer structure of the insulating layer 110a and the insulating layer 110c over the insulating layer 110a. Alternatively, the insulating layer 110 may have a single-layer structure. Any of the insulating layer 110a, the insulating layer 110b, and the insulating layer 110c described above can be selected as the insulating layer 110 appropriately in accordance with the purpose.

The insulating layer 116 is provided to cover a top surface and a side surface of the conductive layer 112, a side surface of the metal oxide layer 114, a top surface and a side surface of the insulating layer 110, a top surface and a side surface of the semiconductor layer 108, and a top surface of the insulating layer 103. The insulating layer 118 is provided to cover the insulating layer 116. The insulating layer 116 and the insulating layer 118 each function as a protective layer and can inhibit diffusion of an impurity element from the outside.

The insulating layer 116 has a function of inhibiting diffusion of impurities from above the insulating layer 116 into the semiconductor layer 108. The insulating layer 116 also has a function of lowering the resistance of the semiconductor layer 108 in contact with the insulating layer 116 at the time of its formation. The insulating layer 116 is provided in contact with a top surface and a side surface of the region 108N. The insulating layer 116 can be formed using an insulating film that can supply impurities to the region 108N by heating at the time of or after formation of the insulating layer 116. Alternatively, the insulating layer 116 can be formed using an insulating film that can cause generation of oxygen vacancies in the region 108N by heating at the time of or after formation of the insulating layer 116.

The insulating layer 116 is preferably a film deposited using a gas containing an impurity element such as hydrogen as a deposition gas used for the deposition. As the gas containing hydrogen, silane or ammonia can be used, for example. In addition, by decreasing the deposition temperature of the insulating layer 116, a large amount of impurity elements can be effectively supplied to the semiconductor layer 108. The deposition temperature of the insulating layer 116 ranges preferably from 200° C. to 500° C., further preferably from 220° C. to 450° C., still further preferably from 230° C. to 430° C., yet still further preferably from 250° C. to 400° C., for example.

When the insulating layer 116 is formed under a reduced pressure while heating is performed, release of oxygen from regions to be the regions 108N in the semiconductor layer 108 can be promoted. When an impurity such as hydrogen is supplied to the semiconductor layer 108 where many oxygen vacancies are formed, the carrier concentration of the regions 108N is increased, and the resistance of the regions 108N can be lowered more effectively.

As the insulating layer 116, for example, an insulating film containing a nitride such as silicon nitride, silicon nitride oxide, silicon oxynitride, aluminum nitride, or aluminum nitride oxide can be favorably used. Specifically, because of having a blocking property against hydrogen and oxygen, silicon nitride can prevent both diffusion of hydrogen from the outside into the semiconductor layer 108 and release of oxygen from the semiconductor layer 108 to the outside, and can achieve a highly reliable transistor.

The insulating layer 116 may be an insulating film having a function of absorbing oxygen in the semiconductor layer 108 and generating oxygen vacancies. It is particularly preferable to use a metal nitride such as aluminum nitride, for example, for the insulating layer 116.

When a metal nitride is used for the insulating layer 116, it is preferable to use a nitride of aluminum, titanium, tantalum, tungsten, chromium, or ruthenium. In particular, aluminum or titanium is preferably included. For example, an aluminum nitride film formed by a reactive sputtering method using aluminum as a sputtering target and a nitrogen-including gas as a deposition gas can be a film having both an extremely high insulating property and an extremely high blocking property against hydrogen and oxygen when the flow rate of the nitrogen gas with respect to the total flow rate of the deposition gas is appropriately controlled. Thus, when such an insulating film containing a metal nitride is provided in contact with the semiconductor layer 108, the resistance of the semiconductor layer 108 can be lowered, and release of oxygen from the semiconductor layer 108 and diffusion of hydrogen into the semiconductor layer 108 can be favorably prevented.

In the case of using aluminum nitride as the metal nitride, the thickness of the insulating layer containing aluminum nitride is preferably 5 nm or more. A film with such a small thickness can have both a high blocking property against hydrogen and oxygen and a function of lowering the resistance of the semiconductor layer. Note that there is no particular limitation on the upper limit of the thickness of the insulating layer; however, the thickness is preferably less than or equal to 500 nm, further preferably less than or equal to 200 nm, still further preferably less than or equal to 50 nm in consideration of productivity.

In the case of using an aluminum nitride film as the insulating layer 116, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, so that dissipation of heat generated in driving the transistor 100 can be increased.

Alternatively, an aluminum titanium nitride film, a titanium nitride film, or the like can be used as the insulating layer 116.

Such an insulating layer 116 is provided in contact with the regions 108N, whereby the insulating layer 116 absorbs oxygen in the regions 108N and oxygen vacancies can be formed in the regions 108N. Furthermore, when heat treatment is performed after the insulating layer 116 is formed, a larger number of oxygen vacancies can be formed in the regions 108N, and a reduction in the resistance can be promoted. In the case where a film containing a metal oxide is used as the insulating layer 116, as the result of absorption of oxygen in the semiconductor layer 108 by the insulating layer 116, a layer containing an oxide of a metal element included in the insulating layer 116 (e.g., aluminum) may be formed between the insulating layer 116 and the regions 108N.

The region 108L is not in contact with the insulating layer 116 owing to the insulating layer 110 positioned therebetween, and thus is supplied with a smaller amount of hydrogen from the insulating layer 116 than the region 108N. Furthermore, the region 108L has a lower impurity concentration than the region 108N and thus can be in a state of having a higher resistance than the region 108N.

Since the regions 108L can be formed in a self-aligned manner as described later, a photomask for forming the regions 108L is not needed and the manufacturing cost can be reduced. In addition, forming the regions 108L in a self-aligned manner does not cause misalignment of the regions 108L relative to the conductive layer 112; hence, the widths of the regions 108L in the semiconductor layer 108 can be substantially the same.

Between the channel formation region and the low-resistance regions 108N in the semiconductor layer 108, the regions 108L functioning as offset regions to which a gate electric field is not applied (or to which the gate electric field is less likely to be applied compared to the channel formation region) can be formed stably without variations. As a result, the source-drain withstand voltage of the transistor can be improved, so that the transistor can have high reliability.

The width L2 of the region 108L ranges preferably from 100 nm to 2 μm, further preferably from 150 nm to 1 μm, still further preferably from 200 nm to 1 μm. Providing the regions 108L reduces the concentration of an electric field around the drain, so that deterioration of the transistor particularly in a state where the drain voltage is high can be suppressed. In particular, making the width L2 of the region 108L larger than the thickness of the insulating layer 110 can effectively suppress electric field concentration around the drain. On the other hand, when the width L2 is longer than 2 μm, the source-drain resistance increases and the driving speed of the transistor may be low. When the width L2 is set in the above range, a transistor and a semiconductor device that have high reliability and high driving speed can be obtained. Note that the width L2 of the region 108L can be determined in accordance with the thickness of the semiconductor layer 108, the thickness of the insulating layer 110, and the level of voltage applied between the source and the drain when the transistor 100 is driven.

Providing the region 108L between the channel formation region and the low-resistance region 108N can reduce the current density at the boundary between the channel formation region and the regions 108N; hence, heat generated at the boundary between the channel and the source or the drain is suppressed, and a transistor and a semiconductor device that have high reliability can be provided.

The insulating layer 103 can have a stacked-layer structure. FIG. 1 illustrates an example where the insulating layer 103 has a structure in which an insulating layer 103a, an insulating layer 103b, an insulating layer 103c, and an insulating layer 103d are stacked in this order from the substrate 102 side. The insulating layer 103a is in contact with the substrate 102. The insulating layer 103d is in contact with the semiconductor layer 108.

The insulating layer 103 preferably satisfies at least one of the following, further preferably satisfies all of the following: having high withstand voltage, having low film stress, not easily releasing hydrogen and water, having a small number of defects in the film, and inhibiting diffusion of impurities contained in the substrate 102.

Among the four insulating films included in the insulating layer 103, the insulating layer 103a, the insulating layer 103b, and the insulating layer 103c positioned on the substrate 102 side are preferably formed using an insulating film containing nitrogen. Meanwhile, the insulating layer 103d in contact with the semiconductor layer 108 is preferably formed using an insulating film containing oxygen. The four insulating films included in the insulating layer 103 are preferably formed successively without exposure to the air with a plasma CVD apparatus.

As each of the insulating layer 103a, the insulating layer 103b, and the insulating layer 103c, an insulating film containing nitrogen, such as a silicon nitride film, a silicon nitride oxide film, an aluminum nitride film, or a hafnium nitride film, can be favorably used, for example. Furthermore, the description of the insulating film that can be used as the insulating layer 110 can be referred to for the insulating layer 103d.

The insulating layer 103a and the insulating layer 103c are preferably dense films that can prevent diffusion of impurities from below them. It is preferable that the insulating layer 103a be a film capable of blocking impurities contained in the substrate 102 and that the insulating layer 103c be a film capable of blocking hydrogen and water contained in the insulating layer 103b. Thus, an insulating film that is formed at a lower deposition rate than the insulating layer 103b can be used as each of the insulating layer 103a and the insulating layer 103c.

Meanwhile, it is preferable that the insulating layer 103b be formed using an insulating film that has low stress and is formed at a high deposition rate. The insulating layer 103b is preferably formed thicker than each of the insulating layer 103a and the insulating layer 103c.

For example, even in the case where silicon nitride films formed by a plasma CVD method are used as the insulating layer 103a, the insulating layer 103b, and the insulating layer 103c, the film density of the insulating layer 103b is smaller than that of the other two insulating films. Thus, in a transmission electron microscope image of a cross section of the insulating layer 103, difference in contrast can be observed in some cases. Note that the boundary between the insulating layer 103a and the insulating layer 103b and the boundary between the insulating layer 103b and the insulating layer 103c are sometimes unclear and thus are clearly shown by dashed lines in FIG. 1 and the like.

As the insulating layer 103d in contact with the semiconductor layer 108, it is preferable to use a dense insulating film in which impurities such as water are less likely to be adsorbed on the surface. In addition, it is preferable to use an insulating film which includes as few defects as possible and in which impurities such as water and hydrogen are reduced. For example, an insulating film similar to the insulating layer 110c included in the insulating layer 110 can be used as the insulating layer 103d.

With the insulating layer 103 having such a stacked-layer structure, the transistor can have extremely high reliability.

Figure 3A:
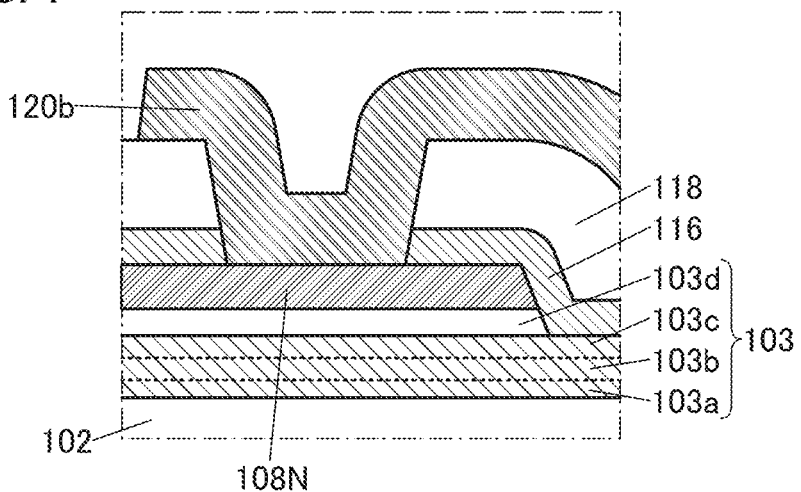
FIG. 3A, FIG. 3B, and FIG. 3C are cross-sectional views of a semiconductor device.

As illustrated in FIG. 1B and FIG. 1C, the transistor 100 preferably includes a region where the insulating layer 103c is in contact with the insulating layer 116. FIG. 3A is an enlarged view of a region Q surrounded by a dashed-dotted line in FIG. 1B, and FIG. 3B is an enlarged view of a region R surrounded by a dashed-dotted line in FIG. 1C.

As illustrated in FIG. 1B and FIG. 3A, in the channel length direction, the insulating layer 116 in a region that does not overlap the semiconductor layer 108 is provided in contact with the insulating layer 103c. Moreover, an end portion of the insulating layer 103d is substantially aligned with an end portion of the semiconductor layer 108.

Figure 3B:
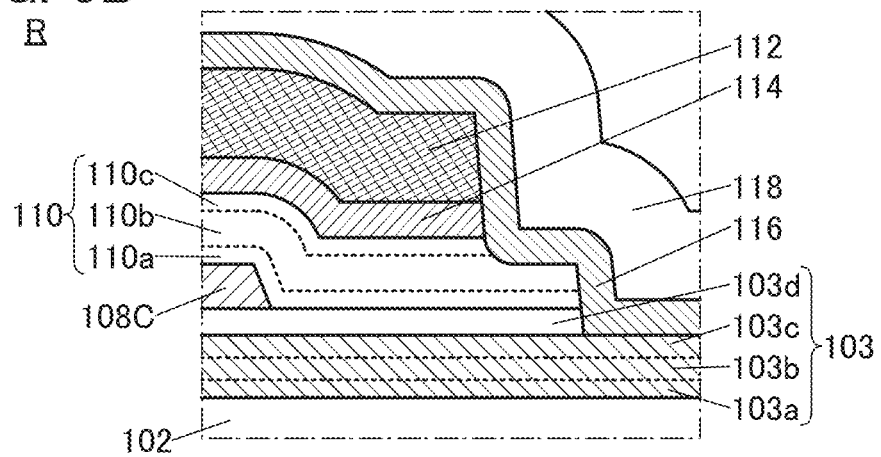

As illustrated in FIG. 3B, in the channel width direction, the insulating layer 116 in a region that does not overlap the insulating layer 110 is provided in contact with the insulating layer 103c. The end portion of the insulating layer 103d is substantially aligned with an end portion of the insulating layer 110. For example, an insulating film to be the insulating layer 103d in the region that is not overlapped by the insulating layer 110 is also removed at the time of forming the insulating layer 110, whereby the end portion of the insulating layer 103d and the end portion of the insulating layer 110 can be substantially aligned with each other.

With the region where the insulating layer 103c and the insulating layer 116 are in contact with each other, diffusion of impurities from the outside of the transistor 100 into the transistor 100 can be suppressed. In particular, an insulating film containing nitrogen can be favorably used as each of the insulating layer 116 and the insulating layer 103c.

Figure 3C:
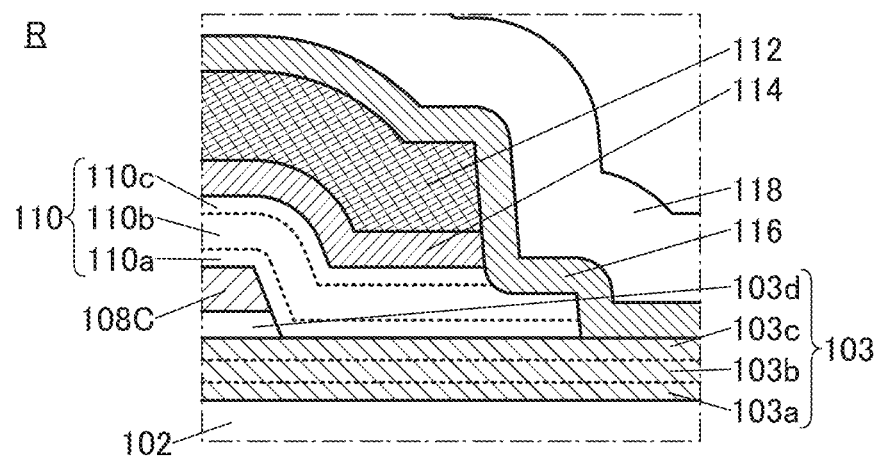

As illustrated in FIG. 3C, the end portion of the insulating layer 103d may be substantially aligned with the end portion of the semiconductor layer 108. For example, when an insulating film to be the insulating layer 103d in the region that is not overlapped by the semiconductor layer 108 is also removed at the time of forming the semiconductor layer 108, the end portion of the insulating layer 103d and the end portion of the semiconductor layer 108 can be substantially aligned with each other.

Figure 4A:
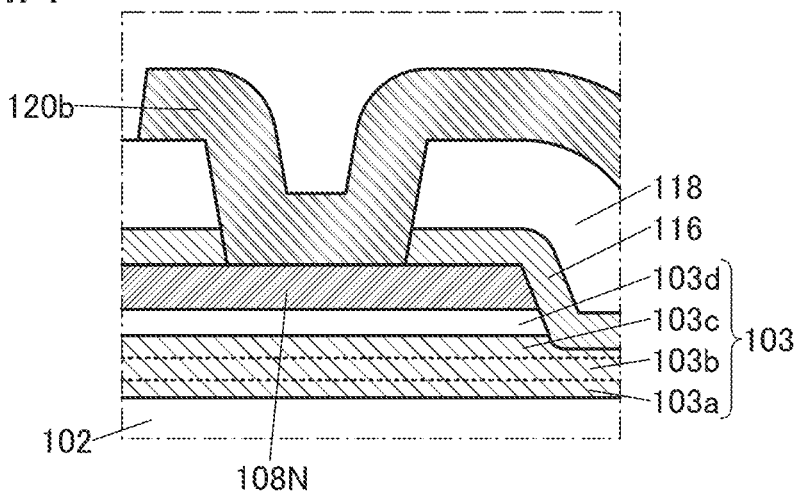
FIG. 4A, FIG. 4B, and FIG. 4C are cross-sectional views of a semiconductor device.

In the channel length direction, the thickness of the insulating layer 103c in the region that is not overlapped by the semiconductor layer 108 is sometimes smaller than the thickness of the insulating layer 103c in a region overlapped by the semiconductor layer 108. FIG. 4A is an enlarged view of the region Q surrounded by the dashed-dotted line in FIG. 1B. FIG. 4A illustrates an example in which the insulating layer 103c in the region that is not overlapped by the semiconductor layer 108 is smaller than the thickness of the insulating layer 103c in the region overlapped by the semiconductor layer 108, and the insulating layer 103c and the insulating layer 116 are in contact with each other in the region where the insulating layer 103c has a smaller thickness.

Figure 4B:
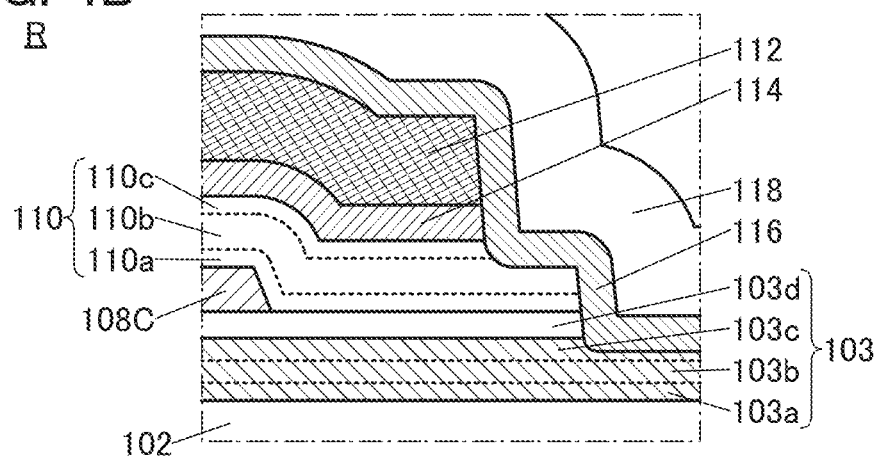
Figure 4C:
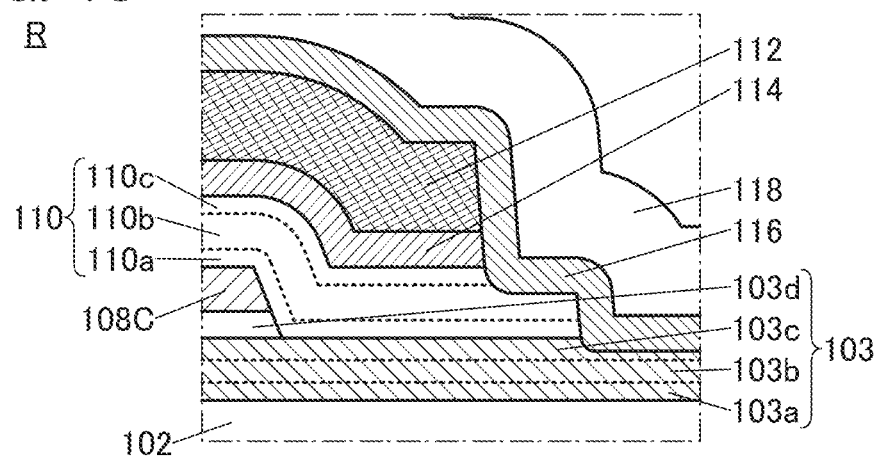

In the channel width direction, the thickness of the insulating layer 103c in the region that is not overlapped by the insulating layer 110 is sometimes smaller than the thickness of the insulating layer 103c in a region overlapped by the insulating layer 110. FIG. 4B and FIG. 4C are enlarged views of the region R surrounded by the dashed-dotted line in FIG. 1C. FIG. 4B and FIG. 4C illustrate examples in which the insulating layer 103c in the region that is not overlapped by the insulating layer 110 is smaller than the thickness of the insulating layer 103c in the region overlapped by the insulating layer 110, and the insulating layer 103c and the insulating layer 116 are in contact with each other in the region where the insulating layer 103c has a smaller thickness. In FIG. 4B, the end portion of the insulating layer 103d is substantially aligned with the end portion of the insulating layer 110. In FIG. 4C, the end portion of the insulating layer 103d is substantially aligned with the end portion of the semiconductor layer 108.

Although FIG. 4A, FIG. 4B, and FIG. 4C each illustrate the example in which the insulating layer 103c and the insulating layer 116 are in contact with each other, one embodiment of the present invention is not limited thereto. It is possible to employ a structure in which the insulating layer 103b is exposed, and the insulating layer 103b and the insulating layer 116 are in contact with each other. It is also possible to employ a structure in which the insulating layer 103a is exposed, and the insulating layer 103a and the insulating layer 116 are in contact with each other.

The end portion of the insulating layer 110 and an end portion of the metal oxide layer 114 are preferably tapered. Such a structure can improve the coverage with the layer formed over the insulating layer 110 and the metal oxide layer 114 (e.g., the insulating layer 116) and inhibit occurrence of a defect, such as breakage or a void, in the layer.

Part of the conductive layer 112 functions as a gate electrode. Part of the insulating layer 110 functions as a gate insulating layer. The transistor 100 is what is called a top-gate transistor, in which the gate electrode is provided over the semiconductor layer 108.

As illustrated in FIG. 1A and FIG. 1B, the transistor 100 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to the regions 108N through an opening portion 141a and an opening portion 141b, respectively, which are provided in the insulating layer 118 and the insulating layer 116.

The semiconductor layer 108 preferably contains a metal oxide.

For example, the semiconductor layer 108 preferably contains indium, an element M (the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc. In particular, the element M is preferably one or more kinds selected from aluminum, gallium, yttrium, and tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

A low-resistance material is preferably used for the conductive layer 112. The use of a low-resistance material for the conductive layer 112 can reduce parasitic resistance and enables the transistor to have a high on-state current, leading to a semiconductor device having a high on-state current. In addition, reducing the wiring resistance in a large display device and a high-resolution display device inhibits signal delay and enables high-speed operation. For the conductive layer 112, copper, silver, gold, aluminum, or the like can be used. Copper is particularly preferable because of its low resistance and high mass productivity.

The conductive layer 112 may have a stacked-layer structure. In the case where the conductive layer 112 has a stacked-layer structure, a second conductive layer is provided over or under, or both over and under a first conductive layer having low resistance. For the second conductive layer, a conductive material that is less likely to be oxidized (that has higher oxidation resistance) than the first conductive layer is preferably used. For the second conductive layer, a material that inhibits diffusion of a component of the first conductive layer is preferably used. For the second conductive layer, for example, a metal oxide such as indium oxide, indium zinc oxide, indium tin oxide (ITO), indium tin oxide containing silicon (ITSO), or zinc oxide, or a metal nitride such as titanium nitride, tantalum nitride, molybdenum nitride, or tungsten nitride can be suitably used.

The metal oxide layer 114 positioned between the insulating layer 110 and the conductive layer 112 functions as a barrier film that prevents diffusion of oxygen contained in the insulating layer 110 to the conductive layer 112 side. The metal oxide layer 114 also functions as a barrier film that prevents diffusion of hydrogen and water contained in the conductive layer 112 to the insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 into the semiconductor layer 108 through the insulating layer 110 can be prevented. Consequently, the carrier concentration in the channel formation region of the semiconductor layer 108 can be extremely low.

For the metal oxide layer 114, an insulating material or a conductive material can be used. When having an insulating property, the metal oxide layer 114 functions as part of the gate insulating layer. Meanwhile, when having conductivity, the metal oxide layer 114 functions as part of the gate electrode.

The metal oxide layer 114 is preferably formed using an insulating material with a higher permittivity than that of silicon oxide. It is particularly preferable to use an aluminum oxide film, a hafnium oxide film, a hafnium aluminate film, or the like because driving voltage can be lowered.

A metal oxide can be used for the metal oxide layer 114. For example, an oxide containing indium, such as indium oxide, indium zinc oxide, indium tin oxide (ITO), or indium tin oxide containing silicon (ITSO), can be used. A conductive oxide containing indium is particularly preferable because of its high conductivity. Moreover, ITSO is not easily crystallized owing to the contained silicon, has high planarity, and thus is highly adhesive to a film formed over the ITSO. A metal oxide such as zinc oxide or zinc oxide containing gallium can be used for the metal oxide layer 114. The metal oxide layer 114 may have a structure in which any of these metal oxides are stacked.

For the metal oxide layer 114, an oxide material containing one or more element that are the same as those of the semiconductor layer 108 is preferably used. It is particularly preferable to use an oxide semiconductor material that can be used for the semiconductor layer 108. In that case, a metal oxide film formed using the same sputtering target as that for the semiconductor layer 108 is preferably used as the metal oxide layer 114 because an apparatus can be shared.

Alternatively, when a metal oxide material containing indium and gallium is used for both the semiconductor layer 108 and the metal oxide layer 114, a material in which the composition (content ratio) of gallium is higher than that in the semiconductor layer 108 is preferably used because an oxygen-blocking property can be further increased. Here, when the semiconductor layer 108 is formed using a material in which the composition of indium is higher than that in the metal oxide layer 114, the field-effect mobility of the transistor 100 can be increased.

The metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 and the semiconductor layer 108.

The semiconductor layer 108 includes a channel formation region overlapped by the conductive layer 112 with the insulating layer 110 therebetween. The semiconductor layer 108 also includes a pair of regions 108N between which the channel formation region is sandwiched. The region 108N is a region of the semiconductor layer 108 that is not overlapped by the conductive layer 112 or the insulating layer 110 and is in contact with the insulating layer 116.

The region 108N can also be regarded as a region having a lower resistance than the channel formation region, a region having a higher carrier concentration than the channel formation region, a region having a higher oxygen defect density than the channel formation region, a region having a higher impurity concentration than the channel formation region, or an n-type region.

The region 108N is a region containing an impurity element (a first element). Examples of the impurity element include hydrogen, boron, carbon, nitrogen, fluorine, phosphorus, sulfur, arsenic, aluminum, magnesium, and a rare gas. Note that typical examples of a rare gas include helium, neon, argon, krypton, and xenon. In particular, boron, phosphorus, magnesium, or aluminum is preferably contained. Furthermore, two or more of these elements may be contained.

Here, the region 108N preferably has a concentration gradient such that the impurity concentration is higher in a portion closer to the insulating layer 116. In that case, the total amount of the impurity element in the region 108N can be smaller than that in the case where the concentration is uniform throughout the entire region 108N; hence, the amount of the impurity that might be diffused into the channel formation region owing to the influence of heat applied during the manufacturing process or the like can be kept small. In addition, an upper portion of the region 108N has a lower resistance, and thus contact resistance with the conductive layer 120a (or the conductive layer 120b) can be more effectively reduced.

As described later, treatment for adding the impurity element to the region 108N can be performed using the insulating layer 110 as a mask. Thus, the region 108N can be formed in a self-aligned manner.

The region 108N preferably includes a region where the impurity concentration is higher than or equal to $1 \times 10^{19}$ atoms/cm$^3$ and lower than or equal to $1 \times 10^{23}$ atoms/cm$^3$, preferably higher than or equal to $5 \times 10^{19}$ atoms/cm$^3$ and lower than or equal to $5 \times 10^{22}$ atoms/cm$^3$, further preferably higher than or equal to $1 \times 10^{20}$ atoms/cm$^3$ and lower than or equal to $1 \times 10^{22}$ atoms/cm$^3$.

The concentrations of the impurity included in the region 108N can be analyzed by an analysis method such as secondary ion mass spectrometry (SIMS) or X-ray photoelectron spectroscopy (XPS), for example. In the case of using XPS analysis, it is possible to find out the concentration distribution in the depth direction by combination of XPS analysis and ion sputtering from a front surface side or a rear surface side.

The impurity element preferably exists in an oxidized state in the region 108N. For example, it is preferable to use an element that is easily oxidized, such as boron, phosphorus, magnesium, aluminum, or silicon, as the impurity element. Since such an element that is easily oxidized can exist stably in an oxidized state by being bonded to oxygen in the semiconductor layer 108, the element can be inhibited from being released even when a high temperature (e.g., higher than or equal to 400° C., higher than or equal to 600° C., or higher than or equal to 800° C.) is applied in a later step. Furthermore, the impurity element deprives oxygen in the semiconductor layer 108, and many oxygen vacancies (Vo) are generated in the region 108N. A defect (hereinafter referred to as VoH) generated by entry of hydrogen in the film into the oxygen vacancy (Vo) serves as a carrier supply source; thus, the region 108N is in an extremely low-resistance state.

Note that the resistance might increase if much oxygen is supplied from the outside or a film near the region 108N to the region 108N at the time of performing high-temperature treatment in a later step. For that reason, in the case where high-temperature treatment is performed, the treatment is preferably performed with the semiconductor layer 108 covered with the insulating layer 116 that has a high barrier property against oxygen.

The insulating layer 116 is provided in contact with the region 108N of the semiconductor layer 108.

The insulating layer 116 functions as a hydrogen supply source to the region 108N. For example, the insulating layer 116 is preferably a film from which hydrogen is released by heating. When such an insulating layer 116 is provided in contact with the region 108N and then heat treatment is performed after the formation of the insulating layer 116, hydrogen can be supplied to the region 108N, thereby lowing the resistance.

The insulating layer 116 is preferably a film deposited using a gas containing hydrogen as a deposition gas used for the deposition. In that case, hydrogen can be effectively supplied to the region 108N also at the time of the deposition of the insulating layer 116.

For the insulating layer 116, for example, an insulating film of silicon nitride, silicon nitride oxide, silicon oxynitride, aluminum nitride, or aluminum nitride oxide can be used.

The region 108N is in a state of containing many oxygen vacancies because the impurity element is added thereto as described above. Thus, supplying hydrogen from the insulating layer 116 in addition to hydrogen contained in the semiconductor layer 108 can further increase the carrier concentration.

The insulating layer 118 functions as a protective layer protecting the transistor 100. For example, an inorganic insulating material such as an oxide or a nitride can be used for the insulating layer 118. More specifically, for example, an inorganic insulating material such as silicon nitride, silicon nitride oxide, silicon oxynitride, aluminum oxide, aluminum oxynitride, aluminum nitride, hafnium oxide, or hafnium aluminate can be used. Alternatively, the insulating layer 118 can be used as a planarization layer. In that case, an organic resin material can be used for the insulating layer 118.

Note that although the case where a stacked-layer structure of the insulating layer 116 and the insulating layer 118 is employed as the protective layer is described here, the insulating layer 118 is not necessarily provided when not needed. Moreover, the insulating layer 118 may have a stacked-layer structure of two or more layers.

Here, the semiconductor layer 108 and oxygen vacancies that might be formed in the semiconductor layer 108 will be described.

Oxygen vacancies formed in the channel formation region of the semiconductor layer 108 affect the transistor characteristics and therefore cause a problem. For example, when an oxygen vacancy is formed in the semiconductor layer 108, hydrogen might enter the oxygen vacancy, which may serve as a carrier supply source. The carrier supply source generated in the channel formation region causes a change in the electrical characteristics, typically, a shift in the threshold voltage, of the transistor 100. Therefore, the number of oxygen vacancies in the channel formation region is preferably as small as possible.

In view of this, one embodiment of the present invention has a structure in which insulating films in the vicinity of the channel formation region of the semiconductor layer 108, specifically, the insulating layer 110 positioned above the channel formation region and the insulating layer 103 positioned below the channel formation region each include an oxide film. When oxygen is moved from the insulating layer 103 and the insulating layer 110 to the channel formation region by heat during the manufacturing process or the like, the number of oxygen vacancies in the channel formation region can be reduced.

The semiconductor layer 108 preferably includes a region where the atomic ratio of In to the element M is higher than 1. A higher percentage of In content results in higher field-effect mobility of the transistor.

Here, in the case of a metal oxide containing In, Ga, and Zn, bonding strength between In and oxygen is weaker than bonding strength between Ga and oxygen; thus, with a higher percentage of In content, oxygen vacancies are likely to be generated in the metal oxide film. There is a similar tendency when a metal element shown above as M is used instead of Ga. The existence of a large number of oxygen vacancies in the metal oxide film leads to a reduction in electrical characteristics and a reduction in reliability of the transistor.

However, in one embodiment of the present invention, an extremely large amount of oxygen can be supplied into the channel formation region of the semiconductor layer 108 containing a metal oxide; thus, a metal oxide material with a high percentage of In content can be used. Accordingly, it is possible to achieve a transistor with extremely high field-effect mobility, stable electrical characteristics, and high reliability.

For example, a metal oxide in which the atomic ratio of In to the element M is 1.5 or higher, 2 or higher, 3 or higher, 3.5 or higher, or 4 or higher can be suitably used.

In particular, the atomic ratio of In to M and Zn in the semiconductor layer 108 is preferably In:M:Zn=4:2:3 or in the neighborhood thereof. Alternatively, the atomic ratio of In to M and Zn is preferably In:M:Zn=5:1:6 or in the neighborhood thereof. Furthermore, as the composition of the semiconductor layer 108, the atomic proportions of In, the element M, and Zn in the semiconductor layer 108 may be approximately equal to each other. That is, a material in which the atomic ratio of In to the element M and Zn is In:M:Zn=1:1:1 or in the neighborhood thereof may be included.

For example, with the use of the transistor with high field-effect mobility in a gate driver that generates a gate signal, a display device with a small frame width (also referred to as a narrow frame) can be provided. Furthermore, with the use of the transistor with high field-effect mobility in a source driver (particularly a demultiplexer connected to an output terminal of a shift register included in the source driver), a display device to which a small number of wirings are connected can be provided.

Note that even when the semiconductor layer 108 includes the region where the atomic ratio of In to the element M is higher than 1, the field-effect mobility might be low if the semiconductor layer 108 has high crystallinity. The crystallinity of the semiconductor layer 108 can be analyzed using X-ray diffraction (XRD) or a transmission electron microscope (TEM), for example.

Here, by reducing the impurity concentration and reducing the density of defect states (reducing oxygen vacancies) in the channel formation region of the semiconductor layer 108, the carrier concentration in the film can be reduced. A transistor using such a metal oxide film for the channel formation region of the semiconductor layer rarely has electrical characteristics with a negative threshold voltage (also referred to as normally-on). Furthermore, a transistor using such a metal oxide film can have characteristics of an extremely low off-state current.

When a metal oxide film with high crystallinity is used for the semiconductor layer 108, damage in the processing of the semiconductor layer 108 or in the deposition of the insulating layer 110 can be inhibited, so that a highly reliable transistor can be achieved. In contrast, when a metal oxide film with relatively low crystallinity is used for the semiconductor layer 108, the electric conductivity is improved, so that a transistor with high field-effect mobility can be achieved.

As the semiconductor layer 108, a metal oxide film having a CAAC (c-axis aligned crystal) structure described later, a metal oxide film having an nc (nano crystal) structure, or a metal oxide film in which a CAAC structure and an nc structure are mixed is preferably used.

The semiconductor layer 108 may have a stacked-layer structure of two or more layers.

For example, the semiconductor layer 108 in which two or more metal oxide films with different compositions are stacked can be used. For example, in the case of using an In-M-Zn oxide, it is preferable to use a stack of two or more films each formed using a sputtering target in which the atomic ratio of In to the element M and Zn is In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

The semiconductor layer 108 in which two or more metal oxide films with different crystallinities are stacked can be used. In that case, the metal oxide films are preferably successively formed without exposure to the air using the same oxide target under different deposition conditions.

In this case, the semiconductor layer 108 can have a stacked-layer structure of a metal oxide film having an nc structure and a metal oxide film having a CAAC structure. Alternatively, a stacked-layer structure of a metal oxide film having an nc structure and a metal oxide film having an nc structure may be employed. Note that the description of a CAC (Cloud-Aligned Composite) given below can be referred to for a function or a material composition of a metal oxide that can be suitably used for the metal oxide films.

For example, the oxygen flow rate ratio at the time of forming an earlier-formed first metal oxide film is set smaller than that at the time of forming a subsequently formed second metal oxide film. Alternatively, a condition without oxygen flowing is employed at the time of forming the first metal oxide film. In such a manner, oxygen can be effectively supplied at the time of forming the second metal oxide film. The first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or forming the insulating layer 110 can be inhibited.

Specifically, the oxygen flow rate ratio at the time of forming the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the conditions at the time of the film formation, such as pressure, temperature, and power, may vary between the first metal oxide film and the second metal oxide film, it is preferable to employ the same conditions other than the oxygen flow rate ratio, in which case the time required for the film formation steps can be shortened.

With such a structure, the transistor 100 with excellent electrical characteristics and high reliability can be achieved.

A structure example of a transistor whose structure is partly different from that of Structure example 1 is described below. Note that description of the same portions as those in Structure example 1 is omitted below in some cases. Furthermore, in drawings that are referred to later, the same hatching pattern is applied to portions having functions similar to those in the above structure example, and the portions are not denoted by reference numerals in some cases.

Structure Example 2

Figure 5A:
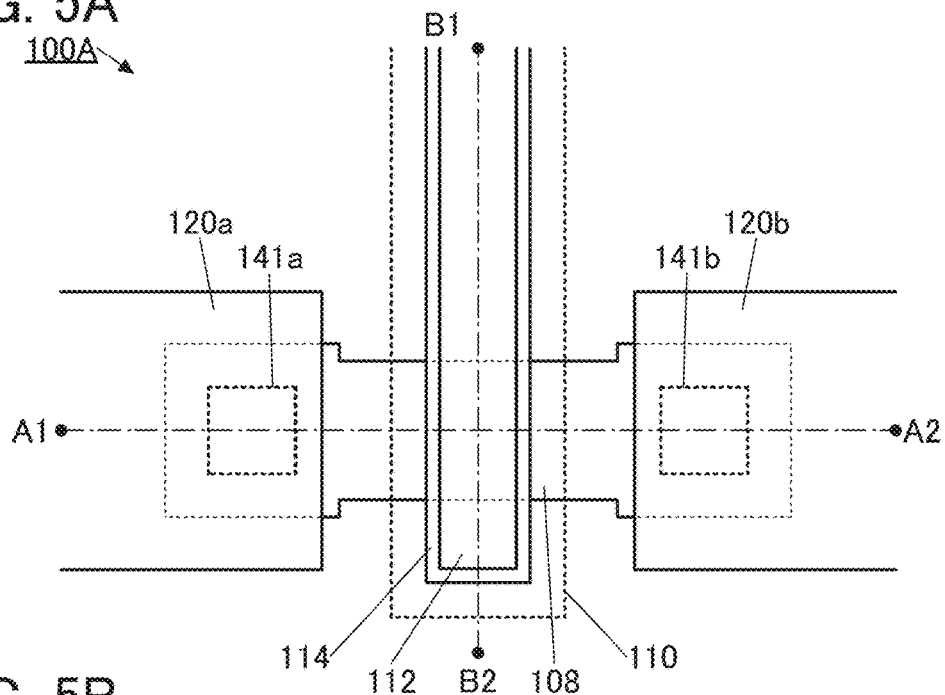
FIG. 5A is a top view of a semiconductor device.
Figure 5B:
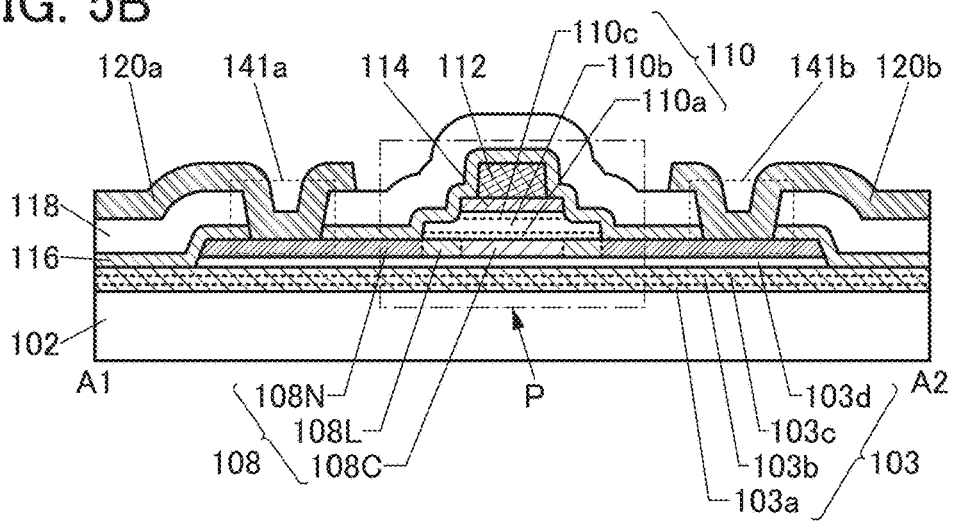
FIG. 5B and FIG. 5C are cross-sectional views of the semiconductor device.
Figure 5C:
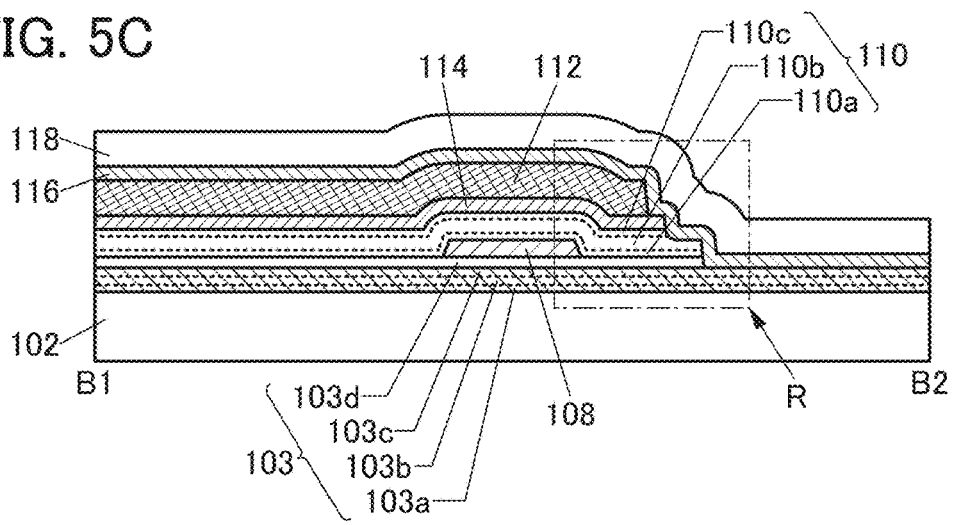
Figure 6A:
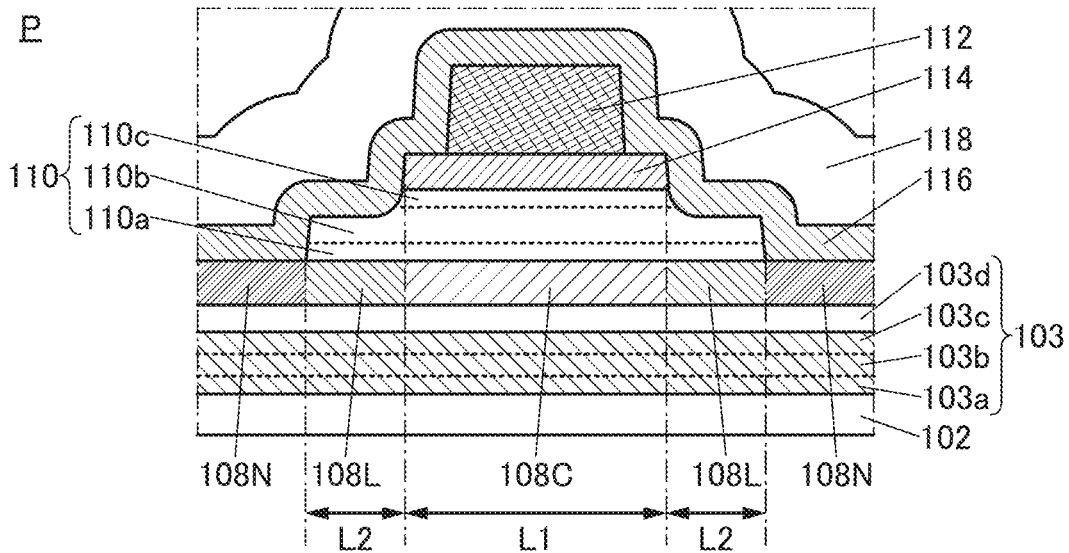
FIG. 6A and FIG. 6B are cross-sectional views of a semiconductor device.
Figure 6B:
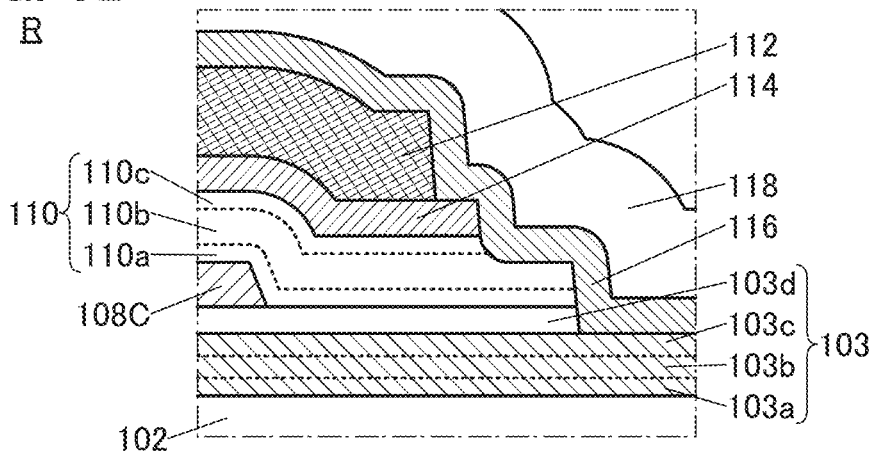

FIG. 5A is a top view of a transistor 100A, FIG. 5B is a cross-sectional view of the transistor 100A in the channel length direction, and FIG. 5C is a cross-sectional view of the transistor 100A in the channel width direction. An enlarged view of the region P surrounded by a dashed-dotted line in FIG. 5B is shown in FIG. 6A. An enlarged view of the region R surrounded by a dashed-dotted line in FIG. 5C is shown in FIG. 6B.

The transistor 100A is different from the transistor 100 mainly in that the end portion of the conductive layer 112 is positioned inward from the end portion of the metal oxide layer 114. Moreover, the insulating layer 116 is provided in contact with a top surface and a side surface of the metal oxide layer.

In the transistor 100A, the end portion of the conductive layer 112 is located inward from the end portion of the metal oxide layer 114. In other words, the metal oxide layer 114 includes a portion extending beyond the end portion of the conductive layer 112 over at least the insulating layer 110.

Since the end portion of the conductive layer 112 is located inward from the end portion of the metal oxide layer 114, steps formed by the side surfaces of the conductive layer 112 and the metal oxide layer 114 are gentler, which can improve step coverage with the layer formed over the conductive layer 112 and the metal oxide layer 114 (e.g., the insulating layer 116) and inhibit occurrence of a defect, such as breakage or a void, in the layer.

A wet etching method can be suitably used to form the conductive layer 112 and the metal oxide layer 114. When a material having a lower etching rate than the conductive layer 112 is used for the metal oxide layer 114, the end portion of the conductive layer 112 can be formed inward from the end portion of the metal oxide layer 114. In addition, the metal oxide layer 114 and the conductive layer 112 can be formed in the same step, which can increase the productivity.

The above is the description of Structure example 2.

Structure Example 3

Figure 7A:
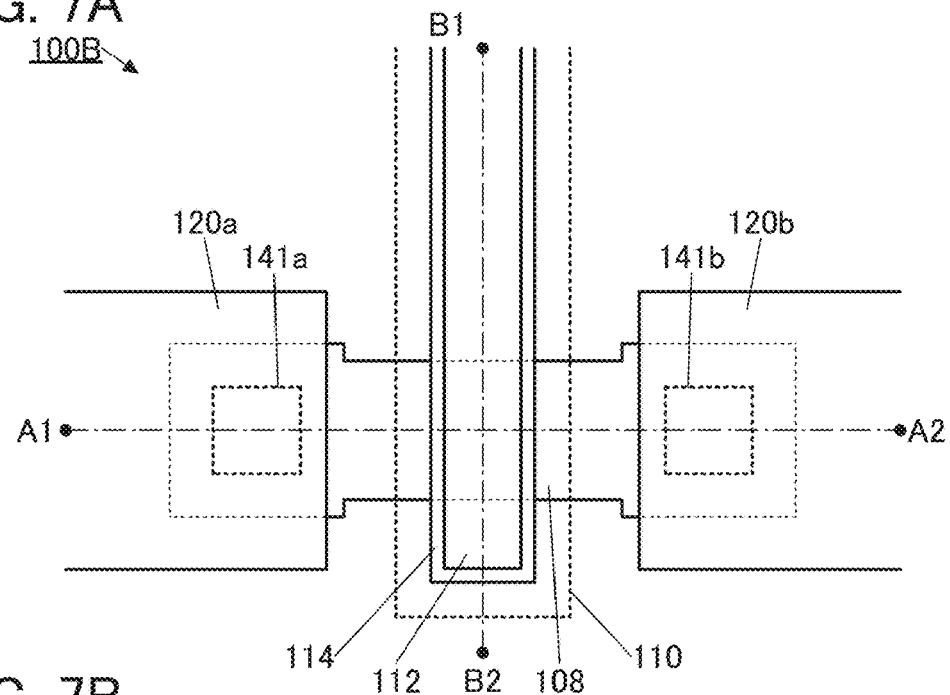
FIG. 7A is a top view of a semiconductor device.
Figure 7B:
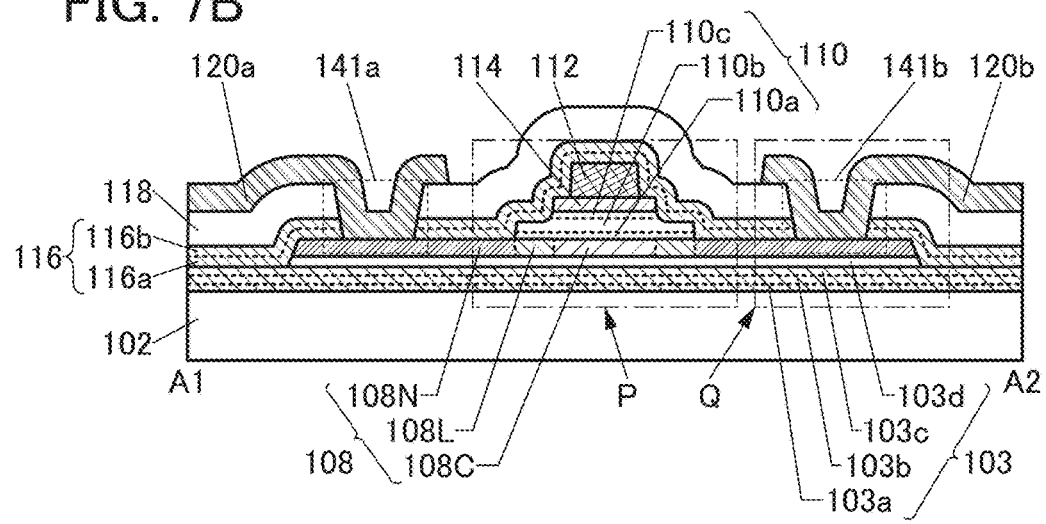
FIG. 7B and FIG. 7C are cross-sectional views of the semiconductor device.
Figure 7C:
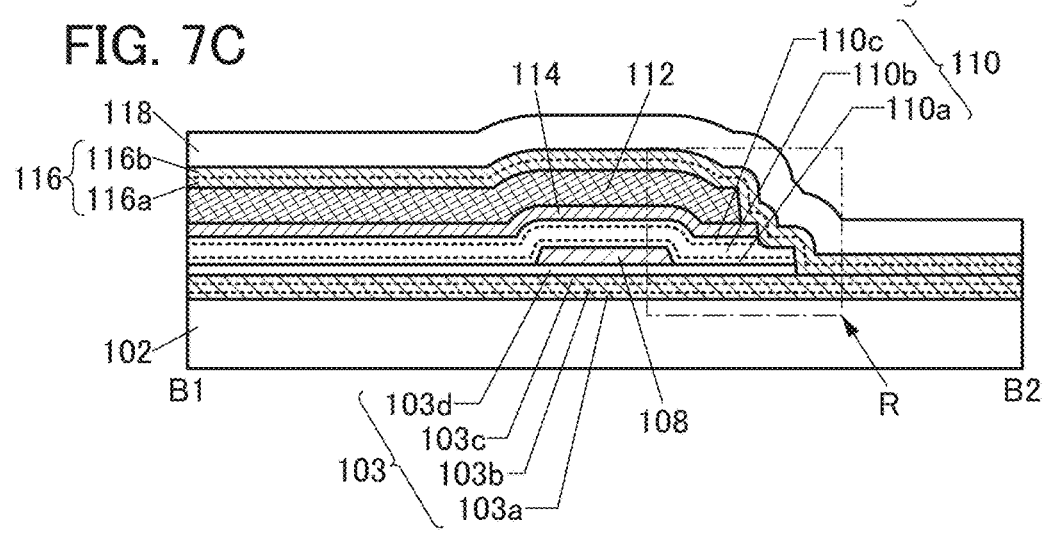
Figure 8A:
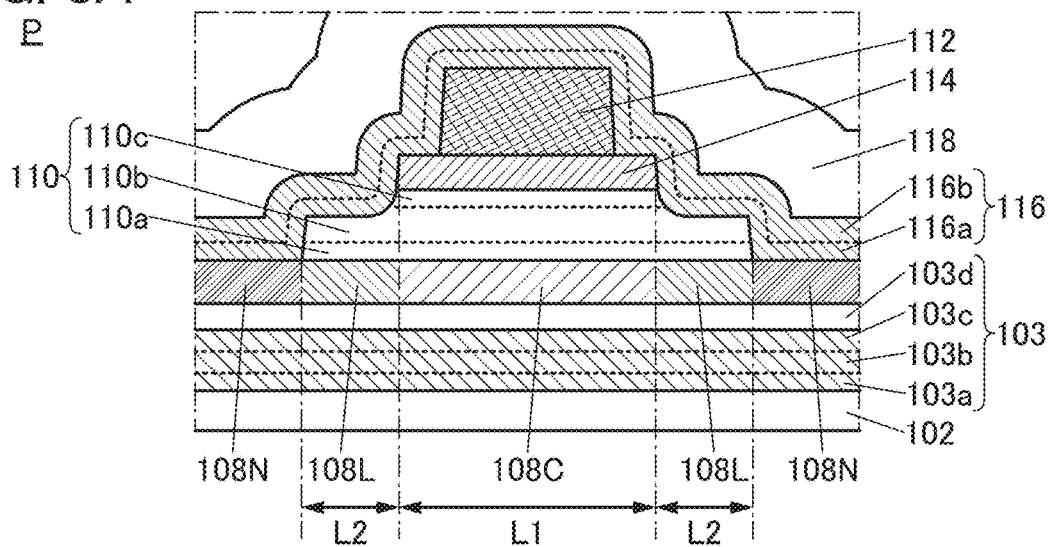
FIG. 8A, FIG. 8B, and FIG. 8C are cross-sectional views of a semiconductor device.
Figure 8B:
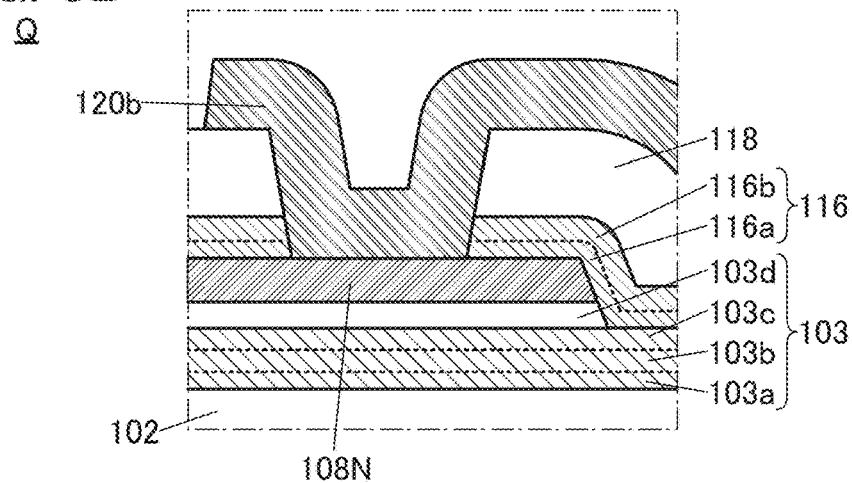
Figure 8C:
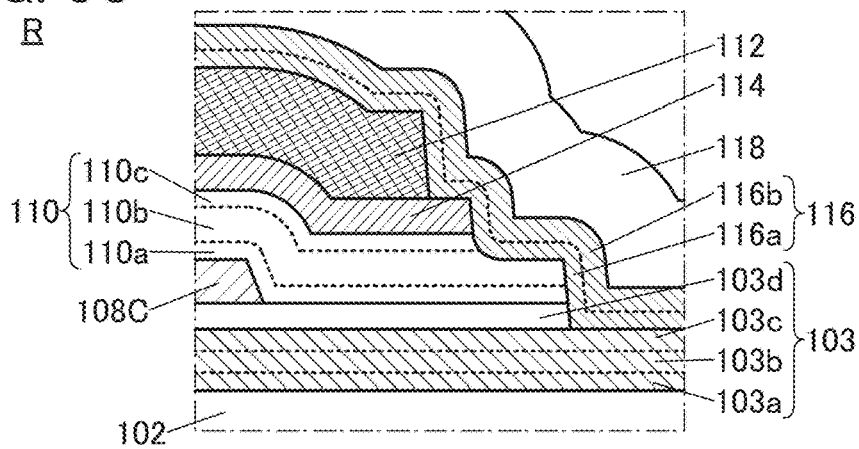

FIG. 7A is a top view of a transistor 100B, FIG. 7B is a cross-sectional view of the transistor 100B in the channel length direction, and FIG. 7C is a cross-sectional view of the transistor 100B in the channel width direction. An enlarged view of the region P surrounded by a dashed-dotted line in FIG. 7B is shown in FIG. 8A. An enlarged view of the region Q surrounded by a dashed-dotted line in FIG. 7B is shown in FIG. 8B. An enlarged view of the region R surrounded by a dashed-dotted line in FIG. 7C is shown in FIG. 8C.

The transistor 100B is different from the transistor 100A mainly in that the insulating layer 116 has a stacked-layer structure. The insulating layer 116 can have a stacked-layer structure of two or more layers. In the case where the insulating layer 116 has a stacked-layer structure, a stacked-layer structure formed of different materials may be employed without limitation to a stacked-layer structure formed of the same material.

FIG. 7B, FIG. 7C, FIG. 8A, FIG. 8B, and FIG. 8C illustrate an example in which the insulating layer 116 has a two-layer structure of an insulating layer 116a and an insulating layer 116b over the insulating layer 116a. The insulating layer 116a and the insulating layer 116b can be formed using a material that can be used for the insulating layer 116. The insulating layer 116a and the insulating layer 116b may be formed using the same material or different materials. Note that insulating films formed of the same kind of material can be used for the insulating layer 116a and the insulating layer 116b; thus, the interface between the insulating layer 116a and the insulating layer 116b cannot be clearly observed in some cases. Therefore, in this embodiment, the interface between the insulating layer 116a and the insulating layer 116b is shown by a dashed line.

As illustrated in FIG. 8A and FIG. 8B, the insulating layer 116 is in contact with the region 108N and functions as a hydrogen supply source to the region 108N. For example, the insulating layer 116 is preferably a film from which hydrogen is released by application of heat.

The insulating layer 116 can be formed in a hydrogen-containing atmosphere. For example, the insulating layer 116 is preferably formed by a plasma CVD method using a deposition gas containing hydrogen. For example, as the insulating layer 116, a silicon nitride film can be formed using a deposition gas containing a silane gas and an ammonia gas. Using the ammonia gas in addition to the silane gas enables the insulating layer 116 to contain a large amount of hydrogen. Furthermore, hydrogen can be supplied to the exposed portion of the semiconductor layer 108 at the time of forming the insulating layer 116.

However, in the case where the insulating layer 116 is formed in a hydrogen-containing atmosphere, the exposed region of the semiconductor layer 108 is sometimes reduced at the time of forming the insulating layer 116. If the surface of the semiconductor layer 108 is reduced, surface roughness of the semiconductor layer 108 becomes large, which might cause a defect such as breakage or a void in a layer formed over the semiconductor layer 108 (e.g., the insulating layer 116).

In view of this, the amount of hydrogen contained in the atmosphere used to form the insulating layer 116a, which is positioned closer to the semiconductor layer 108, is preferably smaller than the amount of hydrogen contained in the atmosphere used to form the insulating layer 116b. For example, the insulating layer 116a and the insulating layer 116b can be formed using a mixed gas of silane, nitrogen, and ammonia, and the flow rate of ammonia used to form the insulating layer 116a can be lower than the flow rate of ammonia used to form the insulating layer 116b. Alternatively, the insulating layer 116a can be formed using a mixed gas of silane and nitrogen, and the insulating layer 116b can be formed using a mixed gas of silane, nitrogen, and ammonia. Furthermore, the insulating layer 116a preferably includes a region having a lower hydrogen concentration than the insulating layer 116b. With such a structure, the reduction of the surface of the semiconductor layer 108 can be suppressed.

For example, even when a silicon nitride film formed by a plasma CVD method is used as the insulating layer 116a and the insulating layer 116b, a difference in film density sometimes allows their boundary to be observed as a difference in contrast in a cross-sectional transmission electron microscope (TEM) image of the insulating layer 110. For example, the insulating layer 116a may include a region having a higher film density than the insulating layer 116b. In the TEM observation, the transmission electron (TE) image is dark-colored (dark) when the film density is high, and the transmission electron (TE) image is pale (bright) when the film density is low. Therefore, in the transmission electron (TE) image, the insulating layer 116a is sometimes shown as a dark-colored (dark) image compared to the insulating layer 116b. Furthermore, the insulating layer 116a may include a region where the hydrogen concentration in the film is lower than that of the insulating layer 116b. The difference in hydrogen concentration between the insulating layer 116a and the insulating layer 116b can be examined by secondary ion mass spectrometry (SIMS), for example.

The insulating layer 116b is preferably formed using a material having a blocking property against hydrogen, water, and oxygen. Moreover, the insulating layer 116b preferably has a higher blocking property against hydrogen, water, and oxygen than the insulating layer 116a. When the insulating layer 116b provided over the insulating layer 116a has a blocking property against hydrogen, water, and oxygen, diffusion of hydrogen and water from the outside into the semiconductor layer 108 and release of oxygen from the semiconductor layer 108 to the outside can be inhibited, leading to a highly reliable transistor.

The insulating layer 116 in contact with the semiconductor layer 108 preferably has a small number of defects in the film. For example, when silicon nitride is used for the insulating layer 116, typical examples of defects in the silicon nitride film include the K-center. The K-center is attributed to a dangling bond of silicon and can be evaluated by electron spin resonance (ESR).

When the amount of hydrogen contained in the atmosphere used to form the insulating layer 116a is made smaller than the amount of hydrogen contained in the atmosphere used to form the insulating layer 116b, the number of defects in the insulating layer 116a may be larger than that in the insulating layer 116b. Thus, when the insulating layer 116 employs a single-layer structure of only the insulating layer 116a, the number of defects in the film as the whole insulating layer 116 would be large. Consequently, the insulating layer 116 employing the stacked-layer structure of the insulating layer 116a and the insulating layer 116b enables the number of defects in the film as the whole insulating layer 116 to be reduced.

The thickness of the insulating layer 116b is preferably 0.5 times to 30 times, further preferably 1 time to 25 times, still further preferably 2 times to 20 times, yet further preferably 3 times to 10 times, yet still further preferably 4 times to 5 times the thickness of the insulating layer 116a. When the insulating layer 116 has the stacked-layer structure, the insulating layer 116 has a blocking property against hydrogen, water, and oxygen, the reduction of the surface of the semiconductor layer 108 is suppressed at the time of forming the insulating layer 116, and the amount of defects included in the insulating layer 116 can be reduced.

The insulating layer 116a and the insulating layer 116b are preferably formed successively without exposure to the air with a plasma CVD apparatus. The successive formation can suppress attachment of impurities to the interface between the insulating layer 116a and the insulating layer 116b. It is further preferable that the insulating layer 116a, the insulating layer 116b, and the insulating layer 118 be successively formed without exposure to the air with a plasma CVD apparatus. The successive formation can suppress attachment of impurities to the interface between the insulating layer 116a and the insulating layer 116b and the interface between the insulating layer 116b and the insulating layer 118.

The above is the description of Structure example 3.

Structure Example 4

Figure 9A:
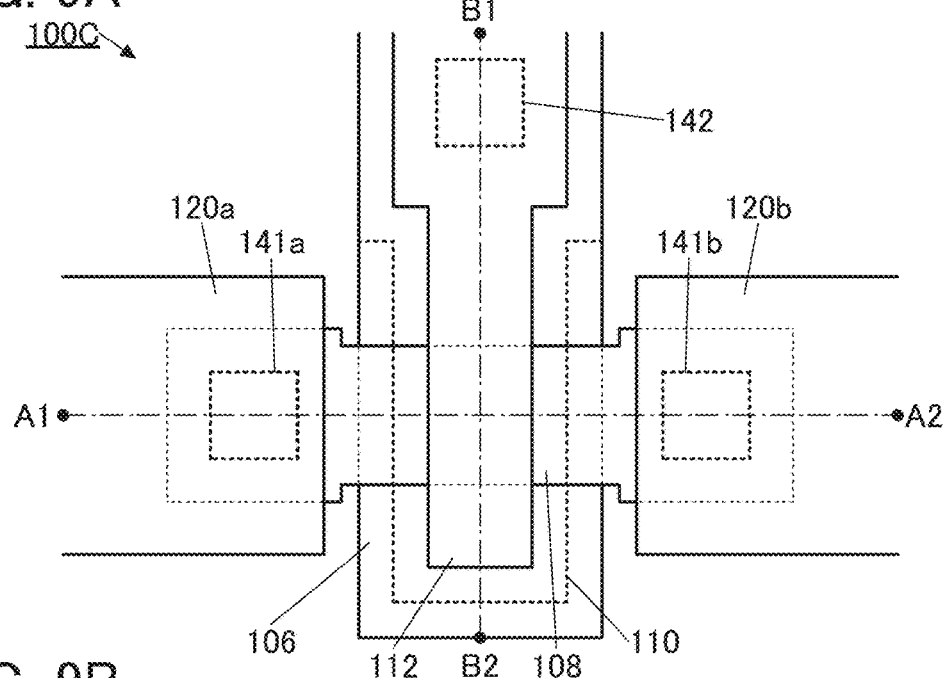
FIG. 9A is a top view of a semiconductor device.
Figure 9B:
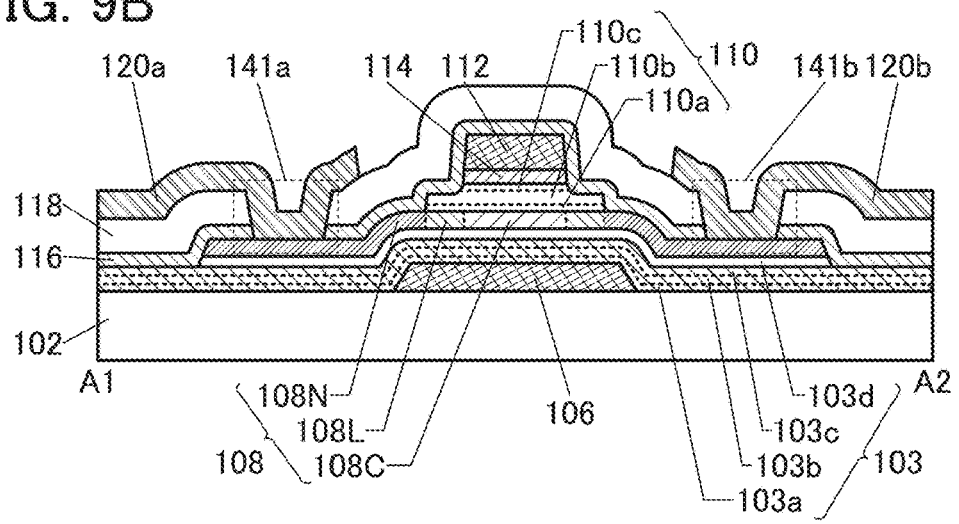
FIG. 9B and FIG. 9C are cross-sectional views of the semiconductor device.
Figure 9C:
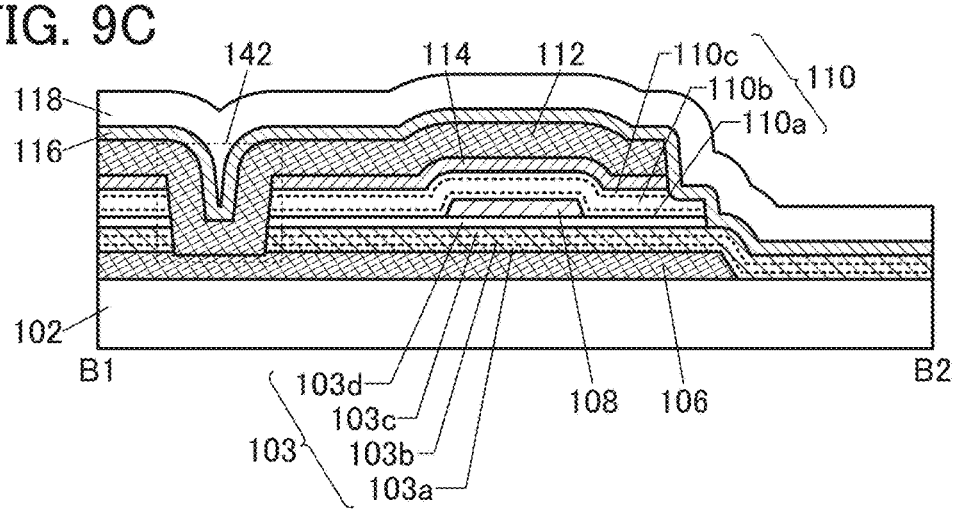

FIG. 9A is a top view of a transistor 100C, FIG. 9B is a cross-sectional view of the transistor 100C in the channel length direction, and FIG. 9C is a cross-sectional view of the transistor 100C in the channel width direction.

The transistor 100C is different from the transistor 100 mainly in including a conductive layer 106 between the substrate 102 and the insulating layer 103. The conductive layer 106 includes a region overlapped by the channel formation region of the semiconductor layer 108, the metal oxide layer 114, and the conductive layer 112.

In the transistor 100C, the conductive layer 106 has a function of a first gate electrode (also referred to as a bottom gate electrode), and the conductive layer 112 has a function of a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps at least one of the conductive layer 112 and the conductive layer 106 functions as a channel formation region. Note that for easy explanation, a portion of the semiconductor layer 108 that is overlapped by the conductive layer 112 is sometimes referred to as a channel formation region in the following description; however, a channel can also be actually formed in a portion that is not overlapped by the conductive layer 112 and overlaps the conductive layer 106 (a portion including the regions 108N).

As illustrated in FIG. 9A and FIG. 9C, the conductive layer 106 may be electrically connected to the conductive layer 112 through an opening portion 142 provided in the metal oxide layer 114, the insulating layer 110, and the insulating layer 103. In that case, the same potential can be applied to the conductive layer 106 and the conductive layer 112.

For the conductive layer 106, a material similar to that for the conductive layer 112, the conductive layer 120a, or the conductive layer 120b can be used. Specifically, a material containing copper is preferably used for the conductive layer 106, in which case wiring resistance can be reduced. When a material including a high-melting-point metal such as tungsten or molybdenum is used for the conductive layer 106, treatment in a later step can be performed at high temperatures.

As illustrated in FIG. 9A and FIG. 9C, the conductive layer 112 and the conductive layer 106 preferably extend beyond an end portion of the semiconductor layer 108 in the channel width direction. In that case, as illustrated in FIG. 9C, the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by the pair of gate electrodes. At this time, it is particularly preferable that the same potential be applied to the conductive layer 106 and the conductive layer 112. Accordingly, the electric field for inducing a channel can be effectively applied to the semiconductor layer 108, so that the on-state current of the transistor 100C can be increased. Thus, the transistor 100C can be reduced in size.

Note that a structure in which the conductive layer 112 and the conductive layer 106 are not connected to each other may be employed. In that case, a constant potential may be supplied to one of the pair of gate electrodes, and a signal for driving the transistor 100C may be supplied to the other. In this case, the potential supplied to one of the electrodes can control the threshold voltage at the time of driving the transistor 100C with the other electrode.

The insulating layer 103 may have a stacked-layer structure. FIG. 9B and FIG. 9C illustrate an example where the insulating layer 103 has a structure in which the insulating layer 103a, the insulating layer 103b, the insulating layer 103c, and the insulating layer 103d are stacked in this order from the conductive layer 106 side. The insulating layer 103a is in contact with the conductive layer 106. The insulating layer 103a is preferably a film capable of blocking the metal element contained in the conductive layer 106. The above description can be referred to for the insulating layer 103a, the insulating layer 103b, the insulating layer 103c, and the insulating layer 103d; hence, detailed description thereof is omitted.

In the case where a film of a metal or an alloy that is less likely to be diffused into the insulating layer 103 is used as the conductive layer 106, for example, the insulating layer 103 may employ a structure in which three insulating films of the insulating layer 103b, the insulating layer 103c, and the insulating layer 103d are stacked without providing the insulating layer 103a.

With the insulating layer 103 having such a stacked-layer structure, the transistor can have extremely high reliability.

The above is the description of Structure example 4.

Manufacturing Method Example 1

A method for manufacturing the semiconductor device of one embodiment of the present invention is described below with reference to drawings. Here, the method is described using the transistor 100C, exemplified in the above structure example, as an example.

Note that thin films that constitute the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. As an example of the thermal CVD method, a metal organic chemical vapor deposition (MOCVD: Metal Organic CVD) method can be given.

The thin films that constitute the semiconductor device (insulating films, semiconductor films, conductive films, and the like) can be formed by a method such as spin coating, dipping, spray coating, ink jetting, dispensing, screen printing, offset printing, a doctor knife, slit coating, roll coating, curtain coating, or knife coating.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are two typical photolithography methods. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light or X-rays may be used. Instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

Each drawing in FIG. 10 to FIG. 14 illustrates a cross section at a stage in the manufacturing process of the transistor 100C. In each drawing, a cross section in the channel length direction is shown on the left side of the center dashed line, and a cross section in the channel width direction is shown on the right side.

[Formation of Conductive Layer 106]

Figure 10A:
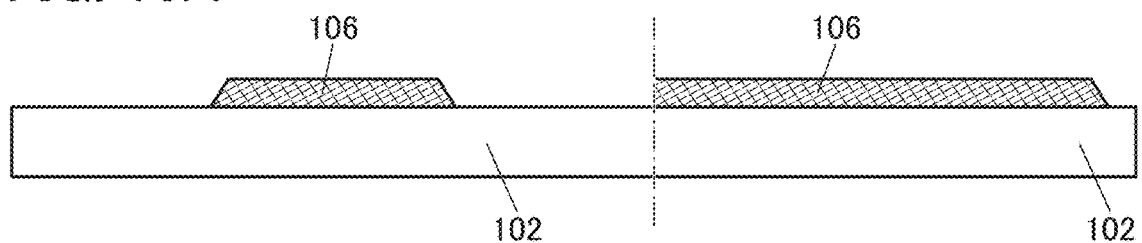
FIG. 10A, FIG. 10B, FIG. 10C, and FIG. 10D are cross-sectional views illustrating a method for manufacturing a semiconductor device.

A conductive film is deposited over the substrate 102 and processed by etching to form the conductive layer 106 functioning as a first gate electrode (FIG. 10A).

[Formation of Insulating Layer 103]

Figure 10B:
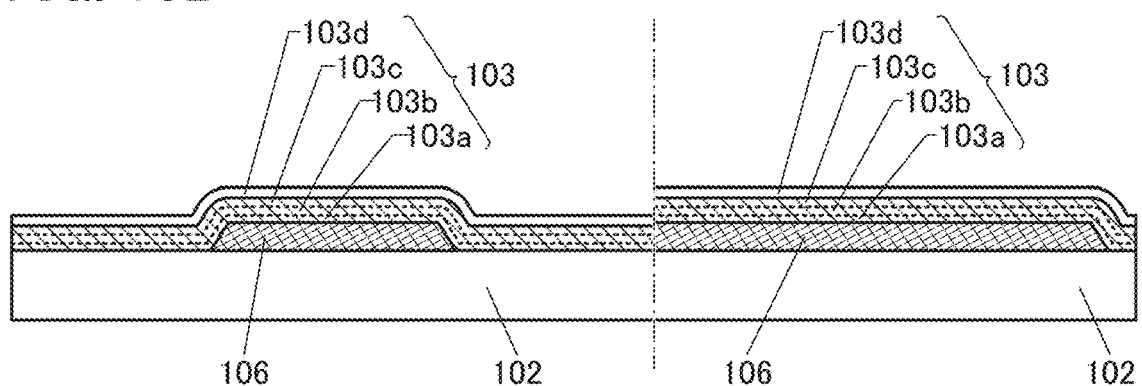

Then, the insulating layer 103 is formed to cover the substrate 102 and the conductive layer 106 (FIG. 10B). The insulating layer 103 can be formed by a PECVD method, an ALD method, a sputtering method, or the like.

Here, the insulating layer 103 is formed by stacking the insulating layer 103a, the insulating layer 103b, the insulating layer 103c, and the insulating layer 103d. In particular, each of the insulating layers included in the insulating layer 103 is preferably formed by a PECVD method.

The insulating layer 103a preferably has a function of blocking impurities. Providing the insulating layer 103a can inhibit diffusion of impurities from a layer below the insulating layer 103 into a layer above the insulating layer 103. The insulating layer 103b preferably has low stress and high withstand voltage. Providing the insulating layer 103b enables the insulating layer 103 to have low stress and high withstand voltage. It is preferable that the insulating layer 103c release a small amount of impurities including hydrogen and have a function of blocking impurities including hydrogen. Providing the insulating layer 103c can inhibit hydrogen diffusion into the channel formation region. It is preferable that the insulating layer 103d have a low defect density and release a small amount of impurities including hydrogen.

The description is made on the case where a silicon nitride film is used as the insulating layer 103a, the insulating layer 103b, and the insulating layer 103c and a silicon oxynitride film is used as the insulating layer 103d. The insulating layer 103a is formed by a plasma CVD method using a mixed gas of silane, nitrogen, and ammonia. Next, an insulating layer 103b having low stress and high withstand voltage is formed using a mixed gas with a higher ammonia flow rate than that for the insulating layer 103a. Then, the insulating layer 103c that releases a small amount of impurities including hydrogen and has a function of blocking impurities including hydrogen is deposited using a mixed gas with a lower ammonia flow rate than that for the insulating layer 103b. Subsequently, the insulating layer 103d that has a low defect density and releases a small amount of impurities including hydrogen is formed using a mixed gas of silane and dinitrogen monoxide, whereby the insulating layer 103 can be formed. Furthermore, switching the deposition conditions in the same chamber enables successive deposition of the insulating layer 103a, the insulating layer 103b, the insulating layer 103c, and the insulating layer 103d in vacuum, leading to formation of the insulating layer 103 with high productivity.

Alternatively, after the insulating layer 103c is deposited, plasma treatment is performed in an oxygen-containing atmosphere so that the surface of the insulating layer 103c is oxidized, whereby the insulating layer 103d can be formed over the insulating layer 103c.

The insulating layer 103b has a lower film density than the insulating layer 103a and the insulating layer 103c in some cases. The difference in film density between the insulating layer 103a, the insulating layer 103b, and the insulating layer 103c can be examined by the concentration (luminance) in a TEM image, for example. Furthermore, the insulating layer 103b sometimes has a higher hydrogen concentration in the film than the insulating layer 103a and the insulating layer 103c. The difference in hydrogen concentration between the insulating layer 103a, the insulating layer 103b, and the insulating layer 103c can be examined by secondary ion mass spectrometry (SIMS), for example.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method, an ion implantation method, or the like.

[Formation of Semiconductor Layer 108]

Figure 10C:
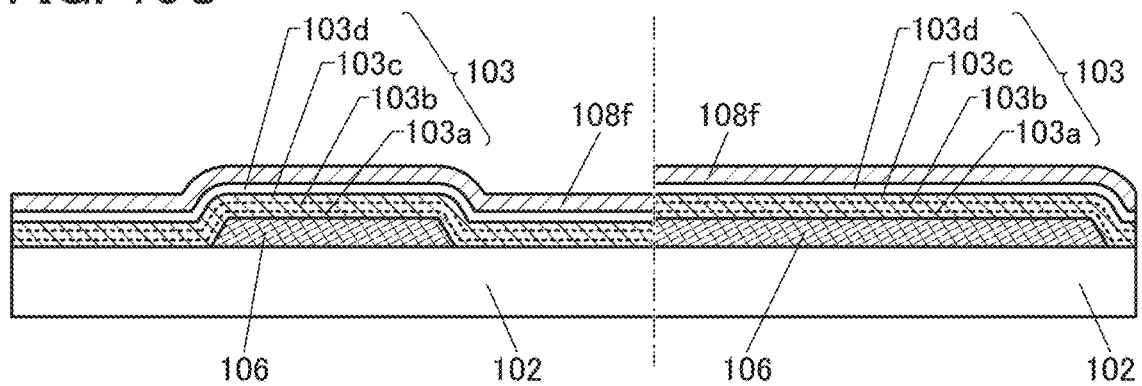

Next, a metal oxide film 108f to be the semiconductor layer 108 is deposited over the insulating layer 103 (FIG. 10C).

The metal oxide film 108f is preferably formed by a sputtering method using a metal oxide target.

In depositing the metal oxide film 108f, an inert gas (e.g., a helium gas, an argon gas, or a xenon gas) may be mixed in addition to an oxygen gas. Note that when the proportion of an oxygen gas in the whole deposition gas (hereinafter also referred to as oxygen flow rate ratio) at the time of depositing the metal oxide film is higher, the crystallinity of the metal oxide film can be higher and a transistor with higher reliability can be obtained. In contrast, when the oxygen flow rate ratio is lower, the crystallinity of the metal oxide film is lower and a transistor with a higher on-state current can be obtained.

In the case where the semiconductor layer 108 has a stacked-layer structure, successive deposition is preferably performed using the same sputtering target in the same deposition chamber because the interface can be favorable. Although the deposition conditions such as pressure, temperature, and power at the time of the deposition may vary between the metal oxide films, it is particularly preferable to employ the same conditions except for the oxygen flow rate ratio because the time required for deposition steps can be shortened. Furthermore, in the case where metal oxide films having different compositions are stacked, successive deposition without exposure to the air is preferably performed.

The deposition conditions are preferably set so that the metal oxide film 108f becomes a metal oxide film having a CAAC structure, a metal oxide film having an nc structure, or a metal oxide film in which a CAAC structure and an nc structure are mixed. Note that the deposition conditions in which the deposited metal oxide film has a CAAC structure and the deposition conditions in which the deposited metal oxide film has an nc structure are different depending on the compositions of the sputtering targets to be used; therefore, the substrate temperature, the oxygen flow rate ratio, the pressure, the power, and the like are set as appropriate in accordance with the compositions.

The metal oxide film 108f is deposited at a substrate temperature higher than or equal to room temperature and lower than or equal to 450° C., preferably higher than or equal to room temperature and lower than or equal to 300° C., further preferably higher than or equal to room temperature and lower than or equal to 200° C., still further preferably higher than or equal to room temperature and lower than or equal to 140° C. For example, in the case where a large-sized glass substrate or a resin substrate is used as the substrate 102, the deposition temperature is preferably higher than or equal to room temperature and lower than 140° C., in which case the productivity can be increased. Furthermore, when the metal oxide film is deposited with the substrate temperature set at room temperature or without heating, the crystallinity can be made low.

Before deposition of the metal oxide film 108f, it is preferable to perform treatment for desorbing water, hydrogen, a component of an organic substance, or the like adsorbed onto a surface of the insulating layer 103 or treatment for supplying oxygen into the insulating layer 103. For example, heat treatment can be performed at a temperature higher than or equal to 70° C. and lower than or equal to 200° C. in a reduced-pressure atmosphere. Alternatively, plasma treatment may be performed in an oxygen-containing atmosphere. When plasma treatment is performed using a dinitrogen monoxide gas, an organic substance on the surface of the insulating layer 103 can be favorably removed. After such treatment, the metal oxide film is preferably formed successively without exposure of the surface of the insulating layer 103 to the air.

Figure 10D:
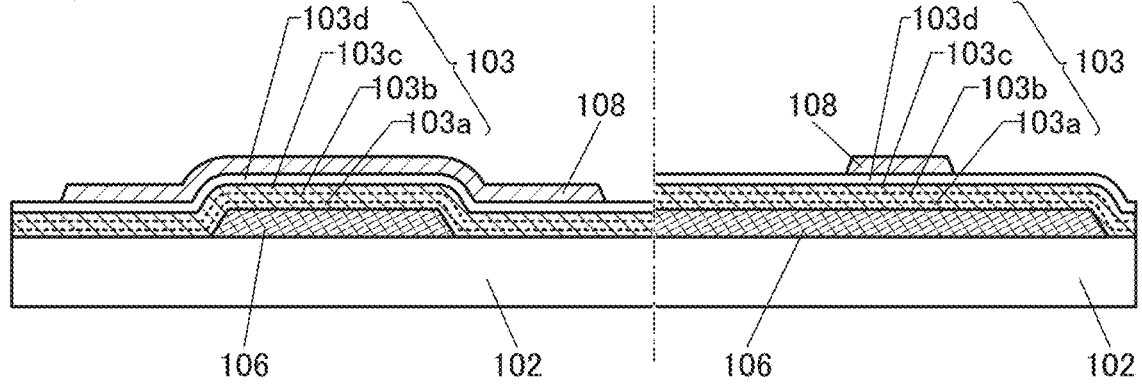

Next, the metal oxide film 108f is processed, so that the island-shaped semiconductor layer 108 is formed (FIG. 10D).

For processing of the metal oxide film, either one or both of a wet etching method and a dry etching method are used. At this time, part of the insulating layer 103d that is not overlapped by the semiconductor layer 108 may be etched and removed. Removing part of the insulating layer 103d makes the semiconductor layer 108 and the insulating layer 103d have substantially the same top surface shapes. Moreover, removing part of the insulating layer 103d makes part of the insulating layer 103c to be exposed, resulting in a structure where the insulating layer 116 to be formed later is in contact with the insulating layer 103c.

After the metal oxide film is deposited or processed into the semiconductor layer 108, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C. Note that heat treatment is not necessarily performed after the metal oxide film is deposited or processed into the semiconductor layer 108. The heat treatment may be performed at any stage as long as it is after the deposition of the metal oxide film. The heat treatment may also serve as heat treatment or a heat application step that is to be performed later.

The heat treatment can be performed in an atmosphere containing a rare gas or nitrogen. Alternatively, heating may be performed in the atmosphere, and then heating may be performed in an oxygen-containing atmosphere. As a nitrogen-containing atmosphere or an oxygen-containing atmosphere, clean dry air (CDA) may be used. It is preferable that the atmosphere of the above heat treatment not contain hydrogen, water, or the like. When a gas that is highly purified to have a dew point of −60° C. or lower, preferably −100° C. or lower is used, hydrogen, water, or the like can be prevented from being taken into the semiconductor layer 108 as much as possible. An electric furnace, a rapid thermal annealing (RTA) apparatus, or the like can be used for the heat treatment. The use of the RTA apparatus can shorten the heat treatment time.

Note that an insulating film 110f is preferably formed immediately after the formation of the semiconductor layer 108. In a state where the surface of the semiconductor layer 108 is exposed, water is adsorbed on the surface of the semiconductor layer 108 in some cases. When water is adsorbed on the surface of the semiconductor layer 108, hydrogen is diffused into the semiconductor layer 108 by later heat treatment or the like, so that VoH is formed in some cases. Since VoH might be a carrier generation source, the amount of water adsorbed on the semiconductor layer 108 is preferably small.

[Formation of Insulating Film 110f]

Figure 11A:
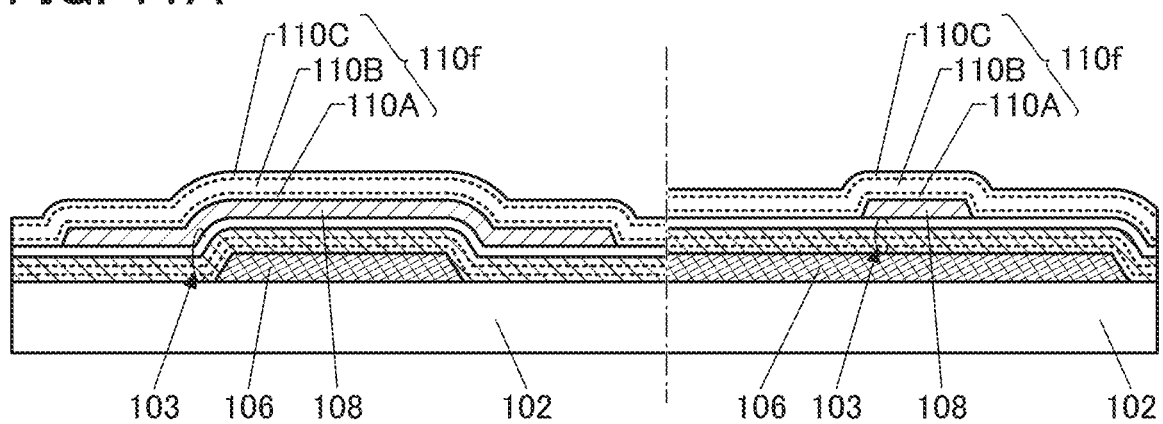
FIG. 11A, FIG. 11B, and FIG. 11C are cross-sectional views illustrating a method for manufacturing a semiconductor device.

Next, the insulating film 110f is formed to cover the insulating layer 103 and the semiconductor layer 108 (FIG. 11A).

The insulating film 110f is a film to be the insulating layer 110 later. As the insulating film 110f, for example, an oxide film such as a silicon oxide film or a silicon oxynitride film is preferably formed with a plasma-enhanced chemical vapor deposition apparatus (a PECVD apparatus or simply referred to as a plasma CVD apparatus). Alternatively, the insulating film 110f may be formed by a PECVD method using a microwave.

Here, an insulating film 110A to be the insulating layer 110a, an insulating film 110B to be the insulating layer 110b, and an insulating film 110C to be the insulating layer 110c are formed to be stacked in this order. In particular, each of the insulating films included in the insulating film 110f is preferably formed by a PECVD method.

The description is made on the case where a silicon oxynitride film is used as the insulating film 110A, the insulating film 110B, and the insulating film 110C. For example, the insulating film 110A is formed by a plasma CVD method using a mixed gas of silane and dinitrogen monoxide. Next, the insulating film 110B is deposited under a condition with a higher power, using a mixed gas in which the ratio of the silane flow rate to the dinitrogen monoxide flow rate is higher than that for the insulating film 110A. Then, the insulating film 110C is deposited under a condition with a lower pressure, using a mixed gas in which the ratio of the silane flow rate to the dinitrogen monoxide flow rate is lower than that for the insulating film 110B; thus, the insulating film 110f can be formed. Furthermore, switching the deposition conditions in the same chamber enables successive deposition of the insulating film 110A, the insulating film 110B, and the insulating film 110C in vacuum, leading to formation of the insulating film 110f with high productivity.

Heat treatment may be performed after the formation of the insulating film 110f. Performing the heat treatment can remove impurities in the insulating film 110f and adsorbed water on the surface of the insulating film 110f. The heat treatment can be performed at a temperature higher than or equal to 200° C. and lower than or equal to 400° C. in an atmosphere containing one or more of nitrogen, oxygen, and a rare gas. Note that heat treatment is not necessarily performed after the formation of the insulating film 110f. The heat treatment may be performed at any stage as long as it is after the formation of the insulating film 110f. The heat treatment may also serve as heat treatment or a heat application step that is to be performed later.

It is preferable to perform plasma treatment on a surface of the semiconductor layer 108 before deposition of the insulating film 110f. By the plasma treatment, impurities adsorbed onto the surface of the semiconductor layer 108, such as water, can be reduced. Thus, impurities at the interface between the semiconductor layer 108 and the insulating film 110f can be reduced, achieving a highly reliable transistor. The plasma treatment is particularly favorable in the case where the surface of the semiconductor layer 108 is exposed to the air after the formation of the semiconductor layer 108 and before the deposition of the insulating film 110f. For example, the plasma treatment can be performed in an atmosphere of oxygen, ozone, nitrogen, dinitrogen monoxide, argon, or the like. The plasma treatment and the deposition of the insulating film 110f are preferably performed successively without exposure to the air.

Here, heat treatment is preferably performed after the insulating film 110f is deposited. By the heat treatment, hydrogen or water contained in the insulating film 110f or adsorbed on its surface can be removed. Moreover, the number of defects in the insulating film 110f can be reduced.

The above description can be referred to for the conditions of the heat treatment.

After the insulating film 110f is formed or after the above heat treatment for removing hydrogen or water is performed, treatment for supplying oxygen to the insulating film 110f may be performed. For example, plasma treatment, heat treatment, or the like can be performed in an oxygen-containing atmosphere. Alternatively, oxygen may be supplied to the insulating film 110f by a plasma ion doping method, an ion implantation method, or the like. As the plasma treatment, a PECVD apparatus can be favorably used, for example. In the case where the insulating film 110f is formed with a PECVD apparatus, plasma treatment is preferably performed in vacuum in succession after the formation of the insulating film 110f. By successively performing the formation of the insulating film 110f and the plasma treatment in vacuum, the productivity can be increased.

In the case where heat treatment is performed after treatment for supplying oxygen to the insulating film 110f, the heat treatment is preferably performed after a film (e.g., a metal oxide film 1140 is formed over the insulating film 110f. When the heat treatment is performed while the insulating film 110f is exposed, oxygen supplied to the insulating film 110f might be released to the outside from the insulating film 110f. Performing the heat treatment after the film (e.g., the metal oxide film 1140 is formed over the insulating film 110f can inhibit release of oxygen, which has been supplied to the insulating film 110f, to the outside from the insulating film 110f.

[Formation of Metal Oxide Film 114f]

Figure 11B:
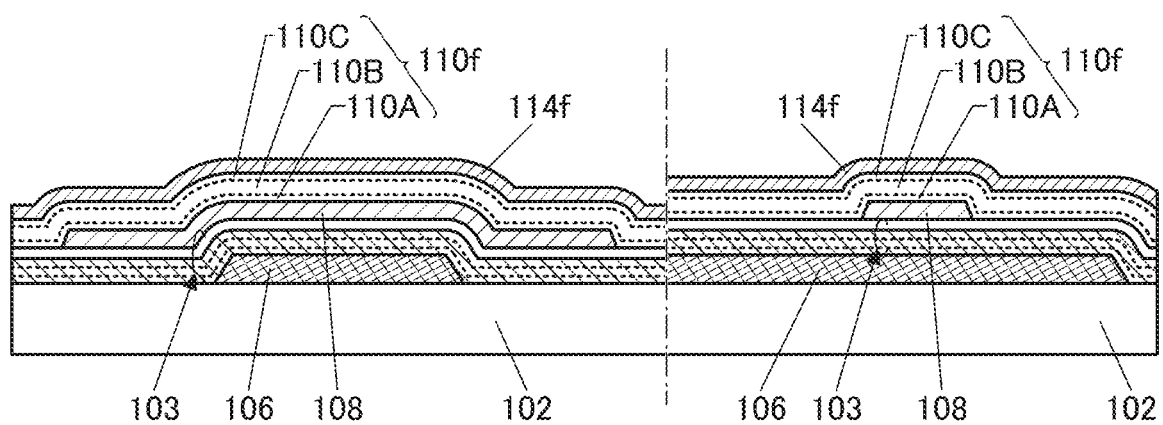

Then, the metal oxide film 114f is formed to cover the insulating film 110f (FIG. 11B).

The metal oxide film 114f is a film to be the metal oxide layer 114 later. The metal oxide film 114f is preferably formed by a sputtering method in an oxygen-containing atmosphere, for example. Thus, oxygen can be supplied to the insulating film 110f at the time of depositing the metal oxide film 114f.

The above description can be referred to for the case where the metal oxide film 114f is formed by a sputtering method using an oxide target containing a metal oxide similar to that in the case of the semiconductor layer 108.

As the metal oxide film 114f, a metal oxide film may be formed by a reactive sputtering method with a metal target using oxygen as a deposition gas. In the case where aluminum is used for the metal target, an aluminum oxide film can be deposited.

At the time of depositing the metal oxide film 114f, the proportion of the oxygen flow rate to the total flow rate of the deposition gas introduced into a deposition chamber of a deposition apparatus (the oxygen flow rate ratio) or the oxygen partial pressure in the deposition chamber is preferably higher, in which case the amount of oxygen supplied into the insulating layer 110 can be increased. The oxygen flow rate ratio or the oxygen partial pressure is, for example, higher than 0% and lower than or equal to 100%, preferably higher than or equal to 10% and lower than or equal to 100%, further preferably higher than or equal to 20% and lower than or equal to 100%, still further preferably higher than or equal to 30% and lower than or equal to 100%, yet still further preferably higher than or equal to 40% and lower than or equal to 100%. It is particularly preferred that the oxygen flow rate ratio be 100% and the oxygen partial pressure be as close to 100% as possible.

When the metal oxide film 114f is formed by a sputtering method in an oxygen-containing atmosphere in the above manner, oxygen can be supplied to the insulating film 110f and release of oxygen from the insulating film 110f can be prevented during the deposition of the metal oxide film 114f. As a result, an extremely large amount of oxygen can be enclosed in the insulating film 110f. Then, by heat treatment performed later, a large amount of oxygen is supplied to the channel formation region of the semiconductor layer 108, so that oxygen vacancies in the channel formation region can be reduced, and thus the transistor can have high reliability.

For the metal oxide film 114f, the substrate temperature is higher than or equal to room temperature and lower than or equal to 450° C., preferably higher than or equal to room temperature and lower than or equal to 300° C., further preferably higher than or equal to room temperature and lower than or equal to 200° C., still further preferably higher than or equal to room temperature and lower than or equal to 140° C. For example, in the case where a large-sized glass substrate or a resin substrate is used as the substrate 102, the deposition temperature is preferably higher than or equal to room temperature and lower than 140° C., in which case the productivity can be increased. In addition, when the deposition temperature of the metal oxide film 114f is high, the crystallinity of the metal oxide film 114f is increased and the etching rate is decreased in some cases. When the deposition temperature of the metal oxide film 114f is low, the crystallinity of the metal oxide film 114f is decreased and the etching rate is increased in some cases. The deposition temperature of the metal oxide film 114f may be selected as appropriate so that the etching rate is desirable with respect to an etchant used for processing the metal oxide film 114f.

Oxygen may be supplied from the insulating film 110f to the semiconductor layer 108 by heat treatment performed after the formation of the metal oxide film 114f. The heat treatment can be performed at a temperature higher than or equal to 200° C. and lower than or equal to 400° C. in an atmosphere containing one or more of nitrogen, oxygen, and a rare gas. Note that heat treatment is not necessarily performed after the formation of the metal oxide film 114f. The heat treatment may be performed at any stage as long as it is after the deposition of the metal oxide film 114f. The heat treatment may also serve as heat treatment or a heat application step that is to be performed later.

[Formation of Conductive Film 112f]

Then, the metal oxide film 114f, the insulating film 110f, and the insulating layer 103 are partly etched to form the opening portion 142 reaching the conductive layer 106. Thus, the conductive layer 112 to be formed later can be electrically connected to the conductive layer 106 through the opening portion 142.

Figure 11C:
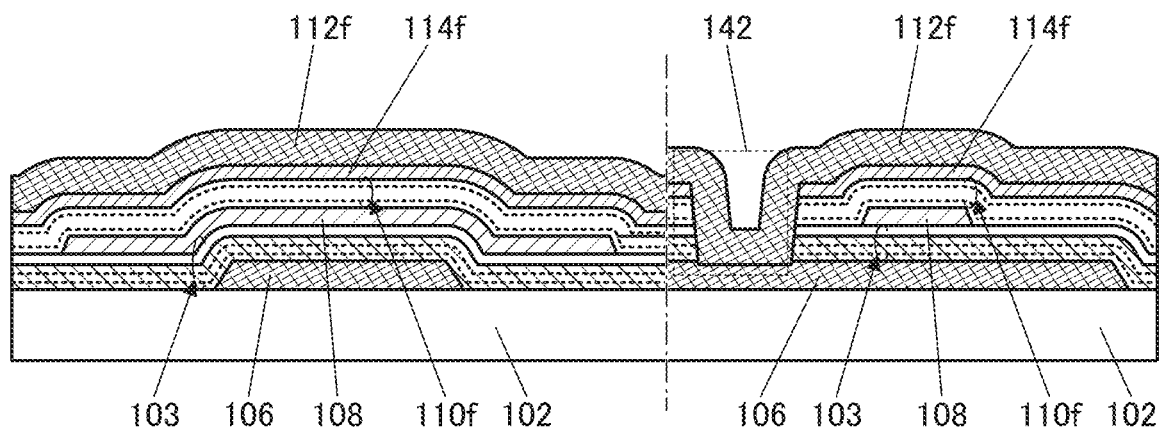

Next, a conductive film 112f to be the conductive layer 112 is deposited over the metal oxide film 114f (FIG. 11C). The conductive film 112f is preferably formed by a sputtering method using a sputtering target of a metal or an alloy.

[Formation of Insulating Layer 110, Metal Oxide Layer 114, and Conductive Layer 112]

Figure 12A:
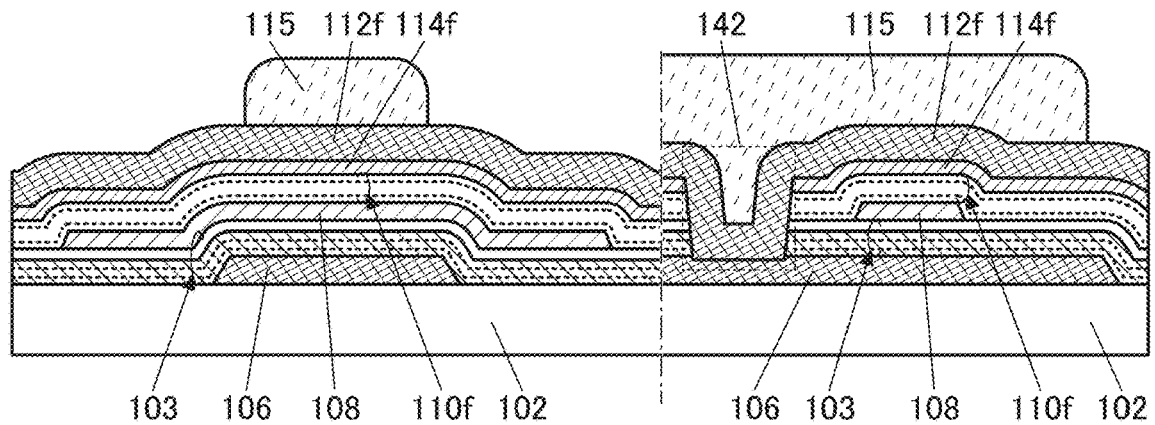
FIG. 12A, FIG. 12B, and FIG. 12C are cross-sectional views illustrating a method for manufacturing a semiconductor device.
Figure 12B:
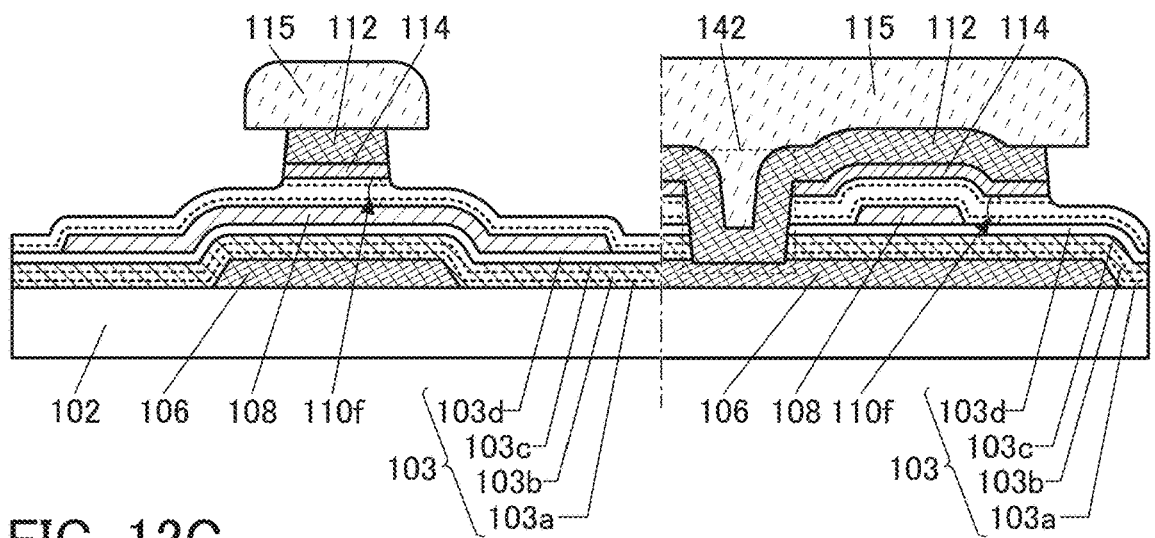

Subsequently, a resist mask 115 is formed over the conductive film 112f (FIG. 12A). After that, the conductive film 112f and the metal oxide film 114f that are in a region not covered with the resist mask 115 are removed, so that the conductive layer 112 and the metal oxide layer 114 are formed (FIG. 12B).

A wet etching method can be suitably used to form the conductive layer 112 and the metal oxide layer 114. In a wet etching method, for example, an etchant containing hydrogen peroxide can be used. For example, an etchant containing one or more of phosphoric acid, acetic acid, nitric acid, hydrochloric acid, and sulfuric acid can be used. In particular, in the case where a material containing copper is used for the conductive layer 112, an etchant containing phosphoric acid, acetic acid, and nitric acid can be suitably used.

The processing is performed so that the end portions of the conductive layer 112 and the metal oxide layer 114 are positioned inward from the outline of the resist mask 115. A wet etching method is suitably used to form the conductive layer 112 and the metal oxide layer 114. The width L2 of the region 108L can be controlled by adjustment of the etching time.

The conductive layer 112 and the metal oxide layer 114 may be formed in the following manner: the conductive film 112f and the metal oxide film 114f are etched by an anisotropic etching method, and then side surfaces of the conductive film 112f and the metal oxide film 114f are etched by an isotropic etching method to make the end surfaces recede (also referred to as side etching). Consequently, the conductive layer 112 and the metal oxide layer 114 that are positioned inward from the insulating layer 110 in a plan view can be formed.

As illustrated in FIG. 12B, at the time of forming the conductive layer 112 and the metal oxide layer 114, the thickness of the insulating film 110f in a region not overlapped by the conductive layer 112 becomes sometimes smaller than the thickness of the insulating film 110f in a region overlapped by the conductive layer 112.

Note that for the formation of the conductive layer 112 and the metal oxide layer 114, etching may be performed at least twice using different etching conditions or methods. For example, the conductive film 112f may be etched first, and then the metal oxide film 114f may be etched under different etching conditions.

Figure 12C:
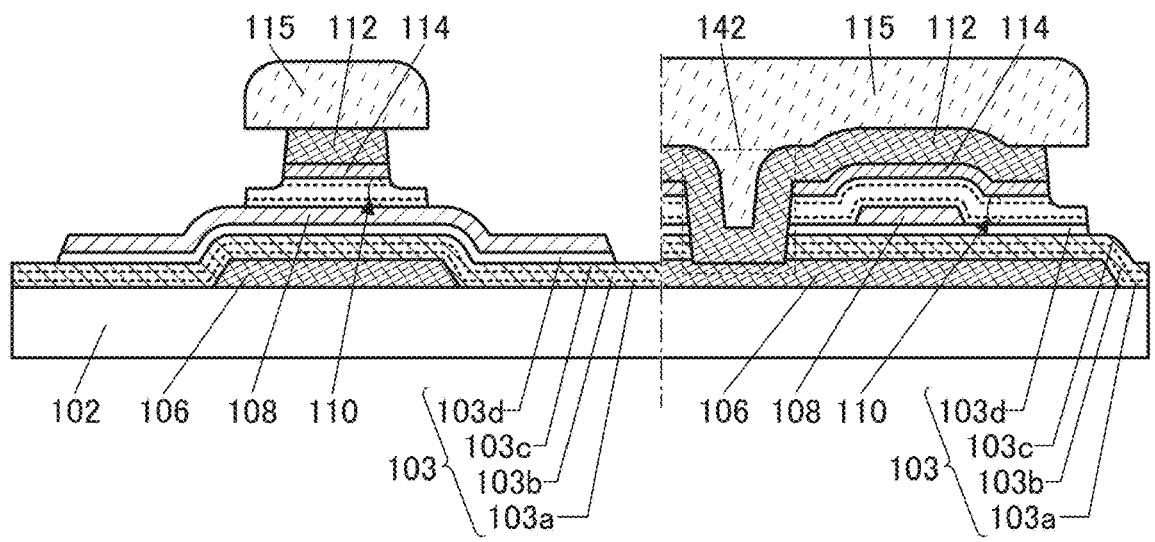

Next, the insulating film 110f in a region not covered with the resist mask 115 is removed to form the insulating layer 110 (FIG. 12C). For the formation of the insulating layer 110, either one or both of a wet etching method and a dry etching method can be used. Although the insulating layer 110 may be formed in a state where the resist mask 115 is removed, a reduction in the thickness of the conductive layer 112 can be inhibited when the resist mask 115 is left. At the time of forming the insulating layer 110, the insulating layer 103d in a region not covered with the resist mask 115 may also be removed.

The width L2 of the region 108L can be controlled by adjusting the conditions for forming the insulating layer 110. For example, the width of the resist mask 115 is reduced by using the conditions in which the resist mask 115 recedes at the time of forming the insulating layer 110. Reducing the width of the resist mask 115 makes the distance between an end portion of the resist mask 115 and an end portion of the conductive layer 112 closer, resulting in a reduction in the width L2 of the region 108L.

After the formation of the insulating layer 110, the resist mask 115 is removed.

Here, cleaning may be performed to remove impurities. Performing cleaning can remove impurities attached to the exposed regions of the insulating layer 110 and the semiconductor layer 108 and inhibit a reduction in the electrical characteristics and reliability of the transistor. Examples of impurities include a component of the etching gas or the etchant attached during etching of the insulating film 110f, a component of the conductive film 112f, and a component of the metal oxide film 114f.

As the cleaning method, wet cleaning using a cleaning solution or the like, plasma treatment, or the like can be used. Alternatively, such cleaning methods may be performed in combination as appropriate. For the wet cleaning, a cleaning solution containing oxalic acid, phosphoric acid, ammonia water, hydrofluoric acid, or the like can be used.

[Formation of Insulating Layer 116 and Regions 108N (Treatment for Supplying Hydrogen)]

Figure 13A:
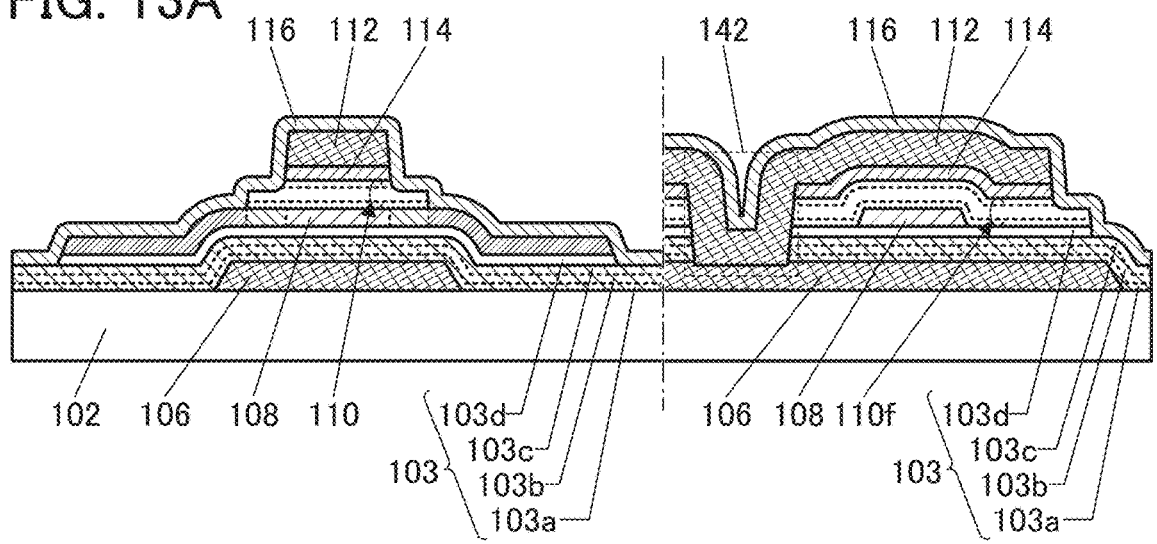
FIG. 13A, FIG. 13B, and FIG. 13C are cross-sectional views illustrating a method for manufacturing a semiconductor device.

Subsequently, treatment for supplying hydrogen to an exposed region of the semiconductor layer 108 is performed. Here, the insulating layer 116 containing hydrogen is deposited in contact with the exposed region of the semiconductor layer 108 to supply hydrogen (FIG. 13A).

The insulating layer 116 is preferably formed by a plasma CVD method using a deposition gas containing hydrogen. For example, a silicon nitride film is deposited using a deposition gas containing a silane gas and an ammonia gas. Using the ammonia gas in addition to the silane gas enables the film to contain a large amount of hydrogen. Furthermore, hydrogen can be supplied to the exposed portion of the semiconductor layer 108 at the time of the deposition.

Heat treatment is preferably performed after the deposition of the insulating layer 116 so that part of hydrogen released from the insulating layer 116 is supplied to part of the semiconductor layer 108. The heat treatment is preferably performed in an atmosphere containing one or more of nitrogen, oxygen, and a rare gas at a temperature higher than or equal to 150° C. and lower than or equal to 450° C., further preferably higher than or equal to 200° C. and lower than or equal to 400° C.

By supplying hydrogen as described above, the regions 108N having an extremely low resistance can be formed in the semiconductor layer 108.

Oxygen can be supplied from the insulating layer 110 to the channel formation region of the semiconductor layer 108 by the heat treatment.

[Formation of Insulating Layer 118]

Figure 13B:
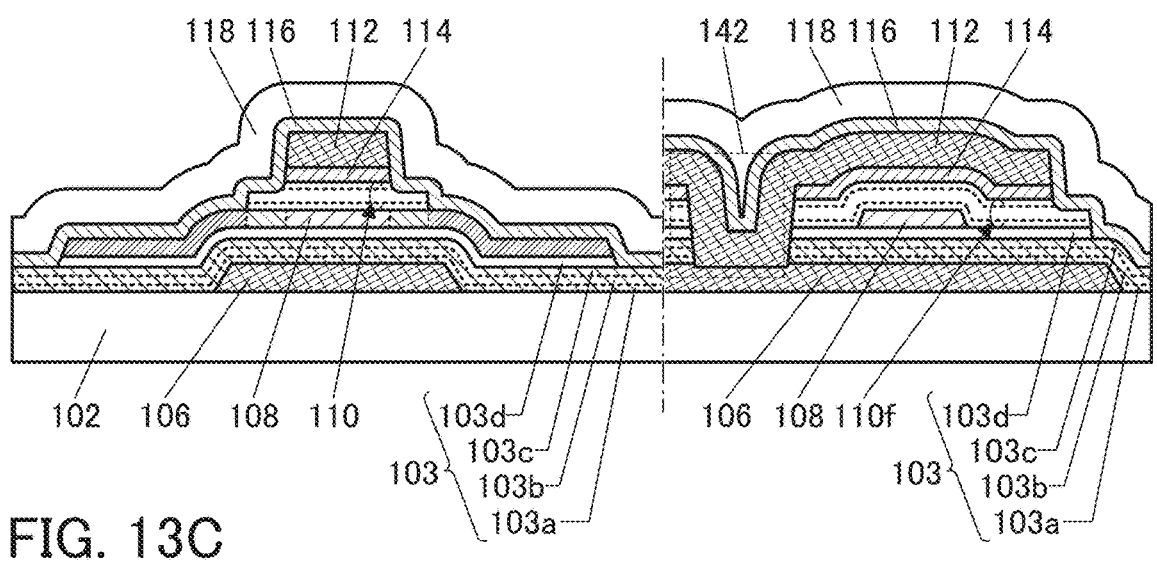

Next, the insulating layer 118 is formed over the insulating layer 116 (FIG. 13B).

When the insulating layer 118 is formed by a plasma CVD method at a too high deposition temperature, some impurities contained in the regions 108N and the like might be diffused into a peripheral portion including the channel formation region of the semiconductor layer 108. As a result, the resistance of the channel formation region might be lowered, and the resistance of the regions 108N might be increased, for example. The deposition temperature of the insulating layer 116 or the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. By forming the insulating layer 118 at low temperatures, even a transistor with a short channel length can have favorable electrical characteristics.

Heat treatment may be performed after the formation of the insulating layer 118.

[Formation of Opening Portion 141a and Opening Portion 141b]

Next, a mask is formed by lithography at a desired position on the insulating layer 118, and then the insulating layer 118 and the insulating layer 116 are partly etched to form the opening portion 141a and the opening portion 141b that reach the regions 108N.

[Formation of Conductive Layer 120a and Conductive Layer 120b]

Figure 13C:
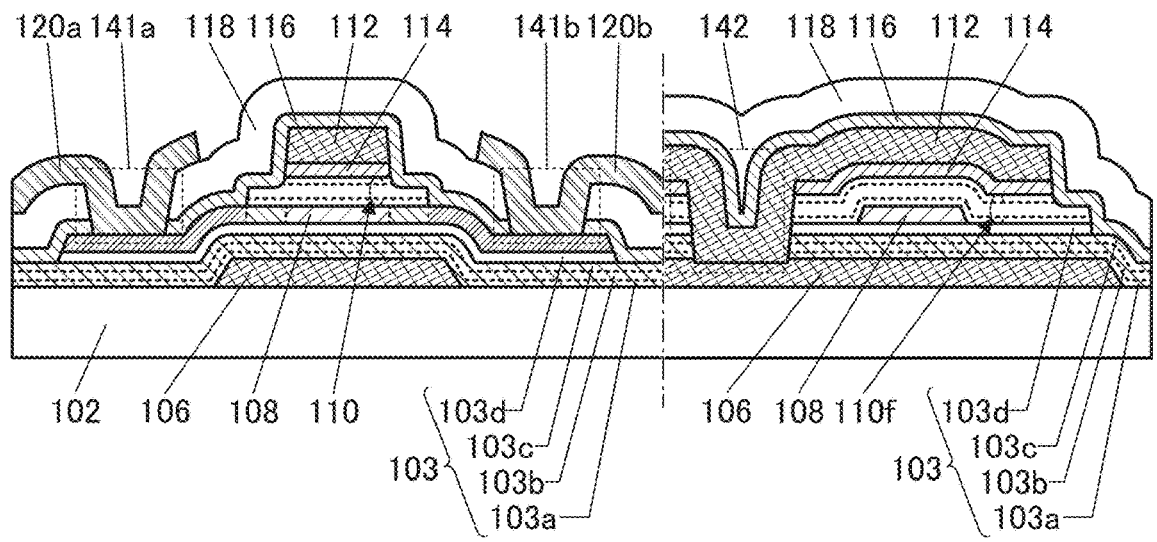

Subsequently, a conductive film is deposited over the insulating layer 118 to cover the opening portion 141a and the opening portion 141b, and the conductive film is processed into a desired shape, so that the conductive layer 120a and the conductive layer 120b are formed (FIG. 13C).

Through the above steps, the transistor 100C can be fabricated.

Manufacturing Method Example 2

The description is made below on an example of the structure where the end portion of the conductive layer 112 is positioned inward from the end portion of the metal oxide layer 114, which is exemplified as the transistor 100A in the above structure example.

The steps up to and including the formation of the resist mask 115 over the conductive film 112f are the same as in <Manufacturing method example 1> described above (see FIG. 12A).

[Formation of Insulating Layer 110, Metal Oxide Layer 114, and Conductive Layer 112]

Figure 14A:
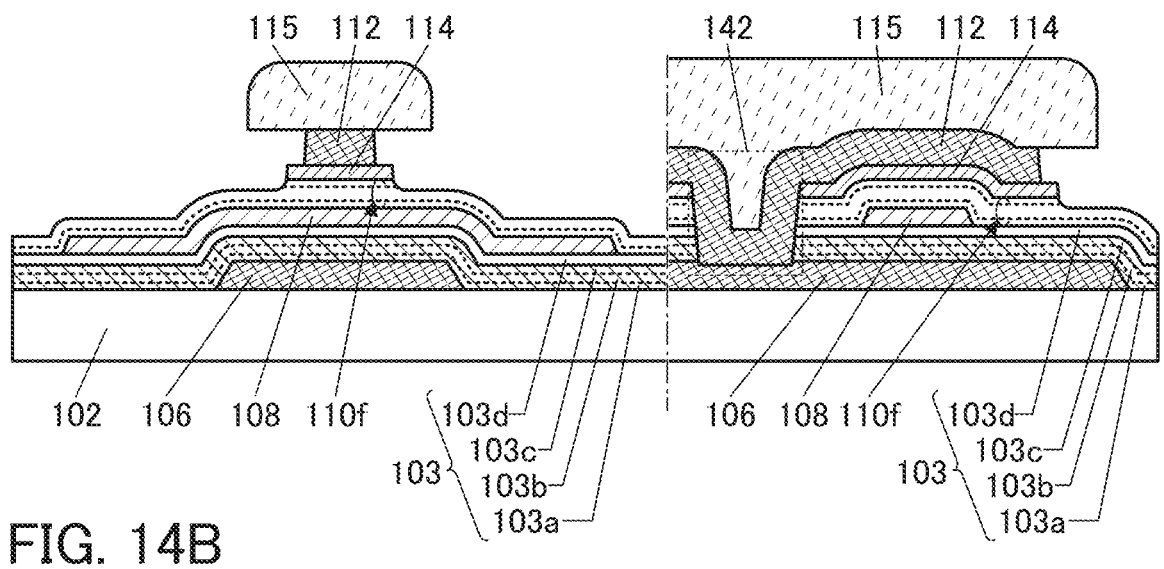
FIG. 14A and FIG. 14B are diagrams illustrating a method for manufacturing a semiconductor device.

Then, the conductive film 112f and the metal oxide film 114f that are in a region not covered with the resist mask 115 are removed, so that the conductive layer 112 and the metal oxide layer 114 are formed (FIG. 14A).

A wet etching method can be suitably used to form the conductive layer 112 and the metal oxide layer 114. At this time, processing is performed such that the end portion of the metal oxide layer 114 is positioned inward from the outline of the resist mask 115 and the end portion of the conductive layer 112 is positioned inward from the outline of the metal oxide layer 114. Moreover, the width L2 of the region 108L can be controlled by adjustment of the etching time.

The conductive layer 112 and the metal oxide layer 114 may be formed in the following manner: the conductive film 112f and the metal oxide film 114f are etched by an anisotropic etching method, and then side surfaces of the conductive film 112f and the metal oxide film 114f are etched by an isotropic etching method to make the end surfaces recede.

As illustrated in FIG. 14A, at the time of forming the conductive layer 112 and the metal oxide layer 114, the thickness of the insulating film 110f in a region not overlapped by the metal oxide layer 114 becomes sometimes smaller than the thickness of the insulating film 110f in a region overlapped by the metal oxide layer 114.

At the time of forming the conductive layer 112 and the metal oxide layer 114, the end portion of the conductive layer 112 may recede from the end portion of the metal oxide layer 114, and the thickness of the metal oxide layer 114 in a region not overlapped by the conductive layer 112 may be smaller than the thickness of the metal oxide layer 114 in a region overlapped by the conductive layer 112.

Figure 14B:
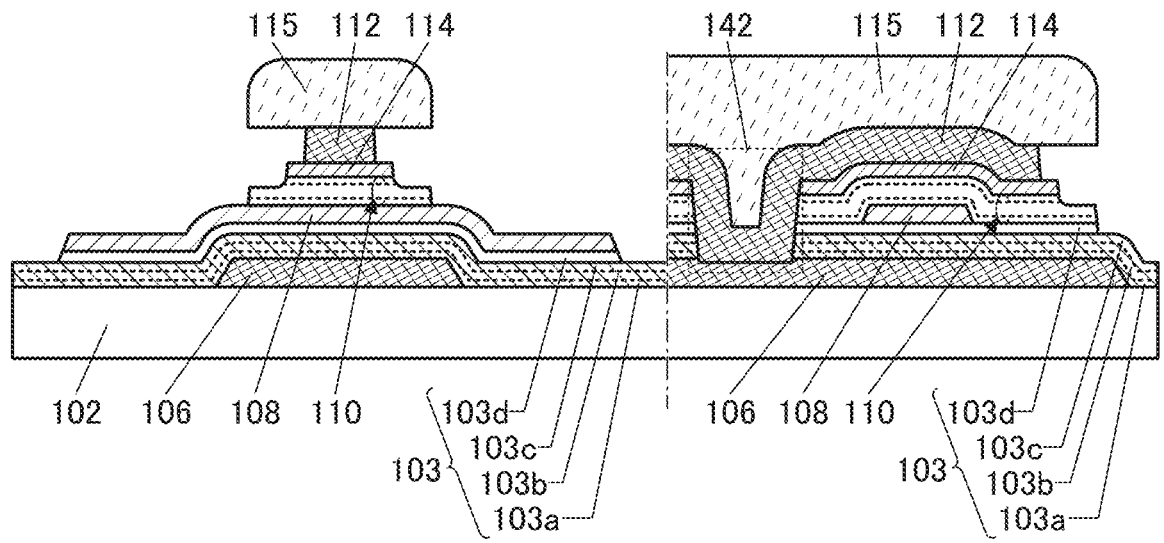

Next, the insulating film 110f in a region not covered with the resist mask 115 is removed to form the insulating layer 110 (FIG. 14B). For the formation of the insulating layer 110, either one or both of a wet etching method and a dry etching method can be used. Although the insulating layer 110 may be formed in a state where the resist mask 115 is removed, a reduction in the thickness of the conductive layer 112 can be inhibited when the resist mask 115 is left.

After the formation of the insulating layer 110, the resist mask 115 is removed.

The description of <Manufacturing method example 1> can be referred to for the subsequent steps including and after the formation of the insulating layer 116; therefore, the details are omitted.

<Components of Semiconductor Device>

Next, components of the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates on which a semiconductor element is provided may be used as the substrate 102.

A flexible substrate may be used as the substrate 102, and the transistor 100 and the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

[Insulating Layer 103]

The insulating layer 103 can be formed by a sputtering method, a CVD method, an evaporation method, a pulsed laser deposition (PLD) method, or the like as appropriate. For example, the insulating layer 103 can be formed using a single layer or stacked layers of an oxide insulating film or a nitride insulating film. To improve the properties of the interface with the semiconductor layer 108, at least a region of the insulating layer 103 that is in contact with the semiconductor layer 108 is preferably formed using an oxide insulating film. The insulating layer 103 is preferably formed using a film from which oxygen is released by heating.

For example, a single layer or stacked layers using silicon oxide, silicon oxynitride, silicon nitride oxide, silicon nitride, aluminum oxide, hafnium oxide, gallium oxide, a Ga—Zn oxide, or the like can be provided as the insulating layer 103.

In the case where a film other than an oxide film, e.g., a silicon nitride film, is used for the side of the insulating layer 103 that is in contact with the semiconductor layer 108, pretreatment such as oxygen plasma treatment is preferably performed on the surface in contact with the semiconductor layer 108 to oxidize the surface or the vicinity of the surface.

[Conductive Film]

The conductive layer 106, the conductive layer 120a functioning as the source electrode, and the conductive layer 120b functioning as the drain electrode can each be formed using a metal element selected from chromium, copper, aluminum, gold, silver, zinc, molybdenum, tantalum, titanium, tungsten, manganese, nickel, iron, and cobalt; an alloy containing the metal element as its component; an alloy including a combination of the metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used for the conductive layer 106, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive layer 106 and the like may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Among the above metal elements, it is particularly preferable that any one or more selected from titanium, tungsten, tantalum, and molybdenum be included in the conductive layer 106, the conductive layer 120a, and the conductive layer 120b. It is particularly preferable to use a tantalum nitride film. Since the tantalum nitride film has conductivity and a high barrier property against copper, oxygen, or hydrogen and releases little hydrogen from itself, it can be favorably used as the conductive film in contact with the semiconductor layer 108 or the conductive film in the vicinity of the semiconductor layer 108.

[Insulating Layer 110]

The insulating layer 110 functioning as the gate insulating film of the transistor 100 and the like can be formed by a PECVD method, a sputtering method, or the like. For the insulating layer 110, an insulating layer including one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

The insulating layer 110 that is in contact with the semiconductor layer 108 is preferably an oxide insulating film and further preferably includes a region containing oxygen in excess of that in the stoichiometric composition.

In other words, the insulating layer 110 is an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For the insulating layer 110, a material having a higher dielectric constant than silicon oxide or silicon oxynitride, such as hafnium oxide, can also be used. In that case, the insulating layer 110 can be thick, and leakage current due to tunnel current can be inhibited. In particular, hafnium oxide having crystallinity is preferable because it has a higher dielectric constant than amorphous hafnium oxide.

[Semiconductor Layer]

In the case where the semiconductor layer 108 is an In-M-Zn oxide, a sputtering target used for depositing the In-M-Zn oxide preferably has the atomic ratio of In to the element M higher than or equal to 1. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer 108 having crystallinity is easily formed. Note that the atomic ratio in the deposited semiconductor layer 108 may vary in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the deposited semiconductor layer 108 is sometimes in the neighborhood of In:Ga:Zn=4:2:3 [atomic ratio].

Note that when the atomic ratio is described as In:Ga:Zn=4:2:3 or in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or in the neighborhood thereof, the case is included where Ga is greater than 0.1 and less than or equal to 2 and Zn is greater than 0.1 and less than or equal to 2 with In being 1.

The energy gap of the semiconductor layer 108 is 2 eV or more, preferably 2.5 eV or more. With the use of such a metal oxide having a wider energy gap than silicon, the off-state current of the transistor can be reduced.

A metal oxide with a low carrier concentration is preferably used for the semiconductor layer 108. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in the metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In some cases, bonding of part of hydrogen to oxygen bonded to a metal atom generates electrons serving as carriers. Thus, a transistor using a metal oxide containing much hydrogen is likely to have normally-on characteristics.

A defect in which hydrogen has entered an oxygen vacancy can function as a donor of the metal oxide. However, it is difficult to evaluate the defects quantitatively. Thus, the metal oxide is evaluated by carrier concentration, not by donor concentration, in some cases. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, hydrogen in the metal oxide is preferably reduced as much as possible. Specifically, the hydrogen concentration of the metal oxide obtained by secondary ion mass spectrometry (SIMS) is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

The carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

The semiconductor layer 108 preferably has a non-single-crystal structure. The non-single-crystal structure includes, for example, a CAAC structure which is described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) is described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including a CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

In an image obtained with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image of the nc-OS film observed with a TEM, for example, a crystal grain boundary cannot be clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS film. Thus, the orientation in the whole film is not observed. Accordingly, the nc-OS film cannot be distinguished from an amorphous oxide semiconductor by some analysis methods. For example, when the nc-OS film is subjected to structural analysis by an out-of-plane method with an XRD apparatus using an X-ray having a diameter larger than the diameter of a crystal part, a peak indicating a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (also referred to as selected-area electron diffraction). Meanwhile, in some cases, a circular (ring-like) region with high luminance is observed and a plurality of spots are observed in the region when the nc-OS film is subjected to electron diffraction using an electron beam with a probe diameter (e.g., 1 nm or larger and 30 nm or smaller) close to or smaller than the size of a crystal part (also referred to as nanobeam electron diffraction).

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier concentration and higher electron mobility than the CAAC-OS film in some cases. Accordingly, a transistor using the nc-OS film may have high field-effect mobility.

The nc-OS film can be formed at a smaller oxygen flow rate ratio in deposition than the CAAC-OS film. The nc-OS film can also be formed at a lower substrate temperature in deposition than the CAAC-OS film. For example, the nc-OS film can be formed at a relatively low substrate temperature (e.g., a temperature of 130° C. or lower) or without heating of the substrate and thus is suitable for the case of using a large glass substrate, a resin substrate, or the like, and productivity can be increased.

An example of a crystal structure of a metal oxide is described. Note that a metal oxide deposited by a sputtering method using an In—Ga—Zn oxide target (In:Ga:Zn=4:2: 4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated.

<Composition of Metal Oxide>

The composition of a CAC (Cloud-Aligned Composite)-OS that can be used in a transistor disclosed in one embodiment of the present invention will be described below.

Note that in this specification and the like, CAAC (c-axis aligned crystal) and CAC (Cloud-Aligned Composite) may be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

The above is the description of the components.

At least part of this embodiment can be implemented in appropriate combination with the other embodiments described in this specification.

Embodiment 2

In this embodiment, an example of a display device that includes the transistor exemplified in the above embodiment will be described.

Structure Example

Figure 15A:
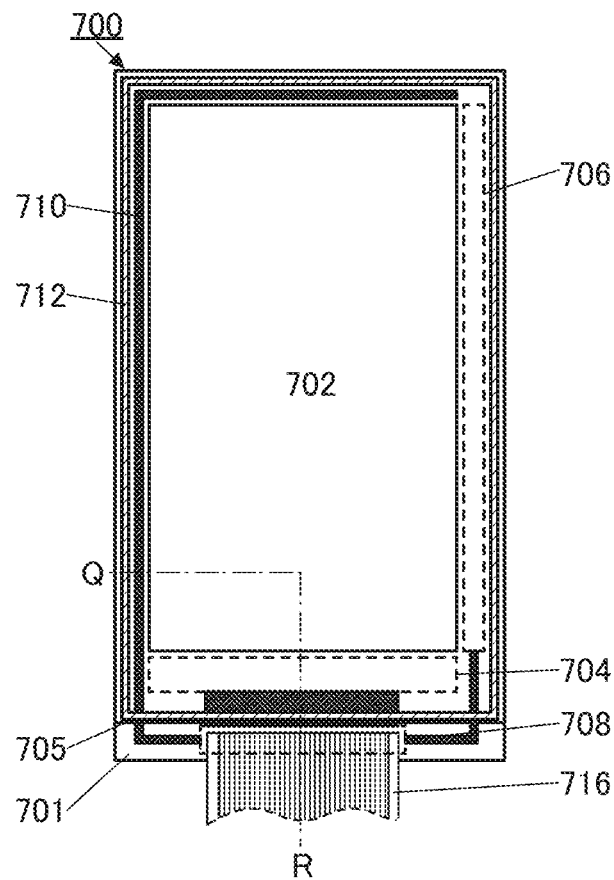
FIG. 15A, FIG. 15B, and FIG. 15C are top views of display devices.

FIG. 15A is a top view of a display device 700. The display device 700 includes a first substrate 701 and a second substrate 705 that are bonded to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that is not overlapped by the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be in the form of an IC chip obtained by packaging a circuit portion formed separately on a semiconductor substrate or the like. The IC chips can be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. Examples of the light-emitting element are self-luminous light-emitting elements such as an LED (Light Emitting Diode), an OLED (Organic LED), a QLED (Quantum-dot LED), and a semiconductor laser. It is also possible to use, for example, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like.

Figure 15B:
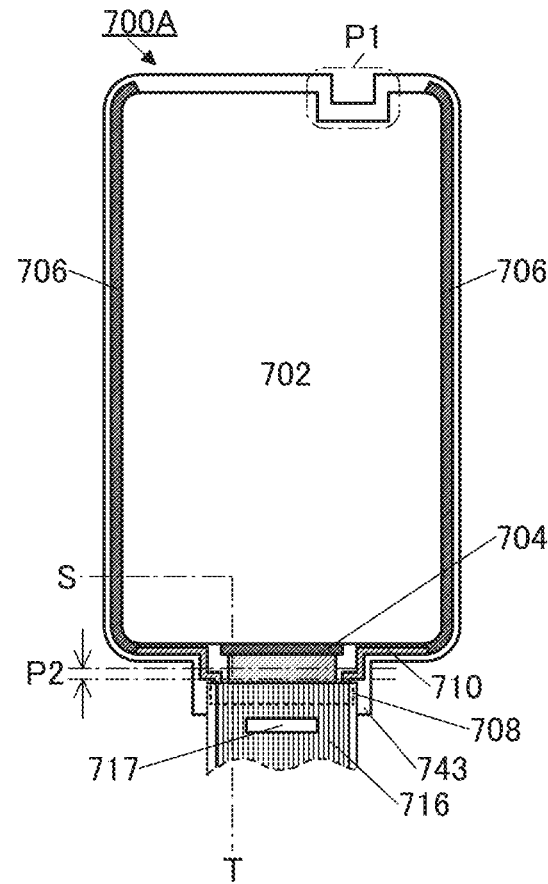

A display device 700A illustrated in FIG. 15B is an example of a display device that includes a flexible resin layer 743 instead of the first substrate 701 and can be used as a flexible display.

In the display device 700A, the pixel portion 702 does not have a rectangular shape but has arc-shaped corner portions. The display device 700A includes a notch portion in which part of the pixel portion 702 and part of the resin layer 743 are cut as shown in a region P1 in FIG. 15B. A pair of gate driver circuit portions 706 are provided on the opposite sides with the pixel portion 702 therebetween. The gate driver circuit portions 706 are provided along a curved outline at the corners of the pixel portion 702.

The resin layer 743 has a protrusion where the FPC terminal portion 708 is provided. Furthermore, part of the resin layer 743 that includes the FPC terminal portion 708 can be bent backward in a region P2 in FIG. 15B. When part of the resin layer 743 is folded back, the display device 700A can be mounted on an electronic device with the FPC 716 underlying the rear side of the pixel portion 702, so that the space of the electronic device can be saved.

The FPC 716 connected to the display device 700A is mounted with an IC 717. The IC 717 functions as a source driver circuit, for example. In this case, the source driver circuit portion 704 in the display device 700A can be configured to include at least one of a protection circuit, a buffer circuit, a demultiplexer circuit, and the like.

Figure 15C:
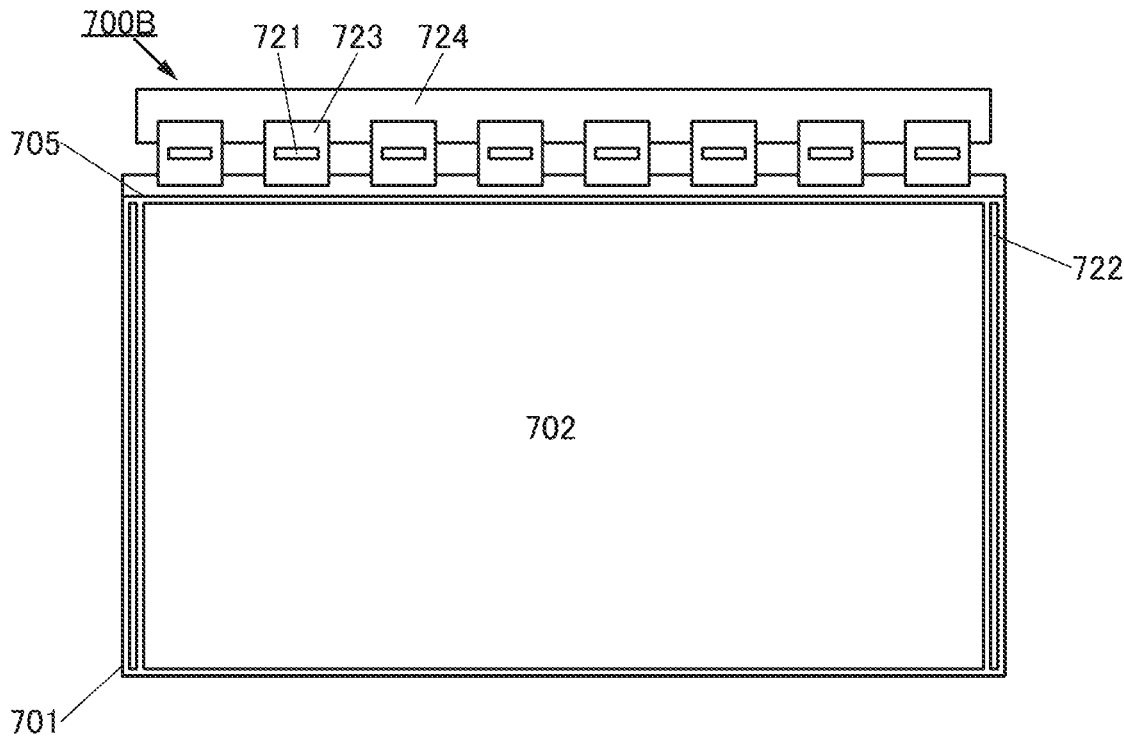

A display device 700B illustrated in FIG. 15C is a display device that can be suitably used for an electronic device with a large screen. For example, the display device 700B can be suitably used for a television device, a monitor device, a personal computer (including a laptop type and a desktop type), a tablet terminal, digital signage, and the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized. When the FPCs 723 are bent, mounting on an electronic device can be performed with the printed circuit board 724 placed on the rear side of the pixel portion 702, so that the space of the electronic device can be saved.

Meanwhile, the gate driver circuit portions 722 are provided over the first substrate 701. Thus, an electronic device with a narrow bezel can be achieved.

With such a structure, a large-size and high-resolution display device can be achieved. For example, a display device with a screen diagonal of 30 inches or more, 40 inches or more, 50 inches or more, or 60 inches or more can be achieved. Furthermore, a display device with extremely high resolution such as 4K2K or 8K4K can be achieved.

Cross-Sectional Structure Example

Figure 16:
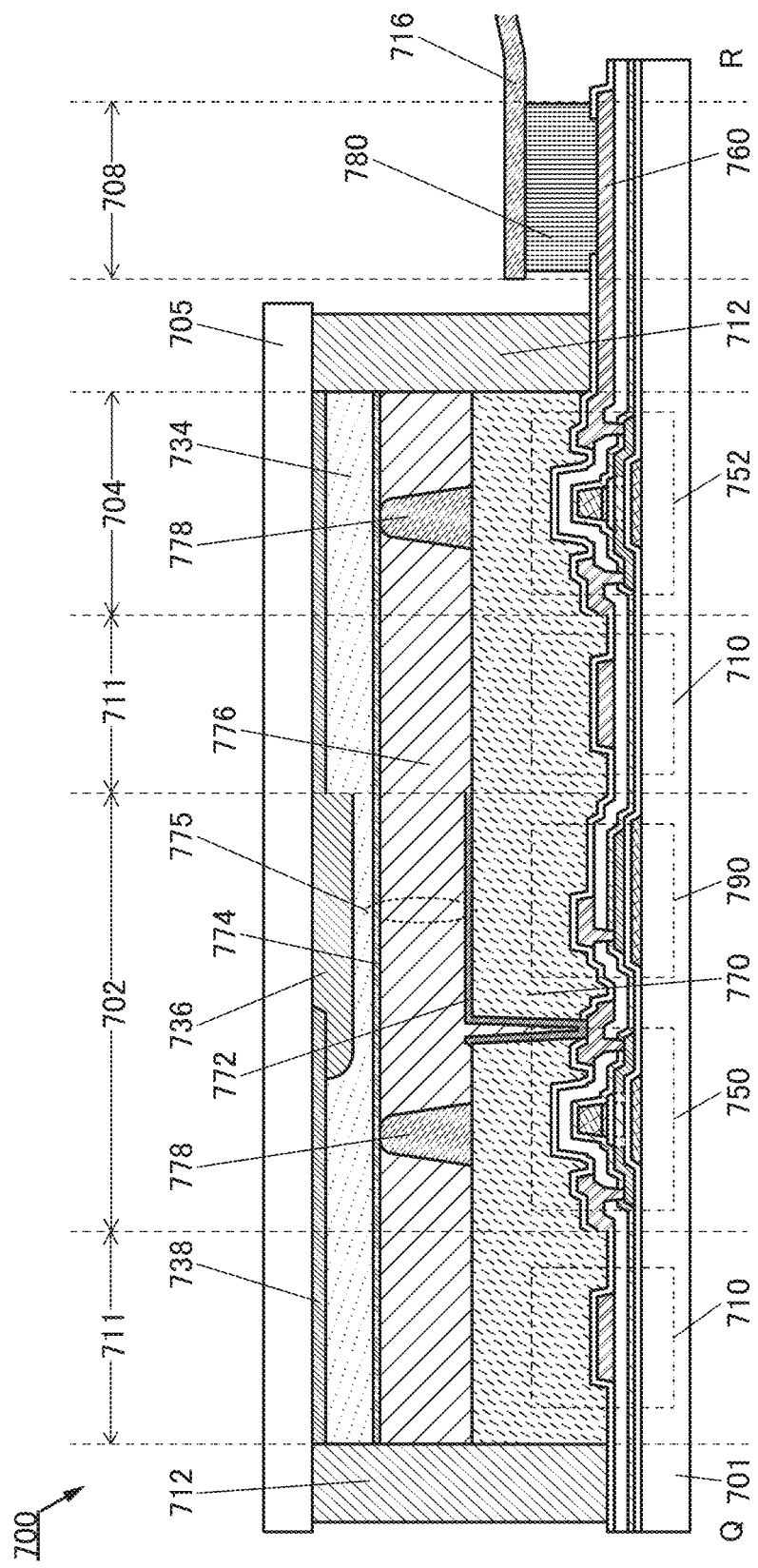
FIG. 16 is a cross-sectional view of a display device.
Figure 17:
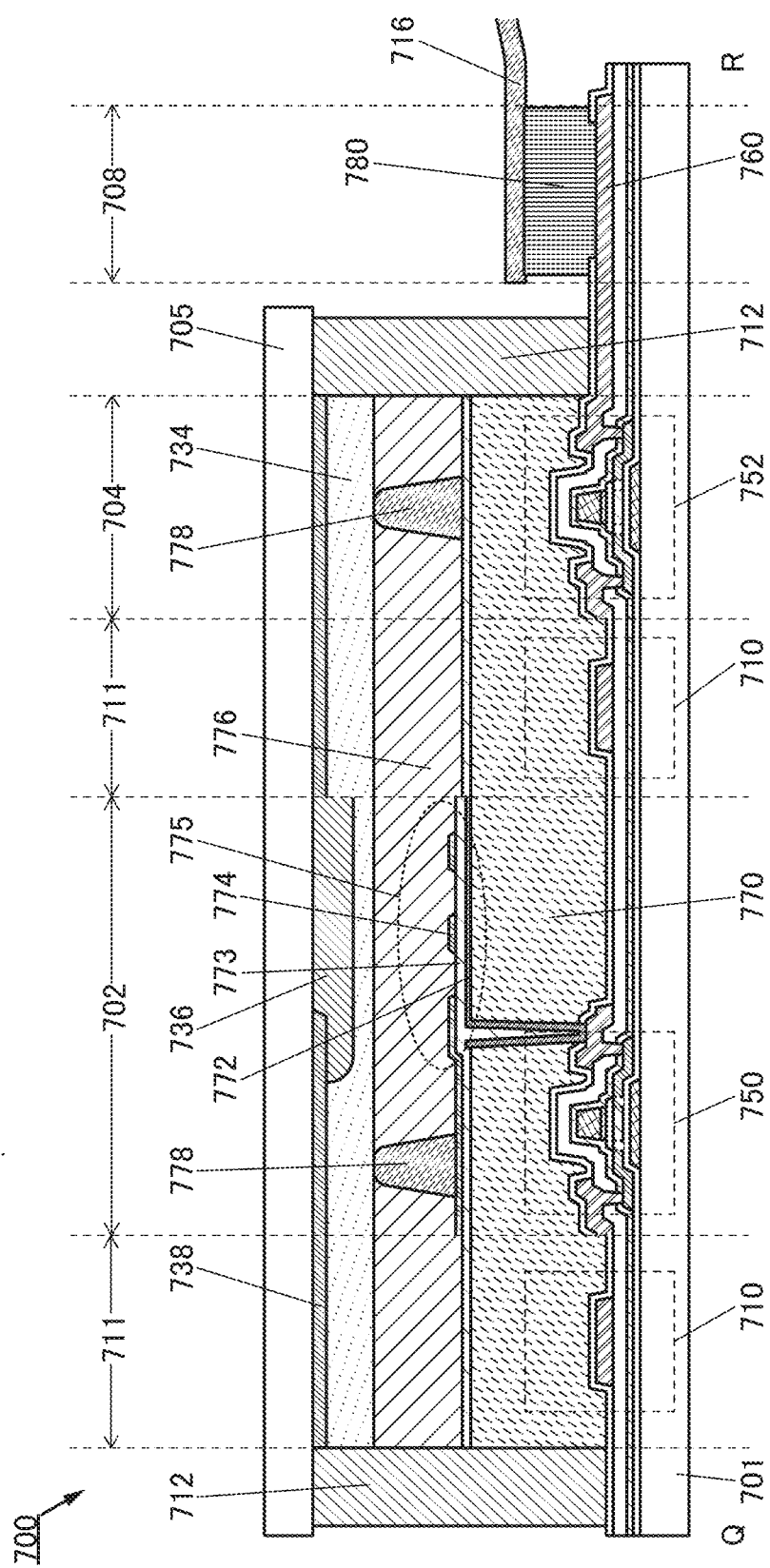
FIG. 17 is a cross-sectional view of a display device.
Figure 18:
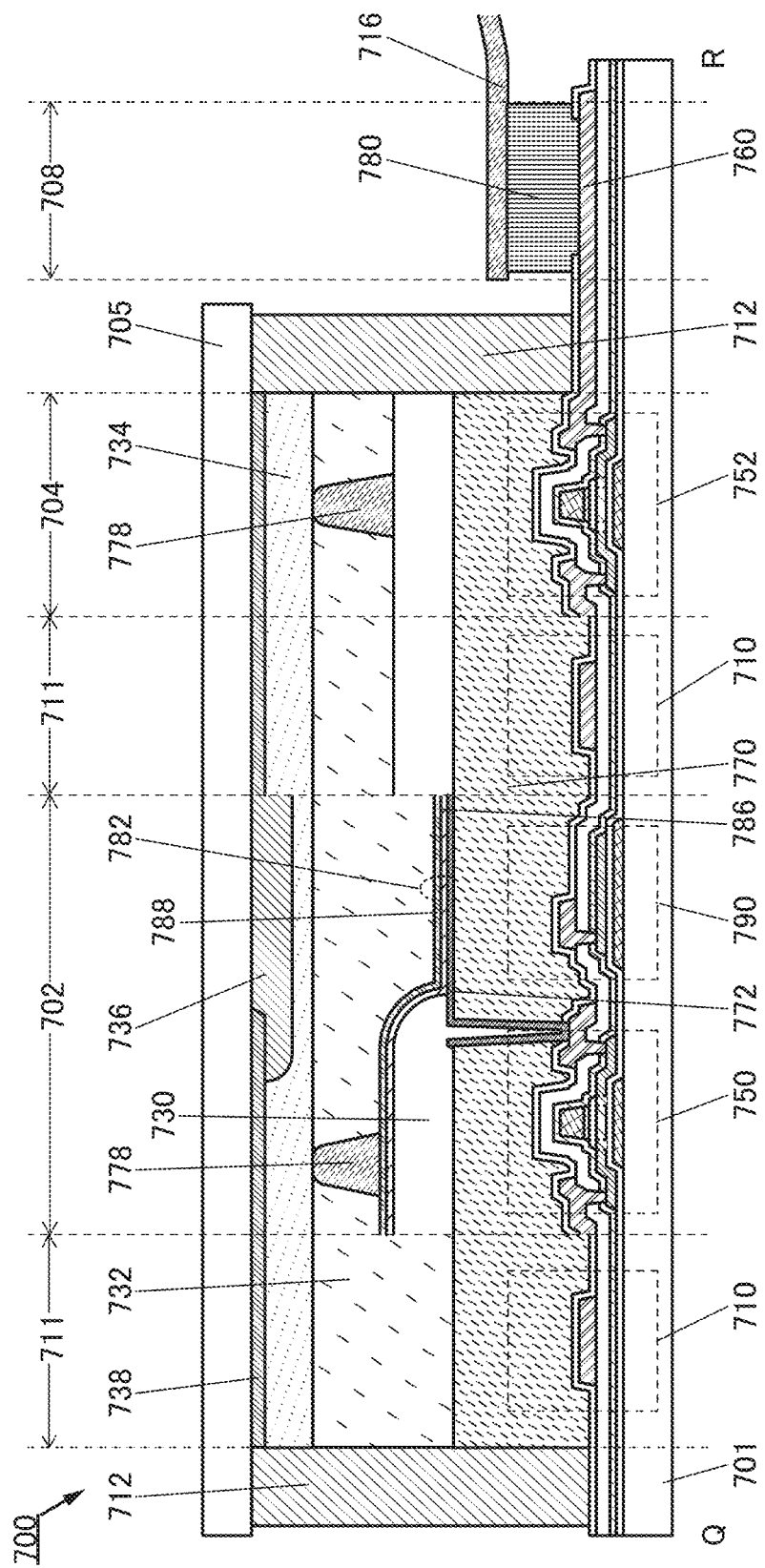
FIG. 18 is a cross-sectional view of a display device.
Figure 19:
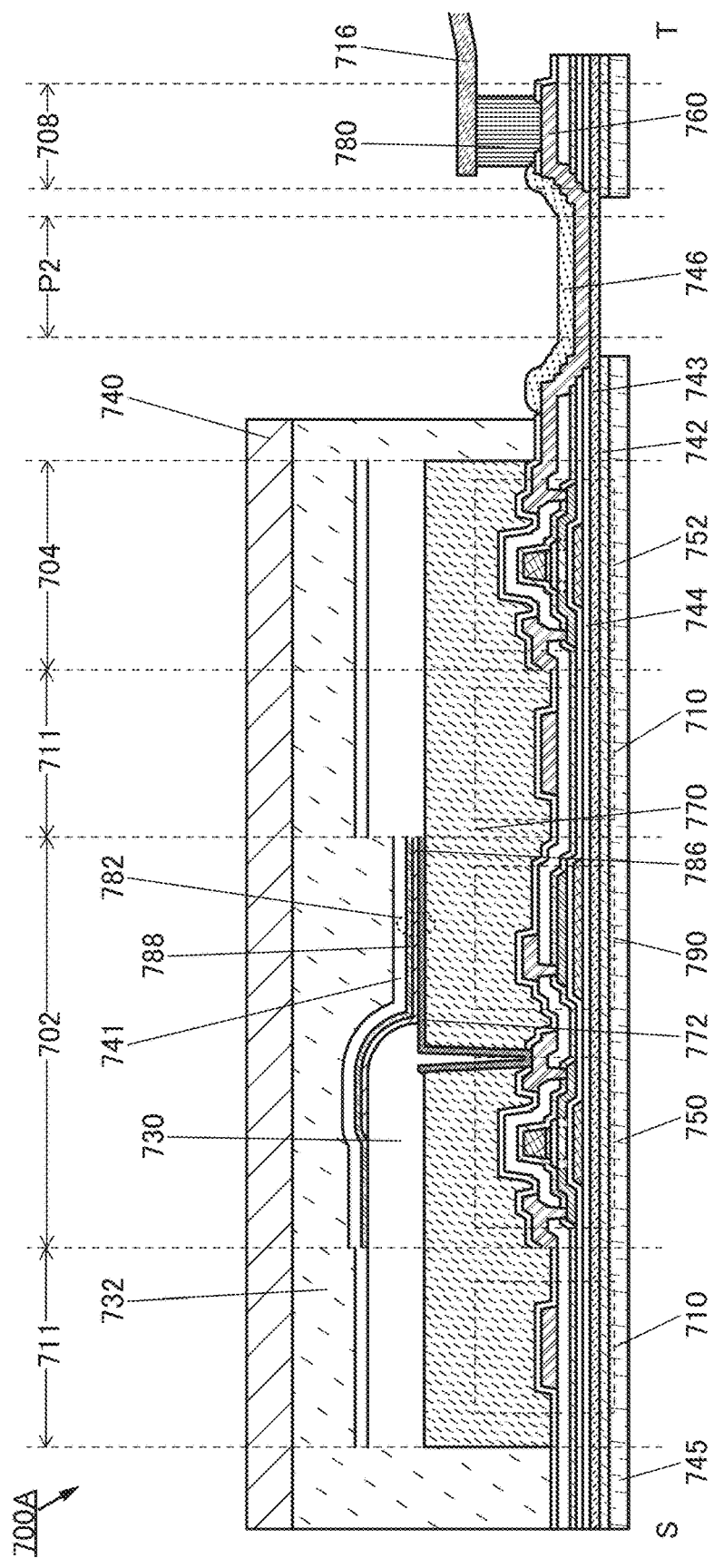
FIG. 19 is a cross-sectional view of a display device.

Structures using a liquid crystal element or an EL element as a display element are described below with reference to FIG. 16 to FIG. 19. Note that FIG. 16 to FIG. 18 are cross-sectional views along the dashed-dotted line Q-R in FIG. 15A. FIG. 19 is a cross-sectional view along the dashed-dotted line S-T in the display device 700A in FIG. 15B. FIG. 16 and FIG. 17 each show a structure using a liquid crystal element as a display element, and FIG. 18 and FIG. 19 each show a structure using an EL element.

[Description of Common Portions in Display Devices]

Display devices illustrated in FIG. 16 to FIG. 19 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 17 shows the case where the capacitor 790 is not provided.

The transistors exemplified in Embodiment 1 can be used as the transistor 750 and the transistor 752.

The transistor used in this embodiment includes a highly purified oxide semiconductor film in which formation of oxygen vacancies is suppressed. Such a transistor can have a low off-state current. Accordingly, an electrical signal such as an image signal can be held for a longer period, and the interval between writes of an image signal and the like can be set longer. As a result, the frequency of refresh operations can be reduced, resulting in an effect of reducing power consumption.

The transistor used in this embodiment can have comparatively high field-effect mobility and thus are capable of high-speed operation. For example, with the use of such a transistor capable of high-speed operation for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, when transistors capable of high-speed operation are used also in the pixel portion, a high-quality image can be provided.

The capacitor 790 illustrated in each of FIG. 16, FIG. 18, and FIG. 19 includes a lower electrode formed by processing the same film as a first gate electrode of the transistor 750 and an upper electrode formed by processing the same metal oxide as the semiconductor layer. The resistance of the upper electrode is reduced as that of a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

The transistor 750 included in the pixel portion 702 and the transistor 752 included in the source driver circuit portion 704 may have different structures. For example, a top-gate transistor may be used as one of the transistors and a bottom-gate transistor may be used as the other. Note that this description of the source driver circuit portion 704 is also applicable to the gate driver circuit portion 706.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

On the second substrate 705 side, a light-blocking film 738, a coloring film 736, and an insulating film 734 that is in contact with these films are provided.

Structure Example of Display Device Using Liquid Crystal Element

The display device 700 illustrated in FIG. 16 includes a liquid crystal element 775 and a spacer 778. The liquid crystal element 775 includes a conductive layer 772, a conductive layer 774, and a liquid crystal layer 776 positioned therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As the light-transmitting material, for example, an oxide material including indium, zinc, tin, or the like is preferably used. As the reflective material, for example, a material including aluminum, silver, or the like is preferably used.

When a reflective material is used for the conductive layer 772, the display device 700 is a reflective liquid crystal display device. Meanwhile, when a light-transmitting material is used for the conductive layer 772, the display device 700 is a transmissive liquid crystal display device. In the case of a reflective liquid crystal display device, a polarizing plate is provided on the viewer side. On the other hand, in the case of a transmissive liquid crystal display device, a pair of polarizing plates are provided such that the liquid crystal element is sandwiched therebetween.

The display device 700 illustrated in FIG. 17 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 17, a storage capacitor can be formed with a stacked-layer structure of the conductive layer 774, the insulating layer 773, and the conductive layer 772. Thus, another capacitor need not be provided, and thus the aperture ratio can be increased.

Although not illustrated in FIG. 16 and FIG. 17, an alignment film in contact with the liquid crystal layer 776 may be provided. An optical member (an optical substrate) such as a polarizing member, a retardation member, or an anti-reflection member and a light source such as a backlight or a side light can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case of employing a horizontal electric field mode, liquid crystal exhibiting a blue phase for which an alignment film is not used may be used.

The mode of the liquid crystal element can be a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

A scattering liquid crystal employing a polymer dispersed liquid crystal, a polymer network liquid crystal, or the like can be used for the liquid crystal layer 776. In this case, monochrome image display may be performed without providing the coloring film 736, or color display may be performed using the coloring film 736.

As a method for driving the liquid crystal element, a time-division display method (also referred to as a field-sequential driving method) by which color display is performed by a successive additive color mixing method may be used. In that case, a structure without the coloring film 736 can be employed. In the case where the time-division display method is employed, advantages such as an increase in the aperture ratio of pixels and an increase in definition because it is not necessary to provide subpixels that emit light of, for example, R (red), G (green), and B (blue).

[Display Device Using Light-Emitting Element]

The display device 700 illustrated in FIG. 18 includes a light-emitting element 782. The light-emitting element 782 includes the conductive layer 772, an EL layer 786, and a conductive film 788. The EL layer 786 includes an organic compound or an inorganic compound such as quantum dots.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material.

In the display device 700 illustrated in FIG. 18, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided at a position overlapping the light-emitting element 782, and the light-blocking film 738 is provided at a position overlapping the insulating film 730 and in the lead wiring portion 711 and the source driver circuit portion 704. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 19 illustrates a structure of a display device suitably applicable to a flexible display. FIG. 19 is a cross-sectional view along the dashed-dotted line S-T in the display device 700A shown in FIG. 15B.

The display device 700A illustrated in FIG. 19 has a structure in which a support substrate 745, a bonding layer 742, the resin layer 743, and an insulating layer 744 are stacked instead of the first substrate 701 in FIG. 18. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as a polyimide resin or an acrylic resin. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700 illustrated in FIG. 19 includes a protective layer 740 instead of the substrate 705 in FIG. 18. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided in an island shape over the insulating film 730 and the conductive layer 772. The EL layers 786 are formed separately so that respective subpixels emit light of different colors, whereby color display can be performed without use of the coloring film 736. A protection layer 741 is provided to cover the light-emitting element 782. The protection layer 741 has a function of preventing diffusion of impurities such as water into the light-emitting element 782. The protective layer 741 is preferably formed using an inorganic insulating film. It is further preferable to employ a stacked-layer structure including one or more inorganic insulating films and one or more organic insulating films.

FIG. 19 shows the region P2 that can be bent. The region P2 includes a portion where the support substrate 745, the adhesive layer 742, and the inorganic insulating film such as the insulating layer 744 are not provided. In the region P2, a resin layer 746 is provided to cover the wiring 760. When the bendable region P2 is provided with a minimum of an inorganic insulating film and has a structure in which only a conductive layer containing a metal or an alloy and a layer containing an organic material are stacked, a crack can be prevented from being caused at the time of folding. When the support substrate 745 is not provided in the region P2, part of the display device 700A can be bent with an extremely small radius of curvature.

Structure Example of Display Device Provided with Input Device

An input device may be provided in the display devices illustrated in FIG. 16 to FIG. 19. An example of the input device includes a touch sensor.

A variety of types such as a capacitive type, a resistive type, a surface acoustic wave type, an infrared type, an optical type, and a pressure-sensitive type can be used as the sensor type, for example. Alternatively, two or more of these types may be used in combination.

Examples of a touch panel structure include what is called an in-cell touch panel in which an input device is provided between a pair of substrates, what is called an on-cell touch panel in which an input device is formed over a display device, and what is called an out-cell touch panel in which an input device is attached to a display device.

At least part of the structure examples, the drawings corresponding thereto, and the like exemplified in this embodiment can be implemented in combination with the other structure examples, the other drawings, and the like as appropriate.

At least part of this embodiment can be implemented in appropriate combination with the other embodiments described in this specification.

Embodiment 3

In this embodiment, a display device that includes the semiconductor device of one embodiment of the present invention will be described with reference to FIG. 20.

Figure 20A:
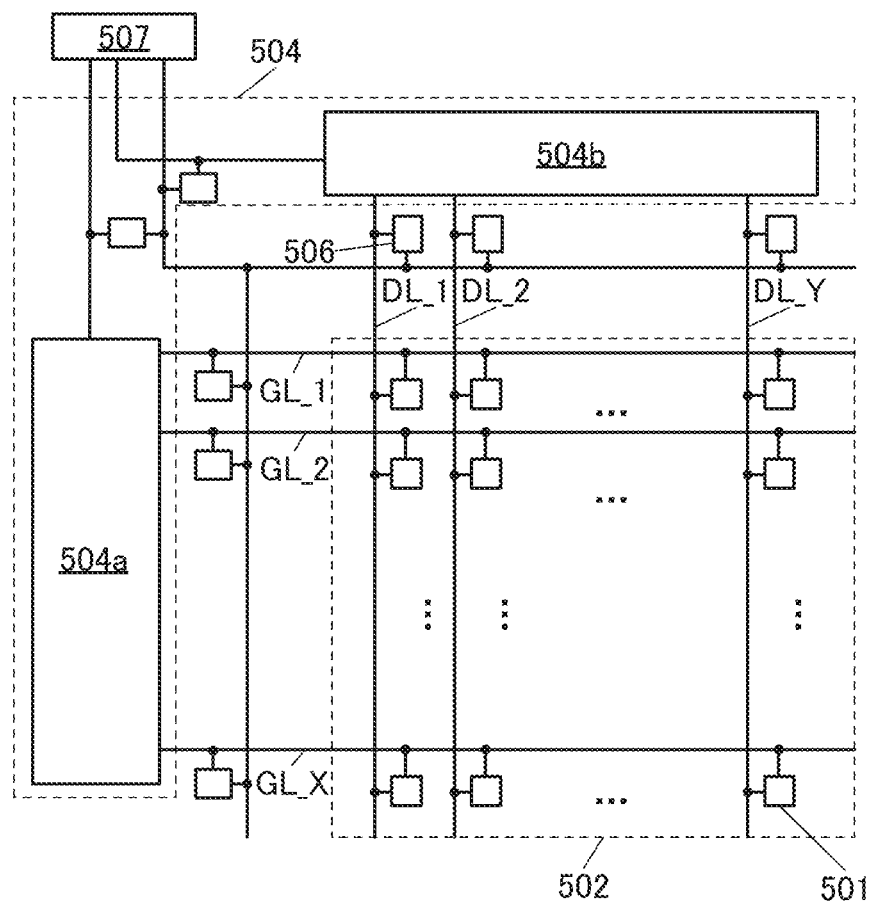
FIG. 20A is a block diagram of a display device.

A display device illustrated in FIG. 20A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scan signal to scan lines GL_1 to GL_X and a source driver 504b that supplies a data signal to data lines DL_1 to DL_Y. The gate driver 504a includes at least a shift register. The source driver 504b is configured using a plurality of analog switches, for example. Alternatively, the source driver 504b may be configured using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 20A is connected to a variety of wirings such as the scan lines GL_1 to GL_X that are wirings between the gate driver 504a and the pixel circuits 501 and the data lines DL_1 to DL_Y that are wirings between the source driver 504b and the pixel circuits 501, for example.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

Figure 20B:
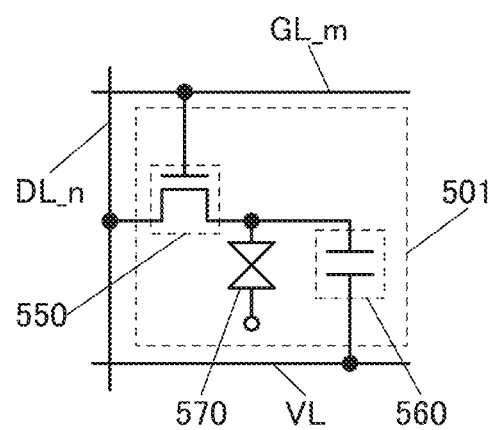
FIG. 20B and FIG. 20C are circuit diagrams of the display device.
Figure 20C:
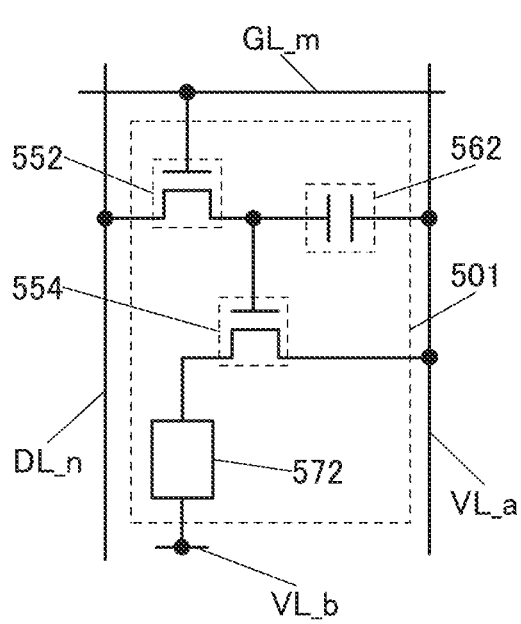

The plurality of pixel circuits 501 illustrated in FIG. 20A can have a configuration illustrated in FIG. 20B or FIG. 20C, for example.

The pixel circuit 501 illustrated in FIG. 20B includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state in the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 20C includes a transistor 552, a transistor 554, a capacitor 562, and a light-emitting element 572. The data line DL_n, the scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in appropriate combination with the other embodiments described in this specification.

Embodiment 4

A pixel circuit including a memory for correcting gray levels displayed by pixels and a display device including the pixel circuit will be described below. The transistor described in Embodiment 1 can be used as a transistor used in the pixel circuit described below.

<Circuit Configuration>

Figure 21A:
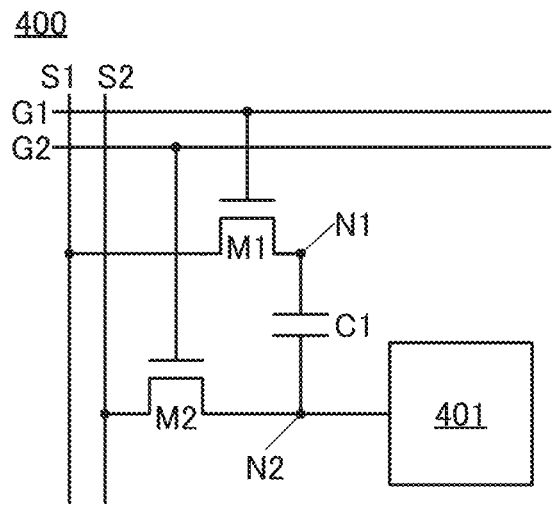
FIG. 21A, FIG. 21C, and FIG. 21D are circuit diagrams of a display device.

FIG. 21A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

Anode that connects the transistor M1 and the capacitor C1 is denoted as a node N1, and a node that connects the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Operation Method Example

Figure 21B:
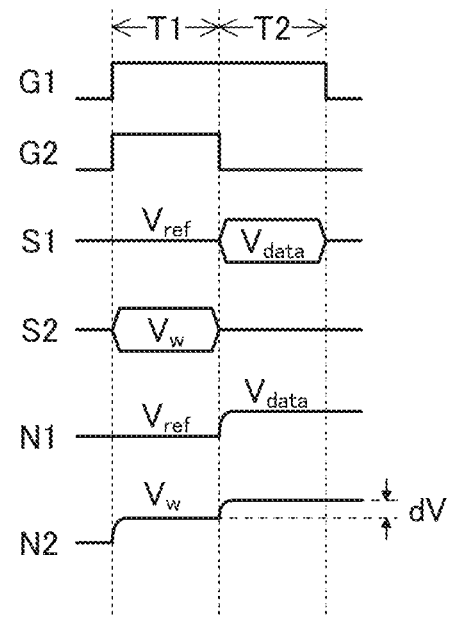
FIG. 21B is a timing chart of the display device.

Next, an example of a method of operating the pixel circuit 400 is described with reference to FIG. 21B. FIG. 21B is a timing chart of the operation of the pixel circuit 400. Note that for simplification of description, the influence of various kinds of resistance such as wiring resistance, parasitic capacitance of a transistor, a wiring, and the like, the threshold voltage of the transistor, and the like is not taken into account here.

In the operation shown in FIG. 21B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Thus, a potential difference $V_w-V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 by a potential dV in accordance with the second data potential $V_{data}$. That is, a potential that is the sum of the first data potential $V_w$ and the potential dV is input to the circuit 401. Note that although dV is shown as a positive value in FIG. 21B, dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high dynamic range (HDR) display or the like can be performed. In the case of using a liquid crystal element, overdriving or the like can be achieved.

Application Examples

Example Using Liquid Crystal Element

Figure 21C:
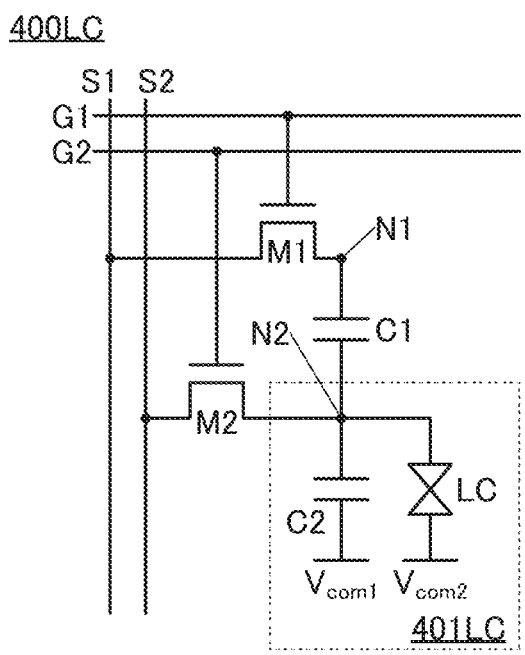

A pixel circuit 400LC illustrated in FIG. 21C includes a circuit 401LC. The circuit 401LC includes a liquid crystal element LC and a capacitor C2.

In the liquid crystal element LC, one electrode is connected to the other electrode of the capacitor C1, the other of the source and the drain of the transistor M2, and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with high driving voltage can be employed, for example. Moreover, by supply of a correction signal to the wiring S1 or the wiring S2, a gray level can be corrected in accordance with the operating temperature, the deterioration state of the liquid crystal element LC, or the like.

Example Using Light-Emitting Element

Figure 21D:
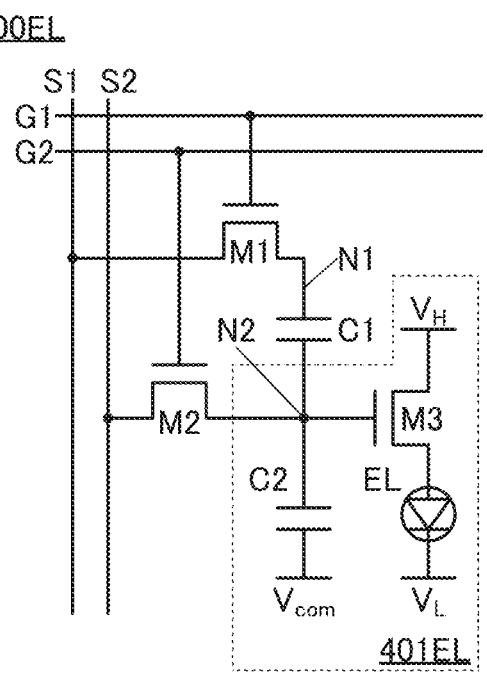

A pixel circuit 400EL illustrated in FIG. 21D includes a circuit 401EL. The circuit 401EL includes a light-emitting element EL, a transistor M3, and the capacitor C2.

In the transistor M3, a gate is connected to one electrode of the capacitor C2, one of a source and a drain is connected to a wiring supplied with a potential VH, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the configuration in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, variations in the electrical characteristics of the transistor M3 and the light-emitting element EL can be corrected by supply of a correction signal to the wiring S1 or the wiring S2.

Note that the configuration is not limited to the circuits shown in FIG. 21C and FIG. 21D, and a configuration to which a transistor, a capacitor, or the like is further added may be employed.

At least part of this embodiment can be implemented in appropriate combination with the other embodiments described in this specification.

Embodiment 5

In this embodiment, a display module that can be fabricated using one embodiment of the present invention will be described.

Figure 22A:
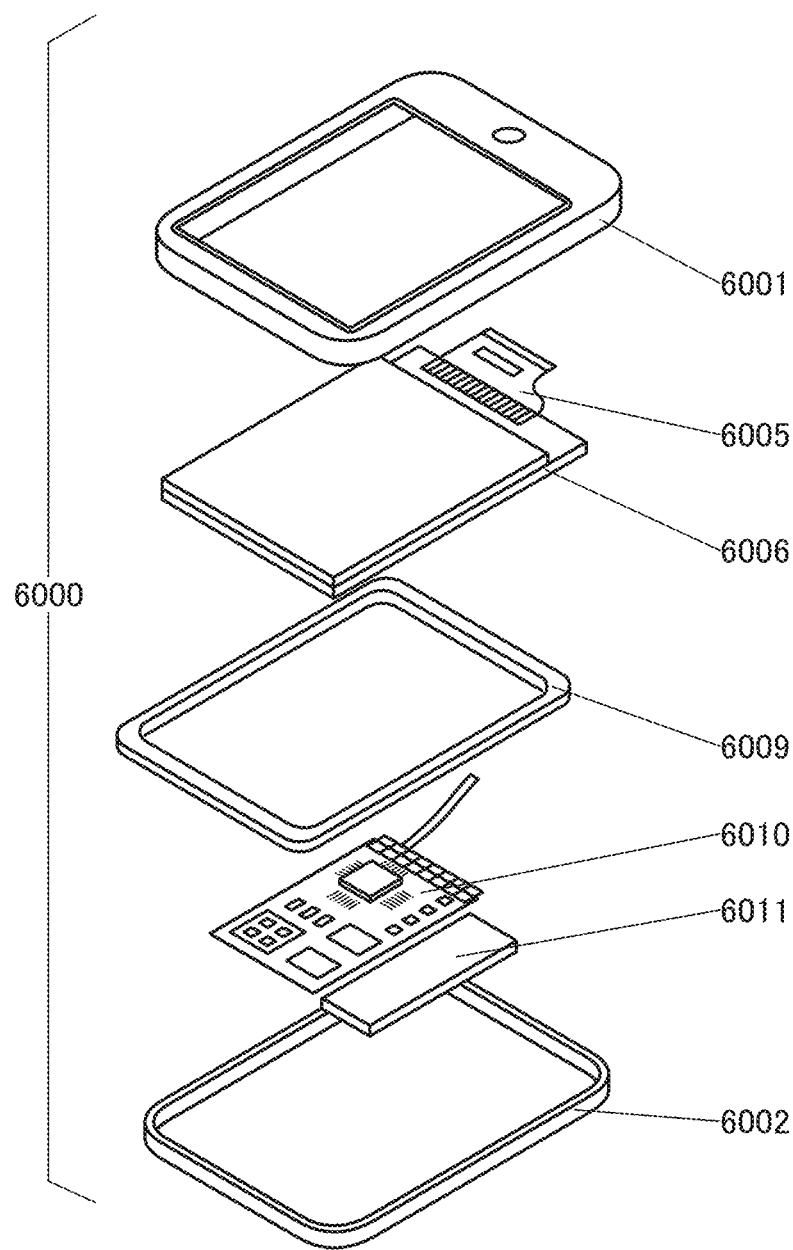
FIG. 22A illustrates a structure example of a display module.

In a display module 6000 illustrated in FIG. 22A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 22B:
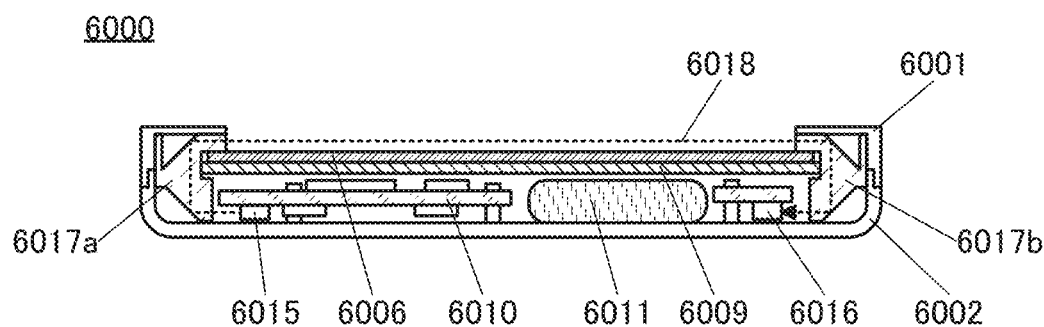
FIG. 22B is a schematic cross-sectional view of the display module.

FIG. 22B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in a region surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be favorably used.

With the use of the light guide portion 6017a and the light guide portion 6017b that transmit the light 6018, the light-emitting portion 6015 and the light-receiving portion 6016 can be placed under the display device 6006, and a malfunction of the touch sensor due to external light reaching the light-receiving portion 6016 can be inhibited. Particularly when a resin that absorbs visible light and transmits infrared rays is used, a malfunction of the touch sensor can be more effectively inhibited.

At least part of this embodiment can be implemented in appropriate combination with the other embodiments described in this specification.

Embodiment 6

In this embodiment, an example of an electronic device in which the display device of one embodiment of the present invention can be used will be described.

Figure 23A:
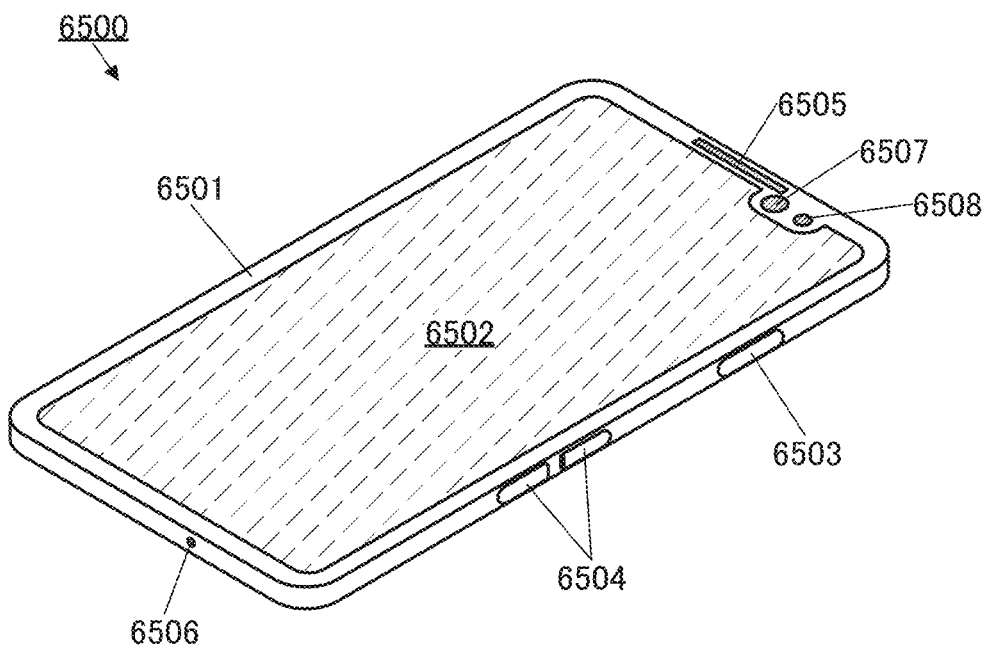
FIG. 23A illustrates a structure example of an electronic device.

An electronic device 6500 illustrated in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 23B:
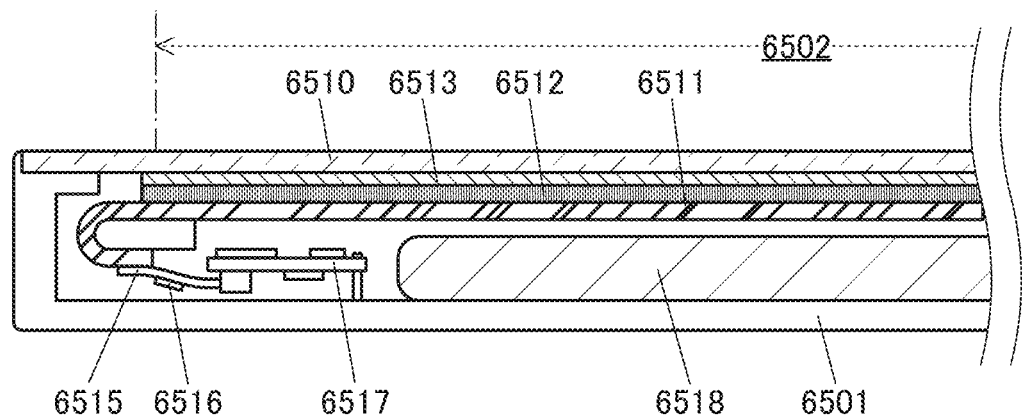
FIG. 23B is a schematic cross-sectional view of the electronic device.

FIG. 23B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not shown.

Part of the display panel 6511 is folded back in a region outside the display portion 6502. An FPC 6515 is connected to the bent part. An IC 6516 is mounted on the FPC 6515. The FPC 6515 is connected to a terminal provided on the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. An electronic device with a narrow frame can be obtained when part of the display panel 6511 is folded back so that the portion connected to the FPC 6515 is positioned on the rear side of a pixel portion.

At least part of this embodiment can be implemented in appropriate combination with the other embodiments described in this specification.

Embodiment 7

In this embodiment, electronic devices each including a display device manufactured using one embodiment of the present invention will be described.

Electronic devices exemplified below include the display device of one embodiment of the present invention in a display portion. Thus, the electronic device achieves high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

The electronic device using one embodiment of the present invention can be incorporated along a flat surface or a curved surface of an inside wall or an outside wall of a house or a building, an interior or an exterior of a car, or the like.

Figure 24A:
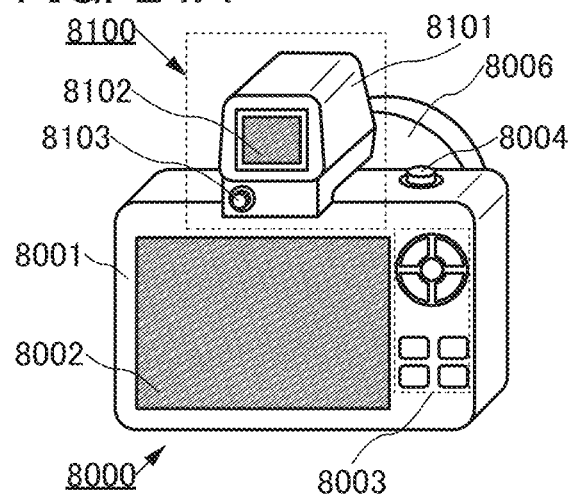
FIG. 24A, FIG. 24B, FIG. 24C, FIG. 24D, and FIG. 24E illustrate structure examples of electronic devices.

FIG. 24A is a diagram showing appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video and the like received from the camera 8000 on the display portion 8102.

The button 8103 has a function of a power button or the like.

The display device of one embodiment of the present invention can be used in the display portion 8002 of the camera 8000 and the display portion 8102 of the finder 8100. Note that a finder may be incorporated in the camera 8000.

Figure 24B:
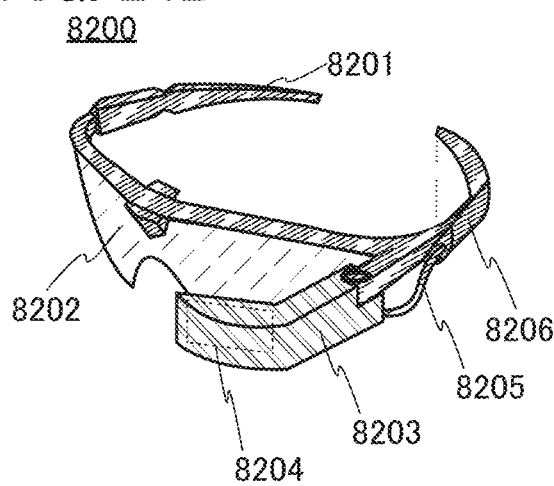

FIG. 24B is a diagram showing appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and data on the movement of the user's eyeball and eyelid can be used as an input means.

The mounting portion 8201 may include a plurality of electrodes capable of sensing current flowing in response to the movement of the user's eyeball in a position in contact with the user, to have a function of recognizing the user's line of sight. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used in the display portion 8204.

Figure 24C:
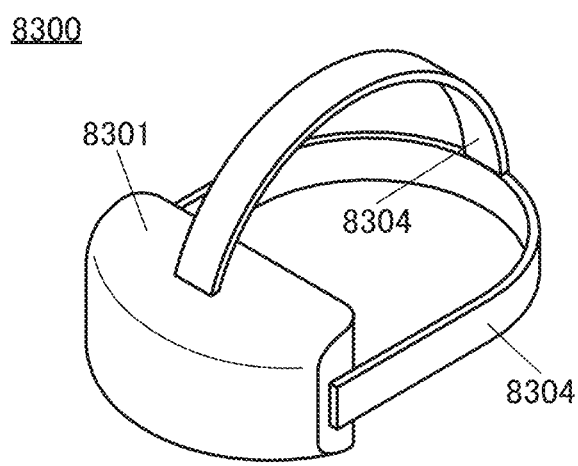
Figure 24D:
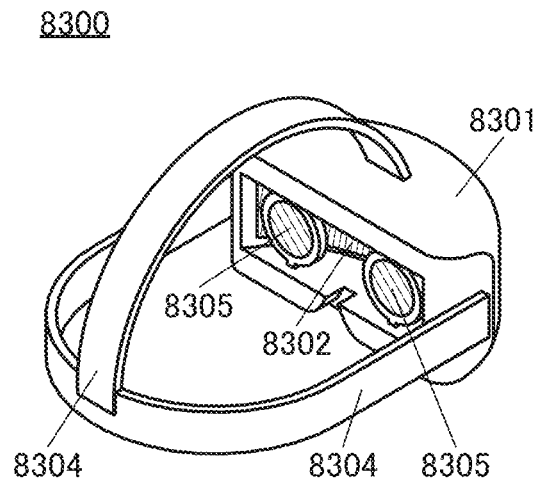
Figure 24E:
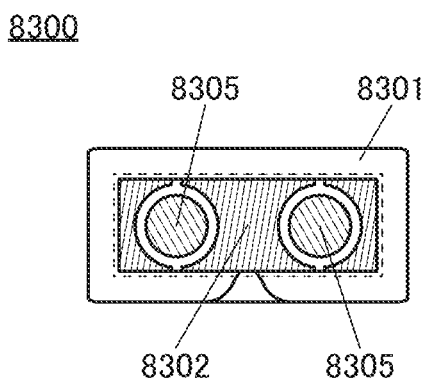

FIG. 24C, FIG. 24D, and FIG. 24E are diagrams showing appearance of a head-mounted display 8300. The head-mounted display 8300 includes a housing 8301, a display portion 8302, a band-shaped fixing unit 8304, and a pair of lenses 8305.

The user can see display on the display portion 8302 through the lenses 8305. Note that the display portion 8302 is preferably placed to be curved, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 24E, the user does not perceive pixels, and a more realistic video can be displayed.

Electronic devices illustrated in FIG. 25A to FIG. 25G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 25A to FIG. 25G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 25A to FIG. 25G are described below.

Figure 25A:
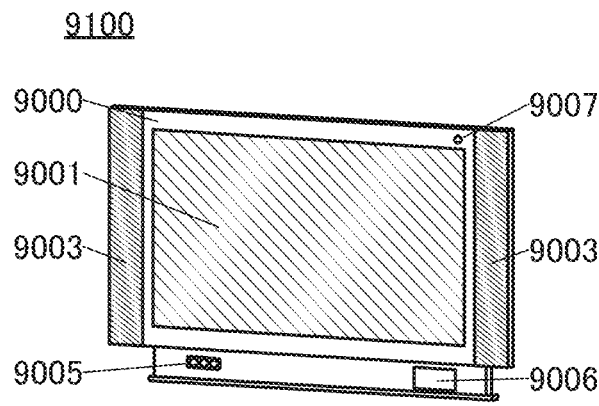
FIG. 25A, FIG. 25B, FIG. 25C, FIG. 25D, FIG. 25E, FIG. 25F, and FIG. 25G illustrate structure examples of electronic devices.

FIG. 25A is a perspective view showing a television device 9100. The television device 9100 can include the display portion 9001 having a large screen size of, for example, 50 inches or more, or 100 inches or more.

Figure 25D:
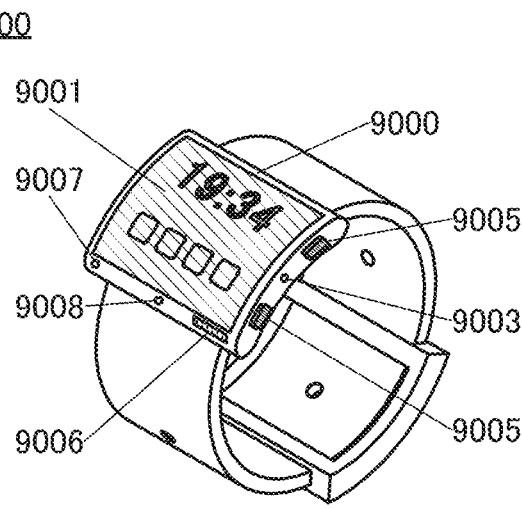
Figure 25B:
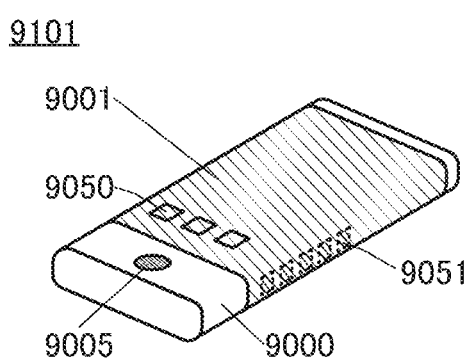

FIG. 25B is a perspective view showing a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters and image information on its plurality of surfaces. FIG. 25B shows an example in which three icons 9050 are displayed. Information 9051 indicated by dashed rectangles can be displayed on another surface of the display portion 9001. Examples of the information 9051 include notification of reception of an e-mail, a message of SNS, or an incoming call, the title and sender of an e-mail, a message of SNS, or the like, the date, the time, remaining battery, and the reception strength of an antenna. Alternatively, the icon 9050 or the like may be displayed at the position where the information 9051 is displayed.

Figure 25E:
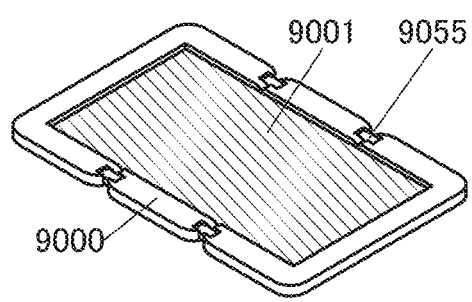
Figure 25C:
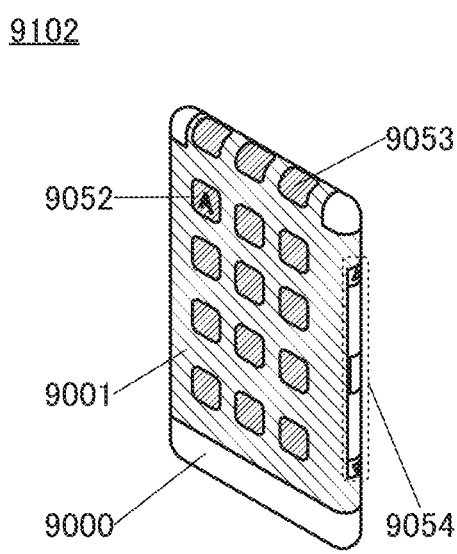

FIG. 25C is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 25D is a perspective view showing a watch-type portable information terminal 9200. The portable information terminal 9200 can be used as a smartwatch (registered trademark), for example. A display surface of the display portion 9001 is curved, and display can be performed along the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 25F:
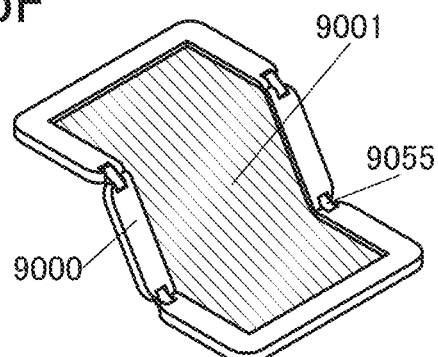
Figure 25G:
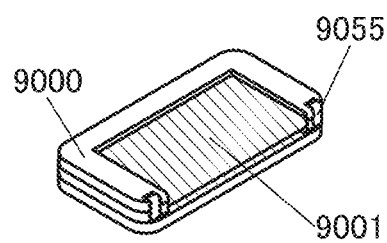

FIG. 25E, FIG. 25F, and FIG. 25G are perspective views showing a foldable portable information terminal 9201. FIG. 25E is a perspective view of an opened state of the portable information terminal 9201, FIG. 25G is a perspective view of a folded state thereof, and FIG. 25F is a perspective view of a state in the middle of change from one of FIG. 25E and FIG. 25G to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figure 26A:
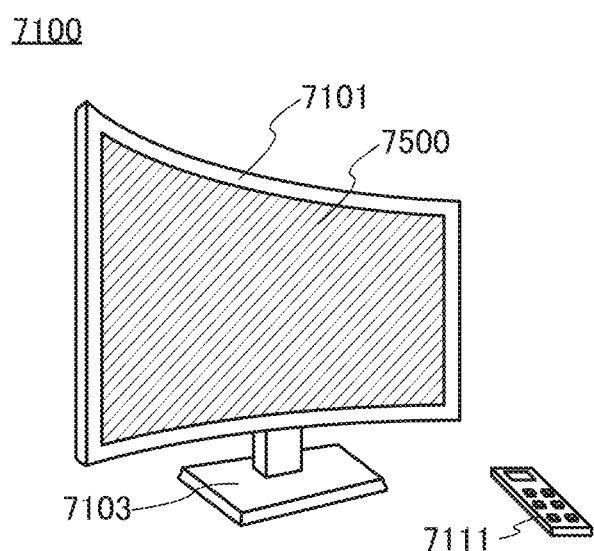
FIG. 26A, FIG. 26B, FIG. 26C, and FIG. 26D illustrate structure examples of electronic devices.

FIG. 26A illustrates an example of a television device. In a television device 7100, a display portion 7500 is incorporated in a housing 7101. Here, a structure in which the housing 7101 is supported by a stand 7103 is illustrated.

The television device 7100 illustrated in FIG. 26A can be operated with an operation switch provided in the housing 7101 or a separate remote controller 7111. Alternatively, a touch panel may be used for the display portion 7500, and the television device 7100 may be operated by touch on the touch panel. The remote controller 7111 may be provided with a display portion in addition to operation buttons.

Note that the television device 7100 may include a television receiver and a communication device for a network connection.

Figure 26B:
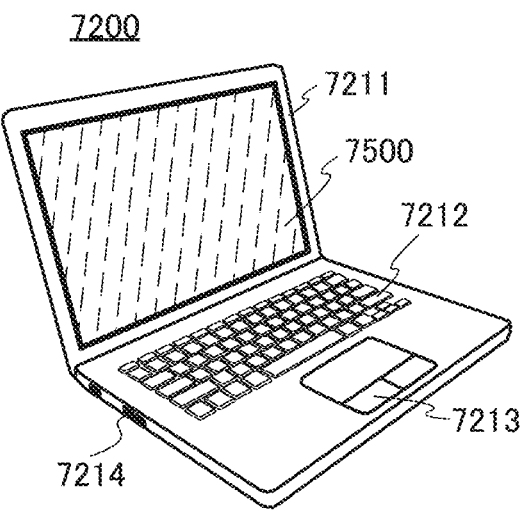

FIG. 26B illustrates a laptop personal computer 7200. The laptop personal computer 7200 includes a housing 7211, a keyboard 7212, a pointing device 7213, an external connection port 7214, and the like. The display portion 7500 is incorporated into the housing 7211.

Figure 26C:
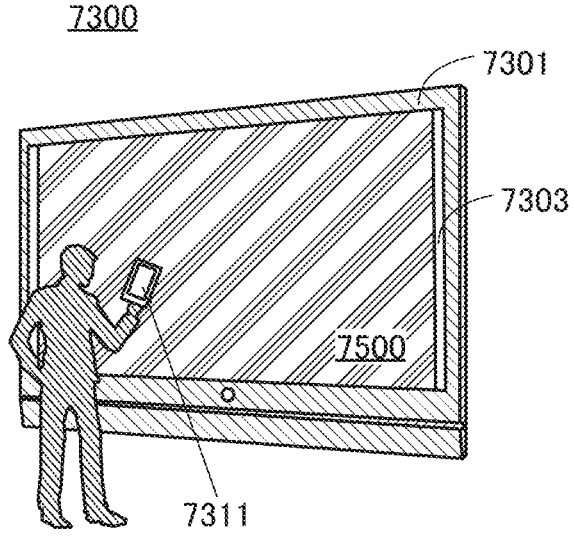
Figure 26D:
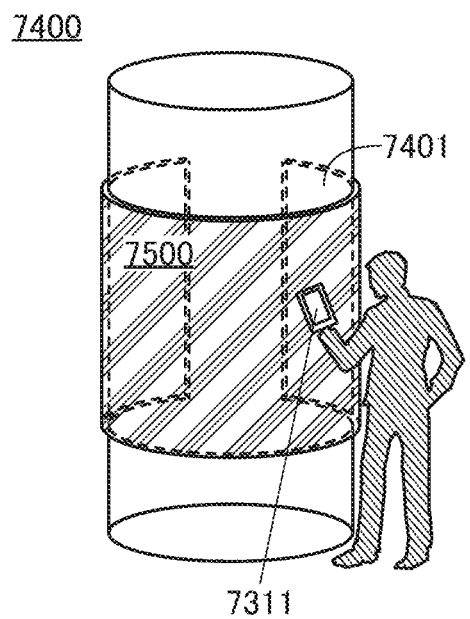

FIG. 26C and FIG. 26D illustrate examples of digital signage.

Digital signage 7300 illustrated in FIG. 26C includes a housing 7301, the display portion 7500, a speaker 7303, and the like. Furthermore, an LED lamp, operation keys (including a power switch or an operation switch), a connection terminal, a variety of sensors, a microphone, and the like can be included.

FIG. 26D illustrates digital signage 7400 mounted on a cylindrical pillar 7401. The digital signage 7400 includes the display portion 7500 provided along a curved surface of the pillar 7401.

A larger display portion 7500 can increase the amount of data that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIG. 26C and FIG. 26D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIG. 26A to FIG. 26D.

The electronic devices of this embodiment each include a display portion; however, one embodiment of the present invention can also be used in an electronic device without a display portion.

At least part of this embodiment can be implemented in appropriate combination with the other embodiments described in this specification.

Example 1

In this example, samples corresponding to the transistor 100C illustrated in FIG. 9 (a sample A1 to a sample A6) were fabricated, and the drain current-drain voltage characteristics (Id-Vd characteristics) of the transistors were evaluated.

<Sample Fabrication>

First, a 30-nm-thick titanium film and a 100-nm-thick copper film were formed in this order over a glass substrate by a sputtering method, and then processed to obtain a first gate electrode (bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order.

The first silicon nitride film and the third silicon nitride film were each deposited by a PECVD method using a mixed gas of a silane gas at a flow rate of 200 sccm, a nitrogen gas at a flow rate of 2000 sccm, and an ammonia gas at a flow rate of 100 sccm. The deposition pressure was 100 Pa, the deposition power was 2000 W, and the substrate temperature was 350° C. Note that the first silicon nitride film corresponds to the insulating layer 103a described in Embodiment 1, and the third silicon nitride film corresponds to the insulating layer 103c described in Embodiment 1.

The second silicon nitride film was deposited by a PECVD method using a mixed gas of a silane gas at a flow rate of 290 sccm, a nitrogen gas at a flow rate of 2000 sccm, and an ammonia gas at a flow rate of 2000 sccm. The deposition pressure was 200 Pa, the deposition power was 3000 W, and the substrate temperature was 350° C. Note that the second silicon nitride film corresponds to the insulating layer 103b described in Embodiment 1.

The first silicon oxynitride film was deposited by a PECVD method using a mixed gas of a silane gas at a flow rate of 20 sccm and a dinitrogen monoxide gas at a flow rate of 3000 sccm. The deposition pressure was 40 Pa, the deposition power was 3000 W, and the substrate temperature was 350° C. Note that the first silicon oxynitride film corresponds to the insulating layer 103d described in Embodiment 1.

Next, a 25-nm-thick first metal oxide film was deposited over the first silicon oxynitride film. The first metal oxide film was deposited by a sputtering method using an In—Ga—Zn oxide target (In:Ga:Zn=4:2:4.1 [atomic ratio]). The deposition pressure was 0.3 Pa, the power was 4.5 kW, and the substrate temperature was room temperature. A mixed gas of an oxygen gas and an argon gas was used as a deposition gas, and the proportion of the flow rate of the oxygen gas to the total flow rate of the deposition gas (hereinafter referred to as oxygen flow rate ratio) was 10%. Note that the film composition of a sample formed using a target having a composition of In:Ga:Zn=4:2:4.1 [atomic ratio] is around In:Ga:Zn=4:2:3 [atomic ratio].

Then, the first metal oxide film was processed into an island shape to form a first metal oxide layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, as a second gate insulating layer, a 5-nm-thick second silicon oxynitride film, a 130-nm-thick third silicon oxynitride film, and a 5-nm-thick fourth silicon oxynitride film were deposited in this order.

The second silicon oxynitride film was deposited by a PECVD method using a mixed gas of a silane gas at a flow rate of 24 sccm and a dinitrogen monoxide gas at a flow rate of 18000 sccm. The deposition pressure was 200 Pa, the deposition power was 130 W, and the substrate temperature was 350° C. Note that the second silicon oxynitride film corresponds to the insulating layer 110a described in Embodiment 1.

The third silicon oxynitride film was deposited by a PECVD method using a mixed gas of a silane gas at a flow rate of 200 sccm and a dinitrogen monoxide gas at a flow rate of 10000 sccm. The deposition pressure was 300 Pa, the deposition power was 750 W, and the substrate temperature was 350° C. Note that the third silicon oxynitride film corresponds to the insulating layer 110b described in Embodiment 1.

The fourth silicon oxynitride film was deposited by a PECVD method using a mixed gas of a silane gas at a flow rate of 20 sccm and a dinitrogen monoxide gas at a flow rate of 3000 sccm. The deposition pressure was 40 Pa, the deposition power was 500 W, and the substrate temperature was 350° C. Note that the fourth silicon oxynitride film corresponds to the insulating layer 110c described in Embodiment 1.

Subsequently, heat treatment was performed at 370° C. in a nitrogen atmosphere for one hour. An oven apparatus was used for the heat treatment.

Next, a 20-nm-thick second metal oxide film was deposited over the fourth silicon oxynitride film. The second metal oxide film was deposited by a sputtering method using an In—Ga—Zn oxide target (In:Ga:Zn=4:2:4.1 [atomic ratio]). The deposition pressure was 0.8 Pa, the power was 3.5 kW, and the substrate temperature was room temperature. An oxygen gas (oxygen flow rate ratio: 100%) was used as a deposition gas.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, over the second metal oxide film, a 10-nm-thick ITSO film and a 100-nm-thick copper film were deposited in this order. The ITSO film and the copper film were deposited by a sputtering method. The ITSO film was deposited using an ITSO target ($In_2O_3$:$SnO_2$:$SiO_2$=85:10:5 [weight ratio]). The copper film was deposited using a Cu target.

Next, a resist mask was formed over the copper film, and the second metal oxide film, the ITSO film, and the copper film were processed to form a second metal oxide layer, an ITSO layer, and a copper layer. A wet etching method was used for the processing. As an etchant, a chemical solution obtained by mixing two chemical solutions, a chemical solution A and a chemical solution B, at 5:1 [volume ratio] just before use was used. As the chemical solution A, an aqueous solution of phosphoric acid (lower than 5 weight %), hydrofluoric acid (lower than 1 weight %), nitric acid (lower than 10 weight %), and an additive (lower than 22 weight %) was used. As the chemical solution B, an aqueous solution of hydrogen peroxide (31 weight %) was used. The etchant temperature at the time of etching was 30° C.

The wet etching treatment time was varied between the sample A1 to the sample A6 to vary the widths L2 of their respective regions 108L. The wet etching treatment time for the sample A1 was 60 sec, the wet etching treatment time for the sample A2 was 75 sec, the wet etching treatment time for the sample A3 was 90 sec, the wet etching treatment time for the sample A4 was 105 sec, the wet etching treatment time for the sample A5 was 120 sec, and the wet etching treatment time for the sample A6 was 135 sec.

Then, cleaning was performed. For the cleaning, an aqueous solution in which 85 weight % phosphoric acid was diluted 500 times was used. The etchant temperature at the time of etching was room temperature, and the treatment time was 15 sec.

Next, the second silicon oxynitride film to the fourth silicon oxynitride film were processed using the aforementioned resist mask as a mask to form the second gate insulating layer. In addition, at the time of forming the second gate insulating layer, the first silicon oxynitride film in a region that is not overlapped by the resist mask was removed to expose part of the third silicon nitride film. A dry etching method was used for the processing. After that, the resist mask was removed.

Then, as a protective layer covering the transistor, a 100-nm-thick fourth silicon nitride film and a 300-nm-thick fifth silicon oxynitride film were deposited in this order.

The fourth silicon nitride film was deposited by a PECVD method using a mixed gas of a silane gas at a flow rate of 150 sccm, a nitrogen gas at a flow rate of 5000 sccm, and an ammonia gas at a flow rate of 100 sccm. The deposition pressure was 200 Pa, the deposition power was 2000 W, and the substrate temperature was 350° C.

The fifth silicon oxynitride film was deposited by a PECVD method using a mixed gas of a silane gas at a flow rate of 290 sccm and a dinitrogen monoxide gas at a flow rate of 4000 sccm. The deposition pressure was 133 Pa, the deposition power was 1000 W, and the substrate temperature was 350° C.

Next, an opening was formed in part of the protective layer covering the transistor, and a 30-nm-thick titanium film, a 100-nm-thick copper film, and a 50-nm-thick titanium film were deposited in this order by a sputtering method, and then processed to obtain a source electrode and a drain electrode. After that, an approximately 1.5-µm-thick acrylic resin film was formed as a planarization layer, and heat treatment was performed under the conditions of a temperature of 250° C. in a nitrogen atmosphere for one hour.

Through the above steps, the transistors each formed over the glass substrate (the sample A1 to the sample A6) were obtained.

<Id-Vd Characteristics Evaluation>

Next, the Id-Vd characteristics of the transistors fabricated as above were measured.

The Id-Vd characteristics of the transistors were measured in such a manner that the source potential was set to a ground potential (GND) and the drain voltage (Vd) was swept from 0 V to 30 V in increments of 0.25 V. The Id-Vd measurements were successively performed on the same transistor under four conditions where the gate voltage (Vg) was 0 V, 2 V, 4 V, and 6 V. The transistor having a channel length of 3 µm and a channel width of 10 µm was used.

Figure 27:
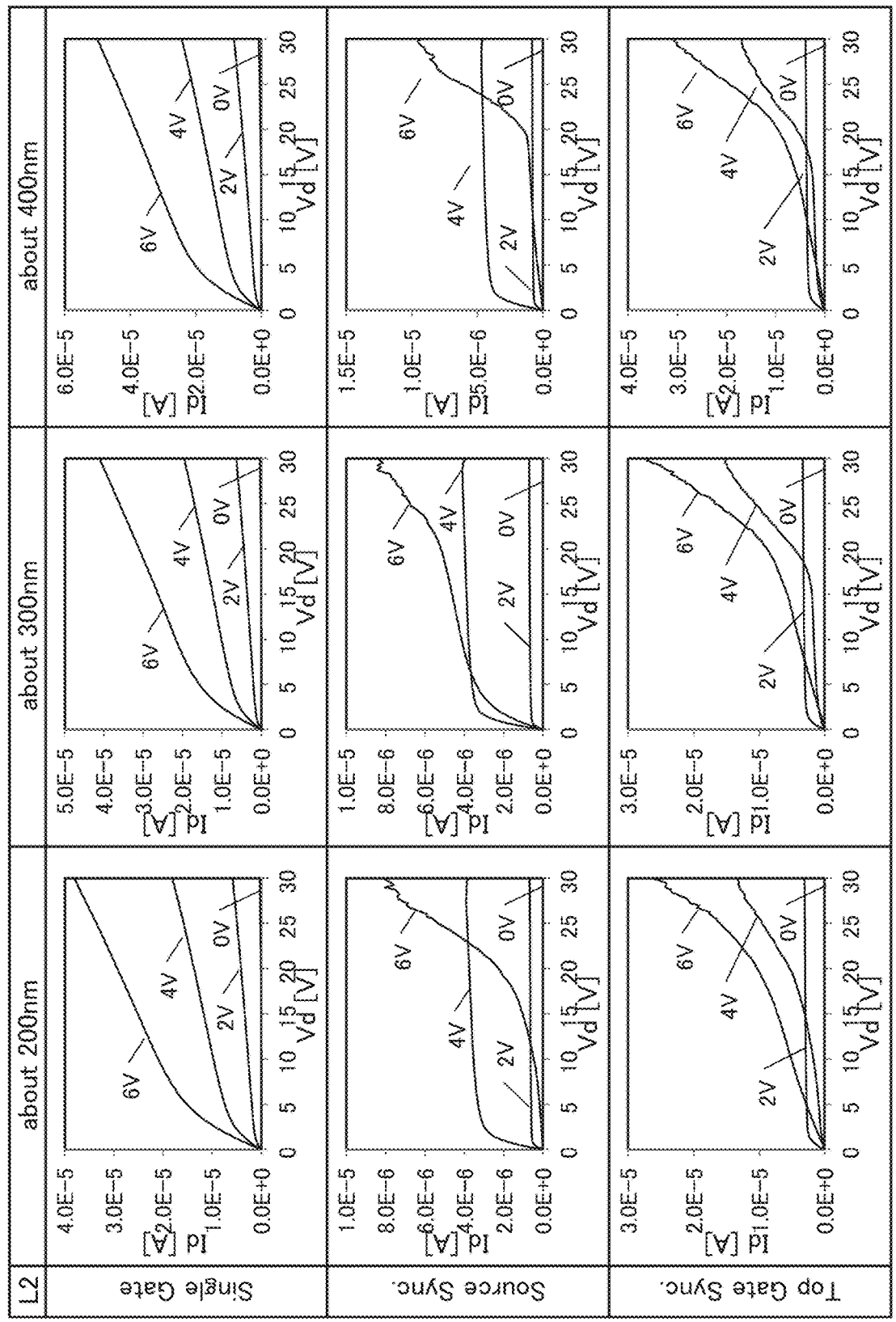
FIG. 27 is a diagram showing Id-Vd characteristics of transistors.
Figure 28:
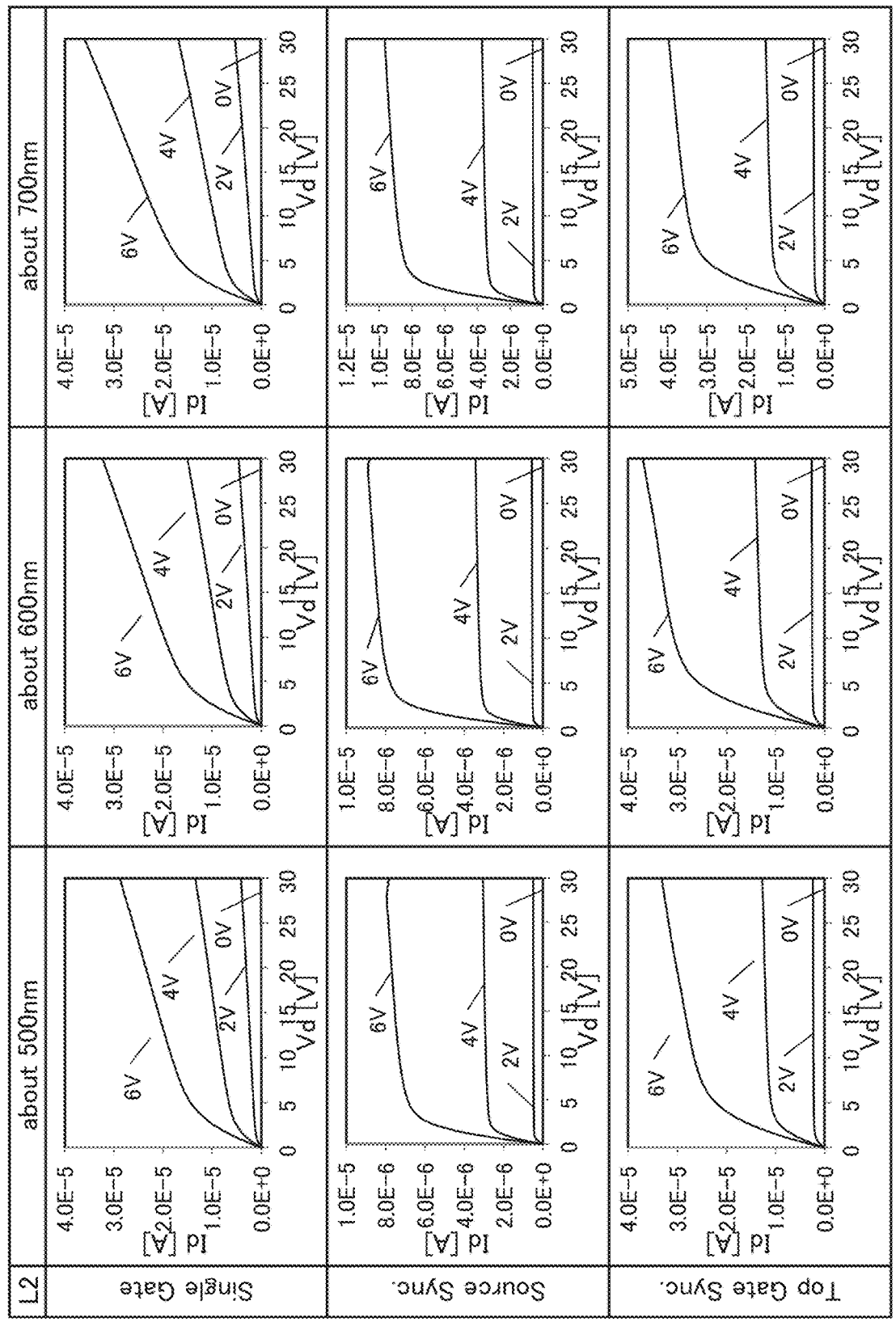
FIG. 28 is a diagram showing Id-Vd characteristics of transistors.

FIG. 27 and FIG. 28 show the Id-Vd characteristics of the sample A1 to the sample A6. In FIG. 27 and FIG. 28, the horizontal axis represents drain voltage (Vd) and the vertical axis represents drain current (Id).

FIG. 27 and FIG. 28 show the results of the sample A1 to the sample A6 in the horizontal direction. Note that the sample A1 had a width L2 of about 200 nm, the sample A2 had a width L2 of about 300 nm, the sample A3 had a width L2 of about 400 nm, the sample A4 had a width L2 of about 500 nm, the sample A5 had a width L2 of about 600 nm, and the sample A6 had a width L2 of about 700 nm.

FIG. 27 and FIG. 28 show different transistor structure conditions in the vertical direction. The Single Gate row shows the results obtained through the Id-Vd measurement performed on the transistor without the conductive layer 106 by application of the gate voltage (Vg) to the conductive layer 112. The Source Sync. row shows the results obtained through the Id-Vd measurement performed on the transistor with the conductive layer 106 by electrically connecting the conductive layer 106 (bottom gate electrode) to the source electrode (GND) and applying the gate voltage (Vg) to the conductive layer 112 (top gate electrode). The Top Gate Sync. row shows the results obtained through the Id-Vd measurement performed on the transistor with the conductive layer 106 by electrically connecting the conductive layer 106 (bottom gate electrode) to the conductive layer 112 (top gate electrode) and applying the gate voltage (Vg) to the conductive layer 112 (top gate electrode).

As shown in FIG. 27 and FIG. 28, in the Single Gate row, Id-Vd characteristics were favorable in each condition. In the Source Sync. and Top Gate Sync. rows, a decrease in the on-state current was observed with a width L2 of about 200 nm, about 300 nm, and about 400 nm, whereas a decrease in the on-state current was not observed and favorable Id-Vd characteristics were exhibited with a width L2 of about 500 nm or greater. It was found that increasing the width L2 can inhibit a decrease in the on-state current in the case where a high drain voltage is applied.

Example 2

In this example, samples corresponding to the region 108C, the region 108L, and the region 108N illustrated in FIG. 2 (a sample B1 to a sample B3) were fabricated, and the resistance of the region 108C, the region 108L, and the region 108N was evaluated. The sample B1 corresponds to the region 108C, the sample B2 corresponds to the region 108L, and the sample B3 corresponds to the region 108N.

<Sample Fabrication: Sample B1>

First, a 25-nm-thick first metal oxide film was deposited over a glass substrate. The first metal oxide film was deposited by a sputtering method using an In—Ga—Zn oxide target (In:Ga:Zn=4:2:4.1 [atomic ratio]). The deposition pressure was 0.6 Pa, the power was 2.5 kW, and the substrate temperature was room temperature. A mixed gas of an oxygen gas and an argon gas was used as a deposition gas, and the oxygen flow rate ratio was 10%.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, a 5-nm-thick first silicon oxynitride film, a 130-nm-thick second silicon oxynitride film, and a 5-nm-thick third silicon oxynitride film were deposited in this order.

The first silicon oxynitride film was deposited by a PECVD method using a mixed gas of a silane gas at a flow rate of 24 sccm and a dinitrogen monoxide gas at a flow rate of 18000 sccm. The deposition pressure was 200 Pa, the deposition power was 130 W, and the substrate temperature was 350° C.

The second silicon oxynitride film was deposited by a PECVD method using a mixed gas of a silane gas at a flow rate of 200 sccm and a dinitrogen monoxide gas at a flow rate of 10000 sccm. The deposition pressure was 300 Pa, the deposition power was 750 W, and the substrate temperature was 350° C.

The third silicon oxynitride film was deposited by a PECVD method using a mixed gas of a silane gas at a flow rate of 20 sccm and a dinitrogen monoxide gas at a flow rate of 3000 sccm. The deposition pressure was 40 Pa, the deposition power was 500 W, and the substrate temperature was 350° C.

Subsequently, heat treatment was performed at 370° C. in a nitrogen atmosphere for one hour. An oven apparatus was used for the heat treatment.

Next, a 20-nm-thick second metal oxide film was deposited over the third silicon oxynitride film. The second metal oxide film was deposited by a sputtering method using an In—Ga—Zn oxide target (In:Ga:Zn=4:2:4.1 [atomic ratio]). The deposition pressure was 0.8 Pa, the power was 3.5 kW, and the substrate temperature was room temperature. An oxygen gas (oxygen flow rate ratio: 100%) was used as a deposition gas.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, over the second metal oxide film, a 10-nm-thick ITSO film and a 100-nm-thick copper film were deposited in this order. The ITSO film and the copper film were deposited by a sputtering method. The ITSO film was deposited using an ITSO target ($In_2O_3:SnO_2:SiO_2$=85:10:5 [weight ratio]). The copper film was deposited using a Cu target.

Next, a 100-nm-thick silicon nitride film was deposited.

The silicon nitride film was deposited by a PECVD method using a mixed gas of a silane gas at a flow rate of 150 sccm, a nitrogen gas at a flow rate of 5000 sccm, and an ammonia gas at a flow rate of 100 sccm. The deposition pressure was 200 Pa, the deposition power was 2000 W, and the substrate temperature was 350° C.

Next, the silicon nitride film, the copper film, the ITSO film, and the second metal oxide film were removed to expose the third silicon oxynitride film.

Then, an opening that reached the first metal oxide film was formed in the first silicon oxynitride film, the second silicon oxynitride film, and the third silicon oxynitride film, and a terminal was provided.

<Sample Fabrication: Sample B2>

First, a first metal oxide film, a first silicon oxynitride film, a second silicon oxynitride film, a third silicon oxynitride film, a second metal oxide film, an ITSO film, and a copper film were formed over a glass substrate. The description of <Sample fabrication: Sample B1> can be referred to for the steps up to the formation of the copper film; therefore, the detailed description is omitted.

Then, the copper film, the ITSO film, and the second metal oxide film were removed to expose the third silicon oxynitride film.

Next, a 100-nm-thick silicon nitride film was deposited.

The silicon nitride film was deposited by a PECVD method using a mixed gas of a silane gas at a flow rate of 150 sccm, a nitrogen gas at a flow rate of 5000 sccm, and an ammonia gas at a flow rate of 100 sccm. The deposition pressure was 200 Pa, the deposition power was 2000 W, and the substrate temperature was 350° C.

Then, an opening that reached the first metal oxide film was formed in the first silicon oxynitride film, the second silicon oxynitride film, the third silicon oxynitride film, and the silicon nitride film, and a terminal was provided.

<Sample Fabrication: Sample B3>

First, a first metal oxide film, a first silicon oxynitride film, a second silicon oxynitride film, a third silicon oxynitride film, a second metal oxide film, an ITSO film, and a copper film were formed over a glass substrate. The description of <Sample fabrication: Sample B1> can be referred to for the steps up to the formation of the copper film; therefore, the detailed description is omitted.

Subsequently, the copper film, the ITSO film, the second metal oxide film, the first silicon oxynitride film, the second silicon oxynitride film, and the third silicon oxynitride film were removed to expose the first metal oxide film.

Next, a 100-nm-thick silicon nitride film was deposited.

The silicon nitride film was deposited by a PECVD method using a mixed gas of a silane gas at a flow rate of 150 sccm, a nitrogen gas at a flow rate of 5000 sccm, and an ammonia gas at a flow rate of 100 sccm. The deposition pressure was 200 Pa, the deposition power was 2000 W, and the substrate temperature was 350° C.

Then, an opening that reached the first metal oxide film was formed in the silicon nitride film, and a terminal was provided.

<Sheet Resistance Measurement>

Next, the sheet resistance of each sample fabricated as above was measured to evaluate the resistance of the first metal oxide film.

Figure 29:
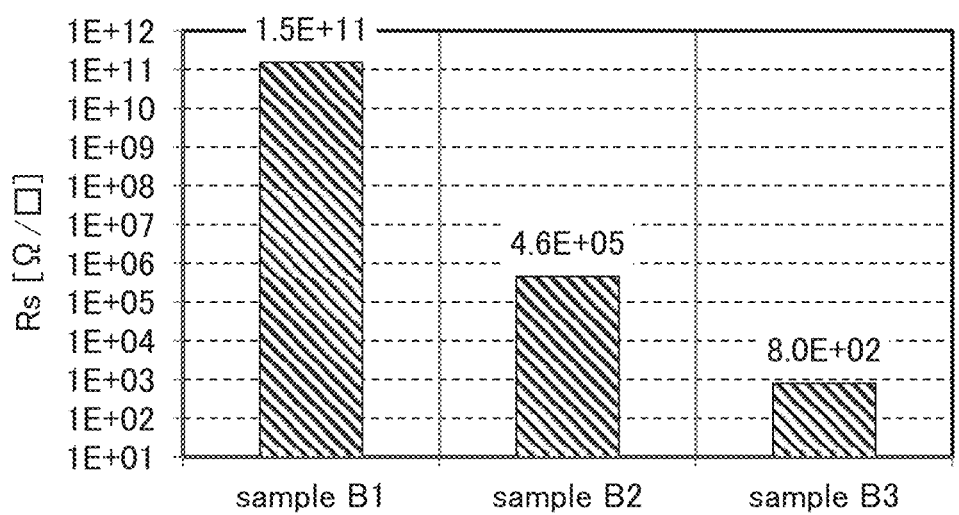
FIG. 29 is a diagram showing the resistance of metal oxide films.

FIG. 29 shows the values of the sheet resistance of the sample B1 to the sample B3. In FIG. 29, the sample names are on the horizontal axis, and the vertical axis represents sheet resistance Rs.

As shown in FIG. 29, the sheet resistance of the sample B1 corresponding to the region 108C was approximately $1.5 \times 10^{11}$ Ω/square. The sheet resistance of the sample B2 corresponding to the region 108L was $4.6 \times 10^5$ Ω/square. The sheet resistance of the sample B3 corresponding to the region 108N was $8.0 \times 10^2$ Ω/square.

Example 3

In this example, samples corresponding to the transistor 100A illustrated in FIG. 5 (a sample C1 and a sample C2) were fabricated, and their cross-sectional shapes were evaluated.

<Sample Fabrication>

First, a 30-nm-thick titanium film and a 100-nm-thick copper film were formed in this order over a glass substrate by a sputtering method, and then processed to obtain a first gate electrode (bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order. The description in Example 1 can be referred to for the first silicon nitride film to the third silicon nitride film and the first silicon oxynitride film; therefore, the detailed description is omitted.

Subsequently, a 25-nm-thick first metal oxide film was deposited over the first silicon oxynitride film. The description in Example 1 can be referred to for the first metal oxide film; thus, the detailed description is omitted.

Then, the first metal oxide film was processed into an island shape to form a first metal oxide layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, as a second gate insulating layer, a 5-nm-thick second silicon oxynitride film, a 130-nm-thick third silicon oxynitride film, and a 5-nm-thick fourth silicon oxynitride film were deposited in this order. The description in Example 1 can be referred to for the second silicon oxynitride film to the fourth silicon oxynitride film; therefore, the detailed description is omitted.

Subsequently, heat treatment was performed at 370° C. in a nitrogen atmosphere for one hour. An oven apparatus was used for the heat treatment.

Next, a 20-nm-thick second metal oxide film was deposited over the fourth silicon oxynitride film. The description in Example 1 can be referred to for the second metal oxide film; therefore, the detailed description is omitted.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, over the second metal oxide film, a 10-nm-thick ITSO film and a 100-nm-thick copper film were deposited in this order. The description in Example 1 can be referred to for the ITSO film and the copper film; thus, the detailed description is omitted.

Next, a resist mask was formed over the copper film, and the second metal oxide film, the ITSO film, and the copper film were processed to form a second metal oxide layer, an ITSO layer, and a copper layer. A wet etching method was used for the processing. The description in Example 1 can be referred to for the etchant; thus, the detailed description is omitted. The wet etching time was 60 sec.

Then, the second silicon oxynitride film to the fourth silicon oxynitride film were processed using the aforementioned resist mask as a mask to form the second gate insulating layer. A dry etching method was used for the processing. Here, dry etching conditions were varied between the sample C1 and the sample C2.

For the sample C1, $C_4F_8$ was used as the etching gas. The ICP high-frequency power was 6000 W, the Bias high-frequency power was 1000 W, the pressure was 0.67 Pa, the $C_4F_8$ gas flow rate was 100 sccm, the etching time was 140 sec, and the lower electrode temperature was 10° C.

For the sample C2, $CF_4$ was used as the etching gas. The ICP high-frequency power was 6000 W, the Bias high-frequency power was 750 W, the pressure was 0.67 Pa, the $CF_4$ gas flow rate was 100 sccm, the etching time was 112 sec, and the lower electrode temperature was 10° C.

Next, the resist mask was removed.

Then, as a protective layer covering the transistor, a 100-nm-thick fourth silicon nitride film and a 300-nm-thick fifth silicon oxynitride film were deposited in this order. The description in Example 1 can be referred to for the fourth silicon nitride film and the fifth silicon oxynitride film; therefore, the detailed description is omitted.

Next, an opening was formed in part of the protective layer covering the transistor, and a 30-nm-thick titanium film, a 100-nm-thick copper film, and a 50-nm-thick titanium film were deposited in this order by a sputtering method, and then processed to obtain a source electrode and a drain electrode. After that, an approximately 1.5-μm-thick acrylic resin was applied as a planarization layer, and heat treatment was performed under the conditions of a temperature of 250° C. in a nitrogen atmosphere for one hour.

Through the above steps, the transistors each formed over the glass substrate (the sample C1 and the sample C2) were obtained.

<Cross-Sectional Observation>

Next, the sample C1 and the sample C2 were thinned by a focused ion beam (FIB), and cross sections of the sample C1 and the sample C2 were observed with a STEM.

<Etching Rate Evaluation>

Regarding the dry etching conditions used in etching of the second silicon oxynitride film to the fourth silicon oxynitride film in fabrication of the sample C1 and the sample C2, the etching rates were evaluated.

Table 1 lists the etching rates. In Table 1, the upper row shows the etching rates with the $C_4F_8$ gas used for fabricating the sample C1, and the lower row shows the etching rate with the $CF_4$ gas used for fabricating the sample C2. Furthermore, types of films to be etched are shown in the horizontal direction. SiON indicates a silicon oxynitride film, SiN indicates a silicon nitride film, IGZO indicates a metal oxide film, and PR indicates a resist film.

TABLE 1

| | SiON [nm/min] | SiN [nm/min] | IGZO [nm/min] | PR [nm/min] |
| --- | --- | --- | --- | --- |
| $C_4F_8$ | 104 | 70 | 1 | 54 |
| $CF_4$ | 119 | 98 | 3 | 118 |

Figure 30A:
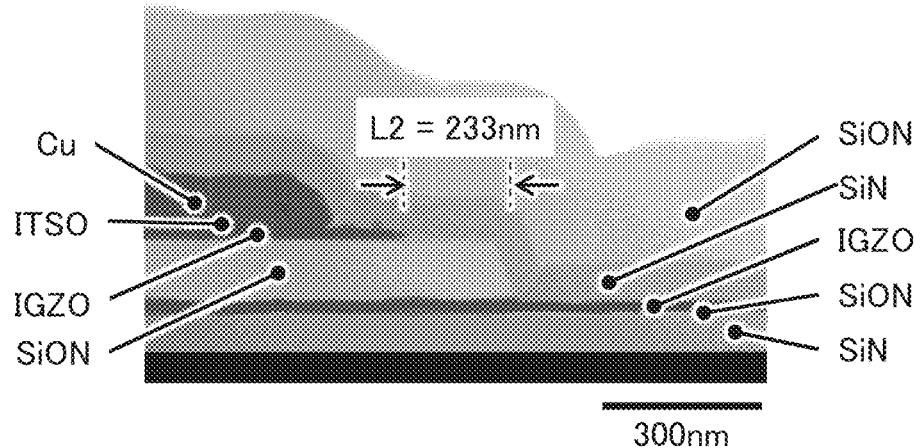
FIG. 30A and FIG. 30B are cross-sectional STEM images.
Figure 30B:
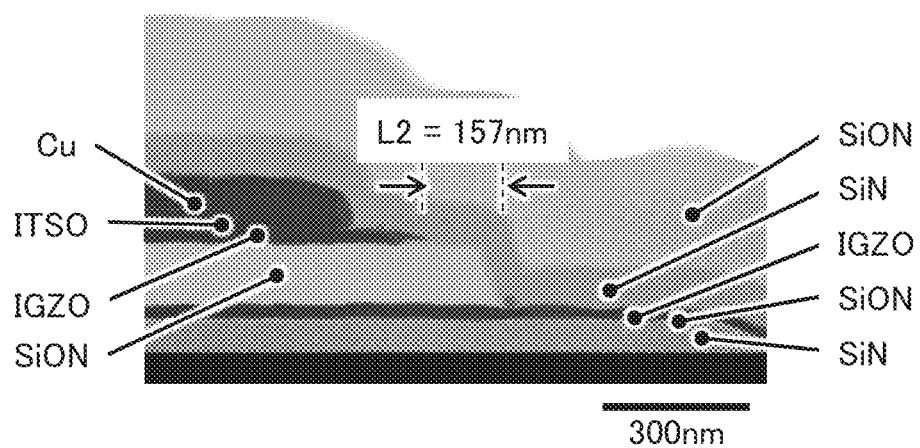
Figure 31:
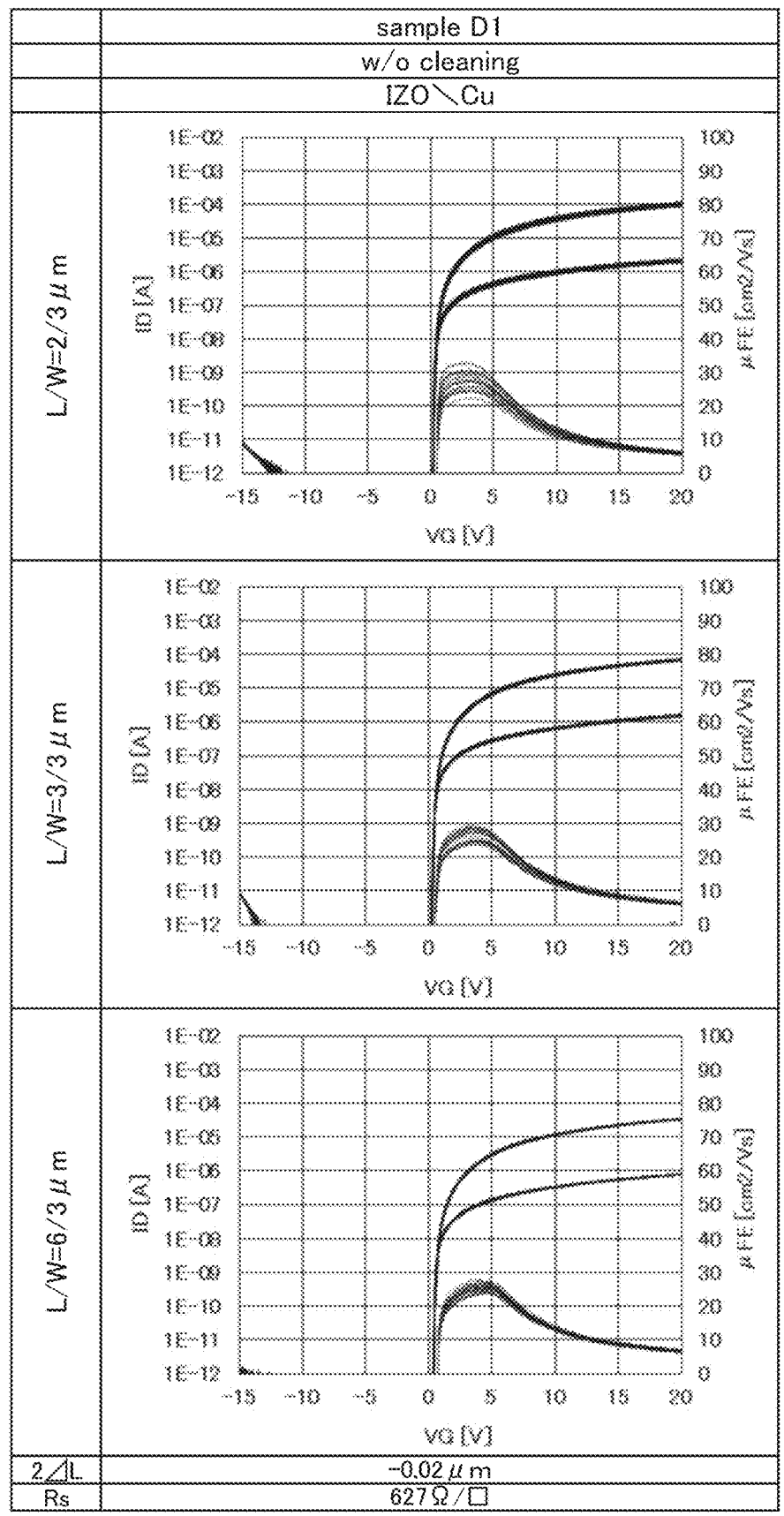
FIG. 31 is a diagram showing Id-Vg characteristics of transistors.
Figure 32:
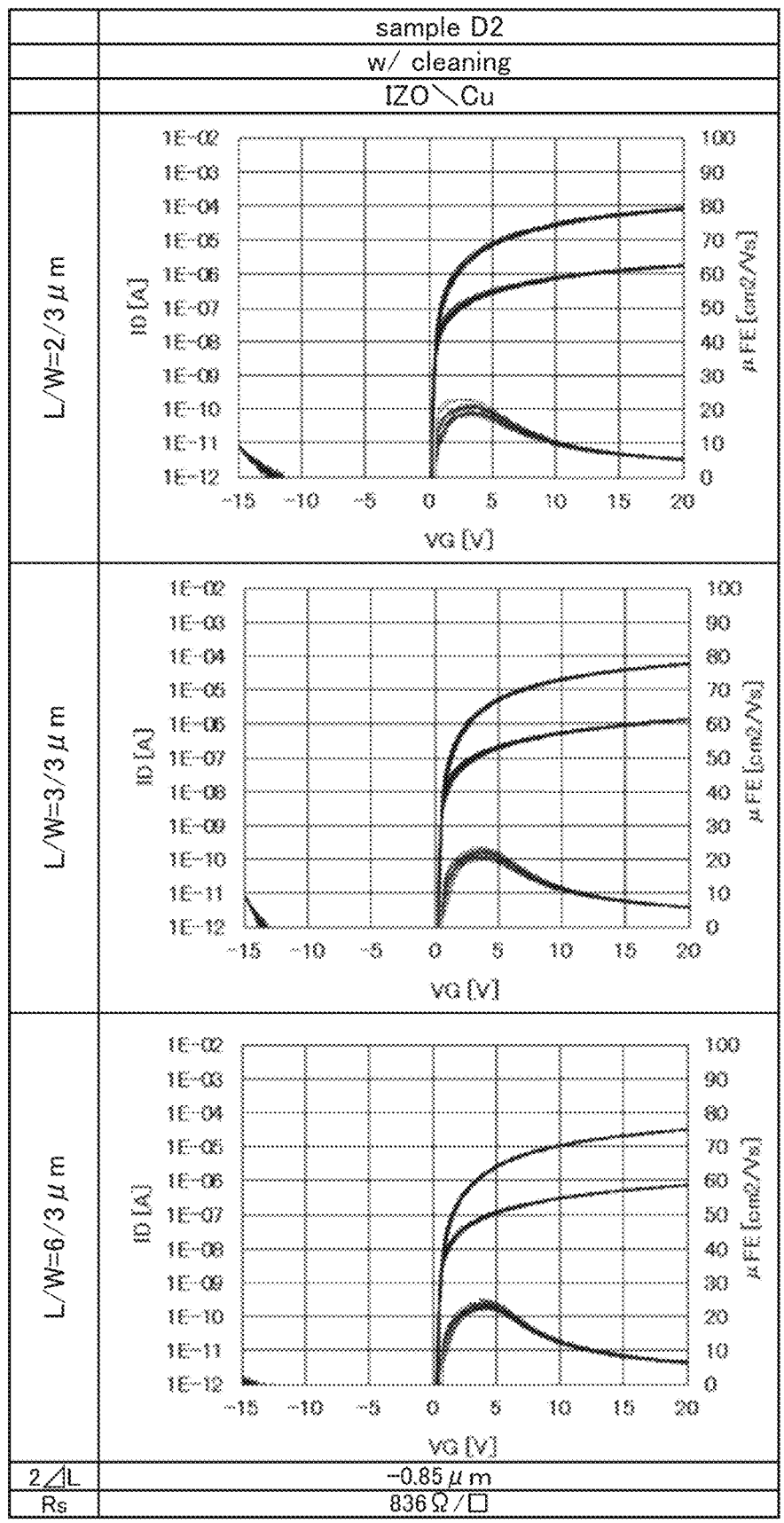
FIG. 32 is a diagram showing Id-Vg characteristics of transistors.
Figure 33:
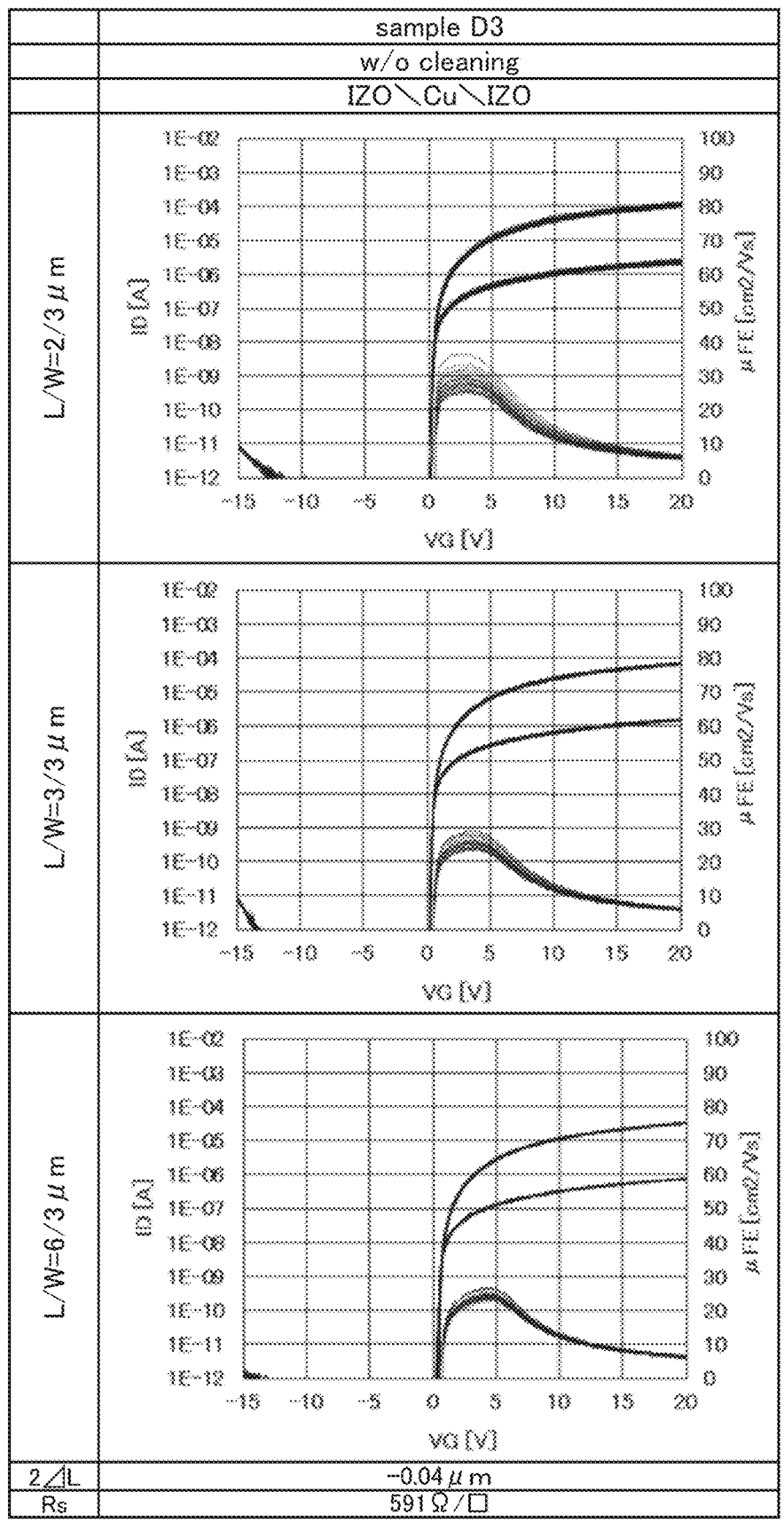
FIG. 33 is a diagram showing Id-Vg characteristics of transistors.
Figure 34:
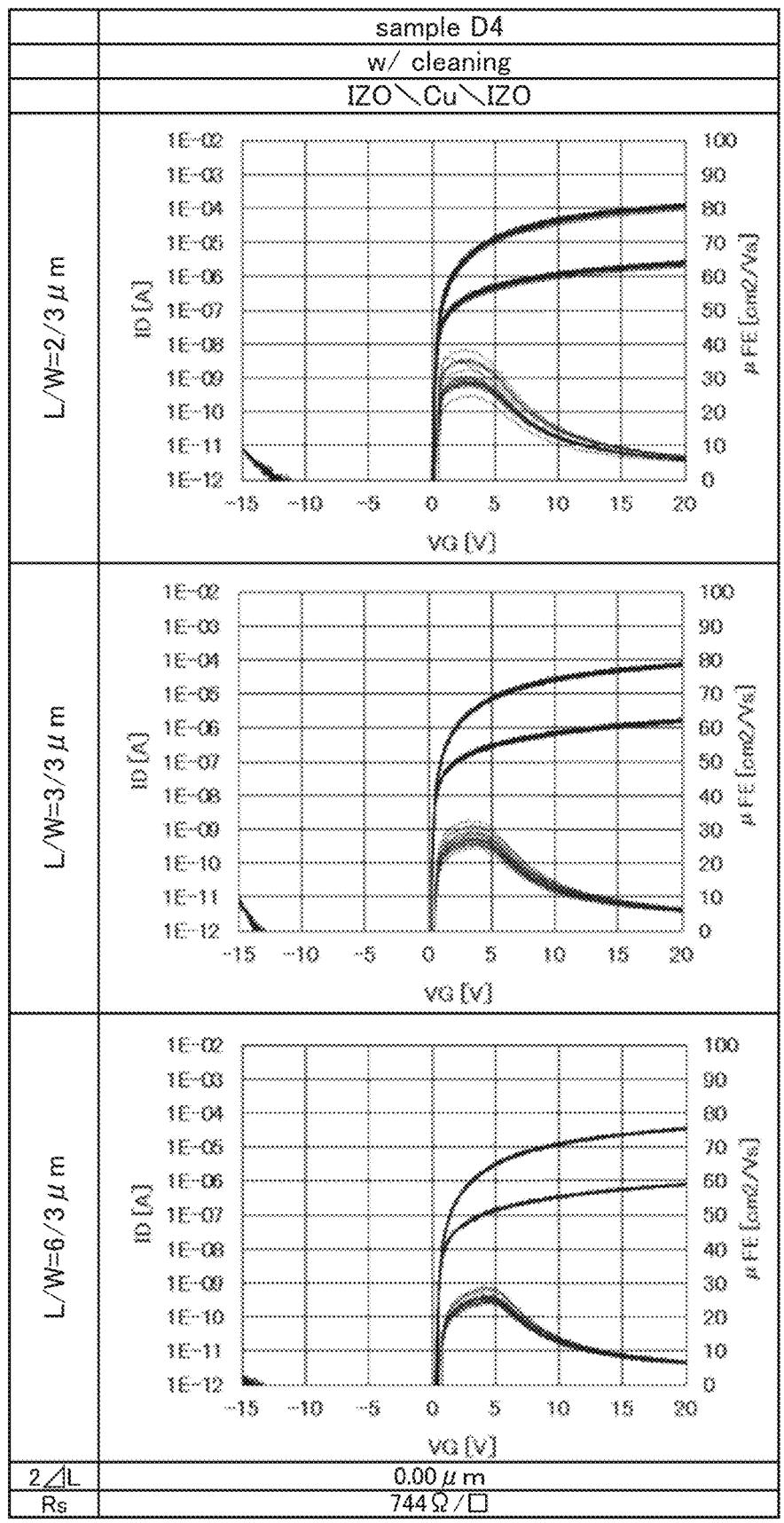
FIG. 34 is a diagram showing Id-Vg characteristics of transistors.

FIG. 30A shows a STEM image of the cross section of the sample C1, and FIG. 30B shows a STEM image of the cross section of the sample C2. FIG. 30A and FIG. 30B are transmission electron images (TE images) at a magnification of 80000 times. In FIG. 30A and FIG. 30B, the silicon oxynitride layer is denoted as SiON, the silicon nitride layer as SiN, the metal oxide layer as IGZO, the ITSO layer as ITSO, and the copper layer as Cu.

As shown in FIG. 30A, the width L2 of the region 108L in the sample C1 was 233 nm. As shown in FIG. 30B, the width L2 of the region 108L in the sample C2 was 157 nm.

As shown in Table 1, the $CF_4$ gas used for fabricating the sample C2 has a higher etching rate for the resist film than the $C_4F_8$ gas used for fabricating the sample C1; hence, the amount of recession of the resist used at the time of forming the second gate insulating layer is presumably larger. A large amount of recession of the resist in the etching using the $CF_4$ gas is likely to have caused the width L2 of the sample C2 to decrease. In other words, it was found that adjusting the formation conditions of the second gate insulating layer can control the width L2 of the region 108L.

Example 4

In this example, samples corresponding to the transistor 100C illustrated in FIG. 9 (a sample D1 to a sample D4) were fabricated, and the drain current-drain voltage characteristics (Id-Vd characteristics) and reliability of the transistors were evaluated. In this example, an indium zinc oxide layer was used as the metal oxide layer 114. A sample in which a copper layer was used as the conductive layer 112, and a sample in which the conductive layer 112 had a stacked-layer structure of a copper layer and an indium zinc oxide layer over the copper layer were fabricated.

Note that in this example, a transistor in which the conductive layer 106 (bottom gate electrode) was electrically connected to the conductive layer 112 (top gate electrode) was fabricated.

<Sample Fabrication>

First, a 30-nm-thick titanium film and a 100-nm-thick copper film were formed in this order over a glass substrate by a sputtering method, and then processed to obtain a first gate electrode (bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order. The description in Example 1 can be referred to for the first silicon nitride film, the second silicon nitride film, the third silicon nitride film, and the first silicon oxynitride film; thus, the detailed description is omitted.

Subsequently, a 25-nm-thick first metal oxide film was deposited over the first silicon oxynitride film. The first metal oxide film was deposited by a sputtering method using an In—Ga—Zn oxide target (In:Ga:Zn=4:2:4.1 [atomic ratio]). The deposition pressure was 0.3 Pa, the power was 4.5 kW, and the substrate temperature was room temperature. A mixed gas of an oxygen gas and an argon gas was used as a deposition gas, and the oxygen flow rate ratio was 10%.

Then, the first metal oxide film was processed into an island shape to form a first metal oxide layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, as a second gate insulating layer, a 5-nm-thick second silicon oxynitride film, a 130-nm-thick third silicon oxynitride film, and a 5-nm-thick fourth silicon oxynitride film were deposited in this order. The description in Example 1 can be referred to for the second gate insulating layer, the third silicon oxynitride film, and the fourth silicon oxynitride film; therefore, the detailed description is omitted.

Then, heat treatment was performed at 370° C. in a nitrogen atmosphere for one hour. An oven apparatus was used for the heat treatment.

Next, a 20-nm-thick second metal oxide film was deposited over the fourth silicon oxynitride film. The second metal oxide film was deposited by a sputtering method using an indium zinc oxide target (In:Zn=2:3 [atomic ratio]). The deposition pressure was 0.6 Pa, the power was 2.5 kW, and the substrate temperature was room temperature. An oxygen gas (oxygen flow rate ratio: 100%) was used as a deposition gas.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, in the sample D1 and the sample D2, as a conductive film, a 100-nm-thick copper film was deposited over the second metal oxide film. In the sample D3 and the sample D4, as the conductive film, a 100-nm-thick copper film and a 30-nm-thick indium zinc oxide film were deposited in this order over the second metal oxide film. The copper film and the indium zinc oxide film were deposited by a sputtering method. The copper film was deposited using a Cu target. The indium zinc oxide film was deposited by a sputtering method using an indium zinc oxide target (In:Zn=2:3 [atomic ratio]). The deposition pressure was 0.6 Pa, the power was 2.5 kW, and the substrate temperature was room temperature. A mixed gas of an oxygen gas and an argon gas was used as a deposition gas, and the oxygen flow rate ratio was 30%.

Next, a resist mask was formed over the conductive film, and the second metal oxide film and the conductive film were processed to form a second metal oxide layer and a conductive layer. A wet etching method was used for the processing. The description in Example 1 can be referred to for the etchant; thus, the detailed description is omitted. In each of the samples, the wet etching treatment time was 55 sec.

Then, the second silicon oxynitride film to the fourth silicon oxynitride film were processed using the aforementioned resist mask as a mask to form the second gate insulating layer. In addition, at the time of forming the second gate insulating layer, the first silicon oxynitride film in a region that is not overlapped by the resist mask was removed to expose part of the third silicon nitride film. A dry etching method was used for the processing. After that, the resist mask was removed.

Next, cleaning was performed on the sample D2 and the sample D4. For the cleaning, an aqueous solution in which 85 weight % phosphoric acid was diluted 500 times was used. The etchant temperature at the time of etching was room temperature, and the treatment time was 15 sec. Cleaning was not performed on the sample D1 and the sample D3.

Then, as a protective layer covering the transistor, a 100-nm-thick fourth silicon nitride film and a 300-nm-thick fifth silicon oxynitride film were deposited in this order. The description in Example 1 can be referred to for the fourth silicon nitride film and the fifth silicon oxynitride film; thus, the detailed description is omitted.

Next, an opening was formed in part of the protective layer covering the transistor, and a 30-nm-thick titanium film, a 100-nm-thick copper film, and a 50-nm-thick titanium film were deposited in this order by a sputtering method, and then processed to obtain a source electrode and a drain electrode. After that, an approximately 1.5-μm-thick acrylic resin was applied as a planarization layer, and heat treatment was performed under the conditions of a temperature of 250° C. in a nitrogen atmosphere for one hour.

Through the above steps, the transistors each formed over the glass substrate (the sample D1 to the sample D4) were obtained.

<Id-Vg Characteristics Evaluation>

Next, the Id-Vg characteristics of the transistors fabricated as above were measured.

The Id-Vg characteristics of the transistors were measured in such a manner that a voltage applied to the first gate electrode (hereinafter also referred to as gate voltage (Vg)) and a voltage applied to the second gate electrode (hereinafter also referred to as gate voltage (Vbg)) were applied from ~15 V to +20 V in steps of 0.25 V. Moreover, a voltage applied to the source electrode (hereinafter also referred to as source voltage (Vs)) was 0 V (common), and a voltage applied to the drain electrode (hereinafter also referred to as drain voltage (Vd)) was 0.1 V and 5.1 V.

FIG. 31 to FIG. 34 respectively show the Id-Vg characteristics of the transistors of the sample E1 to the sample E4. FIG. 31 to FIG. 34 each show conditions with different transistor channel lengths in the vertical direction, and show three types of transistors having a channel width of 3 μm and a channel length of 2 μm, 3 μm, and 6 μm. In FIG. 31 to FIG. 34, the horizontal axis represents gate voltage (Vg), the left vertical axis represents drain current (Id), and the right vertical axis represents saturation mobility (μFE) at Vd=5.1 V. Note that Id-Vg characteristics of 20 transistors were measured for each sample. FIG. 31 to FIG. 34 each show superimposed Id-Vg characteristics of the 20 transistors.

FIG. 31 to FIG. 34 also show a difference (2ΔL) between the designed channel length and the effective channel length. The effective channel length was obtained by TLM (Transmission Line Model) analysis.

As shown in FIG. 31 to FIG. 34, each of the samples had favorable electrical characteristics.

<Reliability Evaluation>

Next, the reliability of the fabricated transistors was evaluated. In this example, a PBTS (Positive Bias Temperature Stress) test, in which a state where a positive potential relative to a source potential and a drain potential is applied to a gate is maintained at high temperatures, and an NBTIS (Negative Bias Temperature Illumination Stress) test, in which a state where a negative potential is applied to a gate is maintained at high temperatures in a light illumination environment, were performed.

In the PBTS test, a substrate over which the transistor was formed was held at 60° C., a voltage of 0.1 V was applied to the drain of the transistor, and a voltage of 20 V was applied to the gate; this state was held for one hour. The test was performed in a dark environment.

In the NBTIS test, a substrate over which the transistor was formed was held at 60° C., a voltage of 10 V was applied to the drain of the transistor, and a voltage of −20 V was applied to the gate; this state was held for one hour. The test was performed in a light illumination environment (irradiation with light of approximately 3400 lux by a white LED).

In the reliability tests, the transistor having a channel length of 2 µm and a channel width of 3 µm was used, and the amount of change in threshold voltage (ΔVth) before and after the gate bias stress test was evaluated.

Figure 35:
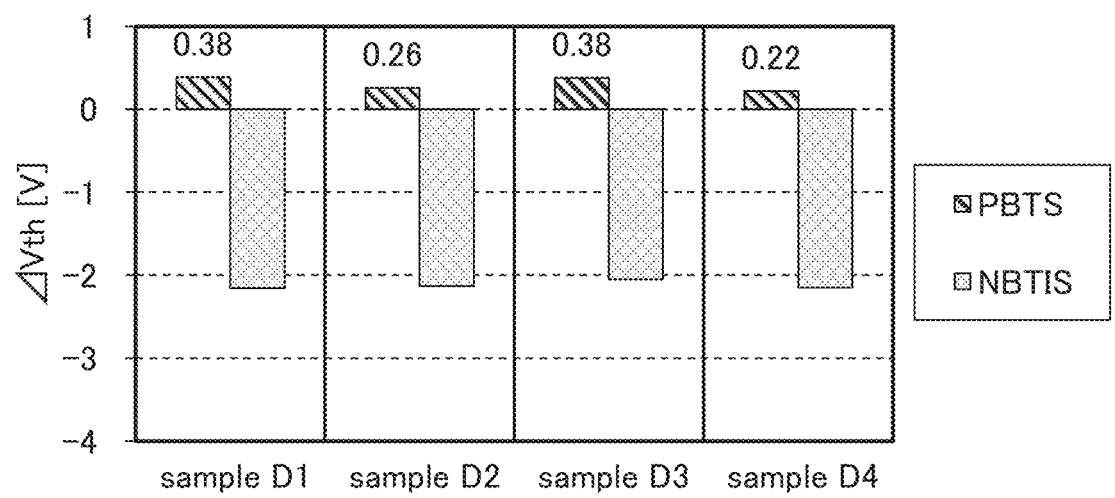
FIG. 35 is a diagram showing results of evaluating reliability of transistors.

FIG. 35 shows the threshold voltage change amount (ΔVth) of the sample E1 to the sample E4.

As shown in FIG. 35, compared to the sample D1 and the sample D3, on which cleaning was not performed before the formation of the protective layer, the sample D2 and the sample D4, on which cleaning was performed, were found to have a small threshold voltage change amount (ΔVth) in the PBTS test. It was found that performing cleaning before the formation of the protective layer removes impurities attached to the gate insulating layer and the semiconductor layer, thereby improving the reliability of the transistor.

Example 5

In this example, a stacked-layer structure of a semiconductor film and an insulating film over the semiconductor film was subjected to plasma treatment in an oxygen-containing atmosphere, and the resistance of the semiconductor film was evaluated. In this example, samples with varying conditions of the plasma treatment and varying conditions of heat treatment after the plasma treatment (a sample E1 to a sample 7) were fabricated.

<Sample Fabrication>

First, as the semiconductor film, a 25-nm-thick metal oxide film was deposited over a glass substrate. The metal oxide film was deposited by a sputtering method using an In—Ga—Zn oxide target (In:Ga:Zn=4:2:4.1 [atomic ratio]). The deposition pressure was 0.6 Pa, the power was 2.5 kW, and the substrate temperature was room temperature. A mixed gas of an oxygen gas and an argon gas was used as a deposition gas, and the oxygen flow rate ratio was 10%.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, as the insulating film, a 5-nm-thick first silicon oxynitride film, a 130-nm-thick second silicon oxynitride film, and a 5-nm-thick third silicon oxynitride film were deposited in this order. The description in Example 2 can be referred to for the first silicon oxynitride film, the second silicon oxynitride film, and the third silicon oxynitride film; therefore, the detailed description is omitted.

Next, the plasma treatment was performed. The plasma treatment was conducted with a PECVD apparatus successively after the deposition of the first silicon oxynitride film, the second silicon oxynitride film, and the third silicon oxynitride film. In the plasma treatment, an oxygen gas at a flow rate of 3000 sccm was used, the pressure was 40 Pa, and the power was 3000 W. The substrate temperature at the time of the plasma treatment was 350° C. The plasma treatment time was 15 sec in the sample E2 and the sample E3, 30 sec in the sample E4 and the sample E5, and 60 sec in the sample E6 and the sample E7. The sample E1 was not subjected to the plasma treatment.

Then, the sample E1, the sample E3, the sample E5, and the sample E7 were subjected to heat treatment at 370° C. in a nitrogen atmosphere for one hour. An oven apparatus was used for the heat treatment. The sample E2, the sample E4, and the sample E6 were not subjected to the heat treatment.

Subsequently, an opening that reached the metal oxide film was formed in the first silicon oxynitride film, the second silicon oxynitride film, and the third silicon oxynitride film, and a terminal was provided.

<Sheet Resistance Measurement>

Next, the sheet resistance of each sample fabricated as above was measured to evaluate the resistance of the metal oxide film.

Figure 36:
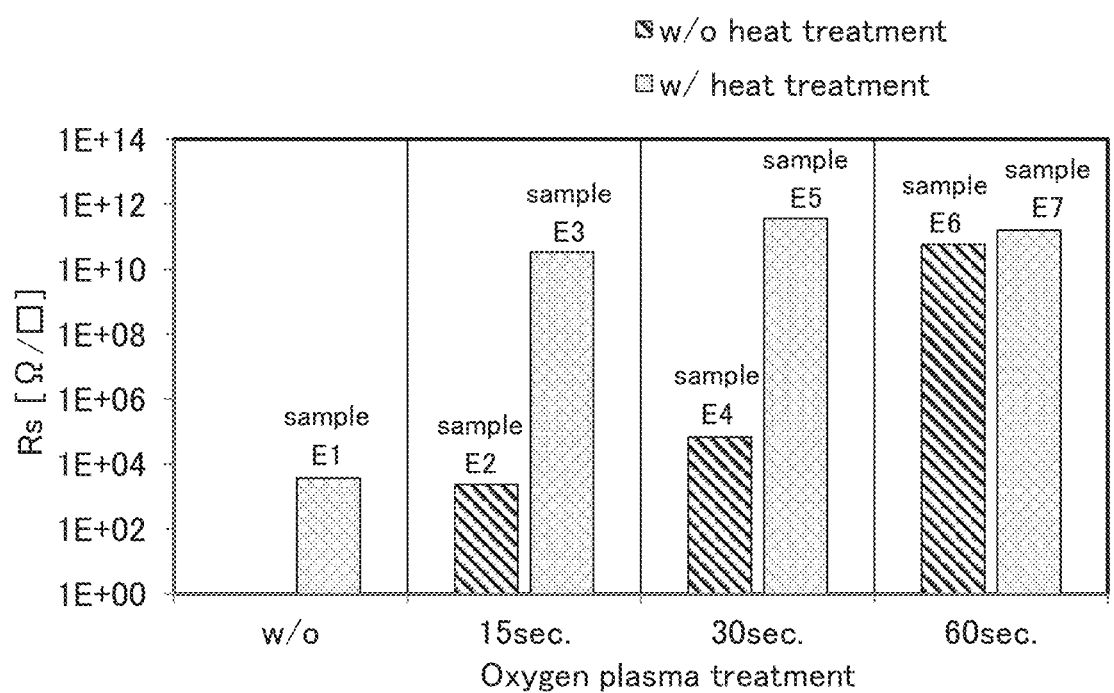
FIG. 36 is a graph showing the resistance of metal oxide films.

FIG. 36 shows the values of the sheet resistance of the sample E1 to the sample E7. In FIG. 36, the horizontal axis represents plasma treatment time, and the vertical axis represents sheet resistance Rs.

As shown in FIG. 36, it was found that performing plasma treatment in an oxygen-containing atmosphere increases the resistance of the metal oxide film. The resistance of the metal oxide film tended to increase with a longer plasma treatment time, and the resistance of the metal oxide film tended to increase by performing heat treatment after the plasma treatment. It was found that performing plasma treatment in an oxygen-containing atmosphere after the formation of the insulating film over the metal oxide film supplies oxygen to the metal oxide film, whereby the resistance of the metal oxide film can be increased.

Example 6

In this example, transistors fabricated by a fabrication method different from that in Example 1 described above (a sample F1 to a sample F3) were evaluated.

Note that in this example, a transistor in which the conductive layer 106 (bottom gate electrode) was electrically connected to the conductive layer 112 (top gate electrode) was fabricated.

<Sample Fabrication>

First, a 30-nm-thick titanium film and a 100-nm-thick copper film were formed in this order over a glass substrate by a sputtering method, and then processed to obtain a first gate electrode (bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order. The description in Example 1 can be referred to for the first silicon nitride film, the second silicon nitride film, the third silicon nitride film, and the first silicon oxynitride film; thus, the detailed description is omitted.

Next, a 25-nm-thick first metal oxide film was deposited over the first silicon oxynitride film. The first metal oxide film was deposited by a sputtering method using an In—Ga—Zn oxide target (In:Ga:Zn=4:2:4.1 [atomic ratio]). The deposition pressure was 0.3 Pa, the power was 4.5 kW, and the substrate temperature was room temperature. A mixed gas of an oxygen gas and an argon gas was used as a deposition gas, and the oxygen flow rate ratio was 10%.

Then, the first metal oxide film was processed into an island shape to form a first metal oxide layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Next, as a second gate insulating layer, a 5-nm-thick second silicon oxynitride film, a 130-nm-thick third silicon oxynitride film, and a 5-nm-thick fourth silicon oxynitride film were deposited in this order. The description in Example 1 can be referred to for the second gate insulating layer, the third silicon oxynitride film, and the fourth silicon oxynitride film; therefore, the detailed description is omitted.

Subsequently, heat treatment was performed at 370° C. in a nitrogen atmosphere for one hour. An oven apparatus was used for the heat treatment.

Next, a second metal oxide film was deposited over the fourth silicon oxynitride film. The second metal oxide film had a stacked-layer structure of a 20-nm-thick In—Ga—Zn oxide film and a 10-nm-thick silicon-containing indium tin oxide (ITSO) film. The In—Ga—Zn metal oxide film was deposited by a sputtering method using an In—Ga—Zn oxide target (In:Ga:Zn=4:2:4.1 [atomic ratio]). The deposition pressure was 0.8 Pa, the power was 3.5 kW, and the substrate temperature was room temperature. An oxygen gas (oxygen flow rate ratio: 100%) was used as a deposition gas. The ITSO film was deposited by a sputtering method using an ITSO target ($In_2O_3$:$SnO_2$:$SiO_2$=85:10:5 [weight ratio]). The deposition pressure was 0.15 Pa, the power was 1 kW (direct current), and the substrate temperature was 80° C. An argon gas was used as a deposition gas.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Next, a 100-nm-thick copper film was deposited over the second metal oxide film. The copper film was deposited by a sputtering method using a Cu target.

Next, a resist mask was formed over the conductive film, and the second metal oxide film and the conductive film were processed to form a second metal oxide layer and a conductive layer. A wet etching method was used for the processing. The description in Example 1 can be referred to for the etchant; thus, the detailed description is omitted. Here, the wet etching treatment time was varied between the sample F1 to the sample F3 to vary the widths L2 of their respective regions 108L. The sample F1 had a width L2 of about 200 nm, the sample F2 had a width L2 of about 300 nm, and the sample F3 had a width L2 of about 400 nm.

Then, the second silicon oxynitride film to the fourth silicon oxynitride film were processed using the aforementioned resist mask as a mask to form the second gate insulating layer. In addition, at the time of forming the second gate insulating layer, the first silicon oxynitride film in a region that is not overlapped by the resist mask was removed to expose part of the third silicon nitride film. A dry etching method was used for the processing. After that, the resist mask was removed.

Subsequently, cleaning was performed. For the cleaning, an aqueous solution in which 85 weight % phosphoric acid was diluted 500 times was used. The etchant temperature at the time of etching was room temperature, and the treatment time was 15 sec.

Then, as a protective layer covering the transistor, a 100-nm-thick fourth silicon nitride film and a 300-nm-thick fifth silicon oxynitride film were deposited in this order. The description in Example 1 can be referred to for the fourth silicon nitride film and the fifth silicon oxynitride film; thus, the detailed description is omitted.

Next, an opening was formed in part of the protective layer covering the transistor, and a 50-nm-thick titanium film, a 400-nm-thick aluminum film, and a 100-nm-thick titanium film were deposited in this order by a sputtering method, and then processed to obtain a source electrode and a drain electrode. After that, an approximately 1.5-μm-thick acrylic resin was applied as a planarization layer, and heat treatment was performed under the conditions of a temperature of 250° C. in a nitrogen atmosphere for one hour.

Through the above steps, the transistors each formed over the glass substrate (the sample F1 to the sample F3) were obtained.

<Id-Vd Characteristics Evaluation>

Next, the Id-Vd characteristics of the transistors fabricated as above were measured.

The Id-Vd characteristics of the transistor were measured in such a manner that the source potential was set to the ground potential (GND) and the drain voltage (Vd) was swept from 0 V to 30 V in increments of 0.25 V. The Id-Vd measurements were successively performed on the same transistor under four conditions where the gate voltage (Vg) was 0 V, 2 V, 4 V, and 6 V. The transistor having a channel length of 6 μm and a channel width of 10 μm was used.

Figure 37:
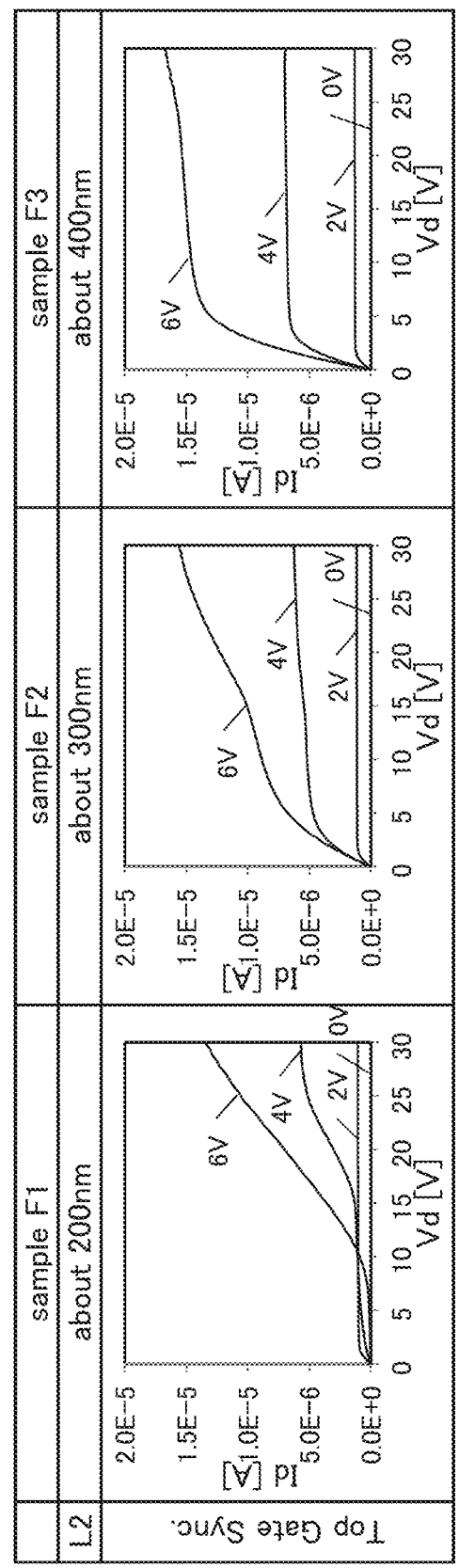
FIG. 37 is a diagram showing Id-Vd characteristics of transistors.

FIG. 37 shows the Id-Vd characteristics of the sample F1 to the sample F3. In FIG. 37, the horizontal axis indicates drain voltage (Vd), and the vertical axis indicates drain current (Id).

As shown in FIG. 37, with a larger width L2, a decrease in the on-state current tended to be further suppressed and more favorable Id-Vd characteristics were exhibited, as in Example 1.

<Evaluation of Continuous Operation of Gate Driver Circuit>

A gate driver circuit that can be used for the display device was fabricated, and its continuous operation was evaluated. Note that a gate driver circuit including a transistor fabricated in the same conditions as the aforementioned sample F3 (width L2=approx. 400 nm) was used.

First, the gate driver circuit was operated with a driving voltage of 25 V (high power supply voltage VDD=+19 V, low power supply voltage=−6 V). Next, the gate driver circuit was operated with a driving voltage of 40 V (high power supply voltage VDD=+20 V, low power supply voltage=−20 V). Then, the gate driver circuit was continuously operated for 57 hours with a driving voltage of 40 V (high power supply voltage VDD=+20 V, low power supply voltage=−20 V). Next, the gate driver circuit was operated with a driving voltage of 25 V (high power supply voltage VDD=+19 V, low power supply voltage=−6 V).

Figure 38:
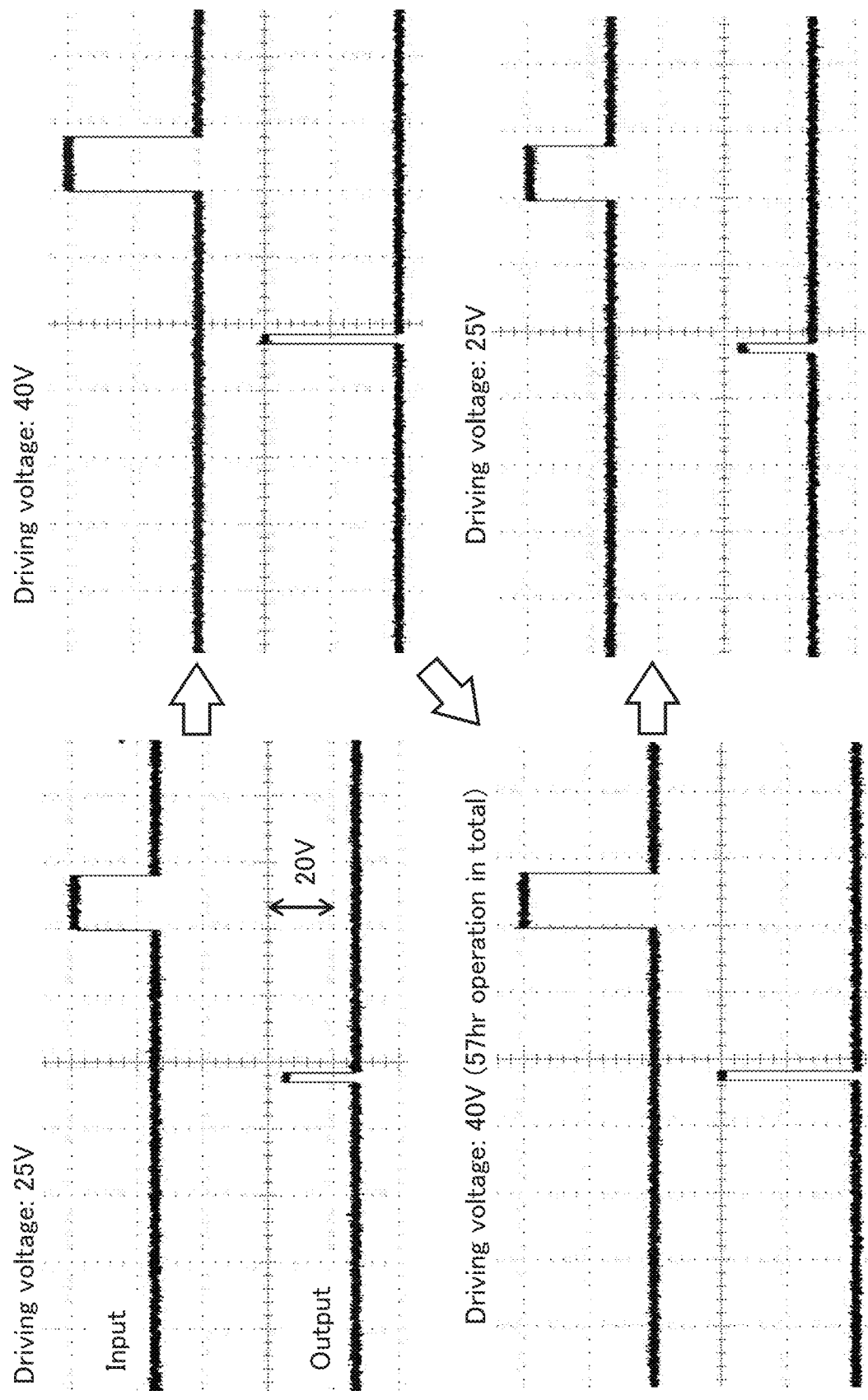
FIG. 38 is a diagram showing operation results of a gate driver.

FIG. 38 shows input waveforms and output waveforms of the gate driver circuit. In FIG. 38, the vertical axis indicates voltage and the horizontal axis indicates time. In each chart, the upper row shows the waveform of an input signal, and the lower row shows the waveform of an output signal.

As shown in FIG. 38, it was demonstrated that the gate driver circuit using the transistor of one embodiment of the present invention operated normally even when being continuously operated with a high driving voltage of 40 V.

Example 7

In this example, the amount of released hydrogen and other properties of silicon nitride films that can be used as the insulating layer 116 described in Embodiment 1 were evaluated.

<Sample Fabrication 1>

Figure 39A:
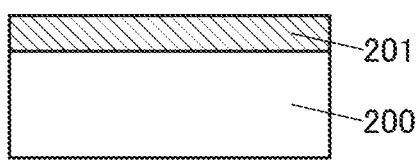
FIG. 39A, FIG. 39B, FIG. 39C, FIG. 39D, and FIG. 39E are cross-sectional views illustrating sample structures.

Samples each including a silicon nitride film (a sample G1 to a sample G6) were fabricated, and release of hydrogen from the silicon nitride films was evaluated. FIG. 39A shows the sample structure of the sample G1 to the sample G6. As the sample G1 to the sample G6, a 100-nm-thick first silicon nitride film 201 was formed over a glass substrate 200.

In this example, a deposition gas used for depositing the first silicon nitride film 201 and the substrate temperature at the time of deposition were varied between the sample G1 to the sample G6.

The first silicon nitride film 201 of the sample G1 was deposited by a PECVD method using a mixed gas of a silane gas at a flow rate of 150 sccm, a nitrogen gas at a flow rate of 5000 sccm, and an ammonia gas at a flow rate of 100 sccm. The substrate temperature at the time of deposition was 240° C.

The first silicon nitride film 201 of the sample G2 was deposited by a PECVD method using a mixed gas of a silane gas at a flow rate of 150 sccm and a nitrogen gas at a flow rate of 5000 sccm. The substrate temperature at the time of deposition was 240° C.

The first silicon nitride film 201 of the sample G3 was deposited by a PECVD method using a mixed gas of a silane gas at a flow rate of 150 sccm, a nitrogen gas at a flow rate of 5000 sccm, and an ammonia gas at a flow rate of 100 sccm. The substrate temperature at the time of deposition was 300° C.

The first silicon nitride film 201 of the sample G4 was deposited by a PECVD method using a mixed gas of a silane gas at a flow rate of 150 sccm and a nitrogen gas at a flow rate of 5000 sccm. The substrate temperature at the time of deposition was 300° C.

The first silicon nitride film 201 of the sample G5 was deposited by a PECVD method using a mixed gas of a silane gas at a flow rate of 150 sccm, a nitrogen gas at a flow rate of 5000 sccm, and an ammonia gas at a flow rate of 100 sccm. The substrate temperature at the time of deposition was 350° C.

The first silicon nitride film 201 of the sample G6 was deposited by a PECVD method using a mixed gas of a silane gas at a flow rate of 150 sccm and a nitrogen gas at a flow rate of 5000 sccm. The substrate temperature at the time of deposition was 350° C.

Note that for any of the sample G1 to the sample G6, the pressure at the time of depositing the first silicon nitride film 201 was 200 Pa, and the deposition power was 2000 W.

<Sample Fabrication 2>

Figure 39B:
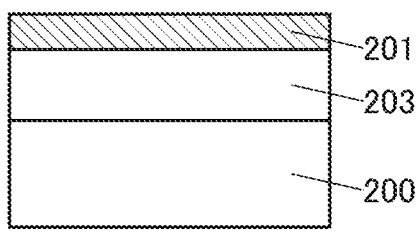
Figure 39C:

Samples each including a silicon nitride film (a sample H1 to a sample H6) were fabricated, and hydrogen-blocking properties of the silicon nitride films were evaluated. FIG. 39B shows the sample structure of the sample H1 to the sample H6. As the sample H1 to the sample H6, a 300-nm-thick second silicon nitride film 203 and a 100-nm-thick first silicon nitride film 201 were formed over the glass substrate 200. Additionally, as a reference sample, a sample in which a 300-nm-thick second silicon nitride film 203 was deposited over the glass substrate 200 (a sample J) was fabricated. FIG. 39C shows the sample structure of the sample J.

First, in the sample H1 to the sample H6 and the sample J, the second silicon nitride film 203 was deposited over the glass substrate 200. The second silicon nitride film 203 was deposited by a PECVD method using a mixed gas of a silane gas at a flow rate of 200 sccm, a nitrogen gas at a flow rate of 2000 sccm, and an ammonia gas at a flow rate of 2000 sccm. The deposition pressure was 200 Pa, the deposition power was 1000 W, and the substrate temperature was 220° C. Note that for the second silicon nitride film 203, deposition conditions that would allow the film to release a large amount of hydrogen by application of heat were employed.

Next, in the sample H1 to the sample H6, the first silicon nitride film 201 was deposited over the second silicon nitride film 203. The first silicon nitride film 201 was formed over the second silicon nitride film 203, which releases hydrogen by application of heat, and the hydrogen-blocking property of the first silicon nitride film 201 was evaluated. In this example, a deposition gas used for depositing the first silicon nitride film 201 and the substrate temperature at the time of deposition were varied between the sample H1 to the sample H6.

The first silicon nitride film 201 of the sample H1 was deposited using the same deposition conditions as the first silicon nitride film 201 of the sample G1.

The first silicon nitride film 201 of the sample H2 was deposited using the same deposition conditions as the first silicon nitride film 201 of the sample G2.

The first silicon nitride film 201 of the sample H3 was deposited using the same deposition conditions as the first silicon nitride film 201 of the sample G3.

The first silicon nitride film 201 of the sample H4 was deposited using the same deposition conditions as the first silicon nitride film 201 of the sample G4.

The first silicon nitride film 201 of the sample H5 was deposited using the same deposition conditions as the first silicon nitride film 201 of the sample G5.

The first silicon nitride film 201 of the sample H6 was deposited using the same deposition conditions as the first silicon nitride film 201 of the sample G6.

<Sample Fabrication 3>

Figure 39D:
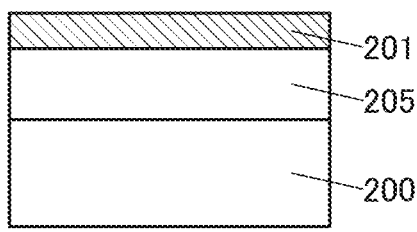
Figure 39E:
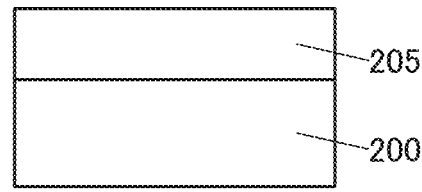

Samples each including a silicon nitride film (a sample K1 to a sample K4) were fabricated, and water-blocking properties of the silicon nitride films were evaluated. FIG. 39D shows the sample structure of the sample K1 to the sample K4. As the sample K1 to the sample K4, a 300-nm-thick first silicon oxynitride film 205 and a 100-nm-thick first silicon nitride film 201 were formed over the glass substrate 200. Additionally, as a reference sample, a sample in which a 300-nm-thick first silicon oxynitride film 205 was deposited over the glass substrate 200 (a sample L) was fabricated. FIG. 39E shows the sample structure of the sample L.

First, in the sample K1 to the sample K4 and the sample L, the first silicon oxynitride film 205 was deposited over the glass substrate 200. The first silicon oxynitride film 205 was deposited by a PECVD method using a mixed gas of a silane gas at a flow rate of 160 sccm and a dinitrogen monoxide gas at a flow rate of 4000 sccm. The deposition pressure was 200 Pa, the deposition power was 1500 W, and the substrate temperature was 220° C. Note that for the first silicon oxynitride film 205, deposition conditions that would allow the film to release a large amount of water by application of heat were employed.

Next, in the sample K1 to the sample K4, the first silicon nitride film 201 was deposited over the first silicon oxynitride film 205. The first silicon nitride film 201 was formed over the first silicon oxynitride film 205, which releases water by application of heat, and the water-blocking property of the first silicon nitride film 201 was evaluated. In this example, a deposition gas used for depositing the first silicon nitride film 201 and the substrate temperature at the time of deposition were varied between the sample K1 to the sample K4.

The first silicon nitride film 201 of the sample K1 was deposited using the same deposition conditions as the first silicon nitride film 201 of the sample G1.

The first silicon nitride film 201 of the sample K2 was deposited using the same deposition conditions as the first silicon nitride film 201 of the sample G2.

The first silicon nitride film 201 of the sample K3 was deposited using the same deposition conditions as the first silicon nitride film 201 of the sample G5.

The first silicon nitride film 201 of the sample K4 was deposited using the same deposition conditions as the first silicon nitride film 201 of the sample G6.

<Sample Fabrication 4>

Figure 40A:
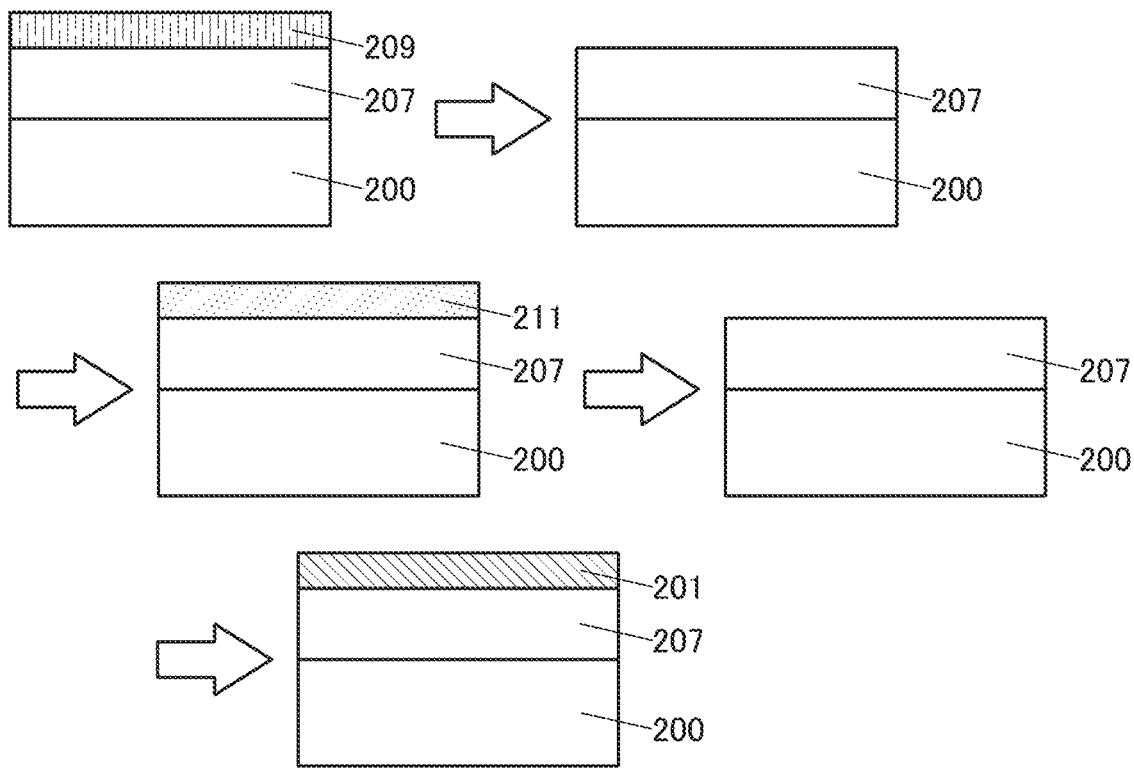
FIG. 40A and FIG. 40B are cross-sectional views illustrating sample structures.
Figure 40B:
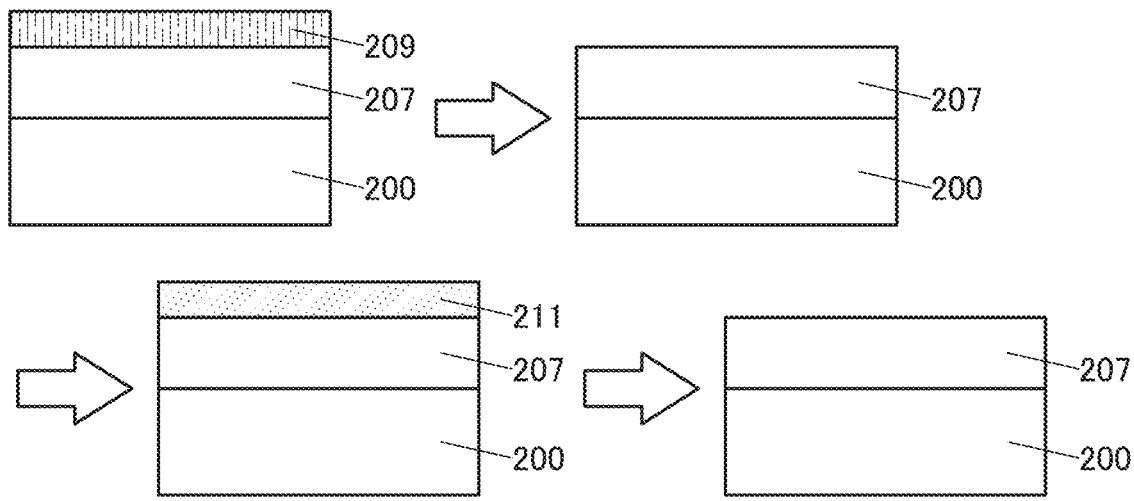

Samples each including a silicon nitride film (a sample M1 to a sample M4) were fabricated, and oxygen-blocking properties of the silicon nitride films were evaluated. FIG. 40A shows the sample structure of the sample M1 to the sample M4. As the sample M1 to the sample M4, a 100-nm-thick second silicon oxynitride film 207 and a 100-nm-thick first silicon nitride film 201 were formed over the glass substrate 200. Additionally, as a reference sample, a sample in which a 100-nm-thick second silicon oxynitride film 207 was deposited over the glass substrate 200 (a sample N) was fabricated. FIG. 40B shows the sample structure of the sample N.

First, in the sample M1 to the sample M4 and the sample N, the second silicon oxynitride film 207 was deposited over the glass substrate 200. The second silicon oxynitride film 207 was deposited by a PECVD method using a mixed gas of a silane gas at a flow rate of 20 sccm and a dinitrogen monoxide gas at a flow rate of 18000 sccm. The deposition pressure was 200 Pa, the deposition power was 100 W, and the substrate temperature was 350° C.

Next, in the sample M1 to the sample M4 and the sample N, a 100-nm-thick oxide conductive film 209 was deposited over the second silicon oxynitride film 207. The oxide conductive film 209 was deposited by a sputtering method using an indium tin oxide target containing silicon.

Subsequently, in the sample M1 to the sample M4 and the sample N, oxygen radical doping treatment was performed with an ashing apparatus. In the oxygen radical doping treatment, the ICP power was 0 W, the bias power was 4500 W, the pressure was 15 Pa, the oxygen flow rate ratio was 100%, the lower electrode temperature was 40° C., and the treatment time was 120 seconds. By performing the oxygen radical doping treatment after the oxide conductive film 209 was formed, oxygen was supplied to the second silicon oxynitride film 207 through the oxide conductive film 209.

Next, in the sample M1 to the sample M4 and the sample N, the oxide conductive film 209 was removed.

Then, in the sample M1 to the sample M4 and the sample N, a 20-nm-thick metal oxide film 211 was deposited over the second silicon oxynitride film 207. The metal oxide film 211 was deposited by a sputtering method using an In—Zn oxide target (In:Zn=2:3 [atomic ratio]). The deposition pressure was 0.3 Pa, the power was 4.5 kW, and the substrate temperature was room temperature. A deposition gas was an oxygen gas (oxygen flow rate ratio: 100%). By depositing the 20-nm-thick metal oxide film 211 over the second silicon oxynitride film 207, oxygen was supplied to the second silicon oxynitride film 207. The oxygen is released from the second silicon oxynitride film 207 by application of heat.

Subsequently, in the sample M1 to the sample M4 and the sample N, the metal oxide film 211 was removed.

Next, in the sample M1 to the sample M4, the first silicon nitride film 201 was deposited over the second silicon oxynitride film 207. The first silicon nitride film 201 was formed over the second silicon oxynitride film 207, which releases oxygen by application of heat, and the oxygen-blocking property of the first silicon nitride film 201 was evaluated. In this example, a deposition gas used for depositing the first silicon nitride film 201 and the substrate temperature at the time of deposition were varied between the sample M1 to the sample M4.

The first silicon nitride film 201 of the sample M1 was deposited using the same deposition conditions as the first silicon nitride film 201 of the sample G1.

The first silicon nitride film 201 of the sample M2 was deposited using the same deposition conditions as the first silicon nitride film 201 of the sample G2.

The first silicon nitride film 201 of the sample M3 was deposited using the same deposition conditions as the first silicon nitride film 201 of the sample G5.

The first silicon nitride film 201 of the sample M4 was deposited using the same deposition conditions as the first silicon nitride film 201 of the sample G6.

<Sample Fabrication 5>

Figure 41:
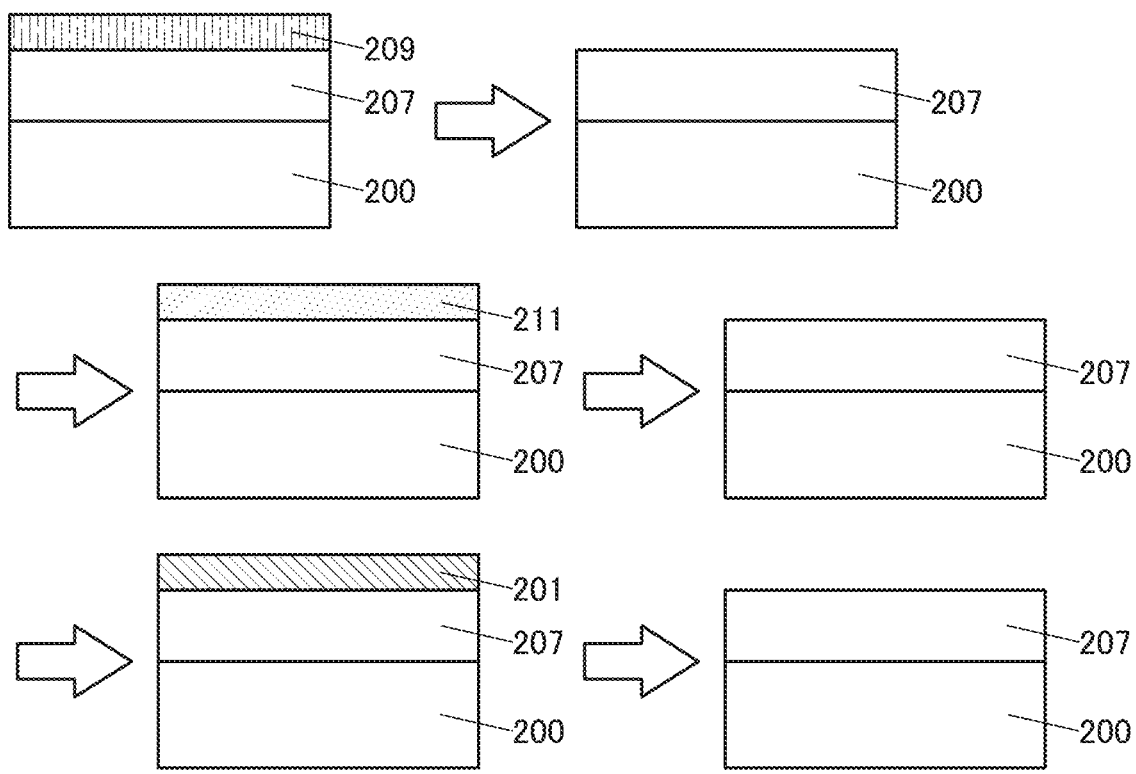
FIG. 41 is a cross-sectional view illustrating a sample structure.

Samples (a sample P1 to a sample P4) were fabricated, and release of oxygen from a lower layer affected by formation of a silicon nitride film was evaluated. FIG. 41 shows the sample structure of the sample P1 to the sample P4. As the sample P1 to the sample P4, a 100-nm-thick second silicon oxynitride film 207 was formed over the glass substrate 200.

First, in the sample P1 to the sample P4, the second silicon oxynitride film 207 was deposited over the glass substrate 200. The above description can be referred to for the second silicon oxynitride film 207; thus, the detailed description is omitted.

Next, in the sample P1 to the sample P4, the oxide conductor film 209 was deposited over the second silicon oxynitride film 207. The above description can be referred to for the oxide conductor film 209; hence, the detailed description is omitted.

Then, in the sample P1 to the sample P4, oxygen radical doping treatment was performed with an ashing apparatus. The above description can be referred to for the oxygen radical doping treatment; thus, the detailed description is omitted.

Next, in the sample P1 to the sample P4, the oxide conductive film 209 was removed.

Subsequently, a 20-nm-thick metal oxide film 211 was deposited over the second silicon oxynitride film 207. The above description can be referred to for the metal oxide film 211; therefore, the detailed description is omitted.

Next, in the sample P1 to the sample P4, the metal oxide film 211 was removed.

Then, in the sample P1 to the sample P4, the first silicon nitride film 201 was deposited over the second silicon oxynitride film 207. In this example, a deposition gas used for depositing the first silicon nitride film 201 and the substrate temperature at the time of deposition were varied between the sample P1 to the sample P4.

The first silicon nitride film 201 of the sample P1 was deposited using the same deposition conditions as the first silicon nitride film 201 of the sample G1.

The first silicon nitride film 201 of the sample P2 was deposited using the same deposition conditions as the first silicon nitride film 201 of the sample G2.

The first silicon nitride film 201 of the sample P3 was deposited using the same deposition conditions as the first silicon nitride film 201 of the sample G5.

The first silicon nitride film 201 of the sample P4 was deposited using the same deposition conditions as the first silicon nitride film 201 of the sample G6.

Then, in the sample P1 to the sample P4, the first silicon nitride film 201 was removed. Here, in some cases, oxygen is released from the second silicon oxynitride film 207 by heat at the time of forming the first silicon nitride film 201 over the second silicon oxynitride film 207. In this example, release of oxygen from the second silicon oxynitride film 207 after the formation of the first silicon nitride film 201 was evaluated.

<TDS Analysis>

A released gas from each sample was evaluated using thermal desorption spectrometry (TDS). In the TDS measurement, the substrate temperature was increased from approximately 50° C. to approximately 520° C. at a substrate temperature rising rate of 30° C./min.

Figure 42:
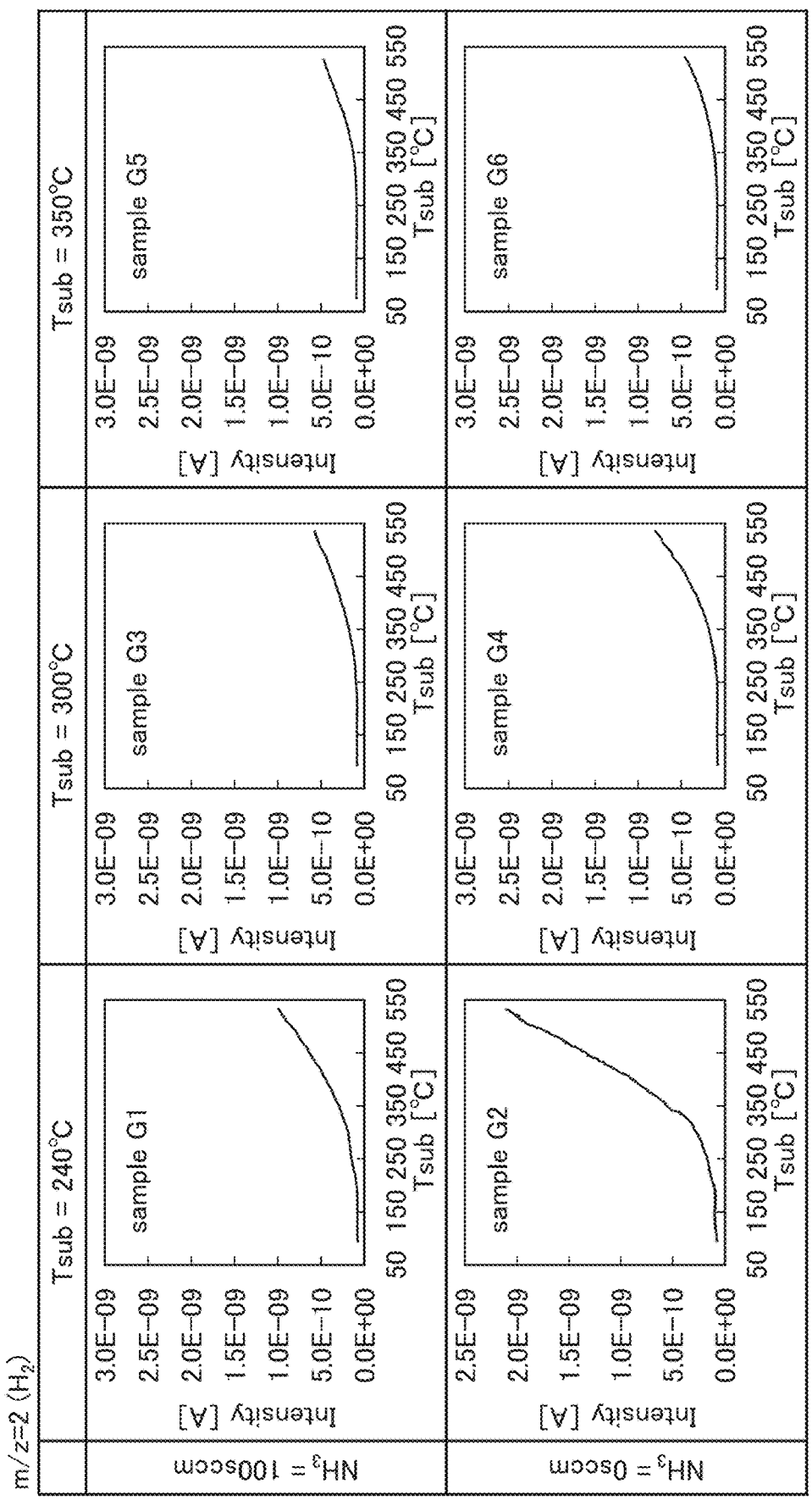
FIG. 42 is a diagram showing TDS measurement results.

FIG. 42 shows TDS analysis results of the sample G1 to the sample G6. In FIG. 42, the flow rate of the ammonia gas at the time of depositing the first silicon nitride film 201 is shown in the vertical direction, and the substrate temperature (Tsub) at the time of depositing the first silicon nitride film 201 is shown in the horizontal direction. In FIG. 42, the horizontal axis represents substrate temperature (Tsub), and the vertical axis represents detection intensity (Intensity) of a mass-to-charge ratio of 2 (m/z=2). A gas with a mass-to-charge ratio of 2 (m/z=2) is mainly a hydrogen molecule.

As shown in FIG. 42, it was found that the amount of released hydrogen is increased with a lower substrate temperature at the time of depositing the first silicon nitride film 201. It was also found that the amount of released hydrogen is reduced when an ammonia gas is used for deposition of the first silicon nitride film 201.

Figure 43:
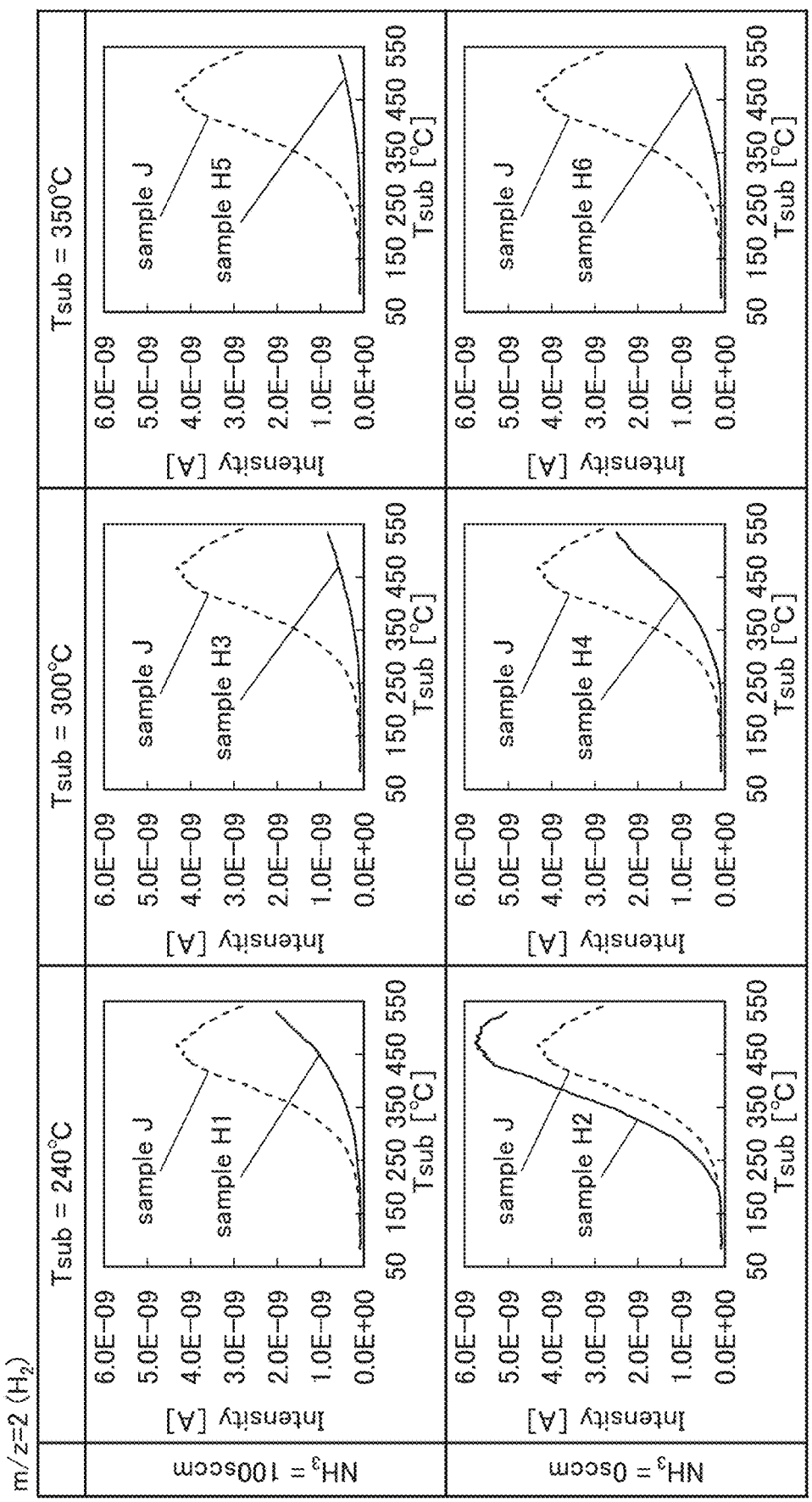
FIG. 43 is a diagram showing TDS measurement results.

FIG. 43 shows TDS analysis results of the sample H1 to the sample H6 and the sample J. In FIG. 43, the flow rate of the ammonia gas at the time of depositing the first silicon nitride film 201 is shown in the vertical direction, and the substrate temperature (Tsub) at the time of depositing the first silicon nitride film 201 is shown in the horizontal direction. In FIG. 43, the horizontal axis represents substrate temperature (Tsub), and the vertical axis represents detection intensity (Intensity) of a mass-to-charge ratio of 2 (m/z=2). A gas with a mass-to-charge ratio of 2 (m/z=2) is mainly a hydrogen molecule.

As shown in FIG. 43, the amount of released hydrogen was increased with a lower substrate temperature at the time of depositing the first silicon nitride film 201. This demonstrates that as the substrate temperature at the time of depositing the first silicon nitride film 201 is lower, hydrogen released from the second silicon nitride film 203 is more likely to pass through the first silicon nitride film 201. That is, it was found that the hydrogen-blocking property of the first silicon nitride film 201 tends to decrease with a lower substrate temperature at the time of depositing the first silicon nitride film 201. It was also found that the hydrogen-blocking property of the first silicon nitride film 201 increases when an ammonia gas is used for deposition of the first silicon nitride film 201.

Figure 44:
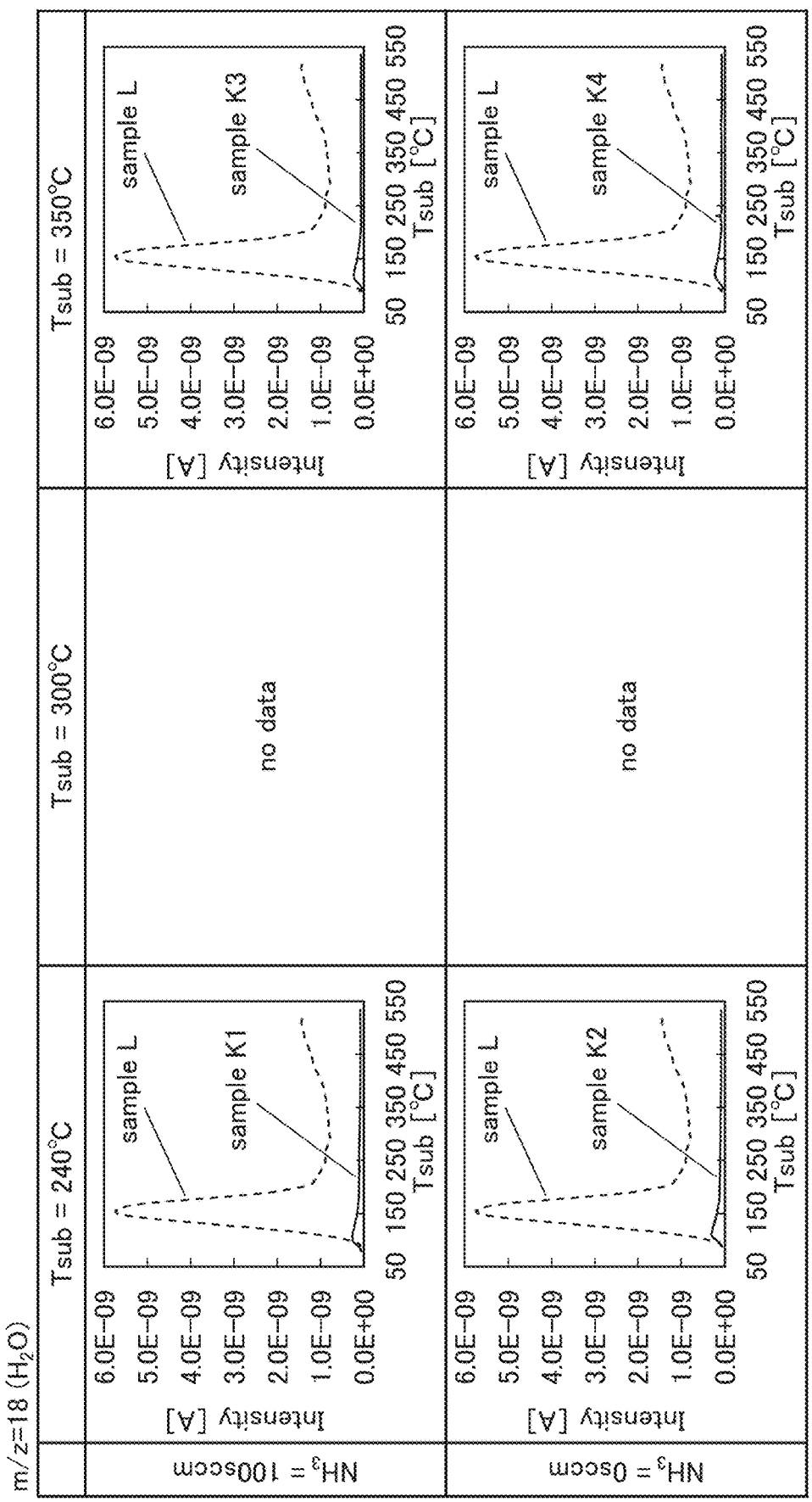
FIG. 44 is a diagram showing TDS measurement results.

FIG. 44 shows TDS analysis results of the sample K1 to the sample K4 and the sample L. In FIG. 44, the flow rate of the ammonia gas at the time of depositing the first silicon nitride film 201 is shown in the vertical direction, and the substrate temperature (Tsub) at the time of depositing the first silicon nitride film 201 is shown in the horizontal direction. In FIG. 44, the horizontal axis represents substrate temperature (Tsub), and the vertical axis represents detection intensity (Intensity) of a mass-to-charge ratio of 18 (m/z=18). A gas having a mass-to-charge ratio of 18 (m/z=18) is mainly a water molecule.

As shown in FIG. 44, the amount of water released from each sample was small, and it was found that water released from the first silicon oxynitride film 205 does not easily pass through the first silicon nitride film 201. That is, the first silicon nitride film 201 was found to have a water-blocking property.

Figure 45:
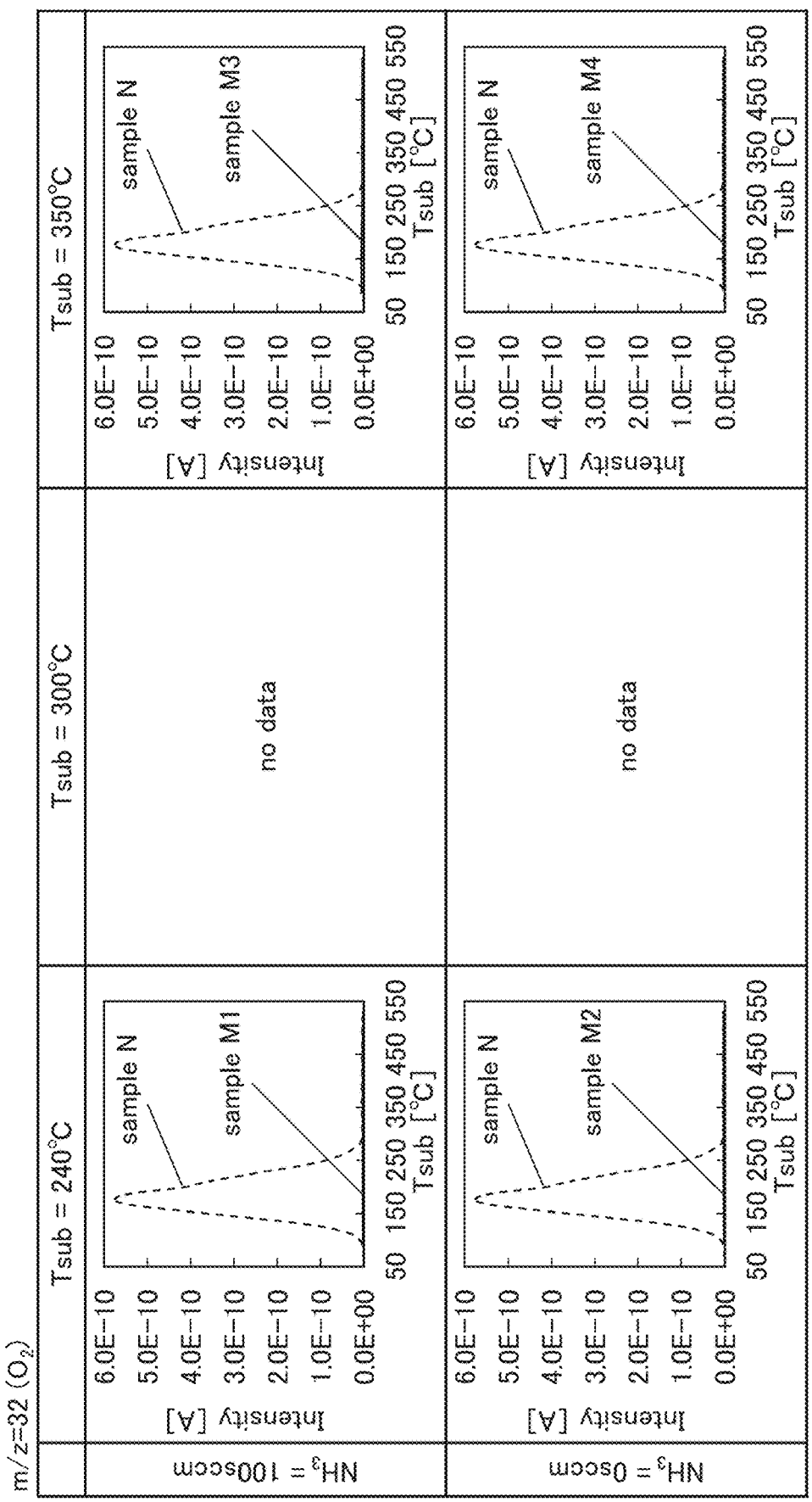
FIG. 45 is a diagram showing TDS measurement results.

FIG. 45 shows TDS analysis results of the sample M1 to the sample M4 and the sample N. In FIG. 45, the flow rate of the ammonia gas at the time of depositing the first silicon nitride film 201 is shown in the vertical direction, and the substrate temperature (Tsub) at the time of depositing the first silicon nitride film 201 is shown in the horizontal direction. In FIG. 45, the horizontal axis represents substrate temperature (Tsub), and the vertical axis represents detection intensity (Intensity) of a mass-to-charge ratio of 32 (m/z=32). A gas with a mass-to-charge ratio of 32 (m/z=32) is mainly an oxygen molecule.

As shown in FIG. 45, the amount of oxygen released from each sample was small. This demonstrates that oxygen released from the second silicon oxynitride film 207 does not easily pass through the first silicon nitride film 201 even when the substrate temperature at the time of depositing the first silicon nitride film 201 is low. That is, it was found that the oxygen-blocking property of the first silicon nitride film 201 is high even when the substrate temperature at the time of depositing the first silicon nitride film 201 is low. It was also found that there is no difference in the oxygen-blocking property of the first silicon nitride film 201 between with and without the use of an ammonia gas for deposition of the first silicon nitride film 201.

Figure 46:
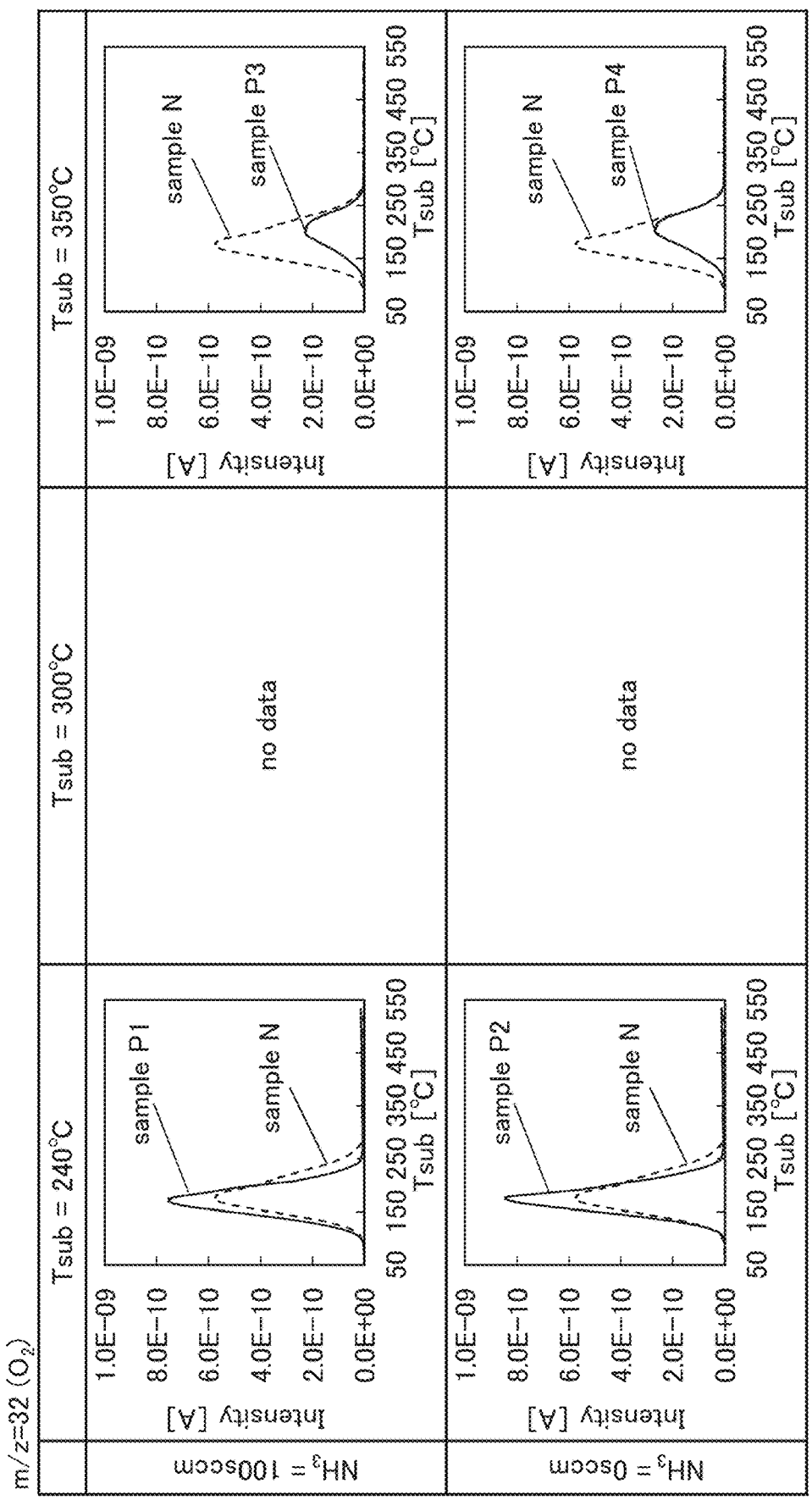
FIG. 46 is a diagram showing TDS measurement results.
Figure 47:
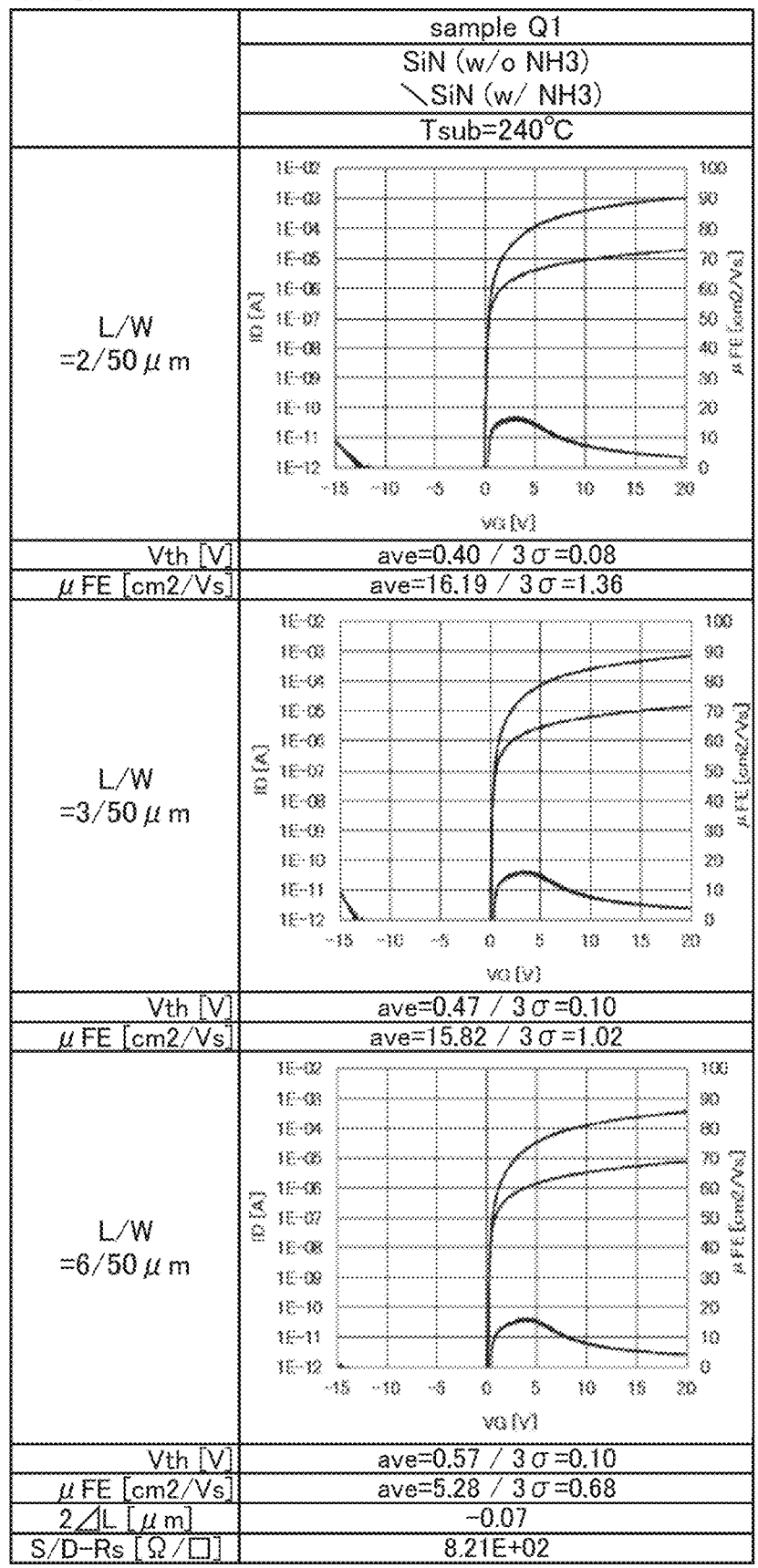
FIG. 47 is a diagram showing Id-Vg characteristics of transistors.
Figure 48:
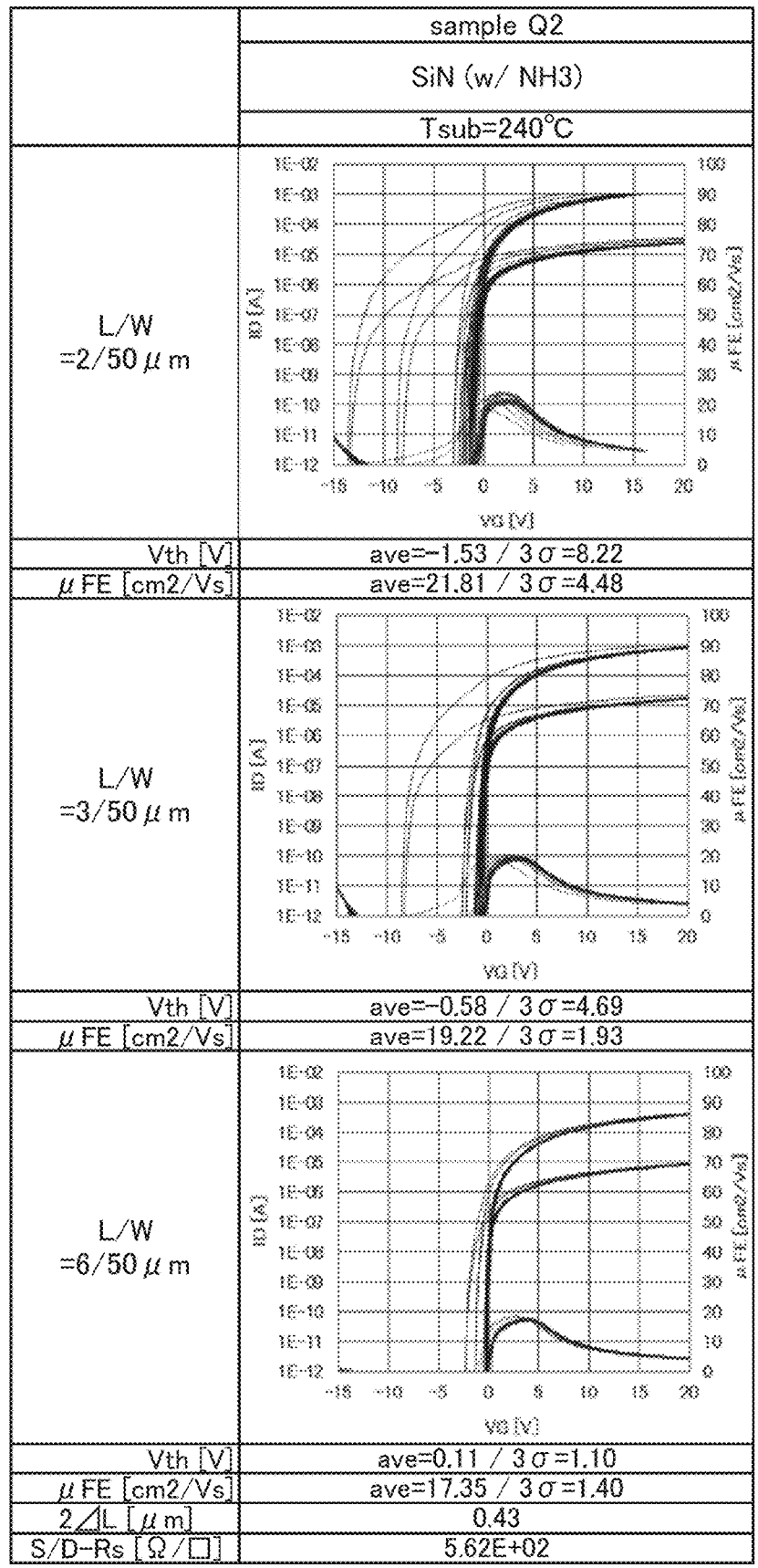
FIG. 48 is a diagram showing Id-Vg characteristics of transistors.
Figure 49:
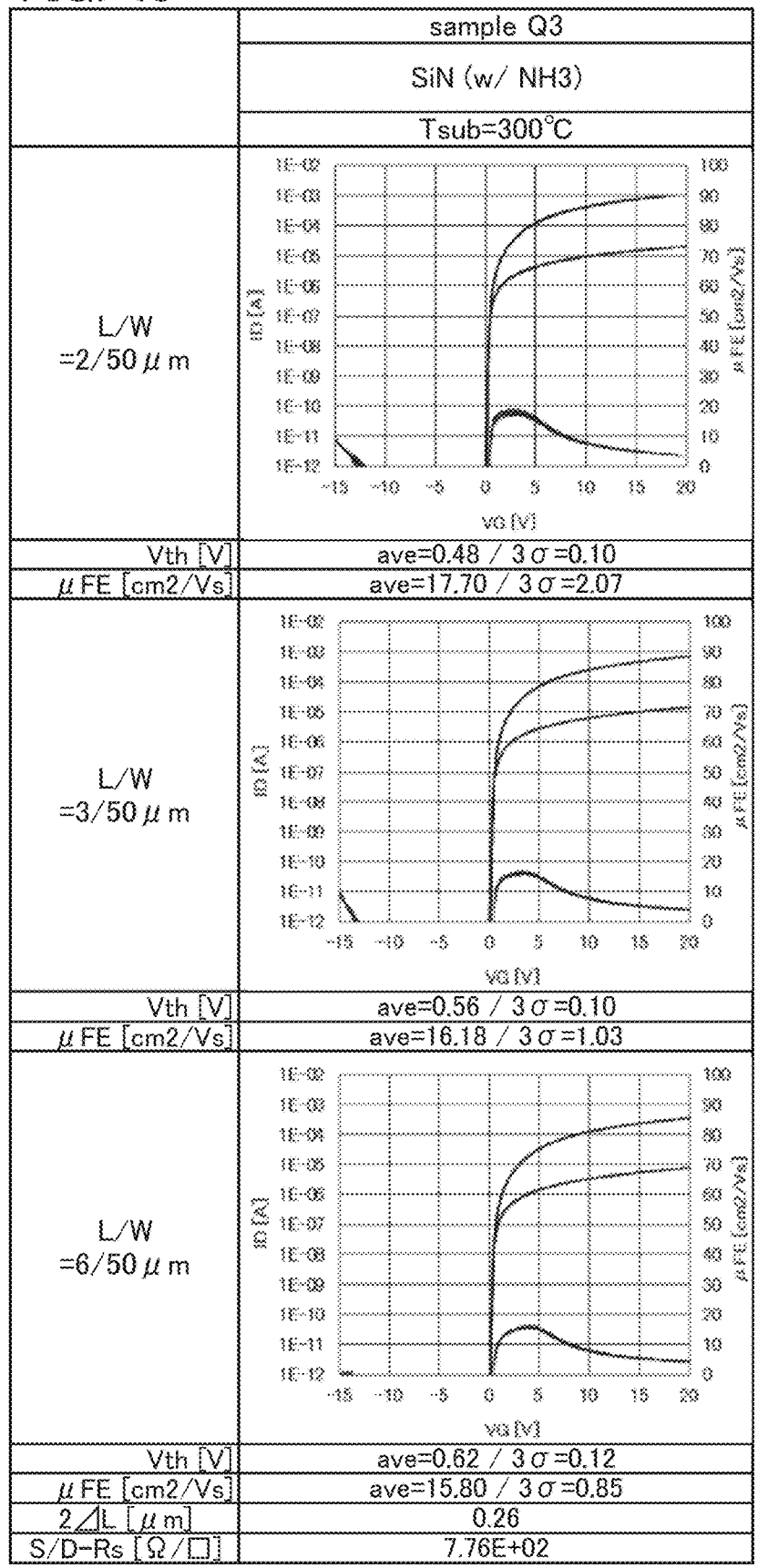
FIG. 49 is a diagram showing Id-Vg characteristics of transistors.

FIG. 46 shows TDS analysis results of the sample P1 to the sample P4 and the sample N. In FIG. 46, the flow rate of the ammonia gas at the time of depositing the first silicon nitride film 201 is shown in the vertical direction, and the substrate temperature (Tsub) at the time of depositing the first silicon nitride film 201 is shown in the horizontal direction. In FIG. 46, the horizontal axis represents substrate temperature (Tsub), and the vertical axis represents detection intensity (Intensity) of a mass-to-charge ratio of 32 (m/z=32). A gas with a mass-to-charge ratio of 32 (m/z=32) is mainly an oxygen molecule.

As shown in FIG. 46, the amount of released oxygen was increased with a lower substrate temperature at the time of depositing the first silicon nitride film 201. This demonstrates that as the substrate temperature at the time of depositing the first silicon nitride film 201 is lower, the amount of oxygen released from the second oxynitride film 207 at the time of depositing the first silicon nitride film 201 decreases. That is, it was found that the amount of oxygen remaining in the second silicon oxynitride film 207 tends to increase with a lower substrate temperature at the time of depositing the first silicon nitride film 201. In addition, no difference was observed in the amount of oxygen remaining in the second silicon oxynitride film 207 between with and without the use of an ammonia gas for deposition of the first silicon nitride film 201.

Example 8

In this example, samples corresponding to the transistor 100B illustrated in FIG. 7 (a sample Q1 to a sample Q7) were fabricated, and the drain current-drain voltage characteristics (Id-Vd characteristics) and reliability of the transistors were evaluated. In this example, an indium zinc oxide layer was used as the metal oxide layer 114. A sample in which a copper layer was used as the conductive layer 112, and a sample in which the conductive layer 112 had a stacked-layer structure of a copper layer and an indium zinc oxide layer over the copper layer were fabricated.

Note that in this example, a transistor in which the conductive layer 106 (bottom gate electrode) illustrated in FIG. 9 was provided and electrically connected to the conductive layer 112 (top gate electrode) was fabricated.

<Sample Fabrication>

First, a 30-nm-thick titanium film and a 100-nm-thick copper film were formed in this order over a glass substrate by a sputtering method, and then processed to obtain a first gate electrode (bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order. The description in Example 1 can be referred to for the first silicon nitride film, the second silicon nitride film, the third silicon nitride film, and the first silicon oxynitride film; thus, the detailed description is omitted.

Subsequently, a 25-nm-thick first metal oxide film was deposited over the first silicon oxynitride film. The first metal oxide film was deposited by a sputtering method using an In—Ga—Zn oxide target (In:Ga:Zn=1:1:1 [atomic ratio]). The deposition pressure was 0.6 Pa, the power was 2.5 kW, and the substrate temperature was room temperature. A mixed gas of an oxygen gas and an argon gas was used as a deposition gas, and the oxygen flow rate ratio was 30%.

Then, the first metal oxide film was processed into an island shape to form a first metal oxide layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate:oxygen gas flow rate=4:1) for one hour. An oven apparatus was used for the heat treatment.

Next, as a second gate insulating layer, a 5-nm-thick second silicon oxynitride film, a 130-nm-thick third silicon oxynitride film, and a 5-nm-thick fourth silicon oxynitride film were deposited in this order. The description in Example 1 can be referred to for the second gate insulating layer, the third silicon oxynitride film, and the fourth silicon oxynitride film; therefore, the detailed description is omitted.

Subsequently, heat treatment was performed at 370° C. in a nitrogen atmosphere for one hour. An oven apparatus was used for the heat treatment.

Next, a 20-nm-thick second metal oxide film was deposited over the fourth silicon oxynitride film. The second metal oxide film was deposited by a sputtering method using an indium zinc oxide target (In:Zn=2:3 [atomic ratio]). The deposition pressure was 0.6 Pa, the power was 2.5 kW, and the substrate temperature was room temperature. In this example, the conditions of the deposition gas used for depositing the second metal oxide film were varied. In the sample Q1 to the sample Q4, an oxygen gas (oxygen flow rate ratio: 100%) was used as the deposition gas. In the sample Q5 to the sample Q7, a mixed gas of an oxygen gas and an argon gas was used as the deposition gas, and the oxygen flow rate ratio was 60%. In the sample Q5 to the sample Q7, the oxygen flow rate ratio at the time of depositing the second metal oxide film is lower, and thus the amount of oxygen supplied to the second gate insulating layer is smaller than in the sample Q1 to the sample Q4.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, as a conductive film, a 100-nm-thick copper film and a 30-nm-thick indium zinc oxide film were deposited in this order over the second metal oxide film. The copper film and the indium zinc oxide film were deposited by a sputtering method. The copper film was deposited using a Cu target. The indium zinc oxide film was deposited by a sputtering method using an indium zinc oxide target (In:Zn=2:3 [atomic ratio]). The deposition pressure was 0.6 Pa, the power was 2.5 kW, and the substrate temperature was room temperature. A mixed gas of an oxygen gas and an argon gas was used as a deposition gas, and the oxygen flow rate ratio was 30%.

Next, a resist mask was formed over the conductive film, and the second metal oxide film and the conductive film were processed to form a second metal oxide layer and a conductive layer. A wet etching method was used for the processing. The description in Example 1 can be referred to for the etchant; thus, the detailed description is omitted.

Then, the second silicon oxynitride film to the fourth silicon oxynitride film were processed using the aforementioned resist mask as a mask to form the second gate insulating layer. In addition, at the time of forming the second gate insulating layer, the first silicon oxynitride film in a region that is not overlapped by the resist mask was removed to expose part of the third silicon nitride film. A dry etching method was used for the processing. After that, the resist mask was removed.

Subsequently, cleaning was performed. For the cleaning, an aqueous solution in which 85 weight % phosphoric acid was diluted 500 times was used. The etchant temperature at the time of etching was room temperature, and the treatment time was 15 sec.

Then, as protective layers that cover the transistor, a 100-nm-thick first protective layer and a 300-nm-thick second protective layer were deposited in this order. In this example, the deposition conditions of the first protective layer were varied between the sample Q1 to the sample Q7. A silicon oxynitride film was used as the second protective layer in each of the samples.

The first protective layer in the sample Q1 had a stacked-layer structure of a 20-nm-thick fourth silicon nitride film and a 80-nm-thick fifth silicon nitride film over the fourth silicon nitride film. The fourth silicon nitride film in the sample Q1 was deposited by a PECVD method using a mixed gas of a silane gas at a flow rate of 150 sccm and a nitrogen gas at a flow rate of 5000 sccm. The pressure at the time of depositing the fourth silicon nitride film was 200 Pa, the deposition power was 2000 W, and the substrate temperature was 240° C. The fifth silicon nitride film in the sample Q1 was deposited by a PECVD method using a mixed gas of a silane gas at a flow rate of 150 sccm, a nitrogen gas at a flow rate of 5000 sccm, and an ammonia gas at a flow rate of 100 sccm. The substrate temperature at the time of deposition was 240° C. The pressure at the time of depositing the fifth silicon nitride film was 200 Pa, the deposition power was 2000 W, and the substrate temperature was 240° C.

The first protective layer in each of the sample Q2 and the sample Q5 had a single-layer structure of a 100-nm-thick fourth silicon nitride film. The fourth silicon nitride film in each of the sample Q2 and the sample Q5 was deposited by a PECVD method using a mixed gas of a silane gas at a flow rate of 150 sccm, a nitrogen gas at a flow rate of 5000 sccm, and an ammonia gas at a flow rate of 100 sccm. The substrate temperature at the time of deposition was 240° C.

The first protective layer in each of the sample Q3 and the sample Q6 had a single-layer structure of a 100-nm-thick fourth silicon nitride film. The fourth silicon nitride film in each of the sample Q3 and the sample Q6 was deposited by a PECVD method using a mixed gas of a silane gas at a flow rate of 150 sccm, a nitrogen gas at a flow rate of 5000 sccm, and an ammonia gas at a flow rate of 100 sccm. The substrate temperature at the time of deposition was 300° C.

The first protective layer in each of the sample Q4 and the sample Q7 had a single-layer structure of a 100-nm-thick fourth silicon nitride film. The fourth silicon nitride film in each of the sample Q4 and the sample Q7 was deposited by a PECVD method using a mixed gas of a silane gas at a flow rate of 150 sccm, a nitrogen gas at a flow rate of 5000 sccm, and an ammonia gas at a flow rate of 100 sccm. The substrate temperature at the time of deposition was 350° C.

The second protective layer in each of the samples was deposited by a PECVD method using a mixed gas of a silane gas at a flow rate of 290 sccm and a dinitrogen monoxide gas at a flow rate of 4000 sccm. The deposition pressure was 133 Pa, the deposition power was 1000 W, and the substrate temperature was 350° C.

Next, an opening was formed in part of the protective layers covering the transistor, and a 30-nm-thick titanium film, a 100-nm-thick copper film, and a 50-nm-thick titanium film were deposited in this order by a sputtering method, and then processed to obtain a source electrode and a drain electrode. After that, an approximately 1.5-μm-thick acrylic resin was applied as a planarization layer, and heat treatment was performed under the conditions of a temperature of 250° C. in a nitrogen atmosphere for one hour.

Through the above steps, the transistors each formed over the glass substrate (the sample Q1 to the sample Q7) were obtained.

<Id-Vg Characteristics Evaluation>

Next, the Id-Vg characteristics of the transistors fabricated as above were measured.

The Id-Vg characteristics of the transistors were measured in such a manner that a voltage applied to the first gate electrode (hereinafter also referred to as gate voltage (Vg)) and a voltage applied to the second gate electrode (hereinafter also referred to as gate voltage (Vbg)) were applied from −15 V to +20 V in steps of 0.25 V. Moreover, a voltage applied to the source electrode (hereinafter also referred to as source voltage (Vs)) was 0 V (common), and a voltage applied to the drain electrode (hereinafter also referred to as drain voltage (Vd)) was 0.1 V and 5.1 V.

FIG. 47 to FIG. 53 respectively show the Id-Vg characteristics of the transistors of the sample Q1 to the sample Q7. FIG. 47 to FIG. 53 show the structure of the first protective layer and the substrate temperature (Tsub) at the time of depositing the first protective layer. It is shown that in the sample Q1, the first protective layer had a stacked-layer structure of the fourth silicon nitride film and the fifth silicon nitride film, an ammonia gas was not used for deposition of the fourth silicon nitride film, and an ammonia gas was used for deposition of the fifth silicon nitride film (SiN (w/o NH3)\SiN (w/ NH3)). It is shown that in the sample Q2 to the sample Q7, the first protective layer had a single-layer structure of the fourth silicon nitride film, and an ammonia gas was used for deposition of the fourth silicon nitride film (SiN (w/ NH3)). In addition, transistors with different channel lengths are shown in the vertical direction, and three types of transistors having a channel width of 50 μm and a channel length of 2 μm, 3 μm, and 6 μm are shown. In FIG. 47 to FIG. 53, the horizontal axis represents gate voltage (Vg), the left vertical axis represents drain current (Id), and the right vertical axis represents saturation mobility (μFE) at Vd=5.1 V. Note that Id-Vg characteristics of 20 transistors were measured for each sample. FIG. 47 to FIG. 53 each show superimposed Id-Vg characteristics of the 20 transistors.

FIG. 47 to FIG. 53 show the average (ave) and 3σ of the threshold voltage (Vth) and saturation mobility (μFE) for each transistor size. Note that a represents a standard deviation. FIG. 47 to FIG. 53 also show a difference (2ΔL) between the designed channel length and the effective channel length. The effective channel length was obtained by TLM (Transmission Line Model) analysis.

<Reliability Evaluation>

Next, the reliability of the fabricated transistors was evaluated. In this example, a PBTS (Positive Bias Temperature Stress) test, in which a state where a positive potential relative to a source potential and a drain potential is applied to a gate is maintained at high temperatures, and an NBTIS (Negative Bias Temperature Illumination Stress) test, in which a state where a negative potential is applied to a gate is maintained at high temperatures in a light illumination environment, were performed.

In the PBTS test, a substrate over which the transistor was formed was held at 60° C., a voltage of 0.1 V was applied to the drain of the transistor, and a voltage of 20 V was applied to the gate; this state was held for one hour. The test was performed in a dark environment.

In the NBTIS test, a substrate over which the transistor was formed was held at 60° C., a voltage of 10 V was applied to the drain of the transistor, and a voltage of −20 V was applied to the gate; this state was held for one hour. The test was performed in a light illumination environment (irradiation with light of approximately 3400 lux by a white LED).

In the reliability tests, the transistor having a channel length of 2 μm and a channel width of 3 μm was used, and the amount of change in threshold voltage (ΔVth) before and after the gate bias stress test was evaluated.

Figure 54A:
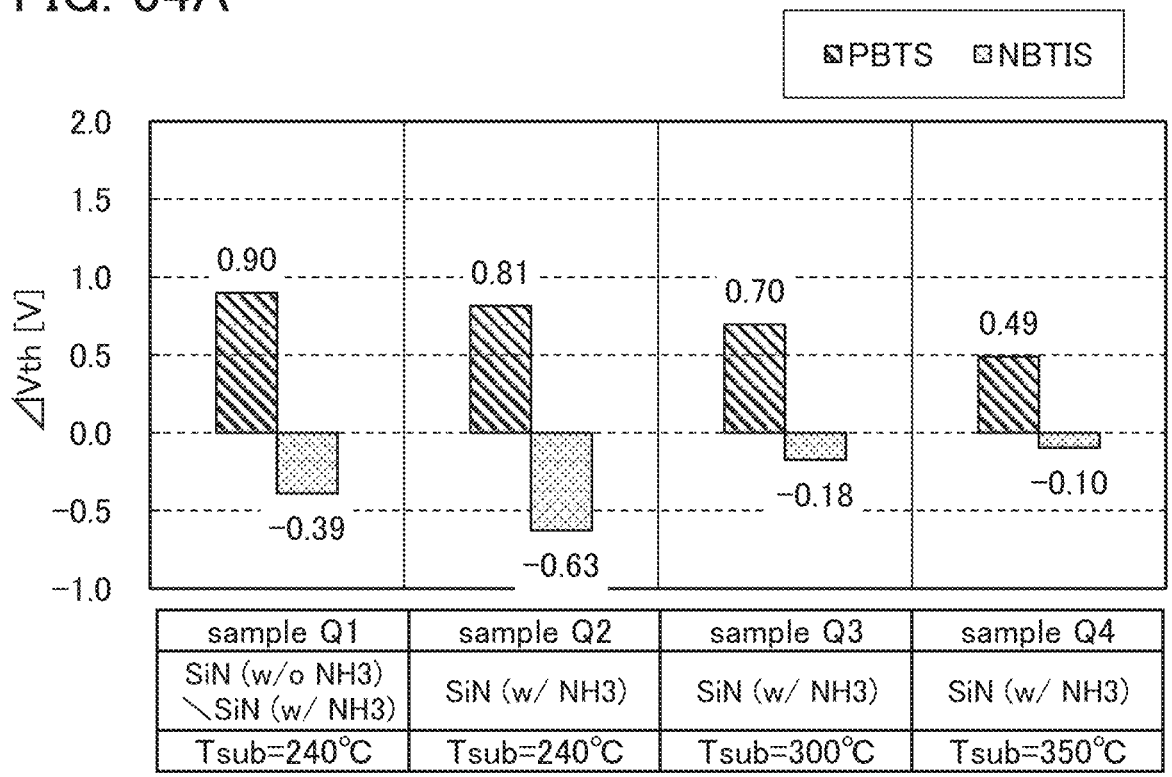
FIG. 54A and FIG. 54B are diagrams showing results of evaluating reliability of transistors.
Figure 54B:
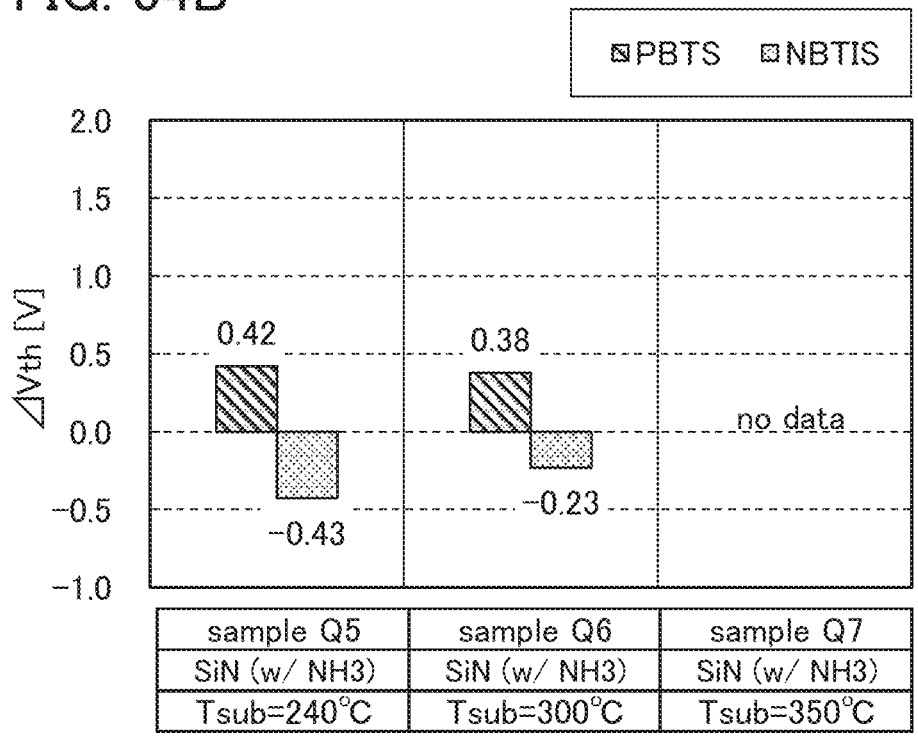

FIG. 54A shows the threshold voltage change amount (ΔVth) of the sample Q1 to the sample Q4. FIG. 54B shows the threshold voltage change amount (ΔVth) of the sample Q5 and the sample Q6. In FIG. 54A and FIG. 54B, the structure of the first protective layer and the substrate temperature at the time of depositing the first protective layer are shown in the horizontal direction. In FIG. 54A and FIG. 54B, the vertical axis represents the threshold voltage change amount (ΔVth).

As shown in FIG. 47 to FIG. 50, in the sample Q1 to the sample Q4, in which the oxygen flow rate ratio at the time of depositing the second metal oxide film was 100%, variations in electrical characteristics tended to be larger with a lower substrate temperature at the time of depositing the first protective layer. It is likely that a lower substrate temperature at the time of depositing the first protective layer leaded to a larger amount of hydrogen released from the first protective layer, and thus, variations in electrical characteristics and the threshold voltage change amount in the NBTIS test increased. It is also likely that in the sample Q1 including the first protective layer with a stacked-layer structure, diffusion of hydrogen into the transistor was suppressed owing to a high hydrogen-blocking property of the fifth silicon nitride film.

As shown in FIG. 54A, in the sample Q1 to the sample Q4, in which the oxygen flow rate ratio at the time of depositing the second metal oxide film was 100%, the threshold voltage change amount (ΔVth) in the NBTIS test tended to be smaller with a higher substrate temperature at the time of depositing the first protective layer. The threshold voltage change amount (ΔVth) in the NBTIS test decreased probably because with a higher substrate temperature at the time of depositing the first protective layer, oxygen supplied to the second gate insulating layer more diffused into the semiconductor device, and Vo and VoH in the semiconductor layer decreased. Furthermore, the threshold voltage change amount (ΔVth) in the NBTIS test was found to be small in the sample Q1, in which the first protective layer had a stacked-layer structure.

Figure 51:
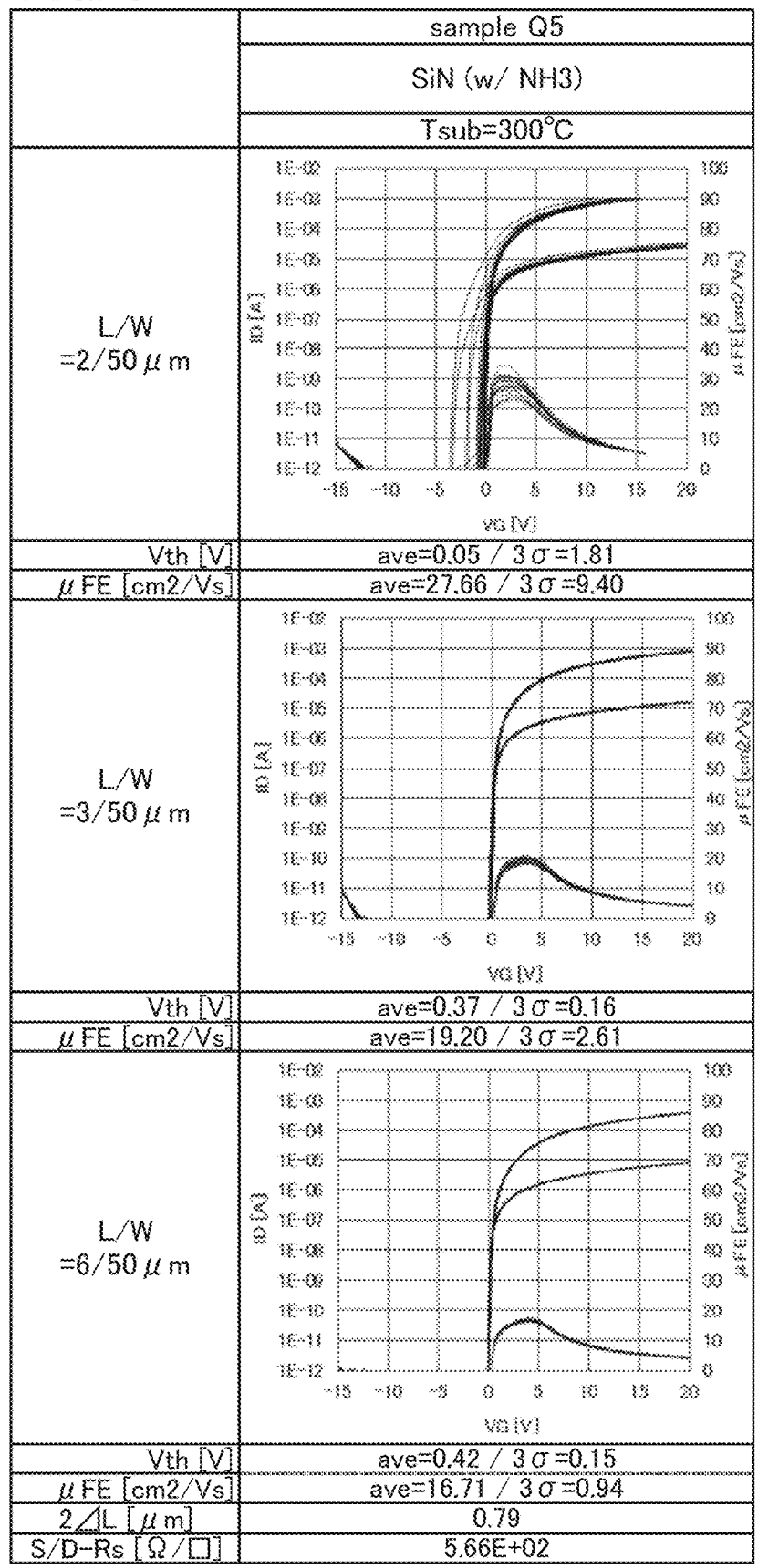
FIG. 51 is a diagram showing Id-Vg characteristics of transistors.
Figure 52:
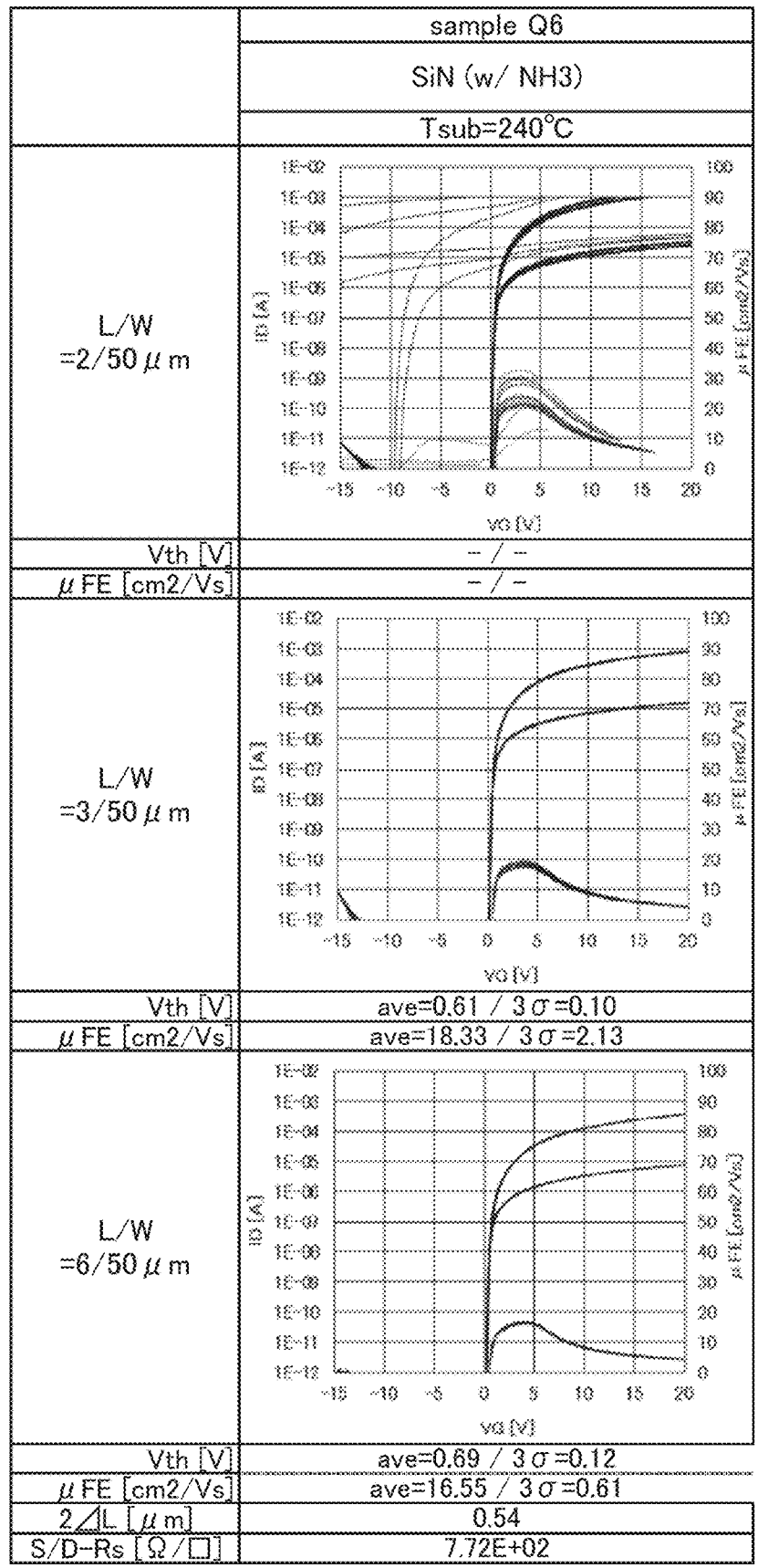
FIG. 52 is a diagram showing Id-Vg characteristics of transistors.
Figure 53:
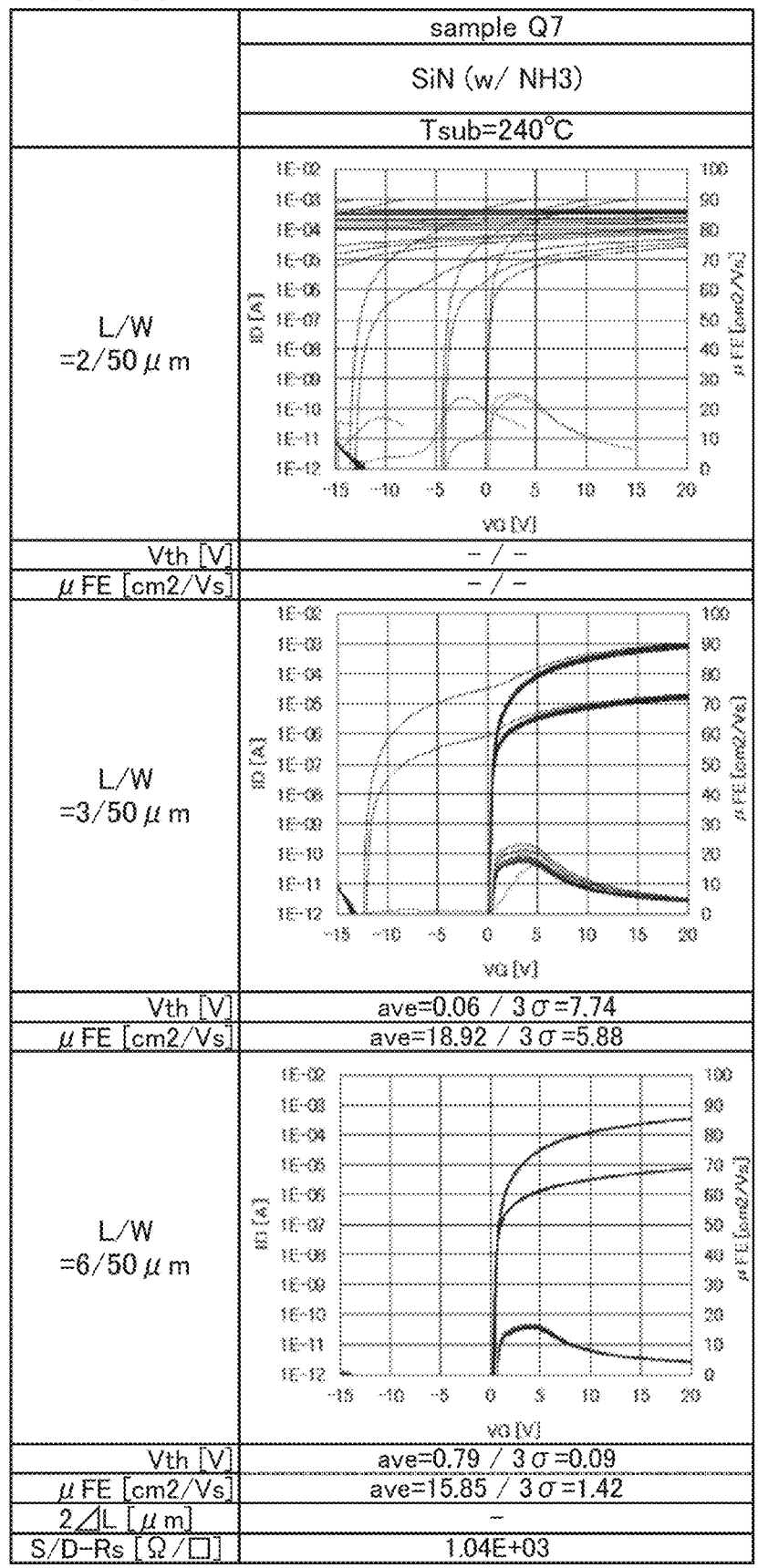
FIG. 53 is a diagram showing Id-Vg characteristics of transistors.

As shown in FIG. 51 to FIG. 53, in the sample Q5 to the sample Q7, in which the oxygen flow rate ratio at the time of depositing the second metal oxide film was 60%, variations in electrical characteristics tended to be larger with a higher substrate temperature at the time of depositing the first protective layer. In the sample Q5 to the sample Q7, the amount of oxygen supplied to the second gate insulating layer is smaller than that in the sample Q1 to the sample Q4. Furthermore, it is likely that as the substrate temperature at the time of depositing the first protective layer was higher, the amount of oxygen released from the second gate insulating layer at the time of depositing the first protective layer was larger and the amount of oxygen diffusing into the semiconductor layer was smaller, so that Vo and VoH in the semiconductor layer were not easily decreased.

As described above, it was found that adjusting the substrate temperature at the time of depositing the first protective layer can achieve both favorable electrical characteristics and high reliability.

Example 9

In this example, a sample corresponding to the transistor 100B illustrated in FIG. 7 (a sample R) was fabricated, and the cross-sectional shape of the transistor in which the insulating layer 116 has a two-layer structure was evaluated. Note that the conductive layer 106 (bottom gate electrode) illustrated in FIG. 9 was provided in this example. Moreover, the insulating layer 103 had a two-layer structure of the insulating layer 103b and the insulating layer 103c.
<Sample Fabrication>
First, a 100-nm-thick tungsten film was formed over a glass substrate by a sputtering method, and then processed to obtain a tungsten layer (first gate electrode).

Next, as a first gate insulating layer, a 200-nm-thick first silicon nitride layer, a 50-nm-thick second silicon nitride layer, and a 100-nm-thick first silicon oxynitride layer were deposited in this order.

Then, a 25-nm-thick metal oxide film was formed by a sputtering method over the first silicon oxynitride layer.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Then, the metal oxide film was processed to form a metal oxide layer.

Next, as a second gate insulating layer, a 5-nm-thick second silicon oxynitride film, a 130-nm-thick third silicon oxynitride film, and a 5-nm-thick fourth silicon oxynitride film were deposited in this order.

Subsequently, heat treatment was performed at 370° C. in a nitrogen atmosphere for one hour. An oven apparatus was used for the heat treatment.

Then, over the fourth silicon oxynitride film, a 10-nm-thick titanium film and a 100-nm-thick copper film were deposited in this order.

Next, a resist mask was formed over the copper film, and the titanium film and the copper film were processed to form a titanium layer and a copper layer. A wet etching method was used for the processing.

Next, the second silicon oxynitride film to the fourth silicon oxynitride film were processed using the aforementioned resist mask as a mask to form a second silicon oxynitride layer to a fourth silicon oxynitride layer (the second gate insulating layer). A dry etching method was used for the processing.

Subsequently, the resist mask was removed.

Then, as a protective layer covering the transistor, a 20-nm-thick third silicon nitride layer, a 80-nm-thick fourth silicon nitride layer, and a 300-nm-thick fifth silicon oxynitride layer were deposited in this order.

The third silicon nitride layer and the fourth silicon nitride layer were deposited by a PECVD method, and the substrate temperature at the time of deposition was 350° C. For deposition of the third silicon nitride layer, a mixed gas of a silane gas at a flow rate of 150 sccm and a nitrogen gas at a flow rate of 5000 sccm was used; the deposition pressure was 200 Pa; and the deposition power was 2000 W. For deposition of the fourth silicon nitride layer, a mixed gas of a silane gas at a flow rate of 150 sccm, a nitrogen gas at a flow rate of 5000 sccm, and an ammonia gas at a flow rate of 100 sccm was used; the deposition pressure was 200 Pa; and the deposition power was 2000 W. After the deposition of the third silicon nitride film, the fourth silicon nitride film was deposited successively without exposure to the air.

Next, an opening was formed in part of the protective layer covering the transistor, and a 100-nm-thick molybdenum film was deposited by a sputtering method and then processed to obtain a source electrode and a drain electrode. After that, an approximately 1.5-μm-thick acrylic resin was applied as a planarization layer, and heat treatment was performed under the conditions of a temperature of 250° C. in a nitrogen atmosphere for one hour.

Through the above steps, the transistor formed over the glass substrate (the sample R) was obtained.
<Cross-Sectional Observation>
Then, the sample R was thinned by a focused ion beam (FIB), and the cross section of the sample R was observed with a STEM.

Figure 55A:
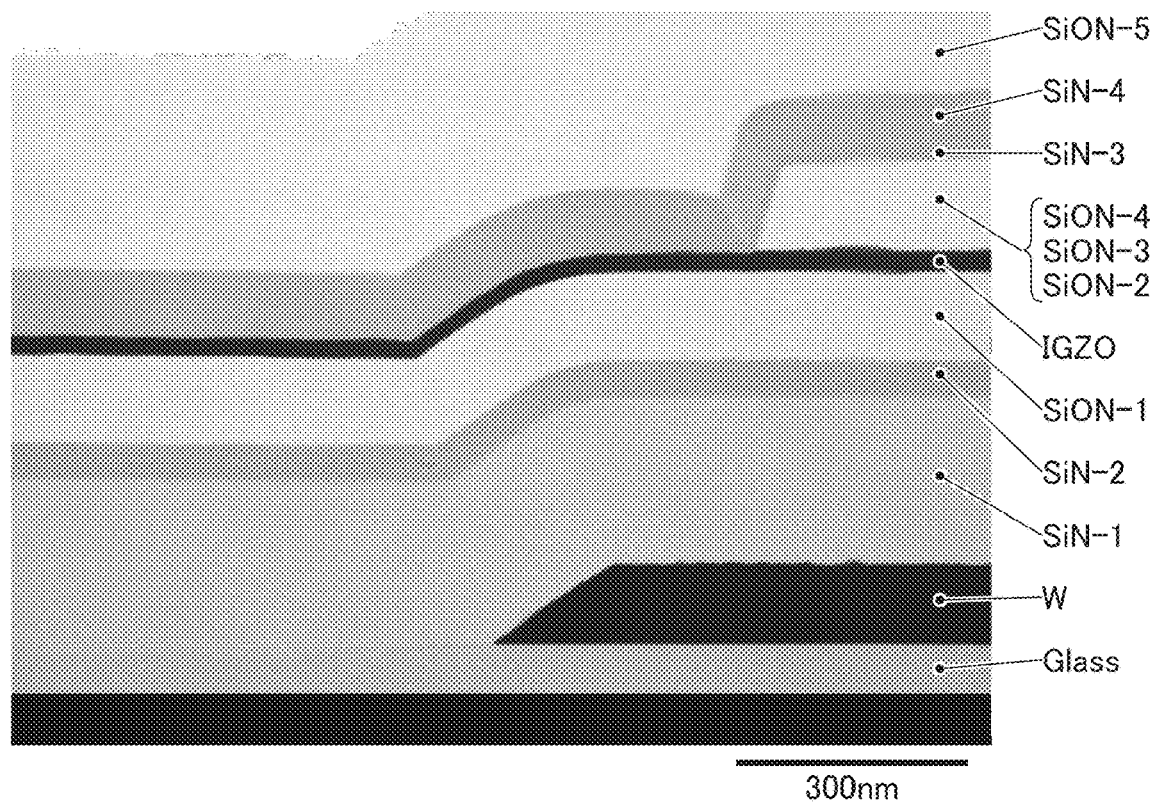
FIG. 55A and FIG. 55B are cross-sectional TEM images of a transistor.

FIG. 55A shows a STEM image of the cross section of the sample R. FIG. 55A is a transmission electron image (TE image) at a magnification of 100000 times. In FIG. 55A, the glass substrate is denoted as Glass, the tungsten layer as W, the first silicon nitride layer as SiN-1, the second silicon nitride layer as SiN-2, the third silicon nitride layer as SiN-3, the fourth silicon nitride layer as SiN-4, the first silicon oxynitride layer as SiON-1, the second silicon oxynitride layer as SiON-2, the third silicon oxynitride layer as SiON-3, the fourth silicon oxynitride layer as SiON-4, the fifth silicon oxynitride layer as SiON-5, and the metal oxide layer as IGZO.

Figure 55B:
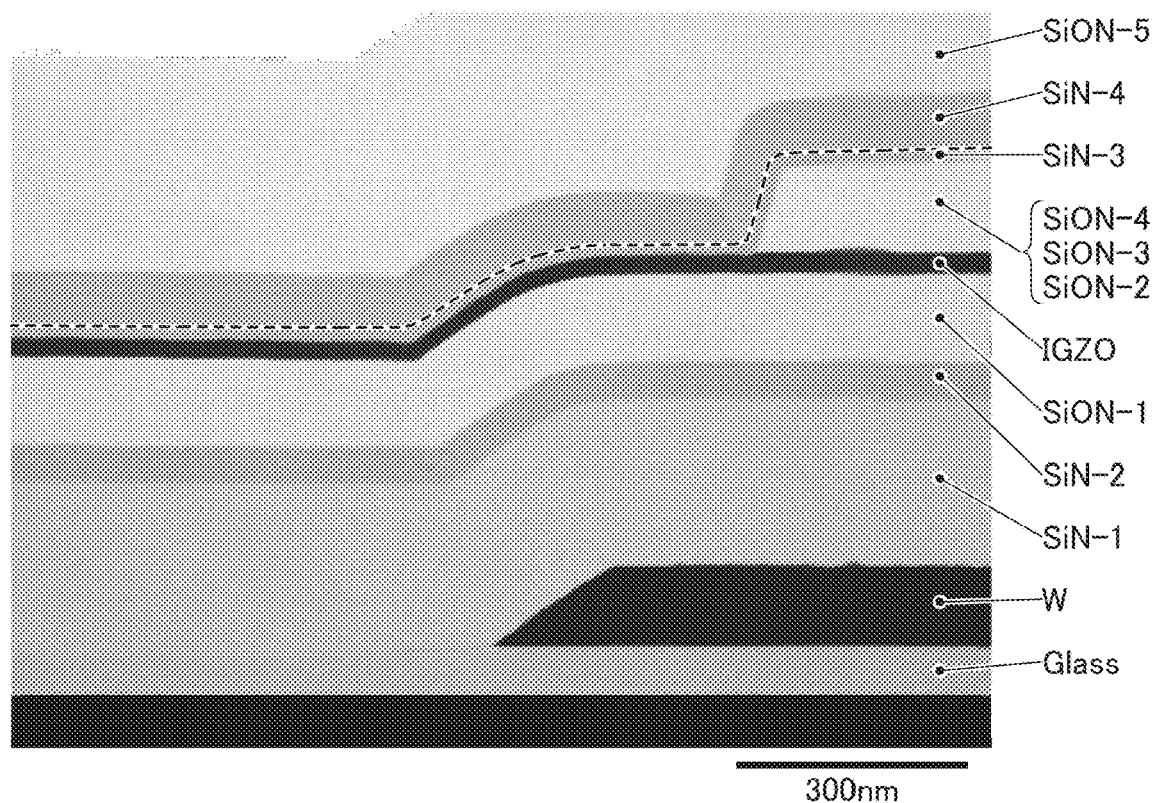

As shown in FIG. 55A, the third silicon nitride layer and the fourth silicon nitride layer, which were the protective layer, were observed to have different concentrations in the transmission electron (TE) image. In FIG. 55B, a boundary between the different concentrations in the TEM image is indicated by a dashed line as an auxiliary line in the third silicon nitride layer (SiN-3 in FIG. 55B) and the fourth silicon nitride layer (SiN-4 in FIG. 55B). Specifically, as compared to the fourth silicon nitride layer formed using an ammonia gas, the third silicon nitride layer, which was formed without using an ammonia gas, was observed to be dark-colored (dark) in the transmission electron (TE) image. Therefore, the third silicon nitride layer is likely to have a higher film density than the fourth silicon nitride layer.

REFERENCE NUMERALS

C1: capacitor, C2: capacitor, DL_Y: data line, DL_1: data line, G1: wiring, G2: wiring, GL_X gate line, GL_1: gate line, M1: transistor, M2: transistor, M3: transistor, N1: node, N2: node, P1: region, P2: region, S1: wiring, S2: wiring, T1: period, T2: period, 100: transistor, 100A: transistor, 100B: transistor, 100C: transistor, 102: substrate, 103: insulating layer, 103a: insulating layer, 103b: insulating layer, 103c: insulating layer, 103d: insulating layer, 106: conductive layer, 108: semiconductor layer, 108C: region, 108f: metal oxide film, 108L: region, 108N: region, 110: insulating layer, 110a: insulating layer, 110A: insulating film, 110b: insulating layer, 110B: insulating film, 110c: insulating layer, 110C: insulating film, 110f: insulating film, 112: conductive layer, 112f: conductive film, 114: metal oxide layer, 114f: metal oxide film, 115: resist mask, 116: insulating layer, 116a: insulating layer, 116b: insulating layer, 118: insulating layer, 120a: conductive layer, 120b: conductive layer, 141a: opening portion, 141b: opening portion, 142: opening portion, 200: glass substrate, 201: silicon nitride film, 203: silicon nitride film, 205: silicon oxynitride film, 207: silicon oxynitride film, 209: oxide conductive film, 211: metal oxide film, 400: pixel circuit, 400EL: pixel circuit, 400LC: pixel circuit, 401: circuit, 401EL: circuit, 401LC: circuit, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 700A: display device, 700B: display device, 701: first substrate, 702: pixel portion, 704: source driver circuit portion, 705: second substrate, 706: gate driver circuit portion, 708: FPC terminal portion, 710: signal line, 711: wiring portion, 712: sealant, 716: FPC, 717: IC, 721: source driver IC, 722: gate driver circuit portion, 723: FPC, 724: printed circuit board, 730: insulating film, 732: sealing film, 734: insulating film, 736: coloring film, 738: light-blocking film, 740: protective layer, 741: protective layer, 742: adhesive layer, 743: resin layer, 744: insulating layer, 745: support substrate, 746: resin layer, 750: transistor, 752: transistor, 760: wiring, 770: planarization insulating film, 772: conductive layer, 773: insulating layer, 774: conductive layer, 775: liquid crystal element, 776: liquid crystal layer, 780: anisotropic conductive film, 782: light-emitting element, 786: EL layer, 788: conductive film, 790: capacitor, 6000: display module, 6001: upper cover, 6002: lower cover, 6005: FPC, 6006: display device, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7500: display portion, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9100: television device, 9101: portable information terminal, 9102: portable information terminal, 9200: portable information terminal, 9201: portable information terminal

The invention claimed is:

1. A semiconductor device comprising:
a semiconductor layer, a first insulating layer, a second insulating layer, a third insulating layer, a metal oxide layer, and a conductive layer,
wherein the semiconductor layer, the second insulating layer, the metal oxide layer, and the conductive layer are stacked in this order over the first insulating layer,
wherein in a cross section in a channel length direction, an end portion of the second insulating layer is positioned inward from an end portion of the semiconductor layer,
wherein the top surface of the second insulating layer comprises a curve in a region where the third insulating layer is in contact with the second insulating layer,
wherein an end portion of the conductive layer and an end portion of the metal oxide layer are positioned inward from the end portion of the second insulating layer,
wherein the third insulating layer is in contact with a top surface of the first insulating layer, a top surface and a side surface of the semiconductor layer, a top surface and a side surface of the second insulating layer, a side surface of the metal oxide layer, and a top surface and a side surface of the conductive layer,
wherein the semiconductor layer comprises a first region, a pair of second regions, and a pair of third regions,
wherein the first region overlaps the first insulating layer and is overlapped by the metal oxide layer,
wherein the second regions sandwich the first region, are overlapped by the second insulating layer, and are not overlapped by the metal oxide layer,
wherein the third regions sandwich the first region and the pair of second regions, and are not overlapped by the second insulating layer,
wherein the third regions are in contact with the third insulating layer,
wherein the third regions comprise a portion having a lower resistance than the first region, and
wherein the second regions comprise a portion having a higher resistance than the third regions.

2. The semiconductor device according to claim 1,
wherein the second insulating layer comprises a portion where a region not overlapped by the metal oxide layer is thinner than a region overlapped by the metal oxide layer.

3. The semiconductor device according to claim 1,
wherein the second region comprises a portion having a sheet resistance greater than or equal to $1\times10^3$ Ω/square and lower than or equal to $1\times10^9$ Ω/square.

4. The semiconductor device according to claim 1,
wherein an electric resistance of the first region is greater than or equal to $1\times10^0$ times and less than or equal to $1\times10^9$ times an electric resistance of the second region.

5. The semiconductor device according to claim 4,
wherein the electric resistance of the second region is greater than or equal to $1\times10^0$ times and less than or equal to $1\times10^9$ times an electric resistance of the third region.

6. The semiconductor device according to claim 1,
wherein in the cross section in the channel length direction, a width of the second region is greater than or equal to 100 nm and less than or equal to 2 μm.

7. The semiconductor device according to claim 1,
wherein the first insulating layer comprises a nitride, and
wherein the third insulating layer comprises a nitride.

8. The semiconductor device according to claim 1, further comprising a fourth insulating layer,
wherein the fourth insulating layer is in contact with a top surface of the third insulating layer, and
wherein the fourth insulating layer comprises a nitride.

9. The semiconductor device according to claim 8,
wherein the third insulating layer comprises a region having a lower hydrogen concentration than the fourth insulating layer.

10. The semiconductor device according to claim 8,
wherein the third insulating layer comprises a region having a higher film density than the fourth insulating layer.

11. The semiconductor device according to claim 1,
wherein the conductive layer and the metal oxide layer have substantially the same top surface shapes.

12. The semiconductor device according to claim 1,
wherein the end portion of the conductive layer is positioned inward from the end portion of the metal oxide layer.

13. The semiconductor device according to claim 1,
wherein the end portion of the second insulating layer and the end portion of the metal oxide layer are tapered.

14. The semiconductor device according to claim 1,
wherein the semiconductor layer and the metal oxide layer comprise the same metal element.

15. The semiconductor device according to claim 14,
wherein the metal element is at least one of indium and zinc.

16. The semiconductor device according to claim 1,
wherein the second insulating layer comprises a first layer, a second layer over the first layer, and a third layer over the second layer.

* * * * *